(12) United States Patent
Buazza et al.

(10) Patent No.: US 6,367,928 B1
(45) Date of Patent: Apr. 9, 2002

(54) METHOD AND COMPOSITION FOR PRODUCING ULTRAVIOLET BLOCKING LENSES

(75) Inventors: Omar M. Buazza, Lou; Stephen C. Luetke; Galen R. Powers, both of Louisville, all of KY (US)

(73) Assignee: Q2100, Inc., Louisville, KY (US)

(*) Notice: Subject to any disclaimer, the term of this patent is extended or adjusted under 35 U.S.C. 154(b) by 0 days.

(21) Appl. No.: 09/398,116

(22) Filed: Sep. 16, 1999

Related U.S. Application Data

(60) Division of application No. 08/959,973, filed on Oct. 29, 1997, now Pat. No. 5,989,462, which is a continuation-in-part of application No. 08/904,289, filed on Jul. 31, 1997.

(51) Int. Cl.⁷ .............................. G02B 1/04; G02C 7/02
(52) U.S. Cl. ..................... 351/159; 351/163; 351/166; 351/177
(58) Field of Search ................................ 264/1.1, 1.36, 264/1.38, 1.7, 1.8; 359/159, 166, 163, 177

(56) References Cited

U.S. PATENT DOCUMENTS

| | | |
|---|---|---|
| 2,524,862 A | 10/1950 | White |
| 2,525,664 A | 10/1950 | Gadsby et al. |
| 3,485,765 A | 12/1969 | Newland et al. |
| 4,113,224 A | 9/1978 | Clark et al. |
| 4,118,853 A | 10/1978 | Mignen |
| 4,132,518 A | 1/1979 | Rips |
| 4,138,538 A | 2/1979 | Kaetsu et al. |

(List continued on next page.)

FOREIGN PATENT DOCUMENTS

| | | |
|---|---|---|
| DE | 40 10 784 | 10/1991 |
| EP | 226 123 | 6/1987 |
| EP | 0 227 337 | 7/1987 |
| EP | 0 245 020 | 11/1987 |
| EP | 0 245 020 A2 | 11/1987 |
| EP | 0 245 022 | 11/1987 |
| EP | 274 595 | 7/1988 |

(List continued on next page.)

OTHER PUBLICATIONS

International Search Report for PCT/US97/06641 dated Oct. 30, 1997.
International Search Report for PCT/US 98/15959 dated Nov. 27, 1998.
Communication from Fastcast Corporation entitled, "What is PID—Tutorial Overview," dated Oct. 22, 1997, pp. 1–25.
Patent Abstracts of Japan, Publication No. 55132221, Publication Dated: Oct. 14, 1980.
Patent Abstracts of Japan, Publication No. 59086603, Publication Dated: May 18, 1984.
Patent Abstracts of Japan, Publication No. 62025162, Publication Dated: Feb. 3, 1987.

*Primary Examiner*—Mathieu D. Vargot
(74) *Attorney, Agent, or Firm*—Eric B. Meyertons; Conley, Rose & Tayon, P.C.

(57) ABSTRACT

An eyeglass lens forming composition containing light absorbing compounds which may undergo light initiated polymerization is provided. Typically, lens forming compositions that absorb light do not permit enough activating radiation to penetrate into the depths of the lens cavity to adequately initiate polymerization of the lens forming composition. An embodiment of the invention provides a system and method for curing such a lens forming composition to form a lens that does not transmit ultraviolet light. Activating light is used having a wavelength greater than the wavelengths of light which the light absorbing compounds absorb. The power of the formed lenses may be controlled by varying the lens forming conditions. Additionally, the lens forming process may be controlled using a microprocessor based control system.

206 Claims, 31 Drawing Sheets

U.S. PATENT DOCUMENTS

| | | |
|---|---|---|
| 4,166,088 A | 8/1979 | Neefe |
| 4,246,207 A | 1/1981 | Spycher |
| 4,252,753 A | 2/1981 | Rips |
| 4,273,809 A | 6/1981 | La Liberte et al. |
| 4,284,399 A | 8/1981 | Newcomb et al. |
| 4,287,337 A | 9/1981 | Guglielmetti et al. |
| 4,298,005 A | 11/1981 | Mutzhas |
| 4,308,400 A | 12/1981 | Felder et al. |
| 4,369,298 A | 1/1983 | Kida et al. |
| 4,390,482 A | 6/1983 | Feurer |
| 4,396,737 A | 8/1983 | Leatherman |
| 4,440,699 A | 4/1984 | Smid et al. |
| 4,441,795 A | 4/1984 | Lobdell |
| 4,512,340 A | 4/1985 | Buck |
| 4,534,915 A | 8/1985 | Neefe |
| 4,542,201 A | 9/1985 | Kanemura et al. |
| 4,561,951 A | 12/1985 | Neckers |
| 4,576,766 A | 3/1986 | Baskerville et al. |
| 4,586,996 A | 5/1986 | Shinohara et al. |
| 4,594,288 A | 6/1986 | Dobigny et al. |
| 4,613,656 A | 9/1986 | Tang |
| 4,622,376 A | 11/1986 | Misura et al. |
| 4,623,497 A | 11/1986 | Waters |
| 4,640,489 A | 2/1987 | Larsen |
| 4,720,356 A | 1/1988 | Chu |
| 4,728,469 A | 3/1988 | Danner et al. |
| 4,746,716 A | 5/1988 | Oates |
| 4,842,782 A | 6/1989 | Portney et al. |
| 4,851,530 A | 7/1989 | Rickwood |
| 4,879,318 A | 11/1989 | Lipscomb et al. |
| 4,889,664 A | 12/1989 | Lindt-Larsen et al. |
| 4,902,725 A | 2/1990 | Moore |
| 4,913,544 A | 4/1990 | Rickwood et al. |
| 4,919,850 A | 4/1990 | Blum et al. |
| 4,955,804 A | 9/1990 | Martell et al. |
| 4,959,429 A | 9/1990 | Misura et al. |
| 4,968,454 A | 11/1990 | Crano et al. |
| 4,983,335 A | 1/1991 | Matsuo et al. |
| 4,988,274 A | 1/1991 | Kenmochi |
| 5,021,196 A * | 6/1991 | Crano et al. |
| 5,028,358 A | 7/1991 | Blum |
| 5,105,126 A | 4/1992 | Whitesel |
| 5,110,881 A * | 5/1992 | McBain et al. |
| 5,135,686 A | 8/1992 | Masuhara et al. |
| 5,147,585 A | 9/1992 | Blum |
| 5,154,861 A | 10/1992 | McBrierty et al. |
| 5,219,497 A * | 6/1993 | Blum ........................ 264/1.7 |
| 5,238,981 A | 8/1993 | Knowles |
| 5,274,132 A | 12/1993 | Van Gemert |
| 5,364,256 A | 11/1994 | Lipscomb et al. |
| 5,369,158 A | 11/1994 | Knowles |
| 5,384,077 A | 1/1995 | Knowles |
| 5,391,327 A | 2/1995 | Ligas et al. |
| 5,405,958 A | 4/1995 | Van Gemert |
| 5,411,679 A | 5/1995 | Kumar |
| 5,415,816 A | 5/1995 | Buazza et al. |
| 5,422,046 A | 6/1995 | Tarshiani et al. |
| 5,429,774 A | 7/1995 | Kumar |
| 5,451,344 A | 9/1995 | Knowles et al. |
| 5,458,814 A | 10/1995 | Kumar et al. |
| 5,458,815 A | 10/1995 | Knowles |
| 5,464,567 A | 11/1995 | Knowles et al. |
| 5,466,398 A | 11/1995 | Van Gemert et al. |
| 5,514,214 A | 5/1996 | Joel et al. |
| 5,516,468 A | 5/1996 | Lipscomb et al. |
| 5,529,728 A | 6/1996 | Buazza et al. |
| 5,531,940 A | 7/1996 | Gupta et al. |
| 5,621,017 A | 4/1997 | Kobayakawa et al. |
| 5,681,871 A | 10/1997 | Molock et al. |
| 5,689,324 A | 11/1997 | Lossman et al. |
| 5,789,015 A | 8/1998 | Gupta et al. |
| 5,851,328 A | 12/1998 | Kohan |
| 5,880,171 A | 3/1999 | Lim et al. |
| 5,910,516 A | 6/1999 | Imura et al. |
| 5,928,575 A | 7/1999 | Buazza |
| 5,976,423 A | 11/1999 | Buazza |
| 5,989,462 A | 11/1999 | Buazza et al. |
| 6,022,498 A | 2/2000 | Buazza et al. |

FOREIGN PATENT DOCUMENTS

| | | |
|---|---|---|
| EP | 0 297 871 | 1/1989 |
| EP | 314 417 | 5/1989 |
| EP | 322 353 | 6/1989 |
| EP | 0 341 534 | 11/1989 |
| GB | 872421 | 7/1961 |
| GB | 1029335 | 5/1966 |
| GB | 1086114 | 10/1967 |
| GB | 2 184 734 | 7/1987 |
| JP | 49-31768 | 7/1972 |
| JP | 58-45445 | 3/1975 |
| JP | 57-85002 | 11/1980 |
| JP | 59-86615 | 11/1982 |
| JP | 63-207632 | 2/1987 |
| JP | 62-288030 | 12/1987 |
| WO | 90/05629 | 5/1990 |
| WO | 92/12851 | 8/1992 |
| WO | 94/04345 | 3/1994 |
| WO | 95/13567 | 5/1995 |
| WO | 97/39880 | 10/1997 |

* cited by examiner

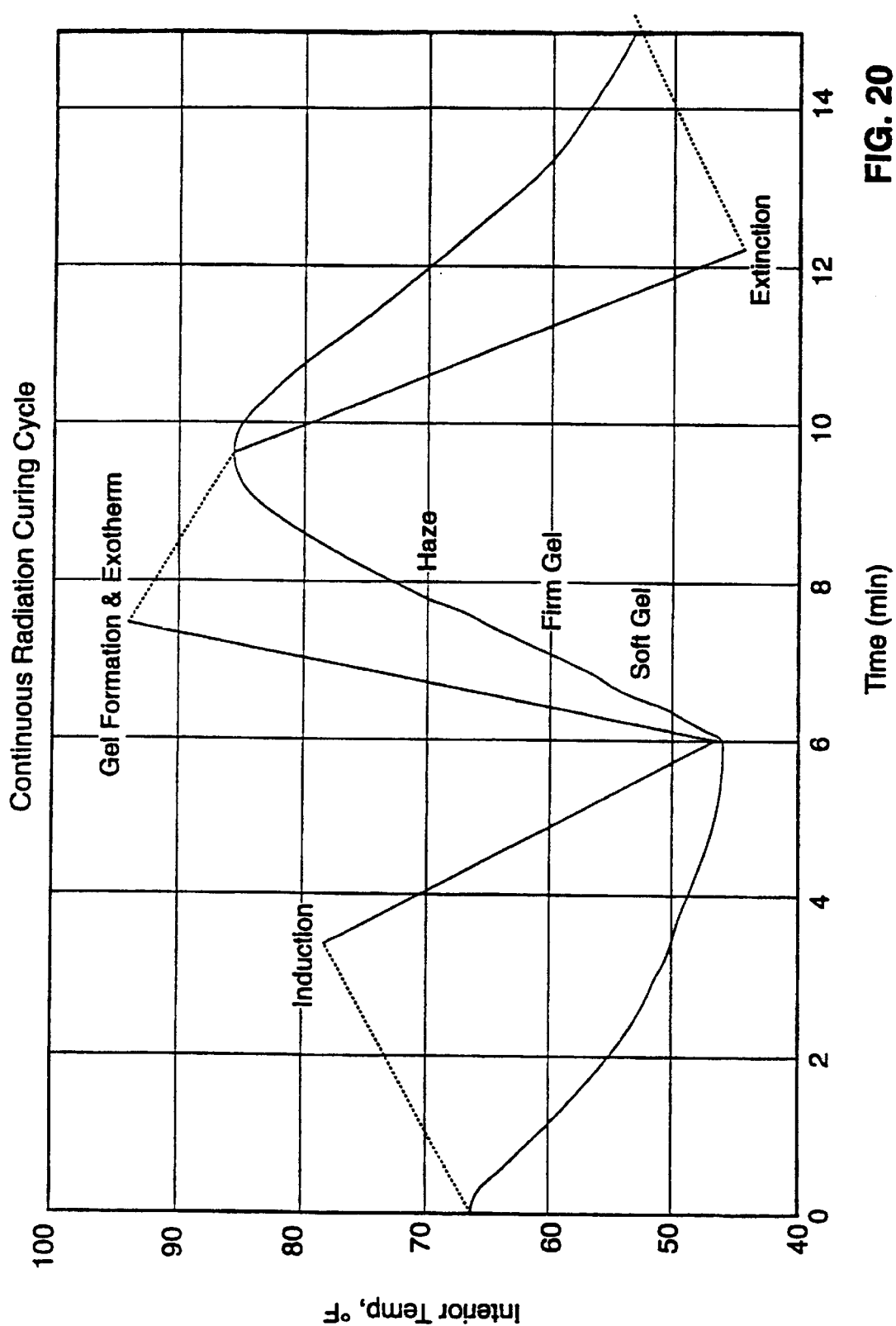

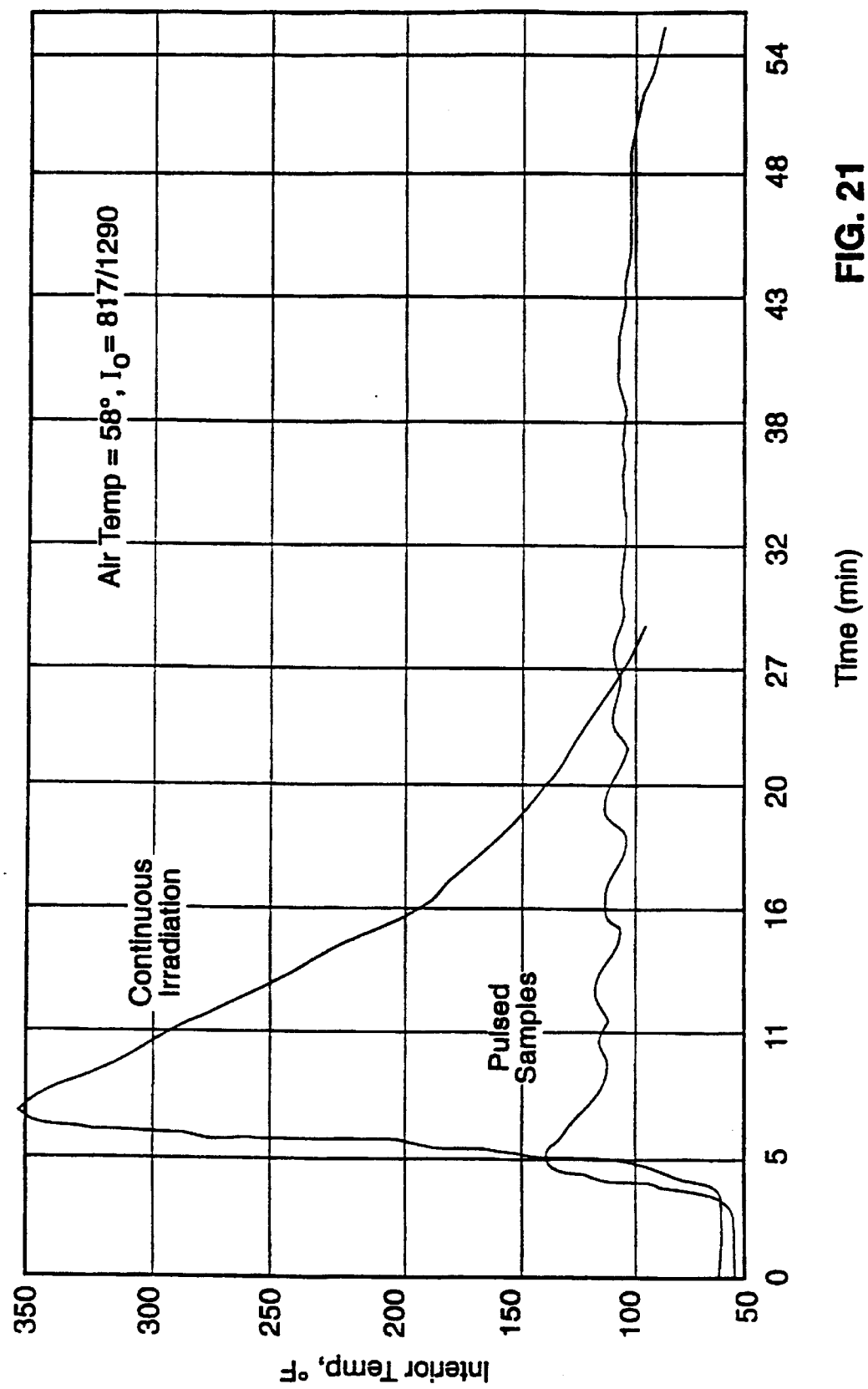

FIG. 22

Interaction of Pulsed Method Variables

The effect that this variable will tend to have:

| On this cycle variable in: | MASS OF SAMPLE | LIGHT INTENSITY | RATE OF COOLING | IDENTITY OF MONOMER |
|---|---|---|---|---|
| OPTIMAL INITIAL EXPOSURE TIME | As sample mass increases, initial exposure time may be increased. The mass of the sample interacts with light intensity to determine a preferred initial exposure time. | As light intensity increases, initial exposure time may tend to decrease. The light intensity level may be controlled for a fixed curing cycle and initial exposure time. It is believed, however, that changes in light intensities may have little impact above a certain light "saturation" point for the sample. | The rate of cooling tends to have a small impact upon the preferred initial exposure period in the FC-104 curing chamber. | Differences in inhibitor & initiator levels between batches of otherwise identical monomers may significantly affect induction periods. Various radiation curable compounds may also vary widely in their preferred initial exposure times due to inherent differences in their reactivity. |
| TOTAL CYCLE TIME | Increased sample mass may require increased total cycle time to dissipate the additional heat generated. | Increased light intensity may cause a decrease in the initial exposure period. It is believed, however that changes in light intensities may have little impact above a certain light "saturation" point for the sample. | Increased rates of heat removal may allow for a reduction in the time between pulses and thus total cycle time. | A significant effect that various monomers may have upon total cycle time will come from their different preferred initial exposure times. |
| TIMING BETWEEN PULSES | Increased sample mass may require longer periods of cooling between pulses of light. More heat tends to be generated from each pulse for larger samples, thus requiring longer time periods to remove heat. | For a given light intensity level, the duration of the pulses may be adjusted to create the desired amount of reaction. The timing between the pulses may also be so adjusted. | Increased rates of heat removal tend to allow for a reduction in the time between pulses. | The duration of the pulses may be adjusted to create the desired amount of reaction and heat generation for the for the particular lens forming material being cured. Adjusting the cooling period between pulses may also be beneficial. |

Interaction of Pulsed Method Variables (continued)

The effect that this variable will tend to have:

| On this cycle variable in: | MASS OF SAMPLE | LIGHT INTENSITY | RATE OF COOLING | IDENTITY OF MONOMER |
|---|---|---|---|---|
| TOTAL EXPOSURE TIME | Increased sample mass tends to require both increased initial exposure time and a greater number of pulse/cooling cycles. | Increased light intensity will tend to result in decreased total exposure time and decreased light intensity will tend to require increased exposure time. It is believed, however, that changes in light intensities may have little impact above a certain light "saturation" point for the sample. | There is only a small relationship between the total dosage of light a particular mass sample requires to polymerize and the rate at which it is being cooled. | A significant effect that monomer identity may have on total cycle time may be contributed by differences in the preferred initial exposure period. Various lens forming materials may also require longer/shorter duration pulses depending upon their reactivity. |
| DURATION OF PULSES | The length of the pulses during each phase of the curing cycle may be adjusted for different mass samples. The time between pulses may be increased/decreased according to mass. | The duration of the pulses may be varied in inverse proportion with the light intensity selected. It is believed, however that changes in light intensities may have little impact above a certain light "saturation" point for the sample. | A pulse will tend to generate a certain amount of heat to be dissipated. Since the pulse duration tends to be small relative to the time between pulses when the heat is being removed, changes in the rate of heat removal should not significantly affect the ideal pulse duration. | Various lens forming materials require different pulse duration depending upon their reactivity. For a selected material, slight differences in initiator & inhibitor levels will not tend to affect pulse duration. |

FIG. 22
(continued)

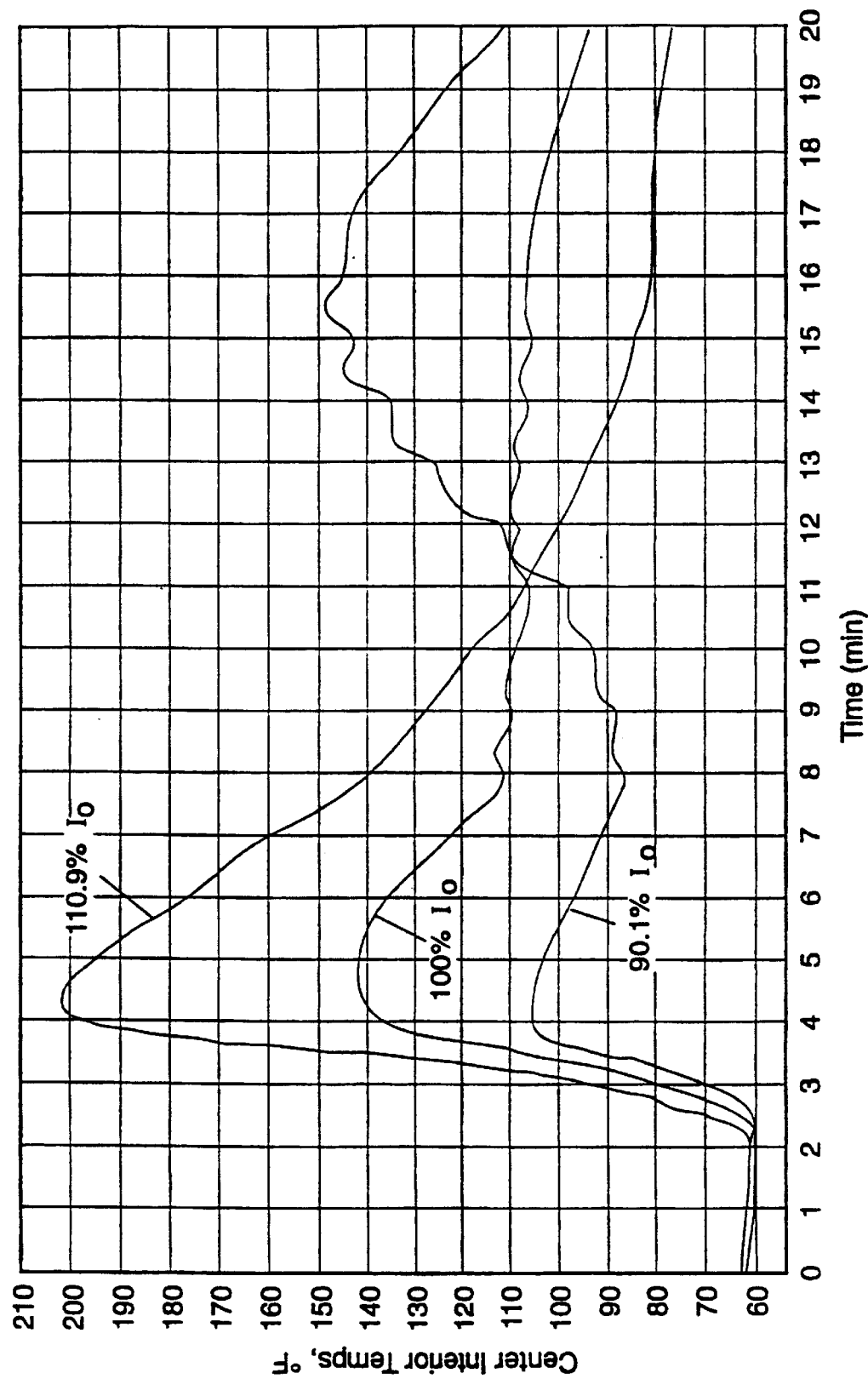

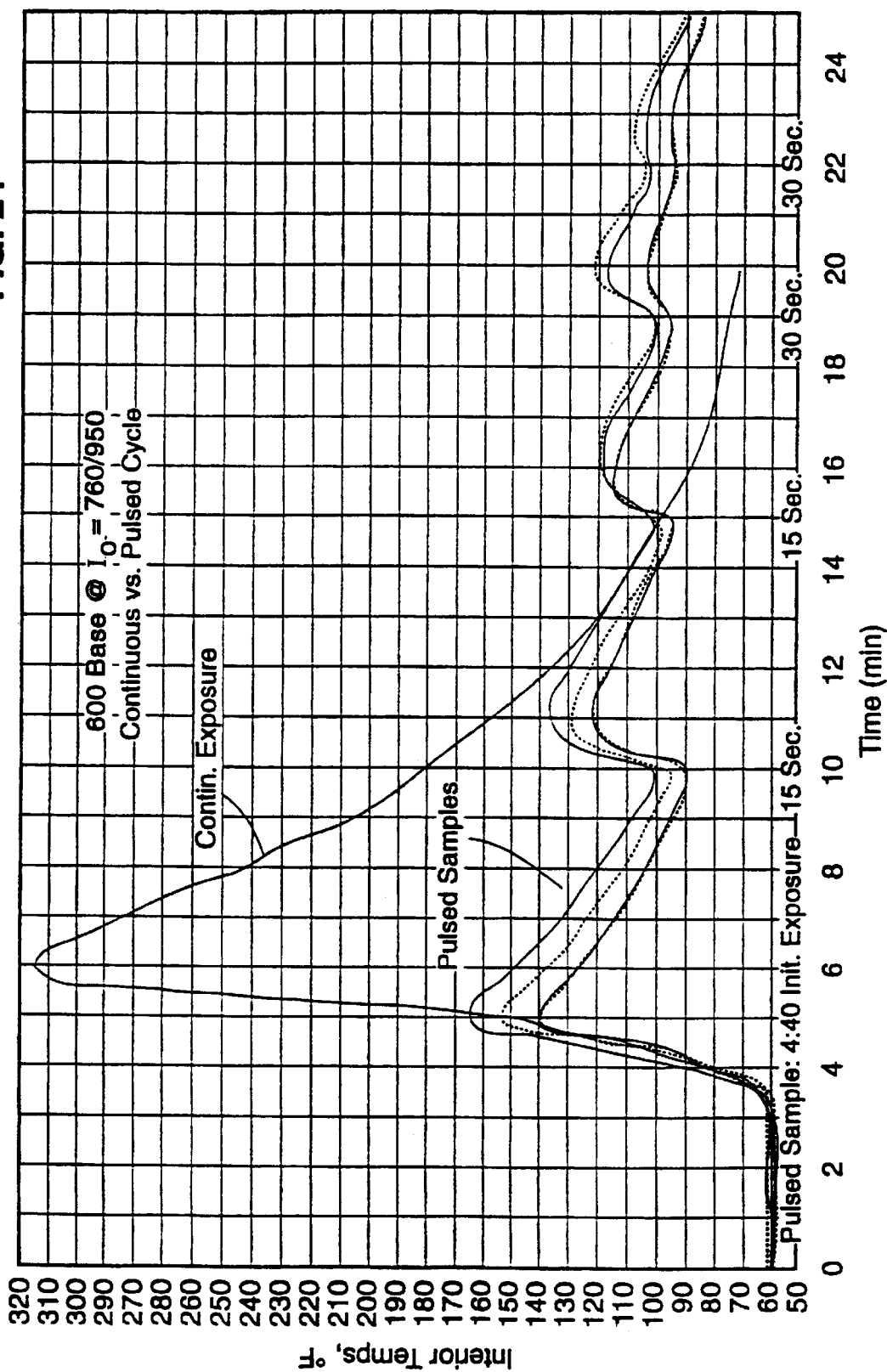

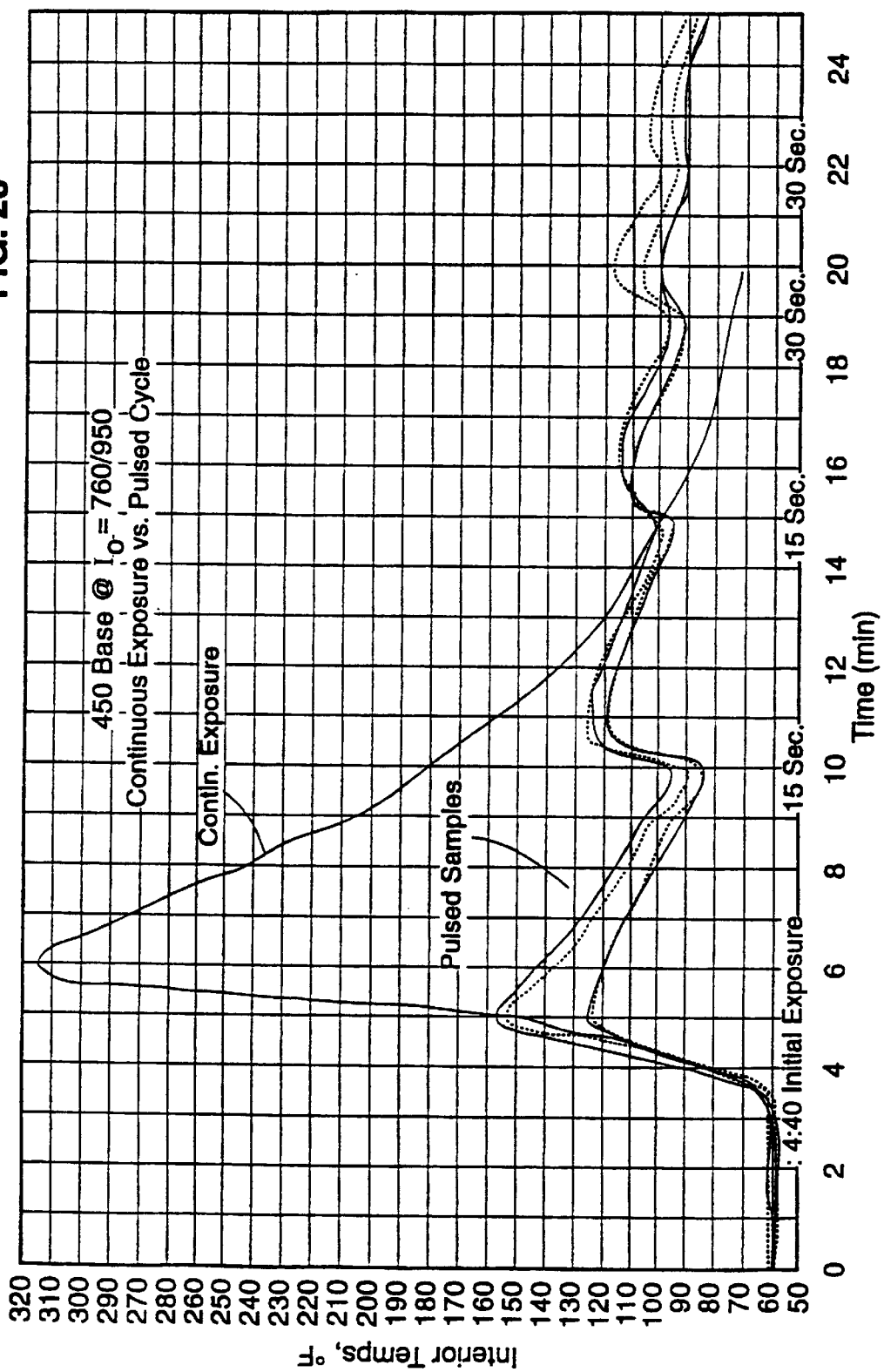

FLASH LAMP CURING CYCLE

ELAPSED TIME (SECONDS)

| FLASH # | TOP LAMP | BOTTOM LAMP |
|---|---|---|
| 1 | 1 | |
| 2 | | 3 |
| 3 | 5 | |
| 4 | | 7 |
| 5 | 9 | |
| 6 | | 11 |
| 7 | 13 | |
| 8 | | 15 |
| 9 | 17 | |
| 10 | | 19 |
| 11 | 21 | |
| 12 | | 23 |
| 13 | 25 | |
| 14 | | 27 |
| 15 | 29 | |
| 16 | | 31 |
| 17 | 33 | |
| 18 | | 35 |
| 19 | 37 | |
| 20 | | 39 |
| 21 | 41 | |
| 22 | 45 | |
| 23 | 49 | |
| 24 | | 267 |
| 25 | 269 | |
| 26 | 541 | |
| 27 | | 543 |
| 28 | 781 | |
| 29 | | 783 |
| 30 | 785 | |
| 31 | | 787 |
| 32 | 905 | |
| 33 | | 905 |
| 34 | 909 | |
| 35 | 913 | |
| 36 | | 959 |
| 37 | 961 | |
| 38 | | 963 |
| 39 | 965 | |
| 40 | 969 | |
| 41 | 973 | |
| 42 | 977 | |
| 43 | 1021 | |
| 44 | | 1023 |
| 45 | 1025 | |
| 46 | | 1027 |
| 47 | 1029 | |
| 48 | | 1031 |
| 49 | 1033 | |
| 50 | | 1035 |
| 51 | 1037 | |
| 52 | | 1039 |

FIG. 34

METHOD AND COMPOSITION FOR PRODUCING ULTRAVIOLET BLOCKING LENSES

RELATED APPLICATION

This application is a divisional of U.S. patent application Ser. No. 08/959,973 filed Oct. 29, 1997, now U.S. Pat. No. 5,989,462, which is a coutinuation-in-part of U.S. patent application Ser. No. 08/904,289, filed Jul. 31, 1997.

BACKGROUND OF THE INVENTION

1. Field of the Invention

The present invention relates generally to eyeglass lenses. More particularly, the invention relates to a lens forming composition and method for making ultraviolet absorbing plastic lenses by curing the lens forming composition using ultraviolet light.

2. Description of Related Art

It is conventional in the art to produce optical lenses by thermal curing techniques from the polymer of diethylene glycol bis(allyl)-carbonate (DEG-BAC). In addition, optical lenses may also be made using ultraviolet ("UV") light curing techniques. See, for example, U.S. Pat. No. 4,728,469 to Lipscomb et al., U.S. Pat. No. 4,879,318 to Lipscomb et al., U.S. Pat. No. 5,364,256 to Lipscomb et al., U.S. Pat. No. 5,415,816 to Buazza et al., U.S. Pat. No. 5,529,728 to Buazza et al., U.S. Pat. No. 5,514,214 to Joel et al., U.S. patent application Ser. No. 07/425,371 filed Oct. 26, 1989, Ser. No. 08/454,523 filed May 30, 1995, Ser. No. 08/453,770 filed May 30, 1995, Ser. No. 07/932,812 filed Aug. 18, 1992, Ser. No. 08/636,510 filed Apr. 19, 1996, and U.S. patent application entitled "METHODS AND APPARATUS FOR EYEGLASS LENS CURING USING ULTRAVIOLET LIGHT AND IMPROVED COOLING"—filed Apr. 18, 1997, all of which are hereby specifically incorporated by reference.

Curing of a lens by ultraviolet light tends to present certain problems that must be overcome to produce a viable lens. Such problems include yellowing of the lens, cracking of the lens or mold, optical distortions in the lens, and premature release of the lens from the mold. In addition, many of the useful UV-curable lens forming compositions exhibit certain characteristics which increase the difficulty of a lens curing process. For example, due to the relatively rapid nature of ultraviolet light initiated reactions, it is a challenge to provide a composition which is UV curable to form an eyeglass lens. Excessive exothermic heat tends to cause defects in the cured lens. To avoid such defects, the level of photoinitiator may be reduced to levels below what is customarily employed in the ultraviolet curing art.

While reducing the level of photoinitiator addresses some problems, it may also cause others. For instance, lowered levels of photoinitiator may cause the material in regions near an edge of the lens and proximate a gasket wall in a mold cavity to incompletely cure due to the presence of oxygen in these regions (oxygen is believed to inhibit curing of many lens forming compositions or materials). Uncured lens forming composition tends to result in lenses with "wet" edges covered by sticky uncured lens forming composition. Furthermore, uncured lens forming composition may migrate to and contaminate the optical surfaces of the lens upon demolding. The contaminated lens is then often unusable.

Uncured lens forming composition has been addressed by a variety of methods (see, e.g., the methods described in U.S. Pat. No. 5,529,728 to Buazza et al). Such methods may include removing the gasket and applying either an oxygen barrier or a photoinitiator enriched liquid to the exposed edge of the lens, and then re-irradiating the lens with a dosage of ultraviolet light sufficient to completely dry the edge of the lens prior to demolding. During such irradiation, however, higher than desirable levels of irradiation, or longer than desirable periods of irradiation, may be required. The additional ultraviolet irradiation may in some circumstances cause defects such as yellowing in the lens.

The low photoinitiator levels utilized in many ultraviolet curable lens forming compositions may produce a lens which, while fully-cured as measured by percentage of remaining double bonds, may not possess sufficient crosslink density on the lens surface to provide desirable dye absorption characteristics during the tinting process.

Various methods of increasing the surface density of such UV curable lenses are described in U.S. Pat. No. 5,529,728 to Buazza et al. In one method, the lens is demolded and then the surfaces of the lens are exposed directly to ultraviolet light. The relatively short wavelengths (around 254 nm) provided by some UV sources (e.g., a mercury vapor lamp) tend to cause the material to crosslink quite rapidly. An undesirable effect of this method, however, is that the lens tends to yellow as a result of such exposure. Further, any contaminants on the surface of the lens which are exposed to short wavelengths of high intensity UV light may cause tint defects.

Another method involves exposing the lens to relatively high intensity ultraviolet radiation while it is still within a mold cavity formed between glass molds. The glass molds tend to absorb the more effective short wavelengths, while transmitting wavelengths of about 365 mn. This method generally requires long exposure times and often the infrared radiation absorbed by the lens mold assembly will cause premature release of the lens from a mold member. The lens mold assembly may be heated prior to exposure to high intensity ultraviolet light, thereby reducing the amount of radiation necessary to attain a desired level of crosslink density. This method, however, is also associated with a higher rate of premature release.

It is well known in the art that a lens mold/gasket assembly may be heated to cure the lens forming composition from a liquid monomer to a solid polymer. It is also well known that such a lens may be thermally postcured by applying convective heat to the lens after the molds and gaskets have been removed from the lens.

In this application the terms "lens forming material" and "lens forming compositions" are used interchangeably.

SUMMARY OF THE INVENTION

One aspect of the invention relates to applying an oxygen barrier around the exposed edges of a lens to initiate the reaction of incompletely cured lens forming material proximate the lens edges. In an embodiment, a liquid polymerizable lens forming composition is placed in a mold cavity having at least two molds and/or a gasket. Ultraviolet rays may be directed toward at least one of the mold members to substantially cure the lens forming composition to a lens having material proximate the edges of the lens that is not filly cured. The gasket may be removed to expose the edges of the lens, and an oxygen barrier comprising a photoinitiator may be placed around the exposed edges of the lens such that at least a portion of the oxygen barrier photoinitiator is proximate lens forming composition that is not filly cured. A portion of the incompletely cured material may be removed manually prior to the application of the oxygen barrier. Subsequently another set of ultraviolet rays may be directed towards the lens such that at least a portion of the oxygen barrier photoinitiator initiates reaction of lens forming composition while the oxygen barrier substantially prevents oxygen from outside the oxygen barrier from contacting at least a portion of the lens forming composition. The lens may be allowed to cool and the oxygen barrier may be removed. The lens may be tinted after the cure is completed.

The oxygen barrier may include a flexible, stretchable, self-sealing film that is at least partially transparent to ultraviolet rays. The oxygen barrier may include polyethylene impregnated with a photoinitiator. The film may include a strip of high density polyethylene that is about 0.01–1.0 mm thick, and more preferably about 0.01–0.10 mm thick. Thicker films tend to be less conformable and stretchable. The oxygen barrier may include a plastic film that is less than about 0.025 mm thick. (e.g., about 0.0127 mm thick) and that was made by (a) immersing or running a plastic film in or through a solution comprising a photoinitiator and an etching agent (b) removing the plastic film from the solution, and (c) drying the plastic film. A surface on the plastic film may be chemically etched prior to or while immersing the plastic film in the solution.

Another aspect of the invention relates to applying conductive heat to the face of a lens. In an embodiment of the invention, a liquid polymerizable lens forming composition is placed in a mold cavity having a first mold member and a second mold member. First ultraviolet rays may be directed toward at least one of the mold members to cure the lens forming composition to a lens. A mold member may be applied to a substantially solid conductive heat source. Heat may be conductively applied to a face of the lens by (a) conductively transferring heat to a face of a mold member from the conductive heat source, and (b) conductively transferring heat through such mold member to the face of the lens.

In an embodiment, a flexible heat distributor may be placed between the heat source and the mold member to partially insulate the mold member and to slowly and uniformly transfer heat to the face of the mold member. The distributor may be shaped to conform to the face of a mold member. The heat source may include a concave element that may conform to the convex face of a mold member. The heat source may include a convex element that may conform to the con cave e face of a mold member. The temperature of the heat source may be thermostatically controlled. Heat may be conductively applied through a mold member to the back face of the lens, thereby enhancing the cross-linking and tintability of the lens forming material proximate to the surface of the back face of the lens (e.g., when an untintable scratch resistant coating is on the front face of the lens).

In an embodiment of the invention an eyeglass lens may be formed by (a) placing a liquid, polymerizable lensforming composition in a mold cavity defined by at least a first mold member and a second mold member, (b) applying a plurality of preferably high intensity ultraviolet light pulses to the lens forming composition, at least one of the pulses having a duration of less than about one second (more preferably less than about 0.1 seconds, and more preferably between 0.1 and 0.001 seconds), and (c) curing the lens forming composition to form a substantially clear eyeglass lens in a time period of less than 30 minutes (more preferably less than 20 minutes, and more preferably still less than 15 minutes).

The pulses preferably have a sufficiently high intensity such that reaction is initiated in substantially all of the lens forming composition that is exposed to pulses in the mold cavity. In one embodiment reaction is initiated in substantially all of any cross section of the lens forming composition that is exposed to pulses in the mold cavity. Preferably the temperature of the lens forming composition begins to rise after such application of UV light.

The lens forming composition may be exposed to UV light from one, two, or multiple sources. Two sources may be applied on opposite sides of the mold cavity to apply light to the lens forming composition from two sides. In an alternate embodiment, the lens forming composition is exposed to a relatively low intensity ultraviolet light before or while the pulses are applied. Such pulses are preferably relatively high in intensity, and are preferably applied to the other side of the mold cavity than the relatively low intensity light.

The lens forming composition is preferably continuously exposed to a relatively low intensity ultraviolet light either before, while, or after pulses of relatively high intensity are applied, the relatively low intensity light having an intensity of less than 1000 microwatts/cm$^2$ (and more preferably less than 100 microwatts/cm$^2$, and more preferably still 2–30 microwatts/cm$^2$), as measured on an outside surface of a mold member of the mold cavity. The relatively low intensity light tends to provide a low amount of light to keep the reaction going in a more steady or even manner between pulses.

Preferably at least one or even all of the pulses has an intensity of at least 0.01 watt/cm$^2$, as measured on an outside surface of a mold member of the mold cavity. Alternately at least one or even all of the pulses have an intensity of at least 0.1 or 1 watt/cm$^2$.

Sufficient ultraviolet light can be applied such that the temperature of the lens forming composition begins to increase. Then in one embodiment at least 5 minutes of waiting or darkness occurs before applying additional light (e.g., pulses). The waiting or darkness allows heat to dissipate, thus tending to prevent excessive heat buildup in the mold cavity. In one embodiment at least 5, 10, or 20 pulses are applied to the lens forming composition before waiting for about 5–8 minutes and then additional light is applied.

The eyeglass lens has an average minimum thickness of at least about 1.5–2.0 mm. Thicker lenses tend to be more difficult to cure with continuous non-pulsed light.

The mold cavity is preferably cooled with air or cooled air. One significant advantage of light pulses is that ambient air may be used to cool the mold cavity, instead of cooled air. Thus significant lens curing costs may be avoided since air coolers tend to be costly to purchase and operate.

The pulses preferably emanate from a flash source of light (i.e., "a flash light") such as a xenon light source. Preferably pulses are applied such that the lens forming composition is oversaturated with ultraviolet light during at least one pulse. Flash lights are advantageous in that they have a short "warm-up" time (as opposed to continuous lights that tend to require 5–60 minutes to stabilize).

Lenses may be formed with pulsed light that have more difficult to cure prescriptions such as lenses with a power greater than positive 2 diopters, or lenses with a power less than minus 4 diopters.

One advantage of pulsed light application via flash lights is that even though higher intensities of light are applied, because the duration of the pulses is so short the total amount of light energy applied to cure the lens forming composition is lessened. Thus less radiant heat is applied to the mold cavity, thereby reducing cooling requirements. Moreover, energy is saved. In one embodiment less than 20, 10, 5, or 1 Joule/cm² of energy is applied to cure the lens forming composition into a lens.

Preferably the ultraviolet light is applied as a function of the temperature of the lens forming composition, as measured directly or indirectly by measuring a temperature within the chamber (e.g., a temperature of at least a portion of the mold cavity) or by measuring a temperature of air in or exiting the chamber.

In another embodiment of the invention, an eyeglass lens may be cured by (a) placing a liquid, polymerizable lens forming composition in a mold cavity defined by at least a first mold member and a second mold member, the lens forming composition comprising a photoinitiator, (b) applying ultraviolet light at an intensity to the lens forming composition through at least one of the mold members for a selected period of time such that a temperature of the composition begins to increase, (c) decreasing the intensity of the ultraviolet light to inhibit the temperature of the lens forming composition from increasing to a selected first temperature, (d) allowing an exothermic reaction of the lens forming composition to increase the temperature of the lens forming composition to a second temperature, the second temperature being less than the selected first temperature, (e) curing the lens forming composition to form a substantially clear eyeglass lens by: (i) applying ultraviolet light at an intensity to the lens forming composition through at least one of the mold members, and (ii) decreasing the intensity of the ultraviolet light; and (f) wherein the eyeglass lens is formed from the lens forming composition in a time period of less than about 30 minutes.

In another embodiment of the invention an eyeglass lens may be made by (a) placing a liquid, polymerizable lens-forming composition in a mold cavity defined by at least a first mold member and a second mold member, the lens forming composition comprising a photoinitiator, (b) applying first ultraviolet light to at least one of the mold members for a selected first period of time such that a temperature of the lens forming composition begins to increase, (c) removing the first ultraviolet light from at least one of the mold members, thereby inhibiting the temperature of the composition from increasing to a selected first temperature, (d) repeatedly and alternately performing the following steps to complete the formation of a lens: (i) applying second ultraviolet light to at least one of the mold members for a selected second period of time and (ii) removing the second ultraviolet light from at least one of the mold members for a selected third period of time.

In an alternate embodiment of the invention an eyeglass lens may be made by (a) placing a liquid, polymerizable lens forming composition in a mold cavity defined by at least a first mold member and a second mold member, the lens forming composition comprising a photoinitiator, (b) directing ultraviolet light at a first intensity toward at least one of the mold members for a selected first period of time such that a temperature of the composition begins to increase, (c) decreasing the first intensity of ultraviolet light from at least one of the mold members, (d) repeatedly directing a plurality of pulses of ultraviolet to the lens forming composition through at least one of the mold members to complete formation of a substantially clear eyeglass lens, at least one of the pulses lasting for a second period of time, and wherein a third period of time exists between application of at least two of the pulses.

An apparatus of the invention may include: (a) a first mold member having a casting face and a non-casting face, (b) a second mold member having a casting face and a non-casting face, the second mold member being spaced apart from the first mold member during use such that the casting faces of the first mold member and the second mold member at least partially define a mold cavity, (c) a first pulse light generator adapted to generate and direct a pulse of ultraviolet light toward at least one of the first and second mold members during use, and (d) a controller adapted to control the first pulse light generator such that ultraviolet light is directed in a plurality of pulses toward at least one of the first and second mold members, at least one of the pulses having a duration of less than one second.

A system of the invention may include (a) a lens forming composition comprising a photoinitiator, (b) a first mold member having a casting face and a non-casting face, (c) a second mold member having a casting face and a non-casing face, the second mold member being spaced apart from the first mold member during use such that the casting faces of the first mold member and the second mold member at least partially define a mold cavity for the lens forming composition, (d) a first pulse light generator adapted to generate and direct a pulse of ultraviolet light toward at least one of the first and second mold members during use, (e) a controller adapted to control the first pulse light generator such that ultraviolet light is directed in a plurality of pulses toward at least one of the first and second mold members, at least one of the pulses having a duration of less than one second, and (f) wherein the system is adapted to cure the lens forming composition to form a substantially clear eyeglass lens in less than 30 minutes.

The lens forming composition preferably comprises at least one polyethylenic-functional monomer containing at least two ethylenically unsaturated groups selected from acrylyl and methacrylyl, at least one polyethylenic-functional monomer containing at least three ethylenically unsaturated groups selected from acrylyl and methacrylyl and/or an aromatic containing bis(allyl carbonate)-functional monomer.

A system of the invention may include: (a) a lens forming composition comprising a photoinitiator, (b) a mold cavity chamber comprising a first mold member having a casting face and a non-casting face, a second mold member having a casting face and a non-casting face, the second mold member being spaced apart from the first mold member during use such that the casting faces of the first mold member and the second mold member at least partially define a mold cavity for the lens forming composition, (c) a first light generator adapted to generate and direct a ultraviolet light in a first intensity toward at least one of the first and second mold members during use, (d) a temperature sensor adapted to sense a temperature in the chamber or a temperature of air exiting the chamber, (e) a controller coupled to the temperature sensor and adapted to control the first light generator such that the first intensity of ultraviolet light directed toward at least one of the first and second mold members is decreased when a temperature measured by the temperature sensor substantially increases, and (f) wherein the system is adapted to cure the lens forming composition to form a substantially clear eyeglass lens in less than 30 minutes.

An apparatus of the invention may include (a) a first mold member having a casting face and a non-casting face, (b) a second mold member having a casting face and a non-casting face, the second mold member being spaced apart from the first mold member during use such that the casting faces of the first mold member and the second mold member at least partially define a mold cavity for a lens forming composition, (c) an ultraviolet light generator adapted to generate and direct ultraviolet light toward at least one of the first and second mold members during use, (e) a controller for controlling the intensity of light directed by the light generator, (f) a light sensor adapted to measure the intensity of light directed by the ultraviolet light generator, the light sensor being adapted to signal the light generator to vary the intensity of the ultraviolet light being produced, and (g) a filter adapted to inhibit light other than ultraviolet light from impinging upon the light sensor.

In an alternate embodiment, a system for making an eyeglass lens may include (a) a first mold member having a casting face and a non-casting face, (b) a second mold member having a casting face and a non-casting face, the second mold member being spaced apart from the first mold member during use such that the casting faces of the first mold member and the second mold member at least partially define a mold cavity for a lens forming composition, (c) an ultraviolet light generator adapted to generate and direct ultraviolet light toward at least one of the first and second mold members during use, (d) a distributor adapted to direct air toward the non-casting face of at least one of the mold members, (e) a thermoelectric cooling system adapted to cool the air, and (f) a first blower adapted to receive effluent air that has contacted the non-casting face of the mold member and to recycle the effluent air to the distributor.

In an embodiment, an eyeglass lens may be made by (a) placing a liquid, polymerizable lens forming composition in a mold cavity defined at least partially by a first mold member and a second mold member, the lens forming composition comprising a photoinitiator; (b) directing a plurality of pulses of ultraviolet light toward the lens forming composition through at least one of the mold members to initiate reaction of the lens forming composition, at least one of the pulses having an intensity of at least about 10 milliwatts/cm$^2$; (c) subsequent to the step of directing the plurality of pulses toward the lens forming composition, directing ultraviolet light of a second intensity toward the lens forming composition through at least one of the mold members to form a substantially clear eyeglass lens, the second intensity being less than about 350 microwatts/cm$^2$; and (d) substantially simultaneously with the step of directing ultraviolet of a second intensity toward the lens forming composition, directing air onto a non-casting face of at least one of the mold members to remove heat from the lens forming composition.

A lens having a scratch resistant coating may be formed by: placing a first coating composition within a mold member, the mold member comprising a casting face and a non-casting face, the coating composition comprising a photoinitiator and being curable upon exposure to ultraviolet light; (a) placing a first coating composition within a mold member, the mold member comprising a casting face and a non-casting face, the coating composition comprising a photoinitiator and being curable upon exposure to ultraviolet light; (b) spinning the mold member to distribute the first coating composition over the casting face; (c) directing ultraviolet light at the mold member to cure at least a portion of the first coating composition; (d) placing a second coating composition within the mold member, the second coating composition comprising a photoinitiator and being curable upon exposure to ultraviolet light; (e) spinning the mold member to distribute the second coating composition over the portion of the first coating composition that has been cured; (f) directing ultraviolet light at the mold member, thereby curing at least a portion of the second coating composition and forming a substantially clear combination coat comprising at least a portion of each of the first and second coating compositions; (g) assembling the mold member with a second mold member to form a mold having a cavity between the mold members; (h) placing a lens-forming composition within the cavity, the lens-forming composition comprising a photoinitiator and being curable upon exposure to ultraviolet light; and (i) directing ultraviolet light at the mold to cure at least a portion of the lens-forming material to form a lens, and wherein the combination coat adheres to the cured portion of the lens-forming material.

In an embodiment, a lens forming composition containing the following components may be used to cure an eyeglass lens that does not transmit ultraviolet light. The composition preferably comprises (a) a monomer capable of being cured to form an eyeglass lens, (b) an ultraviolet absorbing compound for inhibiting at least a portion of ultraviolet light from being transmitted through the eyeglass lens, (c) a co-initiator adapted to activate curing of the monomer to form the eyeglass lens, and (d) a photoinitiator adapted to activate the co-initiator in response to being exposed to ultraviolet light.

In another embodiment, a lens forming composition containing the following components may be used to cure an eyeglass lens that does not transmit ultraviolet light. The composition preferably comprises (a) a monomer capable of being cured to form an eyeglass lens, (b) an ultraviolet absorbing compound for inhibiting at least a portion of ultraviolet light from being transmitted through the eyeglass lens, and (c) a photoinitiator adapted to activate curing of the monomer to form the eyeglass lens. The monomer may be cured by treatment with activating light. The activating light preferably includes light having a wavelength substantially greater than about 380 nm.

In an embodiment, the conditions whereby a lens is formed from a lens forming composition may be altered such that the formed lens has a power substantially different from the targeted power of the lens. The peak temperature of the composition may be preferably altered such that lenses formed at elevated peak temperatures may have a lens power lower than targeted from the shape of the mold cavity. Alternatively, the time at which the lenses are removed from the lens forming mold may be altered such that lenses that are released at an earlier time from the mold may have a power substantially greater than targeted from the shape of the mold cavity.

In an embodiment, the lens forming process may be controlled using a microprocessor based controller. The controller preferably monitors the response of the lens forming composition to a pulse of activating light. The controller preferably measures the temperature and the rate of temperature change during the process. While the lens is no longer being irradiated with activating light, the controller preferably monitors the temperature curves and performs a mathematical analysis of the temperature curve profile. Dosages of activating light, based on the response of the composition to the last activating light applied, may be determined and applied. This process may be repeated until the lens is substantially cured.

BRIEF DESCRIPTION OF THE DRAWINGS

The above brief description as well as further objects, features and advantages of the methods and apparatus of the present invention will be more fully appreciated by reference to the following detailed description of presently preferred but nonetheless illustrative embodiments in accordance with the present invention when taken in conjunction with the accompanying drawings in which:

FIG. 20 is a graph illustrating a temperature profile of a continuous radiation cycle.

FIG. 21 is a graph illustrating temperature profiles for a continuous irradiation cycle and a pulse irradiation cycle employed with a mold/gasket set having a 3.00 D base curve, and while applying cooled air at 58° F. to the mold/gasket set.

FIG. 22 is a chart illustrating qualitative relationships among curing cycle variables.

FIG. 23 is a graph illustrating temperature profiles for one curing cycle for a mold/gasket set having a 6.00 D base curve and used with three different light levels.

FIG. 24 is a graph illustrating continuous and pulsed temperature profiles for a curing cycle employing a mold/gasket set with a 6.00 D base curve.

FIG. 25 is a graph illustrating continuous and pulsed temperature profiles for a curing cycle employing a mold/gasket set with a 4.50 D base curve.

FIG. 34 depicts a flash lamp curing cycle.

DESCRIPTION OF A PREFERRED EMBODIMENTS

Apparatus, operating procedures, equipment, systems, methods, and compositions for lens curing using ultraviolet light are available from Rapid Cast, Inc., Q2100, Inc., and Fast Cast, Inc. in East Rockaway, N.Y. and Louisville, Ky. The Fast Cast, Inc. publication entitled "Operation Manual For The FastCast LenSystem" is hereby incorporated by reference.

Figure 1:
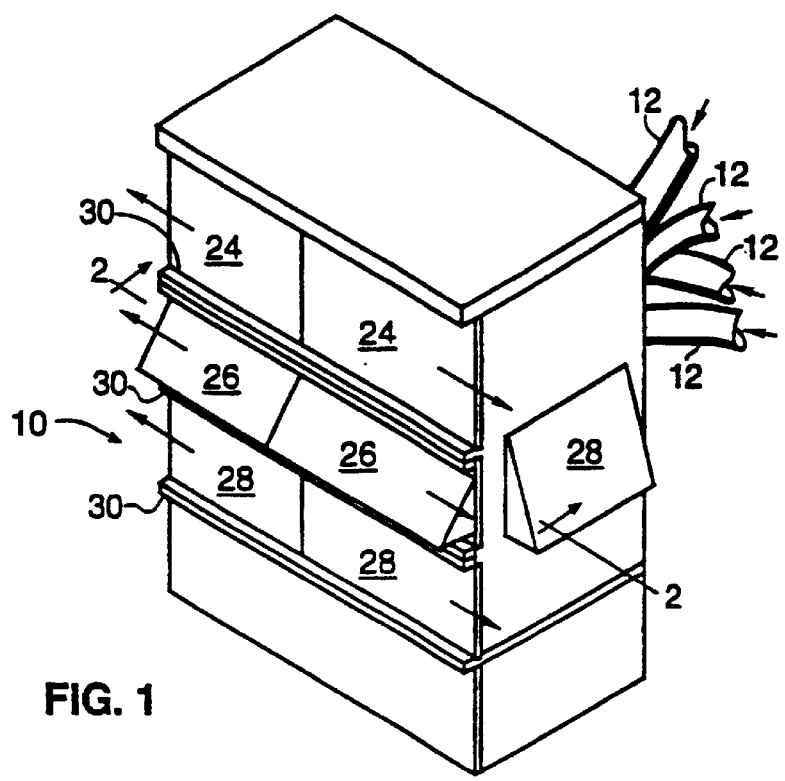
FIG. 1 is a perspective view of an apparatus for producing a plastic lens.

Referring now to FIG. 1, a plastic lens curing chamber of the present invention is generally indicated by reference numeral 10. The lens curing chamber 10 preferably communicates through a plurality of pipes 12 with an air source (not shown), the purpose of which will be discussed below.

Figure 2:
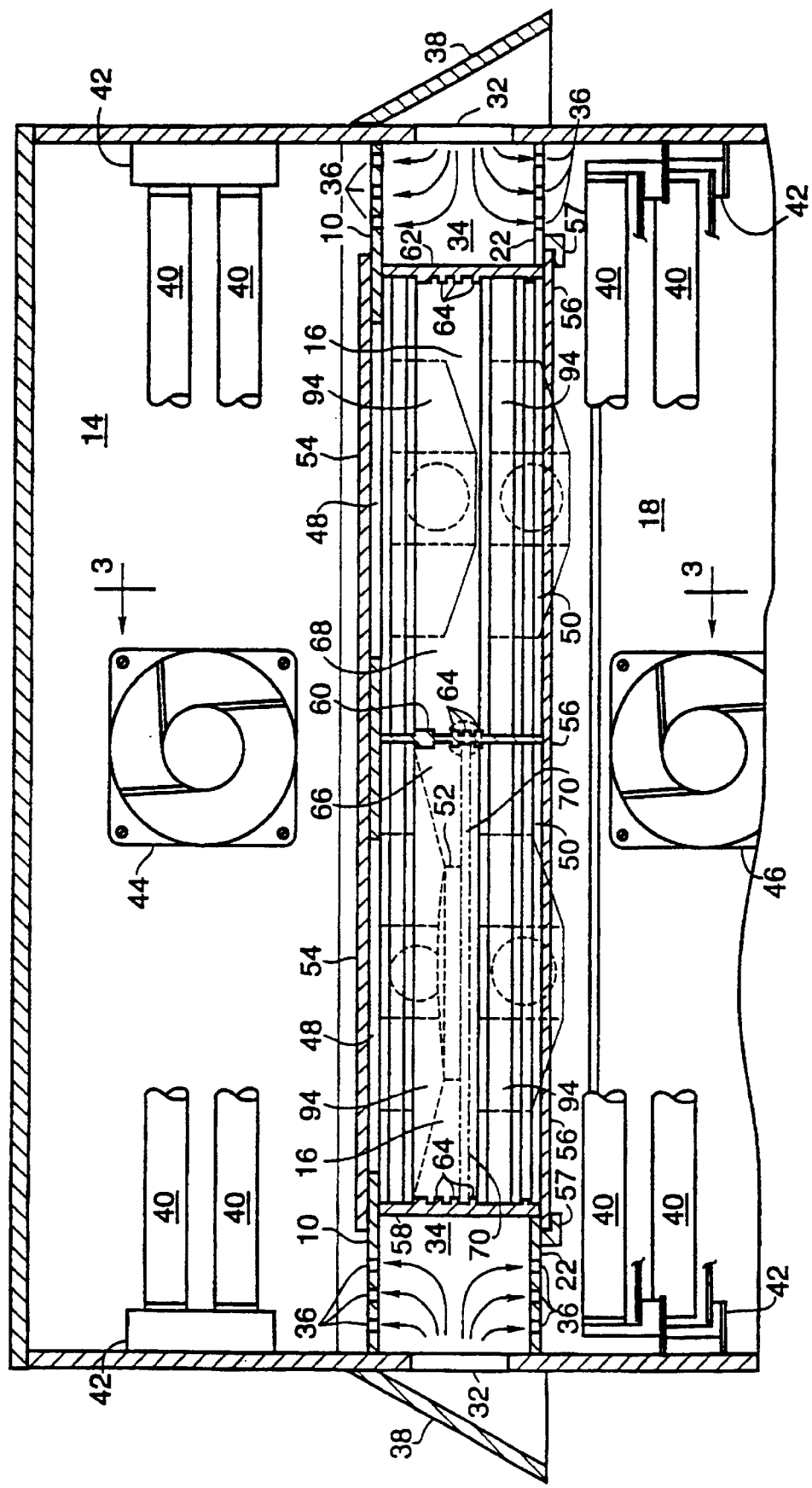
FIG. 2 is a cross-sectional view of the apparatus taken along line 2—2 of FIG. 1.

As shown in FIG. 2, the plastic lens curing chamber 10 may include an upper lamp chamber 14, an irradiation chamber 16, and a lower lamp chamber 18. The upper lamp chamber 14 may be separated from the irradiation chamber 16 by a plate 20. The lower lamp chamber may be separated from the irradiation chamber 16 by a plate 22. The upper lamp chamber 14, the irradiation chamber 16, and the lower lamp chamber 18 may be isolated from ambient air by upper lamp chamber doors 24, irradiation chamber doors 26, and lower lamp chamber doors 28, respectively. While the upper lamp chamber doors 24, the irradiation chamber doors 26 and the lower lamp chamber doors 28 are shown in FIG. 1 as including two corresponding door members, those of ordinary skill in the art will recognize that the doors 24, 26 and 28 may include single or multiple door members. The upper lamp chamber doors 24, the irradiation chamber doors 26 and the lower lamp chamber doors 28 may be slidingly mounted in guides 30. As shown in FIG. 2, vents 32 may communicate with upper lamp chamber 14 and lower lamp chamber 18 by way of corresponding vent chambers 34 and openings 36 disposed in plate 20 and plate 22. Each vent 32 may be shielded by a vent cover 38.

Figure 3:
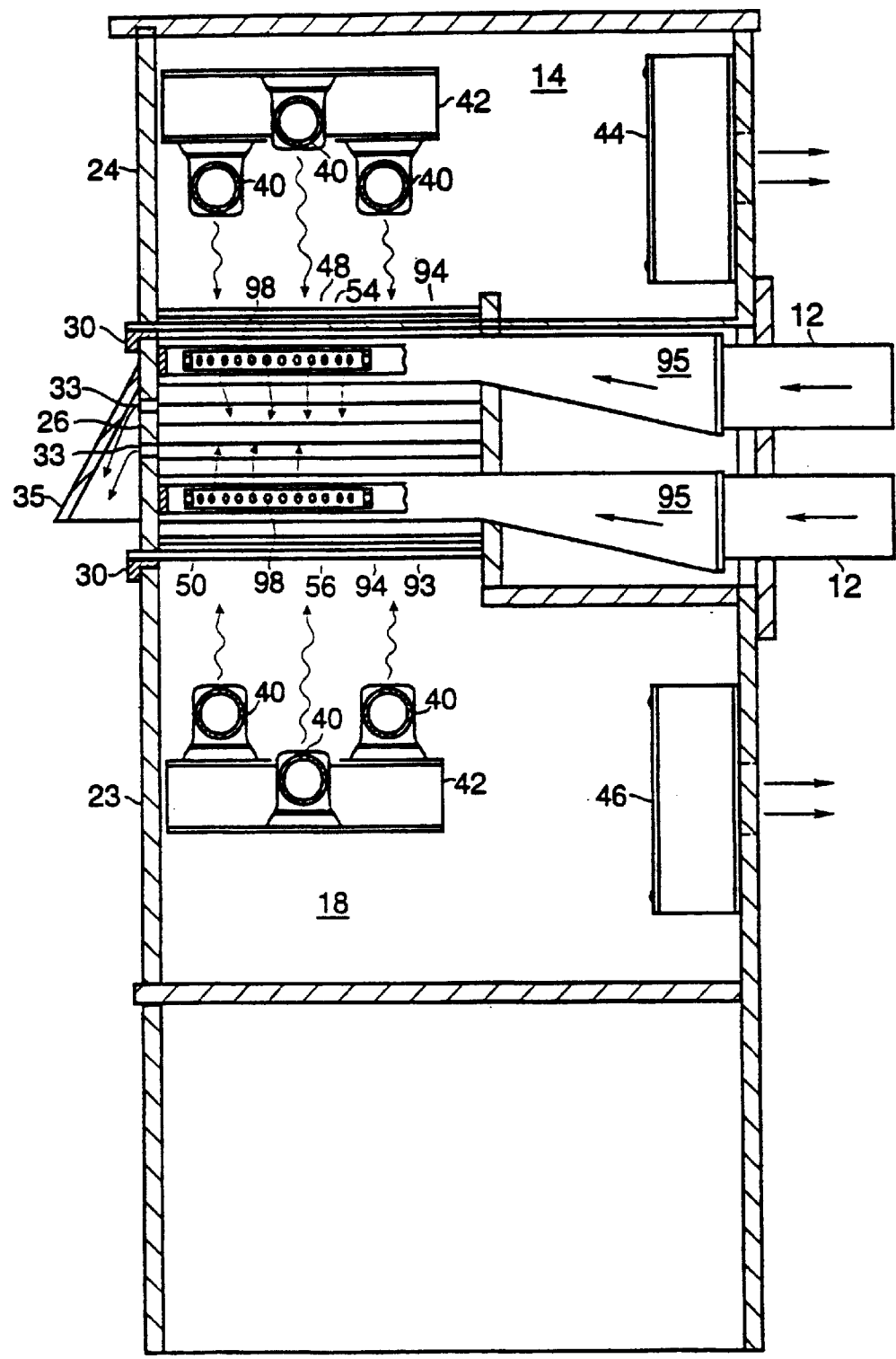
FIG. 3 is a cross-sectional view of the apparatus taken along line 3—3 of FIG. 2.

As shown in FIG. 3, vents 33 may be disposed in the irradiation chamber doors 26 and communicate with irradiation chamber 16. Each vent 33 may be shielded by a vent cover 35.

As shown in FIGS. 2 and 3, a plurality of light generating devices or lamps 40 may be disposed within each of upper lamp chamber 14 and lower lamp chamber 18. Preferably, upper lamp chamber 14 and lower lamp chamber 18 each include three lamps 40 that are arranged in a triangular fashion in which the lamps 40 in the upper lamp chamber 14 are disposed with the point of the triangle pointing upwards whereas the lamps 40 in the lower lamp chamber 18 are disposed with the point of the triangle pointing downward. The lamps 40, preferably, generate ultraviolet light having a wavelength in the range of at least approximately 300 nm to 400 nm since the effective wavelength spectrum for curing the lens forming material lies in the 300 nm to 400 nm region. The lamps 40 may be supported by and electrically connected to suitable fixtures 42.

An exhaust fan 44 may communicate with upper lamp chamber 14 while an exhaust fan 46 may communicate with lower lamp chamber 18.

As noted above, the upper lamp chamber 14 may be separated from the irradiation chamber 16 by plate 20. Similarly, lower lamp chamber 18 may be separated from the irradiation chamber 16 by plate 22. The plates 20 and 22 may include apertures 48 and 50, respectively, through which the light generated by lamps 40 may be directed so as to impinge upon a lens cell 52 (shown in phantom in FIG. 2). The diameter of the lens cell 52 is preferably approximately 74 mm. The apertures 48 and 50 preferably range from about 70 mm to about 140 mm.

In one embodiment an upper light filter 54 rests upon plate 20 while a lower light filter 56 rests upon plate 22 or is supported by brackets 57. The upper light filter 54 and lower light filter 56 are shown in FIG. 2 as being made of a single filter member, however, those of ordinary skill in the art will recognize that each of the upper light filter 54 and lower light filter 56 may include two or more filter members. The components of upper light filter 54 and lower light filter 56 preferably are modified depending upon the characteristics of the lens to be molded. For instance, in a preferred embodiment for making negative lenses, the upper light filter 54 includes a plate of Pyrex glass that is frosted on both sides resting upon a plate of clear Pyrex glass. The lower light filter 56 includes a plate of Pyrex glass frosted on one side resting upon a plate of clear Pyrex glass with a device for reducing the intensity of ultraviolet light incident upon the center portion in relation to the edge portion of the lens being disposed between the plate of frosted Pyrex and the plate of clear Pyrex glass.

Conversely, in a preferred arrangement for producing positive lenses, the upper light filter 54 includes a plate of Pyrex glass frosted on one or both sides and a plate of clear Pyrex glass resting upon the plate of frosted Pyrex glass with a device for reducing the intensity of ultraviolet light incident upon the edge portion in relation to the center portion of the lens being disposed between the plate of clear Pyrex glass and the plate of frosted Pyrex glass. The lower light filter 56 includes a plate of clear Pyrex glass frosted on one side resting upon a plate of clear Pyrex glass with a device for reducing the intensity of ultraviolet light incident upon the edge portion in relation to the center portion of the lens being disposed between the plates of clear Pyrex glass. In this arrangement, in place of a device for reducing the relative intensity of ultraviolet light incident upon the edge portion of the lens, the diameter of the aperture 50 can be reduced to achieve the same result, i.e. to reduce the relative intensity of ultraviolet light incident upon the edge portion of the lens.

It will be apparent to those skilled in the art that each filter 54 or 56 could be composed of a plurality of filter members or include any other means or device effective to reduce the light to its desired intensity, to diffuse the light and/or to create a light intensity gradient across the lens cell 52. Alternately, in certain embodiments no filter elements may be used.

Preferably, the upper light filter 54 or the lower light filter 56 each include at least one plate of Pyrex glass having at least one frosted surface. Also, either or both of the upper light filter 54 and the lower light filter 56 may include more than one plate of Pyrex glass each frosted on one or both surfaces, and/or one or more sheets of tracing paper. After passing through frosted Pyrex glass, the ultraviolet light is believed to have no sharp intensity discontinuities which is believed to lead to a reduction in optical distortions in the finished lens in some instances. Those of ordinary skill in the art will recognize that other means may be used to diffuse the ultraviolet light so that it has no sharp intensity discontinuities.

Figure 4:
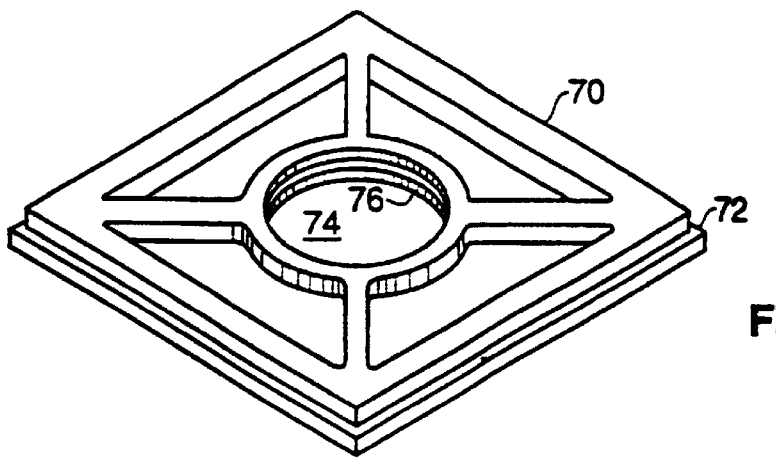
FIG. 4 is a detail view of a component of the apparatus.

Preferably disposed within the irradiation chamber 16 are a left stage 58, a center stage 60, and a right stage 62, each of which preferably includes a plurality of steps 64. The left stage 58 and center stage 60 define a left irradiation chamber 66 while the right stage 62 and center stage 60 define a right irradiation chamber 68. A cell holder 70, shown in phantom in FIG. 2 and in detail in FIG. 4, may be disposed within each of left irradiation chamber 66 and right irradiation chamber 68. The cell holder 70 may include a peripheral step 72 that is designed to allow a cell holder 70 to be supported upon complementary steps 64 of left stage 58 and center stage 60, and center stage 60 and right stage 62, respectively. As shown in FIG. 4, each cell holder 70 also may include a central bore 74 to allow the passage therethrough of ultraviolet light from the lamps 40 and an annular step 76 which is designed to support a lens cell 52 in a manner described below.

Figure 6:
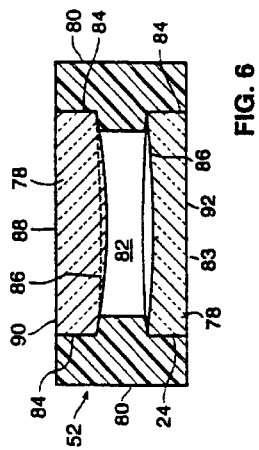
FIG. 6 is a cross-sectional view of a lens cell for use in an apparatus of the invention.

As shown in FIG. 6, each lens cell 52 may include opposed mold members 78, separated by an annular gasket 80 to define a lens molding cavity 82. The opposed mold members 78 and the annular gasket 80 may be shaped and selected in a manner to produce a lens having a desired diopter.

The mold members 78 are preferably formed of any suitable material that will permit rays of ultraviolet light to pass therethrough. The mold members 78 are preferably formed of glass. Each mold member 78 has an outer peripheral surface 84 and a pair of opposed surfaces 86 and 88 with the surfaces 86 and 88 being precision ground. Preferably the mold members 78 have desirable ultraviolet light transmission characteristics and both the casting surface 86 and non-casting surface 88 preferably have no surface aberrations, waves, scratches or other defects as these may be reproduced in the finished lens.

As noted above, the mold members 78 are adapted to be held in spaced apart relation to define a lens molding cavity 82 between the facing surfaces 86 thereof. The mold members 78 are preferably held in a spaced apart relation by a T-shaped flexible annular gasket 80 that seals the lens molding cavity 82 from the exterior of the mold members 78. In use, the gasket 80 may be supported on the annular step 76 of the cell holder 70.

In this manner, the upper or back mold member 90 has a convex inner surface 86 while the lower or front mold member 92 has a concave inner surface 86 so that the resulting lens molding cavity 82 is shaped to form a lens with a desired configuration. Thus, by selecting the mold members 78 with a desired surface 86, lenses with different characteristics, such as focal lengths, may be made by the apparatus 10.

Rays of ultraviolet light emanating from lamps 40 pass through the mold members 78 and act on a lens forming material disposed in the mold cavity 82 in a manner discussed below so as to form a lens. As noted above, the rays of ultraviolet light may pass through a suitable filter 54 or 56 to impinge upon the lens cell 52.

The mold members 78, preferably, are formed from a material that will not allow ultraviolet radiation having a wavelength below approximately 300 nm to pass therethrough. Suitable materials are Schott Crown, S-1 or S-3 glass manufactured and sold by Schott Optical Glass Inc., of Duryea, Pa. or Corning 8092 glass sold by Corning Glass of Corning, N.Y. A source of flat-top or single vision molds may be Augen Lens Co. in San Diego, Calif.

The annular gasket 80 may be formed of vinyl material that exhibits good lip finish and maintains sufficient flexibility at conditions throughout the lens curing process. In a preferred embodiment, the annular gasket 80 is formed of silicone rubber material such as GE SE6035 which is commercially available from General Electric. In another preferred embodiment, the annular gasket 80 is formed of copolymers of ethylene and vinyl acetate which are commercially available from E. I. DuPont de Nemours & Co. under the trade name ELVAX7. Preferred ELVAX7 resins are ELVAX7 350 having a melt index of 17.3–20.9 dg/min and a vinyl acetate content of 24.3–25.7 wt. %, ELVAX7 250 having a melt index of 22.0–28.0 dg/min and a vinyl acetate content of 27.2–28.8 wt. %, ELVAX7 240 having a melt index of 38.0–48.0 dg/min and a vinyl acetate content of 27.2–28.8 wt. %, and ELVAX7 150 having a melt index of 38.0–48.0 dg/min and a vinyl acetate content of 32.0–34.0 wt. %. Regardless of the particular material the gaskets 80 may be prepared by conventional injection molding or compression molding techniques which are well-known by those of ordinary skill in the art.

Figure 5:
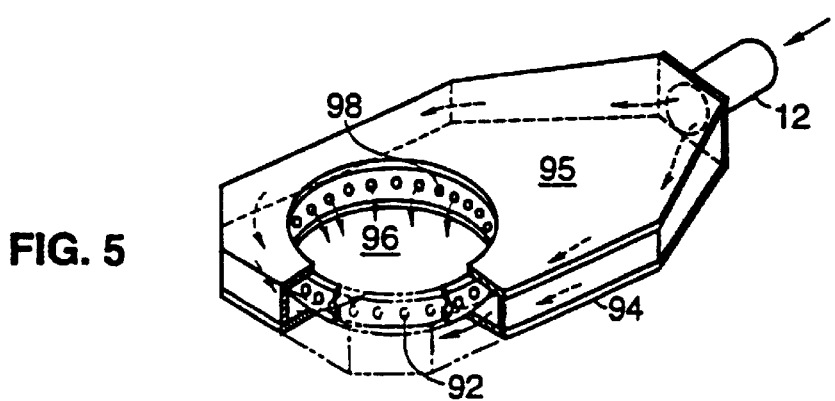
FIG. 5 is a detail view of a component of the apparatus.

As shown in phantom in FIG. 2, in section in FIG. 3, and in detail in FIG. 5, an upper and lower air distribution device 94 is disposed in each of left irradiation chamber 66 and right irradiation chamber 68. Each air distribution device 94 is connected to a pipe 12. As shown in FIG. 5, each air distribution device 94 includes a plenum portion 95 and a substantially cylindrical opening 96 having orifices 98 disposed therein to allow for the expulsion of air from the air distribution device 94. The diameter of the orifices 98 may be constant, or may vary around the circumference of cylindrical opening 96 preferably reaching a maximum when directly opposite the plenum portion 95 of air distribution device 94 and preferably reaching a minimum immediately adjacent the plenum portion 95. In addition, the orifices 98 are designed to blow air toward a lens cell 52 that may be disposed in a lens cell holder 70 and installed in left irradiation chamber 66 or right irradiation chamber 68.

In operation, the apparatus of the present invention may be appropriately configured for the production of positive lenses which are relatively thick at the center or negative lenses which are relatively thick at the edge. To reduce the likelihood of premature release, the relatively thick portions of a lens preferably are polymerized at a faster rate than the relatively thin portions of a lens.

The rate of polymerization taking place at various portions of a lens may be controlled by varying the relative intensity of ultraviolet light incident upon particular portions of a lens. The rate of polymerization taking place at various portions of a lens may also be controlled by directing air across the mold members 78 to cool the lens cell 52.

For positive lenses the intensity of incident ultraviolet light is preferably reduced at the edge portion of the lens so that the thicker center portion of the lens polymerizes faster than the thinner edge portion of the lens. Conversely, for a negative lens, the intensity of incident ultraviolet light is preferably reduced at the center portion of the lens so that the thicker edge portion of the lens polymerizes faster than the thinner center portion of the lens. For either a positive lens or a negative lens, air may be directed across the faces of the mold members 78 to cool the lens cell 52. As the overall intensity of incident ultraviolet light is increased, more cooling is needed which can be accomplished by either or both of increasing the velocity of the air and reducing the temperature of the air.

It is well known by those of ordinary skill in the art that lens forming materials having utility in the present invention tend to shrink as they cure. If the relatively thin portion of a lens is allowed to polymerize before the relatively thick portion, the relatively thin portion will tend to be rigid at the time the relatively thick portion cures and shrinks and the lens will either release prematurely from or crack the mold members 78. Accordingly, when the relative intensity of ultraviolet light incident upon the edge portion of a positive lens is reduced relative to the center portion, the center portion polymerizes faster and shrinks before the edge portion is rigid so that the shrinkage is more uniform. Conversely, when the relative intensity of ultraviolet light incident upon the center portion of a negative lens is reduced relative to the edge portion, the edge portion polymerizes faster and shrinks before the center becomes rigid so that the shrinkage is more uniform.

The variation of the relative intensity of ultraviolet light incident upon a lens may be accomplished in a variety of ways. According to one method, in the case of a positive lens, a ring of opaque material may be placed between the lamps 40 and the lens cell 52 so that the incident ultraviolet light falls mainly on the thicker center portion of the lens. Conversely, for a negative lens, a disk of opaque material may be placed between the lamps 40 and the lens cell 52 so that the incident ultraviolet light falls mainly on the edge portion of the lens.

According to another method, in the case of a negative lens, a sheet material having a variable degree of opacity ranging from opaque at a central portion to transparent at a radial outer portion is disposed between the lamps 40 and the lens cell 52. Conversely, for a positive lens, a sheet material having a variable degree of opacity ranging from transparent at a central portion to opaque at a radial outer portion is disposed between the lamps 40 and the lens cell 52.

Those of ordinary skill in the art will recognize that there are a wide variety of techniques other than those enumerated above for varying the intensity of the ultraviolet light incident upon the opposed mold members 78.

In some embodiments, the intensity of the incident light has been measured and determined to be approximately 3.0 to 5.0 milliwatts per square centimeter (mW/cm$^2$) prior to passing through either the upper light filter 54 or the lower light filter 56 and the total intensity at the thickest part of the lens ranges from 0.6 to 2.0 mW/cm$^2$ while the intensity at the thinnest portion of the lens ranges from 0.1 to 1.5 mW/cm$^2$. In some embodiments the overall light intensity incident on the lens cell 52 has less of an impact on the final product than the relative light intensity incident upon the thick or thin portions of the lens so long as the lens cell 52 is sufficiently cooled to reduce the polymerization rate to an acceptable level.

In addition, as described below, in certain embodiments heat may be conductively applied to the molds and/or lens, thereby enhancing the quality of the cured lenses.

The ultraviolet lamps 40 preferably are maintained at a temperature at which the lamps 40 deliver maximum output. The lamps 40, preferably, are cooled because the intensity of the light produced by the lamps 40 fluctuates when the lamps 40 are allowed to overheat. In the apparatus depicted in FIG. 2, the cooling of the lamps 40 is accomplished by sucking ambient air into the upper lamp chamber 14 and lower lamp chamber 18 through vent 32, vent chambers 34 and openings 36 by means of exhaust fans 44 and 46, respectively. Excessive cooling of the lamps 40 should be avoided, however, as the intensity of the light produced by the lamps 40 is reduced when the lamps 40 are cooled to an excessive degree.

As noted above, the lens cell 52 is preferably cooled during curing of the lens forming material as the overall intensity of the incident ultraviolet light is increased. Cooling of the lens cell 52 generally reduces the likelihood of premature release by slowing the reaction and improving adhesion. There are also improvements in the optical quality, stress characteristics and impact resistance of the lens. Cooling of the lens cell 52 is preferably accomplished by blowing air across the lens cell 52. The air preferably has a temperature ranging between 15 and 85° F. (about −9.4° C. to 29.4° C.) to allow for a curing time of between 30 and 10 minutes. The air distribution devices 94 depicted in FIG. 5 have been found to be particularly advantageous as they are specifically designed to direct air directly across the surface of the opposed mold members 78. After passing across the surface of the opposed mold members 78, the air emanating from the air distribution devices 94 is vented through vents 33. Alternately the air emanating from the air distribution devices 94 may be recycled back to an air cooler.

The lens cell 52 may also be cooled by disposing the lens cell in a liquid cooling bath.

The opposed mold members 78 are preferably thoroughly cleaned between each curing run as any dirt or other impurity on the mold members 78 may cause premature release. The mold members 78 are cleaned by any conventional means well known to those of ordinary skill in the art such as with a domestic cleaning product, i.e., Mr. Clean™ available from Proctor and Gamble. Those of ordinary skill in the art will recognize, however, that many other techniques may also be used for cleaning the mold members 78.

Yellowing of the finished lens may be related to the monomer composition, the identity of the photoinitiator, and the concentration of the photoinitiator.

When casting a lens, particularly a positive lens that is thick in the center, cracking may be a problem. Addition polymerization reactions, including photochemical addition polymerization reactions, are exothermic. During the process, a large temperature gradient may build up and the resulting stress may cause the lens to crack.

The formation of optical distortions usually occurs during the early stages of the polymerization reaction during the transformation of the lens forming composition from the liquid to the gel state. Once patterns leading to optical distortions form they are difficult to eliminate. When gelation occurs there typically is a rapid temperature rise. The exothermic polymerization step causes a temperature increase, which in turn causes an increase in the rate of polymerization, which causes a further increase in temperature. If the heat exchange with the surroundings is not sufficient enough there will be a runaway situation that leads to premature release, the appearance of thermally caused striations and even breakage.

Accordingly, when continuous UV light is applied, it is preferred that the reaction process be smooth and not too fast but not too slow. Heat is preferably not generated by the process so fast that it cannot be exchanged with the surroundings. The incident ultraviolet light intensity preferably is adjusted to allow the reaction to proceed at a desired rate. It is also preferred that the seal between the annular gasket 80 and the opposed mold members 78 be as complete as possible.

Factors that have been found to lead to the production of lenses that are free from optical distortions are (1) achieving a good seal between the annular gasket 80 and the opposed mold members 78; (2) using mold members 78 having surfaces that are free from defects; (3) using a formulation having an appropriate type and concentration of photoinitiator that will produce a reasonable rate of temperature rise; and (4) using a homogeneous formulation. Preferably, these conditions are optimized.

Premature release of the lens from the mold will result in an incompletely cured lens and the production of lens defects. Factors that contribute to premature release are (1) a poorly assembled lens cell 52; (2) the presence of air bubbles around the sample edges; (3) imperfection in gasket lip or mold edge; (4) inappropriate formulation; (5) uncontrolled temperature rise; and (6) high or nonuniform shrinkage. Preferably, these conditions are minimized.

Premature release may also occur when the opposed mold members 78 are held too rigidly by the annular gasket 80. Preferably, there is sufficient flexibility in the annular gasket 80 to permit the opposed mold members 78 to follow the lens as it shrinks. Indeed, the lens must be allowed to shrink in diameter slightly as well as in thickness. The use of an annular gasket 80 that has a reduced degree of stickiness with the lens during and after curing is therefore desirable.

In a preferred technique for filling the lens molding cavity 82, the annular gasket 80 is placed on a concave or front mold member 92 and a convex or back mold member 90 is moved into place. The annular gasket 80 is then pulled away from the edge of the back mold member 90 at the uppermost point and a lens forming composition is injected into the lens molding cavity 82 until a small amount of the lens forming composition is forced out around the edge. The excess is then removed, preferably, by vacuum. Excess liquid that is not removed could spill over the face of the back mold member 90 and cause optical distortion in the finished lens.

Despite the above problems, the advantages offered by the radiation cured lens molding system clearly outweigh the disadvantages. The advantages of a radiation cured system include a significant reduction in energy requirements, curing time and other problems normally associated with conventional thermal systems.

The lens forming material may include any suitable liquid monomer or monomer mixture and any suitable photosensitive initiator. As used herein "monomer" is taken to mean any compound capable of undergoing a polymerization reaction. Monomers may include non-polymerized material or partially polymerized material. When partially polymerized material is used as a monomer, the partially polymerized material preferably contains functional groups capable of undergoing further reaction to form a new polymer. The lens forming material, preferably, does not include any component, other than a photoinitiator, that absorbs ultraviolet light having a wavelength in the range of 300 to 400 nm. The liquid lens forming material is preferably filtered for quality control and placed in the lens molding cavity 82 by pulling the annular gasket 80 away from one of the opposed mold members 78 and injecting the liquid lens forming material into the lens molding cavity 82. Once the lens molding cavity 82 is filled with such material, the annular gasket 80 is replaced into its sealing relation with the opposed mold members 78.

Those skilled in the art will recognize that once the cured lens is removed from the lens molding cavity 82 by disassembling the opposed mold members 78, the lens can be further processed in a conventional manner, such as by grinding its peripheral edge.

According to the present invention a polymerizable lens forming composition includes an aromatic-containing bis(allyl carbonate)-functional monomer and at least one polyethylenic-functional monomer containing two ethylenically unsaturated groups selected from acrylyl and methacrylyl. In a preferred embodiment, the composition further includes a suitable photoinitiator. In other preferred embodiments, the composition may include one or more polyethylenic-functional monomers containing three ethylenically unsaturated groups selected from acrylyl and methacrylyl, and a dye.

Aromatic-containing bis(allyl carbonate)-functional monomers which can be utilized in the practice of the present invention are bis(allyl carbonates) of dihydroxy aromatic-containing material. The dihydroxy aromatic-containing material from which the monomer is derived may be one or more dihydroxy aromatic-containing compounds. Preferably the hydroxyl groups are attached directly to nuclear aromatic carbon atoms of the dihydroxy aromatic-containing compounds. The monomers are themselves known and can be prepared by procedures well known in the art.

The aromatic-containing bis(allyl carbonate)-functional monomers can be represented by the formula:

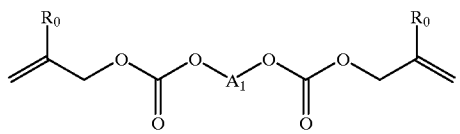

(I)

in which $A_1$ is the divalent radical derived from the dihydroxy aromatic-containing material and each $R_0$ is independently hydrogen, halo, or a $C_1$–$C_4$ alkyl group. The alkyl group is usually methyl or ethyl. Examples of $R_0$ include hydrogen, chloro, bromo, fluoro, methyl ethyl, n-propyl, isopropyl and n-butyl. Most commonly $R_0$ is hydrogen or methyl; hydrogen is preferred. A subclass of the divalent radical $A_1$ which is of particular usefulness is represented by the formula:

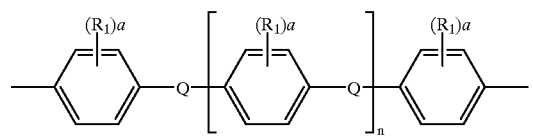

(II)

in which each $R_1$ is independently alkyl containing from 1 to about 4 carbon atoms, phenyl or halo; the average value of each a is independently in the range of from 0 to 4; each Q is independently oxy, sulfonyl, alkanediyl having from 2 to about 4 carbon atoms, or alkylidene having from 1 to about 4 carbon atoms; and the average value of n is in the range of from 0 to about 3. Preferably Q is methylethylidene, viz., isopropylidene.

Preferably the value of n is zero, in which case $A_1$ is represented by the formula:

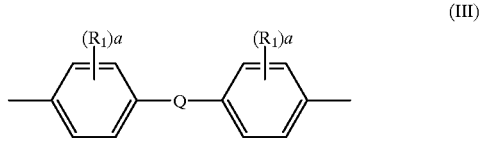

(III)

in which each $R_1$, each a, and Q are as discussed in respect of Formula II. Preferably the two free bonds are both in the ortho or para positions. The para positions are especially preferred.

The dihydroxy aromatic-containing compounds from which $A_1$ is derived may also be polyol-functional chain extended compounds. Examples of such compounds include alkaline oxide extended bisphenols. Typically the alkaline oxide employed is ethylene oxide, propylene oxide, or mixtures thereof. By way of exemplification, when para, para-bisphenols are chain extended with ethylene oxide, the bivalent radical $A_1$ may often be represented by the formula:

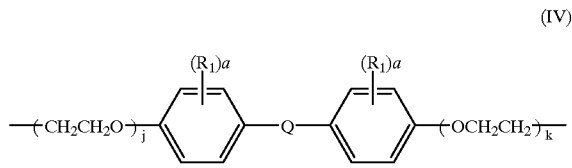

(IV)

where each $R_1$, each a, and Q are as discussed in respect of Formula II, and the average values of j and k are each independently in the range of from about 1 to about 4.

A preferred aromatic-containing bis(allyl carbonate)-functional monomer is represented by the formula:

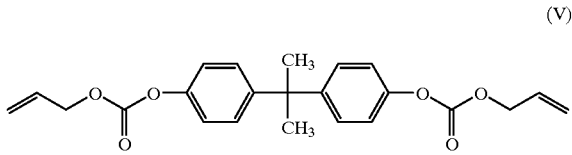

(V)

and is commonly known as bisphenol A bis(allyl carbonate).

A wide variety of compounds may be used as the polyethylenic functional monomer containing two or three ethylenically unsaturated groups. A preferred polyethylenic functional compounds containing two or three ethylenically unsaturated groups may be generally described as the acrylic acid esters and the methacrylic acid esters of aliphatic polyhydric alcohols, such as, for example, the di- and triacrylates and the di- and trimethacrylates of ethylene glycol, triethylene glycol, tetraethylene glycol, tetramethylene glycol, glycidyl, diethyleneglycol, butyleneglycol, propyleneglycol pentanediol, hexanediol, trimethylolpropane, and tripropyleneglycol. Examples of specific suitable polyethylenic—functional monomers containing two or three ethylenically unsaturated groups include trimethylolpropanetriacrylate (TMPTA), tetraethylene glycol diacrylate (TTEGDA), tripropylene glycol diacrylate (TRPGDA), 1,6 hexanedioldimethacrylate (HDDMA), and hexanedioldiacrylate (HDDA).

In general, a photoinitiator for initiating the polymerization of the lens forming composition of the present invention, preferably, exhibits an ultraviolet absorption spectrum over the 300–400 nm range. High absorptivity of a photoinitiator in this range, however, is not desirable, especially when casting a thick lens. The following are examples of illustrative photoinitiator compounds within the scope of the invention: methyl benzoylformate, 2-hydroxy-2-methyl-1-phenylpropan-1-one, 1-hydroxycyclohexyl phenyl ketone, 2,2-di-sec-butoxyacetophenone, 2,2-diethoxyacetophenone, 2,2-diethoxy-2-phenyl-acetophenone, 2,2-dimethoxy-2-phenyl-acetophenone, benzoin methyl ether, benzoin isobutyl ether, benzoin, benzil, benzyl disulfide, 2,4-dihydroxybenzophenone, benzylideneacetophenone, benzophenone and acetophenone. Preferred photoinitiator compounds are 1-hydroxycyclohexyl phenyl ketone (which is commercially available from Ciba-Geigy as Irgacure 184), methyl benzoylformate (which is commercially available from Polysciences, Inc.), or mixtures thereof.

Methyl benzoylformate is a generally preferred photoinitiator because it tends to provide a slower rate of polymerization. The slower rate of polymerization tends to prevent excessive heat buildup (and resultant cracking of the lens) during polymerization. In addition, it is relatively easy to mix liquid methyl benzoylformate (which is liquid at ambient temperatures) with many acrylates, diacrylates, and allyl carbonate compounds to form a lens forming composition. The lenses produced with the methyl benzoylformate photoinitiator tend to exhibit more favorable stress patterns and uniformity.

A strongly absorbing photoinitiator will absorb most of the incident light in the first millimeter of lens thickness, causing rapid polymerization in that region. The remaining light will produce a much lower rate of polymerization below this depth and will result in a lens that has visible distortions. An ideal photoinitiator will exhibit high activity, but will have a lower extinction coefficient in the useful range. A lower extinction coefficient of photoinitiators at longer wavelengths tends to allow the ultraviolet radiation to penetrate deeper into the reaction system. This deeper penetration of the ultraviolet radiation allows photoinitiator radicals to form uniformly throughout the sample and provide excellent overall cure. Since the sample can be irradiated from both top and bottom, a system in which appreciable light reaches the center of the thickest portion of the lens is preferred. The photoinitiator solubility and compatibility with the monomer system is also an important requirement.

An additional consideration is the effect of the photoinitiator fragments in the finished polymer. Some photoinitiators generate fragments that impart a yellow color to the finished lens. Although such lenses actually absorb very little visible light, they are cosmetically undesirable.

Photoinitiators are often very system specific so that photoinitiators that are efficient in one system may function poorly in another. In addition, the initiator concentration to a large extent is dependent on the incident light intensity and the monomer composition. The identity of the initiator and its concentration are important for any particular formulation. A concentration of initiator that is too high tends to lead to cracking and yellowing of the lens. Concentrations of initiator that are too low tend to lead to incomplete polymerization and a soft material.

Dyes and/or pigments are optional materials that may be present when high transmission of light is not necessary.

The listing of optional ingredients discussed above is by no means exhaustive. These and other ingredients may be employed in their customary amounts for their customary purposes so long as they do not seriously interfere with good polymer formulating practice.

According to a preferred embodiment of the present invention, a preferred aromatic-containing bis(allyl carbonate) functional monomer, bisphenol A bis(allyl carbonate) is admixed with one or more faster reacting polyethylenic functional monomers containing two acrylate or methacrylate groups such as 1,6 hexanediol dimethacrylate (HDDMA), 1,6 hexanediol diacrylate (HDDA), tetraethylene glycol diacrylate (TTEGDA), and tripropylene glycol diacrylate (TRPGDA) and optionally a polyethylenic functional monomer containing three acrylate groups such as trimethylolpropane triacrylate (TMPTA). Generally, compounds containing acrylate groups polymerize much faster than those containing allyl groups.

In one embodiment, the lamps 40 generate an intensity at the lamp surface of approximately 4.0 to 7.0 mW/cm$^2$ of ultraviolet light having wavelengths between 300 and 400 nm, which light is very uniformly distributed without any sharp discontinuities throughout the reaction process. Such bulbs are commercially available from Sylvania under the trade designation Sylvania Fluorescent (F15T8/2052) or Sylvania Fluorescent (F15T8/350BL/18") GTE.

As noted above, ultraviolet light having wavelengths between 300 and 400 nm is preferred because the photoinitiators according to the present invention, preferably, absorb most efficiently at this wavelength and the mold members 78, preferably, allow maximum transmission at this wavelength.

It is preferred that there be no sharp intensity gradients of ultraviolet radiation either horizontally or vertically through the lens composition during the curing process. Sharp intensity gradients through the lens may lead to defects in the finished lens.

According to one embodiment of the present invention, the liquid lens forming composition includes bisphenol A bis(allyl carbonate) in place of DEG-BAC. The bisphenol A bis(allyl-carbonate) monomer has a higher refractive index than DEG-BAC which allows the production of thinner lenses which is important with relatively thick positive or negative lenses. The bisphenol A bis(allyl-carbonate) monomer is commercially available from PPG Industries under the trade name HIRI I or CR-73. Lenses made from this product sometimes have a very slight, barely detectable, degree of yellowing. A small amount of a blue dye consisting of 9,10-anthracenedione, 1-hydroxy-4-[(4-methylphenyl)amino] available as Thermoplast Blue 684 from BASF Wyandotte Corp. is preferably added to the composition to counteract the yellowing. In addition, the yellowing tends to disappear if the lens is subjected to the above-described post-cure heat treatment. Moreover, if not post-cured the yellowing tends to disappear at ambient temperature after approximately 2 months.

TTEGDA, available from Sartomer and Radcure, is a diacrylate monomer that, preferably, is included in the composition because it is a fast polymerizing monomer that reduces yellowing and yields a very clear product. If too much TTEGDA is included in the more preferred composition, i.e. greater than about 25% by weight, however, the finished lens may be prone to cracking and may be too flexible as this material softens at temperatures above 40 NC. If TTEGDA is excluded altogether, the finished lens may to be brittle.

HDDMA, available from Sartomer, is a dimethacrylate monomer that has a very stiff backbone between the two methacrylate groups. HDDMA, preferably, is included in the composition because it yields a stiffer polymer and increases the hardness and strength of the finished lens. This material is quite compatible with the bisphenol A bis(allyl carbonate)

monomer. HDDMA contributes to high temperature stiffness, polymer clarity and speed of polymerization.

TRPGDA, available from Sartomer and Radcure, is a diacrylate monomer that, preferably, is included in the composition because it provides good strength and hardness without adding brittleness to the finished lens. This material is also stiffer than TTEGDA.

TMPTA, available from Sartomer and Radcure, is a triacrylate monomer that, preferably, is included in the composition because it provides more crosslinking in the finished lens than the difunctional monomers. TMPTA has a shorter backbone than TTEGDA and increases the high temperature stiffness and hardness of the finished lens. Moreover, this material contributes to the prevention of optical distortions in the finished lens. TMPTA also contributes to high shrinkage during polymerization. The inclusion of too much of this material in the more preferred composition may make the finished lens too brittle.

Certain of the monomers that are preferably utilized in the composition of the present invention, such as TTEGDA, TRPGDA and TMPTA, include impurities and have a yellow color in certain of their commercially available forms. The yellow color of these monomers is preferably reduced or removed by passing them through a column of alumina (basic) which includes aluminum oxide powder—basic. After passage through the alumina column, the monomers absorb almost no ultraviolet light. Also after passage through the alumina column differences between monomers obtained from different sources are substantially eliminated. It is preferred, however, that the monomers be obtained from a source which provides the monomers with the least amount of impurities contained therein. The composition preferably is filtered prior to polymerization thereof to remove suspended particles.

The composition of the present invention, preferably, may be prepared according to the following protocol. Appropriate amounts of HDDMA, TTEGDA, TMPTA and TRPGDA are mixed and stirred thoroughly, preferably with a glass rod. The acrylate/methacrylate mixture may then be passed through a purification column.

A suitable purification column may be disposed within a glass column having a fitted glass disk above a teflon stopcock and having a top reservoir with a capacity of approximately 500 ml and a body with a diameter of 22 mm and a length of about 47 cm. The column may be prepared by placing on the fitted glass disk approximately 35 g. of activated alumina (basic), available from ALFA Products, Johnson Matthey, Danvers, Mass. in a 60 mesh form or from Aldrich in a 150 mesh form. Approximately 10 g. of an inhibitor remover (hydroquinone/methylester remover) available as HR-4 from Scientific Polymer Products, Inc., Ontario, N.Y. then may be placed on top of the alumina and, finally, approximately 35 g. of activated alumina (basic) may be placed on top of the inhibitor remover.

Approximately 600 g. of the acrylate/methacrylate mixture may then be added above the column packing. An overpressure of 2–3 psi may then be applied to the top of the column resulting in a flow rate of approximately 30 to 38 grams per hour. Parafilm may be used to cover the junction of the column tip and the receiving bottle to prevent the infiltration of dust and water vapor. The acrylate/methacrylate mixture, preferably, may be received in a container that is opaque to ultraviolet radiation.

An appropriate amount of bisphenol A bis(allyl carbonate) may then be added to the acrylate/methacrylate mixture to prepare the final monomer mixture.

An appropriate amount of a photoinitiator may then be added to the final monomer mixture. The final monomer mixture, with or without photoinitiator, may then be stored in a container that is opaque to ultraviolet radiation.

An appropriate amount of a dye may also be added to the final monomer mixture, with or without photoinitiator.

After edging, the ultraviolet light cured lenses of the present invention demonstrate excellent organic solvent resistance to acetone, methylethyl ketone, and alcohols.

For best results, both the casting surfaces 86 and non-casting surfaces 88 of the mold members 78 are finished to optical quality. For instance, a wave on the non-casting surface 88 may be reproduced in the finished lens as a result of the distortion of the incident light.

Mold markings cause differential light intensity conditions under the marking, even when the mark is on the non-casting surface 88 of the mold members 78. The fully exposed region of the lens will tend to be harder, and the lens may have stresses because of this. The portion of the lens under the mark will also tend to be weaker at the end of the curing period. This effect has been observed and may cause premature release or induce cracking.

Mold defects at the edges interfere with the sealing conditions and frequently induce premature release.

It is believed that as the reaction proceeds, the heat generated tends to reduce the adhesion between the shrinking lens and the mold face. This reduction in adhesion tends to cause the lens to pull away from the mold. In high curvature (i.e. high power) lenses this problem tends to be even more pronounced because of two factors: (1) these lenses have more thickness and thus more material that is generating heat (which thus speeds up the reaction and generates more heat), and (2) these lenses have a greater thickness differential between the thick and thin portions of the lens, which tends to cause stress on the molds due to differential shrinkage. It is also possible that the temperatures generated relatively deep inside a thick lens may cause some vaporization of the monomer. The vaporized monomer may then migrate to the lens/mold interface, breaking the vacuum between the two.

Because of the problem of premature release, preferably high power lenses are cured to maintain adhesion to the molds. Preferably the molds flex and accommodate stress.

Figure 9:
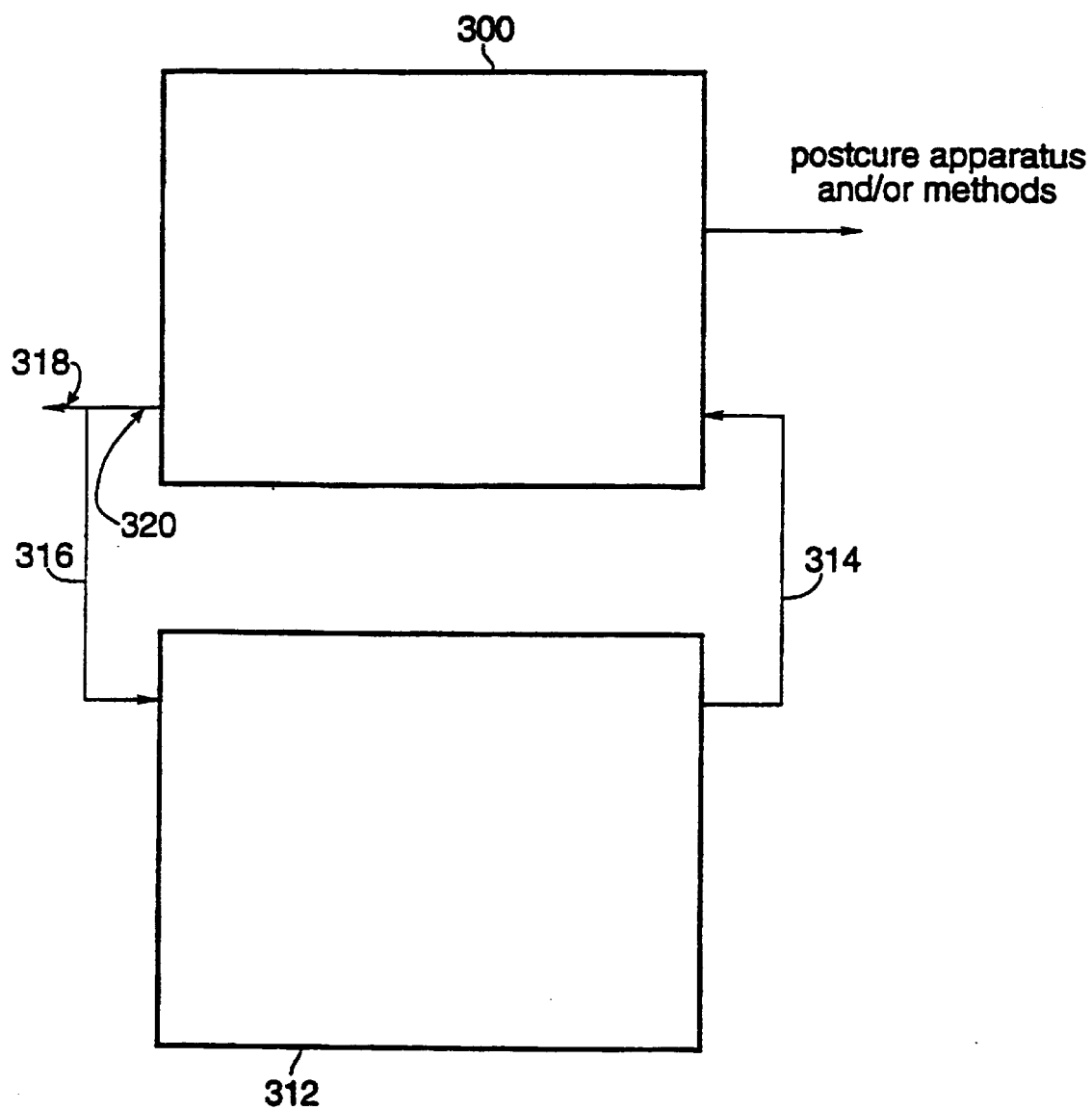
FIG. 9 is a schematic block diagram of an alternate process and system for making and postcuring a plastic lens.

Preferably the cooling fluid used is air at a temperature of less than 50° C. The fluid may be below 0° C., however in a preferred embodiment the fluid was at a temperature of between 0° C. and less than 20° C., preferably about 0–15° C., more preferably about 0–10° C., more preferably still about 3–8° C. In one preferred embodiment the fluid temperature was about 5° C. As shown in FIG. 9, a lens forming apparatus 300 for making a plastic lens may include a cooler 312 for supplying cool fluid to the apparatus 300 via conduit 314. The fluid may be supplied to the apparatus 300 and then discharged via conduit 320. The fluid discharged via conduit 320 may be vented via conduit 318 or it may alternately be recirculated via conduit 316 to the cooler 312. The cooler 312 preferably includes a Neslab CFT-50 water/antifreeze chiller (Newington, N.H., U.S.A.). A Neslab-built blower box designed for a minimum temperature of 3° C. and 8 cubic feet (about 0.224 cubic meters) per minute of air per air distributor 94 was used with the chiller. The blower box included a heat exchanger coil through which chilled water was circulated, a blower, and a plenum-type arrangement for supplying air to the conduit 314.

If lenses are produced with continuous UV light without any mold cooling, the temperature of the mold-lens assembly may rise to above 50° C. Low diopter lenses may be prepared in this fashion, but higher plus or minus diopter lenses may fail. Certain lenses may be made by controlling (e.g., cooling) the temperature of the lens material during cure with circulating uncooled fluid (i.e., fluid at ambient temperatures). The ambient fluid in these systems is directed towards the mold members in the same manner as described above. Circulating ambient temperature fluid permits manufacture of a wider range of prescriptions than manufacture of the lenses without any mold cooling at all.

Most polymerization factors are interrelated. The ideal temperature of polymerization is related to the diopter and thickness of the lens being cast. Thermal mass is a factor. Lower temperatures (below about 10° C.) are preferred to cast higher + or − diopter lenses when using continuous UV light. These lower temperatures tend to permit an increase in photoinitiator concentration, which in turn may speed up the reaction and lower curing time.

Preventing premature release when using continuous UV light is also somewhat dependent upon the flowrates of cooling fluid, as well as its temperature. For instance, if the temperature of the cooling fluid is decreased it may also be possible to decrease the flowrate of cooling fluid. Similarly, the disadvantages of a higher temperature cooling fluid may be somewhat offset by higher flowrates of cooling fluid.

In one embodiment the air flow rates for a dual distributor system (i.e., an air distributor above and below the lens composition) are about 1–30 standard cubic feet ("scf") (about 0.028–0.850 standard cubic meters) per minute per distributor, more preferably about 4–20 cubic feet (about 0.113–0.566 standard cubic meters) per minute per distributor, and more preferably still about 9–15 (about 0.255–0.423 standard cubic meters) cubic feet per minute per distributor. "Standard conditions," as used herein, means 60° F. (about 15.556° C.) and one atmosphere pressure (about 101.325 kilopascals).

The thickness of the glass molds used to cast polymerized lenses may affect the lenses produced. A thinner mold tends to allow more efficient heat transfer between the polymerizing material and the cooling air, thus reducing the rate of premature release. In addition, a thinner mold tends to exhibit a greater propensity to flex. A thinner mold tends to flex during the relatively rapid differential shrinkage between the thick and thin portions of a polymerized lens, again reducing the incidence of premature release. In one embodiment the first or second mold members have a thickness less than about 5.0 mm, preferably about 1.0–5.0 mm, more preferably about 2.0–4.0 mm, and more still about 2.5–3.5 mm.

"Front" mold or face means the mold or face whose surface ultimately forms the surface of an eyeglass lens that is furthest from the eye of an eyeglass lens wearer. "Back" mold or face means the mold or face whose surface ultimately forms the surface of an eyeglass lens that is closest to the eye of a eyeglass lens wearer.

In one embodiment the lens forming material is preferably cured to form a solid lens at relatively low temperatures, relatively low continuous ultraviolet light intensity, and relatively low photoinitiator concentrations. Lenses produced as such generally have a Shore D hardness of about 60–78 (for preferred compositions) when cured for about 15 minutes as described above. The hardness may be improved to about 80–81 Shore D by postcure heating the lens in a conventional oven for about 10 minutes, as described above.

In a preferred embodiment, UV light may be provided with mercury vapor lamps provided in UVEXS, Inc. Model CCU or 912 curing chambers (Sunnyvale, Calif., U.S.A).

In an alternate method for making a lens, the desired curvature (i.e., power) of the lens may be varied using the same molds, but with different light distributions. In this manner one mold may be used to prepare different lenses with different curvatures. The method includes the steps of: (1) placing a polymerizable lens forming material in a mold cavity defined in part between a first mold member and a second mold member, and wherein the cavity defines a theoretical curvature that is different from the desired curvature, (2) directing ultraviolet rays towards at least one of the first and second mold members, and wherein the ultraviolet rays are directed towards the first or second mold member such that the material cures to form a lens with the desired curvature, and (3) contacting fluid against the first or second mold member to cool the first or second mold member. The resulting lens curvature may vary depending on the way the ultraviolet light is directed towards the first or second mold members. That is, by varying the relative intensity of the light across the lens material radii it is possible to vary the curvature of the resulting lens.

EXAMPLE 1

| Formulation: | 17% | Bisphenol A BisAllyl Carbonate |
|---|---|---|
| | 10% | 1,6 Hexanediol dimethacrylate |
| | 20% | Trimethylolpropane triacrylate |
| | 21% | Tetraethyleneglycol diacrylate |
| | 32% | Tripropyleneglycol diacrylate |
| | 0.012% | Hydroxycyclohexyl phenyl ketone |
| | 0.048 | Methylbenzoylformate |
| | <10 PPM | Hydroquinone & Methylethylhydroquinone |

Hydroquinone and Methylethylhydroquinone were stabilizers present in some of the diacrylate and/or triacrylate compounds obtained from Sartomer. Preferably the amount of stabilizers is minimized since the stabilizers affect the rate and amount of curing. If larger amounts of stabilizers are added, then generally larger amounts of photoinitiators must also be added.

Light Condition: $mW/cm^2$ measured at plane of sample with Spectroline DM 365N Meter from Spectronics Corp. (Westbury, N.Y.)

| | Center | Edge |
|---|---|---|
| Top: | 0.233 | 0.299 |
| Bottom: | 0.217 | 0.248 |

Air Flow: 9.6 standard cubic feet ("CFM") per manifold— 19.2 CFM total on sample
Air Temperature: 4.4 degrees Centigrade
Molds: 80 mm diameter Corning #8092 glass

| | Radius | Thickness |
|---|---|---|
| Concave: | 170.59 | 2.7 |
| Convex: | 62.17 | 5.4 |

Gasket: General Electric SE6035 silicone rubber with a 3 mm thick lateral lip dimension and a vertical lip dimension sufficient to provide an initial cavity center thickness of 2.2 mm Filling: The molds were cleaned and assembled into the gasket. The mold/gasket assembly was then temporarily positioned on a fixture which held the two molds pressed against the gasket lip with about 1 kg. of pressure. The upper edge of the gasket was peeled back to allow about 27.4 grams of the monomer blend to be charged into the cavity. The upper edge of the gasket was then eased back into place and the excess monomer was vacuumed out with a small aspirating device. It is preferable to avoid having monomer drip onto the noncasting surface of the mold because a drop tends to cause the ultraviolet light to become locally focused and may cause an optical distortion in the final product.

Curing: The sample was irradiated for fifteen minutes under the above conditions and removed from the "FC-104" curing chamber (i.e., the chamber shown in FIGS. 14 and 15). The molds were separated from the cured lens by applying a sharp impact to the junction of the lens and the convex mold. The sample was then postcured at 110° C. in a conventional gravity type thermal oven for an additional ten minutes, removed and allowed to cool to room temperature.

Results: The resulting lens measured 72 mm in diameter, with a central thickness of 2.0 mm, and an edge thickness of 9.2 mm. The focusing power measured ~5.05 diopter. The lens was water clear ("water-white"), showed negligible haze, exhibited total visible light transmission of about 94%, and gave good overall optics. The Shore D hardness was about 80. The sample withstood the impact of a 1 inch steel ball dropped from fifty inches in accordance with ANSI 280.1- 1987, 4.6.4 test procedures.

ADDITIONAL IMPROVEMENTS

POSTCURE WITH AN OXYGEN BARRIER ENRICHED WITH PHOTOINITIATOR

In certain applications, all of the lens forming composition may fail to completely cure by exposure to ultraviolet rays when forming the lens. In particular, a portion of the lens forming composition proximate the gasket often remains in a liquid state following formation of the lens. It is believed that the gaskets are often somewhat permeable to air, and, as a result, oxygen permeates them and contacts the portions of the lens forming material that are proximate the gasket. Since oxygen tends to inhibit the photocuring process, portions of the lens forming composition proximate the gasket tend to remain uncured as the lens is formed.

Uncured lens forming composition proximate the gasket is a problem for several reasons. First, the liquid lens forming composition leaves the edges of the cured lens in a somewhat sticky state, which makes the lenses more difficult to handle. Second, the liquid lens forming composition is somewhat difficult to completely remove from the surface of the lens. Third, liquid lens forming composition may flow and at least partially coat the surface of lenses when such lenses are removed from the molds. This coating is difficult to remove and makes application of scratch resistant coatings or tinting dyes more difficult. This coating tends to interfere with the interaction of scratch resistant coatings and tinting dyes with the cured lens surface. Fourth, if droplets of liquid lens forming material form, these droplets may later cure and form a ridge or bump on the surface of the lens, especially if the lens undergoes later postcure or scratch resistant coating processes. As a result of the above problems, often lenses must be tediously cleaned or recast when liquid lens forming composition remains after the lens is formed in an initial cure process.

The problems outlined above can be mitigated if less liquid lens forming composition remains proximate the gasket after the lens is formed. One method of lessening this "wet edge" problem relates to increasing the amount of photoinitiator present in the lens forming composition (i.e., increasing the amount of photoinitiation in the lens forming composition above about 0.15 percent). Doing so, however, tends to create other problems. Specifically, increased photoinitiator levels tend to cause exothermic heat to be released at a relatively high rate during the reaction of the composition. Premature release and/or lens cracking tends to result. Thus it is believed that lower amounts of photoinitiator are preferred.

The wet edge problem has been addressed by a variety of methods described in U.S. patent application Ser. No. 07/931,946. Such methods relate to removing the gasket and applying either an oxygen barrier or a photoinitiator enriched liquid to the exposed edge of the lens. The lens is then re-irradiated with sufficient ultraviolet light to completely dry the edge of the lens prior to demolding.

Figure 12:
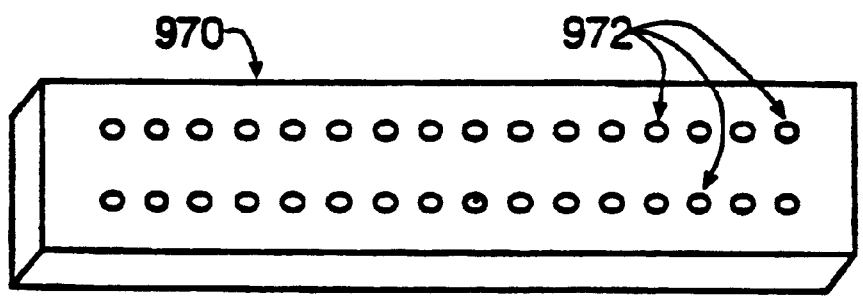
FIG. 12 is a view of an embodiment of an oxygen barrier with photoinitiator.

An embodiment of the invention relates to improving the methods described in the Ser. No. 07/931,946 application. This embodiment relates to combining an oxygen barrier with a photoinitiator. Specifically, in one embodiment an oxygen barrier 970 (e.g., a thin strip of polyethylene film or the like as shown in FIG. 12) is embedded or impregnated with a photoinitiator 972. The oxygen barrier is then wrapped around the edge of a cured lens which is still encased between two molds (but with the gasket removed). While still "in the mold," the lens is then exposed to ultraviolet light, thereby drying its edge. An improvement of this method over those previously disclosed is that there is a significant reduction in the UV dosage necessary to bring the lens edge to dryness.

A plastic oxygen barrier film which includes a photoinitiator may be made by: (a) immersing a plastic film in a solution comprising a photoinitiator, (b) removing the plastic film from the solution, and (c) drying the plastic film. The solution may include an etching agent. Preferably a surface of the plastic film is etched prior to or while immersing the plastic film in the solution.

In one example, thin strips (e.g., about 10 mm wide) of high density polyethylene film (approximately 0.013 mm thick) may be soaked in a solution of 97% acetone and 3% Irgacure 184 (a photoinitiator commercially available from Ciba Geigy located in Farmingdale, N.J.) for about five minutes. The polyethylene film may be obtained from Tape Solutions, Inc. (Nashville, Tenn.). In a more preferred embodiment, 0.5% Byk 300 (a flow agent commercially available from Byk Chemie located in Wallingford, Conn.) may be included in the soaking solution. It is believed that xylene in the Byk 300 tends to etch the surface of the film and make the film more receptive to absorption of the Irgacure 184. In a still more preferred embodiment, the treated polyethylene strips may be dipped in acetone for about ten seconds to remove excess Irgacure 184. Excess photoinitiator may be seen as a white powder which coats the strips after drying. In either case, the strips are then allowed to air dry before applying them to the edge of the lens as described above.

In one alternate embodiment of the invention, a plastic eyeglass lens may be made by the following steps: (1) placing a liquid polymerizable lens forming composition in a mold cavity defined by a gasket, a first mold member, and a second mold member; (2) directing first ultraviolet rays toward at least one of the mold members to cure the lens forming composition so that it forms a lens with a back face, edges, and a front face, and wherein a portion of the lens forming composition proximate the edges of the lens is not fully cured; (3) removing the gasket to expose the edges of the lens; (4) applying an oxygen barrier which includes a photoinitiator around the exposed edges of the lens such that at least a portion of the oxygen barrier photoinitiator is proximate lens forming composition that is not fully cured; and (5) directing second ultraviolet rays towards the lens such that at least a portion of the oxygen barrier photoinitiator initiates reaction of lens forming composition while the oxygen barrier substantially prevents oxygen from outside the oxygen barrier from contacting at least a portion of the lens forming composition. The first and second ultraviolet rays may (a) be at the same or different wavelengths and/or intensities, (b) be continuous or pulsed, and (c) be from the same or different light source.

A purpose of the steps 4–5 is to reduce the amount of uncured liquid lens forming composition that is present when the lens is separated from the molds and/or gasket. It has been found that reducing the amount of liquid lens forming composition is especially advantageous if such reduction occurs before the molds are separated from the cured lens. Separating the molds from the cured lens may cause uncured liquids to at least partially coat the lens faces. This coating occurs because uncured liquid lens forming composition tends to get swept over the faces when the molds are separated from the lens. It is believed that curing of the lens tends to create a vacuum between the lens and the mold. Air may sweep over the mold faces to fill this vacuum when the molds are separated from the lens. This air tends to take liquid lens forming composition into the vacuum with it.

In step 4 above, an oxygen barrier which includes a photoinitiator is applied to the edges or sides of the lens after the gasket is removed. Preferably this oxygen barrier is applied while the lens are still attached to the molds. In an alternate embodiment this oxygen barrier is also applied to the edges or sides of the molds at the same time it is applied to the sides of the lens. In a preferred embodiment, the sides of the lenses are first cleaned or wiped to remove at least a portion of the uncured liquid lens forming composition before the oxygen barrier is applied.

After the oxygen barrier is applied, second ultraviolet rays are directed towards the lens. After the second ultraviolet rays are directed toward the lens, at least a portion of the liquid lens forming composition which was not cured in the initial cure steps is cured. It is believed that the photoinitiator embedded in the oxygen barrier facilitates faster and more complete curing of the uncured lens forming composition. As such, less second ultraviolet rays are employed, thereby lessening the time and energy required in this step. Furthermore, lens quality tends to be enhanced since a lower application of the second ultraviolet rays tends to reduce the potential for lens yellowing.

In a preferred embodiment, substantially all of the remaining liquid lens forming composition is cured after the second ultraviolet rays are directed toward the lens. More preferably, the lens is substantially dry after the second ultraviolet rays are directed towards the lens.

After the second ultraviolet rays are directed toward the lens, the lens may then be demolded. The lens may then be tinted. After the lens is demolded, a scratch resistant coating may be applied to the lens. In one embodiment, a scratch resistant coating is applied to the demolded lens by applying a liquid scratch resistant coating composition to a face of the lens and then applying ultraviolet rays to this face to cure the liquid scratch resistant coating to a solid.

In an embodiment, the intensity of the ultraviolet rays applied to the face of the lens to cure the liquid scratch resistant coating composition to a solid is about 150–300 mW/cm$^2$ at a wave length range of about 360–370 nm, and about 50–150 mW/cm$^2$ at a wave length range of about 250–260 nm. The lens may be heated after removal from the molds, or after application of a scratch resistant coating to the lens.

In a preferred embodiment, the total intensity of the first ultraviolet rays directed toward the mold members is less than about 10 mW/cm$^2$.

In an embodiment, the intensity of the second ultraviolet rays directed toward the lens is about 150–300 mW/cm$^2$ at a wave length range of about 360–370 nm, and about 50–150 mW/cm$^2$ at a wave length range of about 250–260 nm. Preferably the second ultraviolet rays are directed towards the lens for less than about 1 minute.

In a preferred embodiment, the above method may further include the additional step of directing third ultraviolet rays towards the lens before the oxygen barrier is applied. These third ultraviolet rays are preferably applied before the gasket is removed. Preferably, the second and third ultraviolet rays are directed toward the back face of the lens (as stated above, the second and third ultraviolet rays are preferably applied while this lens is in the mold cavity). The third ultraviolet rays are preferably about the same range of intensity as the second ultraviolet rays. The same apparatus may be used for both the second and third ultraviolet rays.

In a preferred embodiment, the method described above also includes the step of removing the oxygen barrier from the edges of the lens.

The second and third ultraviolet rays may be repeatedly directed towards the lens. For instance, these ultraviolet rays may be applied via a light assembly whereby the lens passes under a light source on a movable stand. The lens may be repeatedly passed under the lights. Repeated exposure of the lens to the ultraviolet rays may be more beneficial than one prolonged exposure.

Preferably the oxygen barrier includes a film, and more preferably a plastic, flexible, and/or elastic film. In addition, the oxygen barrier is preferably at least partially transparent to ultraviolet rays so that ultraviolet rays may penetrate the oxygen barrier to cure any remaining liquid lens forming composition. Preferably the oxygen barrier is stretchable and self-sealing. These features make the film easier to apply. Preferably the oxygen barrier is resistant to penetration by liquids, thus keeping any liquid lens forming composition in the mold assembly. Preferably, the oxygen barrier includes a thermoplastic composition. It is anticipated that many different oxygen barriers may be used (e.g., saran wrap, polyethylene, etc.). In one preferred embodiment, the film is "Parafilm M Laboratory Film" which is available from American National Can (Greenwich, Conn., U.S.A.). The oxygen barrier may also include aluminum foil.

Preferably the oxygen barrier is less than about 1.0 mm thick. More preferably the oxygen barrier is 0.01 to 0.10 mm thick, and more preferably still the oxygen barrier is less than 0.025 mm thick. If the oxygen barrier is too thick, then it may not be readily stretchable and/or conformable, and it may not allow a sufficient amount of light to pass through it. If the oxygen barrier is too thin, then it may tend to tear.

An apparatus for applying a scratch resistant coating composition to a lens and then curing the scratch resistant coating composition is described in U.S. Pat. No. 4,895,102 to Kachel et al. and U.S. Pat. No. 3,494,326 to Upton (both of which are incorporated herein by reference). In addition, the apparatus schematically shown in FIG. 10 may also be used to apply the scratch resistant coating.

Figure 10:
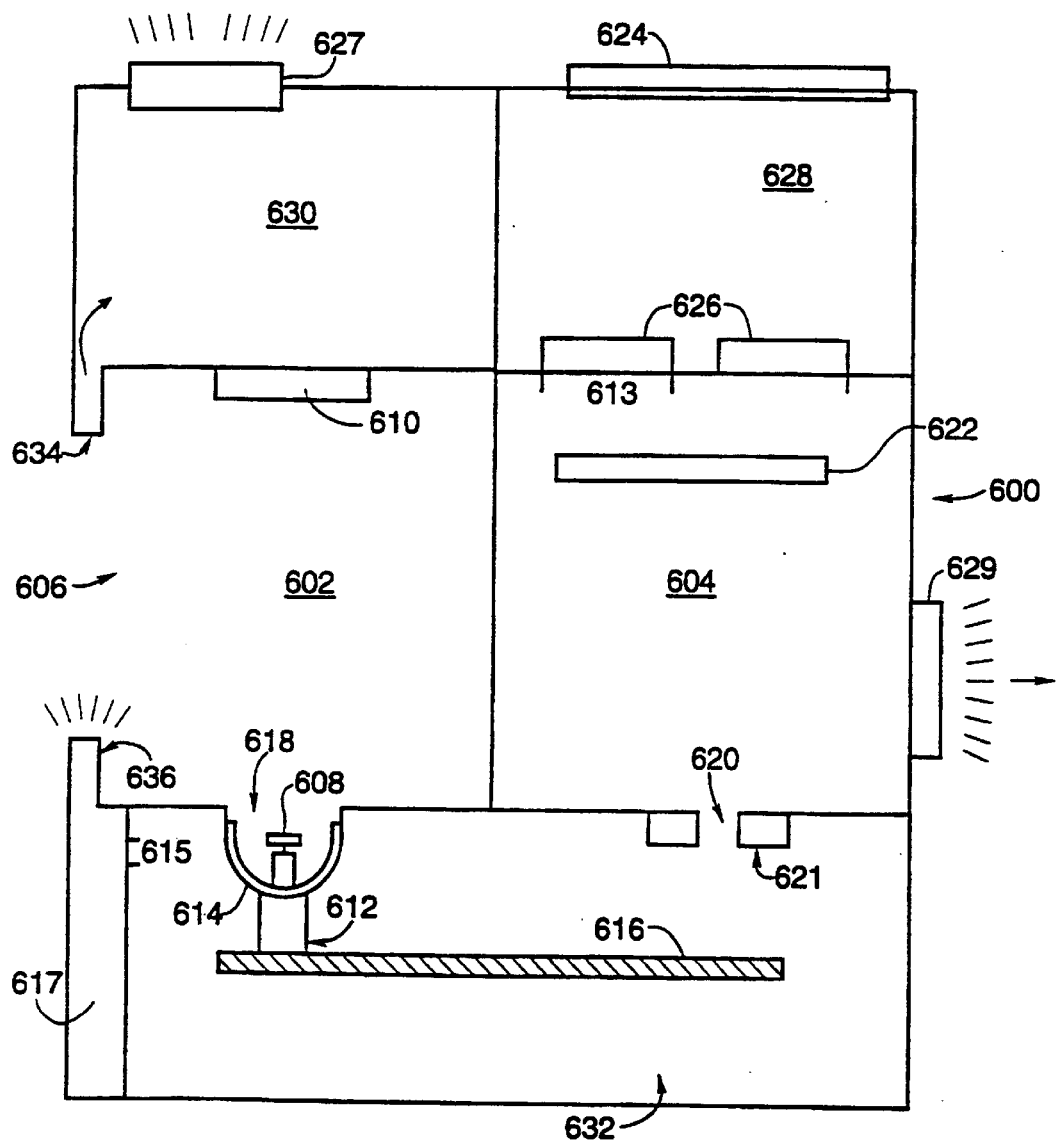
FIG. 10 is a schematic diagram of an apparatus to apply UV light to a lens or mold assembly.

FIG. 10 depicts an apparatus 600 with a first chamber 602 and a second chamber 604. This apparatus can be used to apply scratch resistant coating to a lens, to postcure a lens, or to apply ultraviolet light to a lens mold assembly. The first chamber 602 includes an opening 606 through which an operator can apply lenses and lens mold assemblies to the lens holder 608. Lens holder 608 is partially surrounded by barrier 614. First chamber 602 may include an inspection light 610, and an opening 618 in the floor of the chamber.

Lens holder 608 is attached to device 612. It is envisioned that device 612 may be a spinning device which would permit the apparatus 600 to be used to apply scratch resistant coatings to lenses. In such case device 612 would connect directly to lens holder 608 through a hole in the bottom of barrier 614. In a preferred embodiment, however, device 612 just connects the lens holder 608 or barrier 614 to moving device 616. It has been found that a separate spinner (not shown) may provide better results for application of scratch resistant coatings to lenses.

Preferably barrier 614 has an interior surface that is made or lined with an absorbant material such as foam rubber. Preferably this absorbant material is disposable and removable. The absorbant material absorbs any liquids that fall off the lens holder 608, keeping in the interior surface of the barrier 614 clean.

In an embodiment, shutter 621 is used to inhibit the ultraviolet light from light assembly 622 from contacting barrier 614. It is preferred that lens holder 608 be exposed to the ultraviolet light from light assembly 622 while shutter 621 blocks at least a portion of the light from contacting barrier 614. Shutter 621 may also inhibit any liquid lens forming material that falls from lens holder 606 from curing on barrier 614. Shutter 621 thus tends to inhibit the formation of flakes on the surface of barrier 614. Shutter 621 operates after barrier 614 drops, thus shielding barrier 614 while allowing UV light to contact the sample.

In an embodiment, apparatus 600 may be used to apply a precoat to lens before the hardcoat is applied. The precoat may serve to increase the "wettability" of the surface to which the hardcoat is to be applied. A surfactant has been conventionally employed for this purpose, however surfactants tend to affect the volatility and flow characteristics of lens coatings in an unfavorable manner. The precoat may include acetone and/or Byk 300. Upon even distribution of the hardcoat onto a lens in lens holder 608, the coating may be wiped near the edges of the lens to prevent the formation of excessive flakes during curing.

In another embodiment, the precoat and hardcoat are distributed onto lens holder 608. Ultraviolet light is directed toward the coatings at least until a gel is formed. A lens forming material may be placed on top of the gel and cured.

Second chamber 604 includes an opening 620 in its floor. It also includes an ultraviolet light assembly 622, which may include multiple lights and a light reflector.

The apparatus 600 includes an air filtering and distribution system. Air is pulled into a chamber 628 by fans 626 through a filter 624 (the quantity and locations of the fans and filters may vary). The filtered air is distributed by the fans 626 throughout chambers 602, 604, and 617. Air flows from point 613 to point 615 via air ducts (not shown) to reach chamber 617. The temperature of the lights and/or the second chamber may be controlled by turning various fans 629 on and off as needed to suck air out of chamber 604. Air is distributed from chamber 617 through holes 636 that are proximate the lower part of the opening 606 in the first chamber 602. Air is also sucked by fans 627 from the first chamber 602 to chamber 630 through holes 634 that are proximate the top part of the opening 606 in the first chamber 602. This arrangement tends to prevent contaminants from entering first chamber 606. Air is discharged from chamber 630 to the surroundings via fans 627.

During use a lens or lens mold assembly may be placed on the lens holder 608. A button can be pressed, causing the moving device 616 to move device 612, lens holder 604, and the barrier 614 so that they are under the opening 620 in the second chamber 604. Light is thus applied to the lens or lens mold assembly from light assembly 622. After a set period of time, the moving device 616 moves everything back to a location underneath the opening 618 in the first chamber 602.

The lens holder 608 may include a suction cup connected to a metal bar. The concave surface of the suction cup may be attachable to a face of a mold or lens, and the convex surface of the suction cup may be attached to a metal bar. The metal bar may be attachable to a lens spinner.

The lens holder may also alternately include movable arms and a spring assembly which are together operable to hold a lens against the lens holder with spring tension during use.

In an alternate method of the invention, a lens may be cured between two mold members. The gasket may be removed and any remaining liquid lens composition may be removed. At this point a mold member may be applied to a substantially solid conductive heat source. Heat may then be conductively applied to a face of the lens by (a) conductively transferring heat to a face of a mold member from the conductive heat source, and (b) conductively transferring heat through such mold member to the face of the lens. The oxygen barrier enriched with photoinitiator may then be applied, and second ultraviolet rays may be directed towards the lens to cure the remaining lens forming composition.

OXYGEN BARRIER EXAMPLE #1

Figure 14:
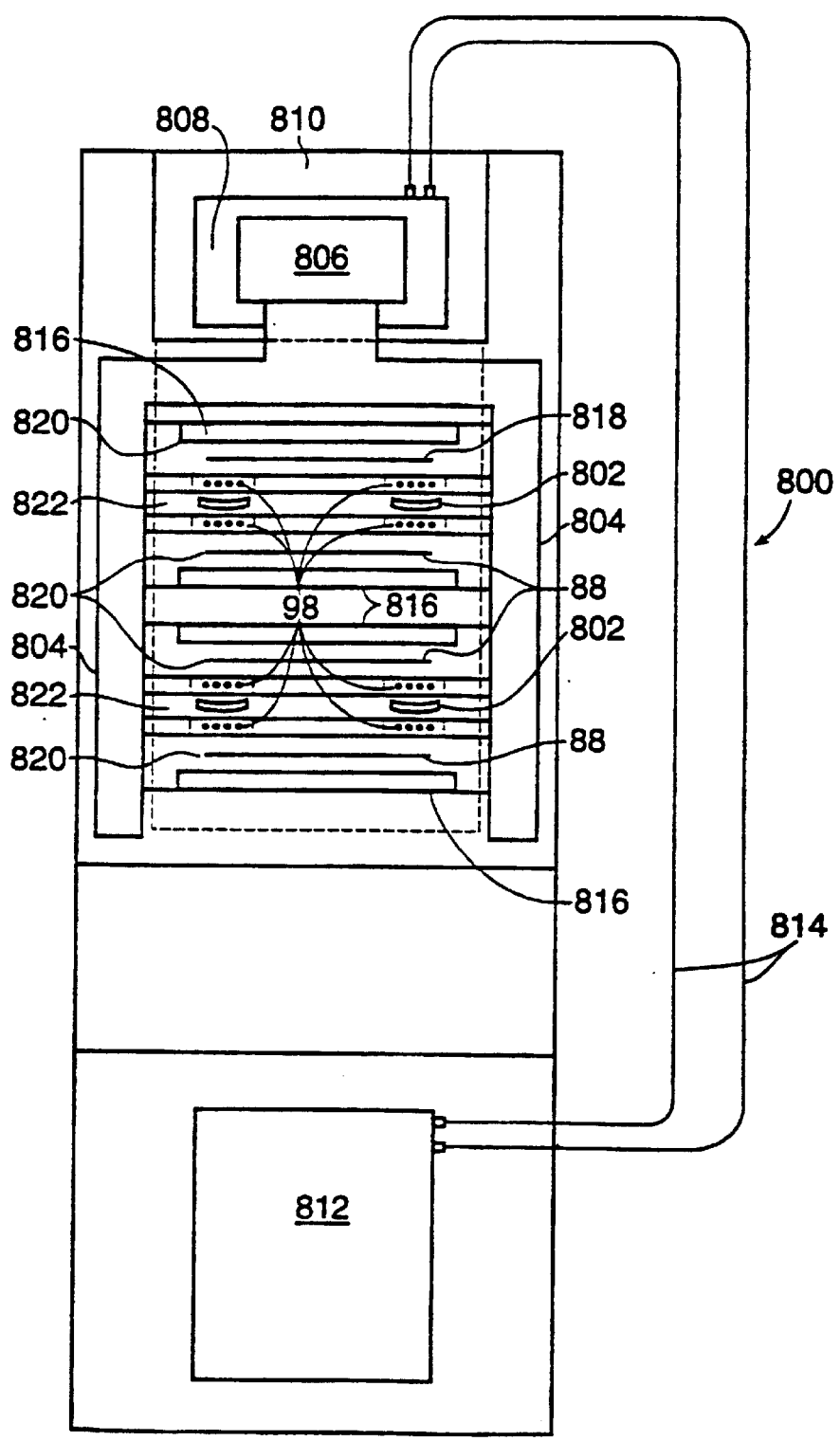
FIG. 14 is a schematic view of the front of a lens curing apparatus.
Figure 15:
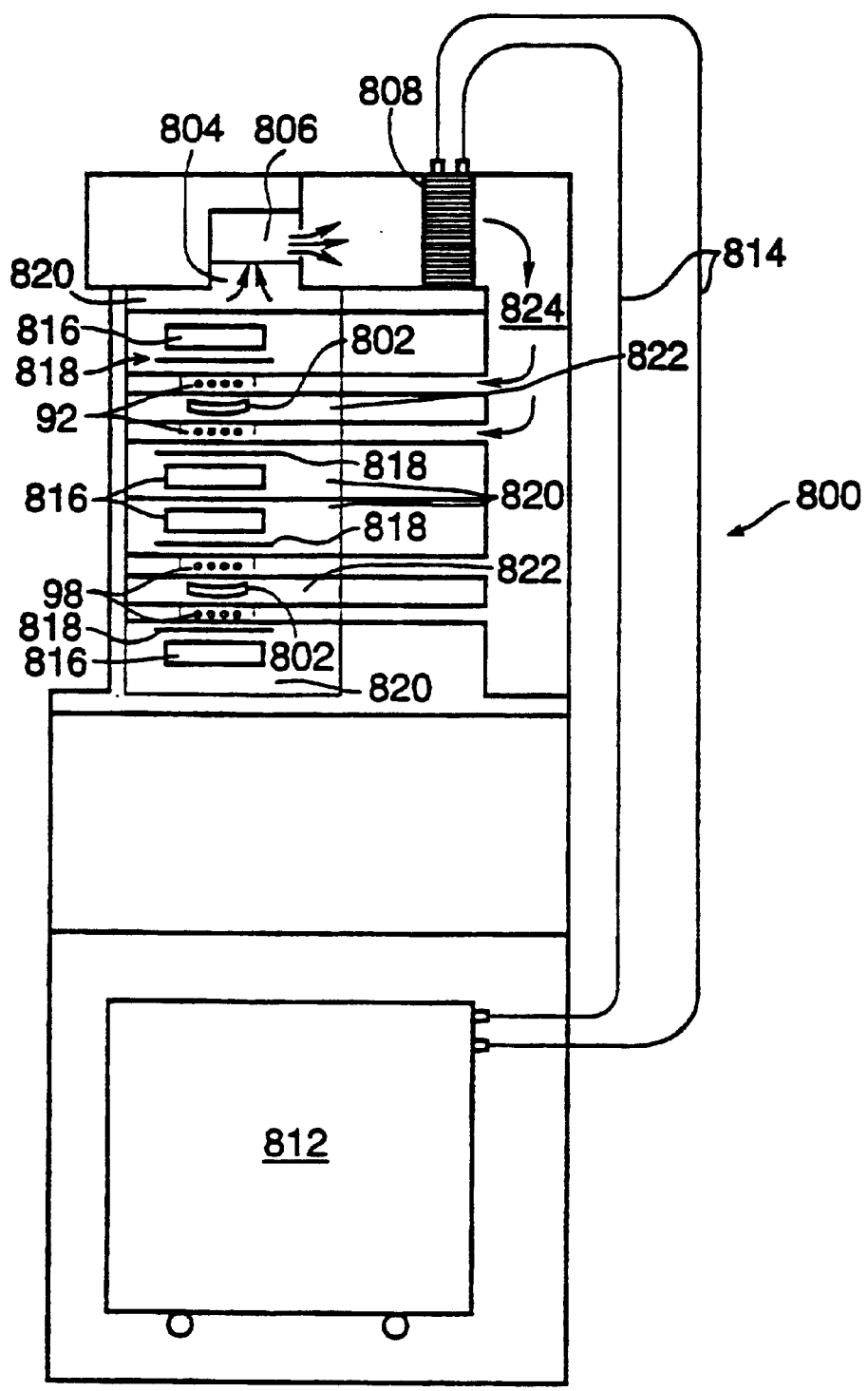
FIG. 15 is a schematic view of the side of a lens curing apparatus.

A liquid lens forming composition was initially cured as in a process and apparatus similar to that specified in Example 1. The composition was substantially the same as specified in Example 1, with the exception that hydroquinone was absent, the concentration of methylethylhydroquinone was about 25–45 ppm, the concentration of 1 hydroxycyclohexyl phenyl ketone was 0.017 percent, and the concentration of methylbenzoylformate was 0.068 percent. The composition underwent the initial 15 minute cure under the "1st UV." The apparatus was substantially the same as described for the above Example 1, with the following exceptions:

1. The air flowrate on each side of the lens mold assembly was estimated to be about 18–20 cubic feet per minute.
2. The apparatus was modified in that air flowed to and from the openings 96 and orifices 98 (which were themselves substantially unchanged) through a duct behind the lens forming chamber, instead of through pipes (e.g. pipe 12 in FIG. 5). Essentially plenum portion 95 was expanded so that the walls of the chamber are the walls of the plenum portion 95. FIG. 14 depicts a front view of this lens curing apparatus 800. Air in apparatus 800 flows from the orifices 98, over the lens mold assembly 802, through ducts 804, through fan 806, through heat exchanger 808, and then through ducts 810 and back to orifices 98 via air return conduits 824 (shown on FIG. 15). FIG. 14 also shows a water chiller 812 which cools water and then sends it through conduits 814 and through heat exchanger 808. FIG. 14 also shows lights 816 and frosted glass 818. The chamber 820 surrounding lights 816 is not connected to the chamber 822 around the mold assembly 802. In this manner chilled air from orifices 98 does not contact and cool the lights 816 (such cooling tends to cause excessive changes in light output). The chamber 820 is cooled by fans (not shown) which turn on and off depending on the temperature of the surface of the lights 816. FIG. 15 shows a side view of apparatus 800.

3. The air flowrate in and out of the chamber surrounding the lights was varied in accordance with the surface temperature of lights. The air flowrate was varied in an effort to keep the temperature on the surface of one of the lights between 104.5° F. and 105° F.
4. The ultraviolet light output was controlled to a set point by varying the power sent to the lights as the output of the lights varied.
5. Frosted glass was placed between the lights and the filters used to vary the intensity of the ultraviolet light across the face of the molds. Preferably the glass was frosted on both sides. The frosted glass acts as a diffuser between the lights and these filters. This frosted glass tended to yield better results if it was placed at least about 2 mm from the filter, more preferably about 10–15 mm, more preferably still about 12 mm, from the filter. Frosted glass was found to dampen the effect of the filters. For instance, the presence of the frosted glass reduced the systems' ability to produce different lens powers by varying the light (see Example 1 and FIG. 1).
6. In FIG. 3 the center lights 40 are shown in a triangular arrangement when viewed from the side. These lights were rearranged to provide an in-line arrangement.

After initial cure, the lens mold assembly was removed from the curing chamber. The lens mold assembly included a lens surrounded by a front mold, a back mold, and a gasket between the front and back molds (see, e.g., the assembly in FIG. 6).

At this point the protocol in Example 1 stated that the lens was demolded (see above). While demolding at this point is possible, as stated above generally some liquid lens forming composition remained, especially in areas of the lens proximate the gasket. Therefore the lens was not demolded as stated in Example 1. Instead, the gasket was removed, liquid lens forming composition was wiped off the edges of the lens, and a layer of oxygen barrier (Parafilm M) with photoinitiator was wrapped around the edges of the lens while the lens was still between the molds. The Parafilm M was wrapped tightly around the edges of the lens and then stretched so that it would adhere to the lens and molds (i.e. in a manner similar to that of Saran wrap). The lens mold assembly was then placed in apparatus 600 so that the back face of the lens (while between the molds) could then be exposed to second ultraviolet light.

This second ultraviolet light was at a substantially higher intensity than the initial cure light, which was directed at an intensity of less than 10 mW/cm$^2$. The mold assembly was passed in and out of second chamber 604 in FIG. 10 (i.e., a UVEXS Model 912) when the light was set at the high setting. Passing in and out of the chamber took about 22 seconds. The total light energy applied during these 22 seconds was about 4500 millijoules per square centimeter ("mJ/cm$^2$").

Preferably the total light energy applied per pass under the second and third ultraviolet ray lights was in the range of about 500–10,000 mJ/cm$^2$, more preferably about 3000–6000 mJ/cm$^2$, and more preferably still 4000–5000 mJ/cm$^2$. Light energy may be varied by varying the time of exposure, or the intensity of the light. Light energy was measured with a Model IL390B Light Bug from International Light, Inc. (Newburyport, Mass., U.S.A.). The total light energy represents the total amount of ultraviolet light over the range of 250 to 400 nm.

It has been found that applying ultraviolet light at this point helped to cure some or all of the remaining liquid lens forming composition. The second ultraviolet light step may be repeated. In this example the second ultraviolet light step was repeated once. It is also possible to expose the front or both sides of the lens to the second ultraviolet light.

After the second ultraviolet light was applied, the mold. assembly was allowed to cool. The reactions caused by exposure to ultraviolet light are exothermic. The ultraviolet lights also tend to emit infra-red light which in turn heats the mold assembly. The lens was then demolded. The demolded lens was substantially drier and harder than lenses that are directly removed from mold assemblies after the initial cure step.

OXYGEN BARRIER EXAMPLE #2

The protocol of Oxygen Barrier Example #1 was repeated except that prior to removal of the gasket the lens mold assembly was positioned so that the back face of the lens was exposed to third ultraviolet light. In this case the third ultraviolet light was at the same intensity and for the same time period as one pass of the second ultraviolet light. It has been found that applying third ultraviolet light at this point helped to cure some or all of the remaining liquid lens forming composition so that when the gasket was removed less liquid lens forming composition was present. All of the remaining steps in Oxygen Barrier Example #1 were applied, and the resultant lens was substantially dry when removed from the molds.

CONDUCTIVE HEATING

An embodiment of the invention relates to postcuring a polymerized lens contained in a mold cavity by applying conductive heat to at least one of the molds that form the mold cavity, prior to demolding the lens.

More particularly, one embodiment of the invention includes the following: (1) placing a liquid lens forming composition in a mold cavity defined by at least a first mold member and a second mold member, (2) directing ultraviolet rays toward at least one of the mold members to cure the lens forming composition so that it forms a lens with a back face, edges, and a front face, (3) applying a mold member of the mold cavity to a substantially solid conductive heat source; and (4) conductively applying heat to a face of the lens by (a) conductively transferring heat to a face of a mold member from the conductive heat source, and (b) conductively transferring heat through such mold member to the face of the lens.

Figure 11:
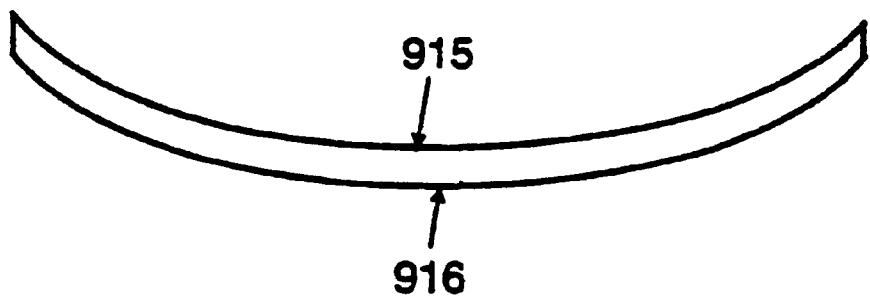
FIG. 11 is a view of an embodiment of a lens.
Figure 16:
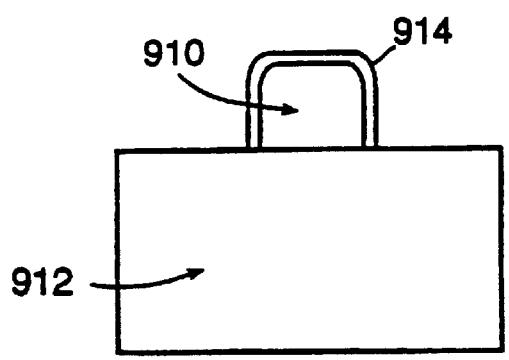
FIG. 16 is a view of an embodiment of a heat source and a heat distributor.
Figure 19:
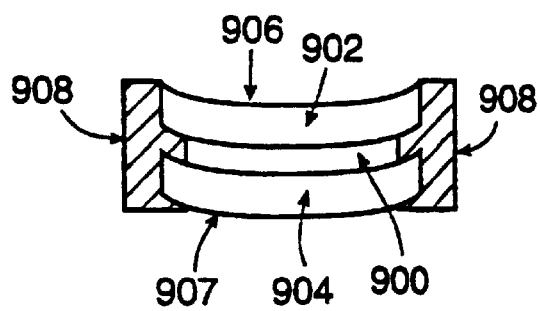
FIG. 19 is a view of an embodiment of two mold members and a gasket.

In an embodiment described as follows, a lens cured by exposure to ultraviolet light is further processed by conductive heating. Such conductive heating tends to enhance the degree of cross-linking in the lens and to increase the tintability of the lens. A lens forming material is placed in mold cavity 900 (illustrated in FIG. 19), which is defined by at least first mold member 902 and second mold member 904. Ultraviolet rays are directed toward at least one of the mold members, thereby curing the lens forming material to a lens. Heat distributor 910 (shown in FIG. 16) may be adapted to distribute conductive heat from conductive heat source 912 to at least one mold member. Heat distributor 910 is preferably flexible such that at least a portion of it may be shaped to substantially conform to the shape of face 906 or face 907 of first mold member 902 or second mold member 904, respectively. Heat distributor 910 is preferably placed in contact with conductive heat source 912, and mold member 902 is placed on heat distributor 910 such that face 906 of the mold member rests on top of the heat distributor 910. Heat distributor 910 may be coupled to heat source 912. Heat is conductively applied to the heat distributor 910 by the heat source 912. Heat is conducted from the heat distributor 910 through the mold member to a face of the lens. The heat distributor may be shaped to accommodate face 906 of first mold member 902 or face 907 of second mold member 904 such that the heat is applied to front face 916 or back face 915 of the lens (shown in FIG. 11). The temperature of heat source 912 may be thermostatically controlled.

Figure 17:
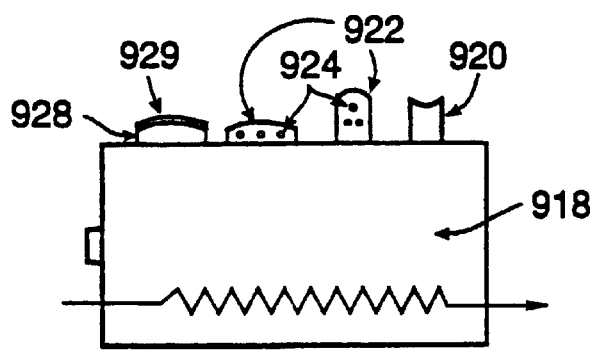
FIG. 17 is a view of various embodiments of a heat source and heat distributors.
Figure 18:
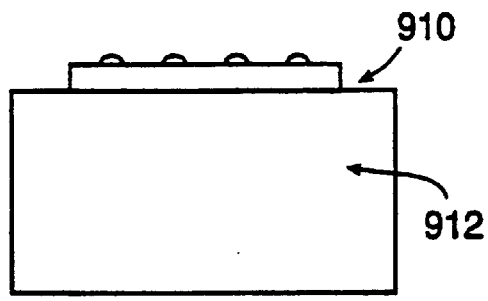
FIG. 18 is a view of an embodiment of a heat source and a heat distributor.

In an embodiment, hot plate 918 (shown in FIG. 17) is used as a heat source to provide conductive heat to the lens. A number of other heat sources may be used. In an embodiment, heat distributor 910 may include countershape 920. Countershape 920 may be placed on top of the hot plate to distribute conductive heat from the hot plate. The countershape is preferably flexible such that at least a portion of it may substantially conform to the shape of an outside face of a mold member. The countershape may be hemispherical and either convex or concave depending upon whether the surface of the mold assembly to be placed upon it is convex or concave. For example, when the concave surface of the back mold is utilized to conduct heat into the lens assembly, a convex countershape is provided to rest the assembly on.

Countershape 920 may include a glass mold, a metal optical lap, a pile of hot salt and/or sand, or any of a number of other devices adapted to conduct heat from heat source 912. It should be understood that FIG. 17 includes combinations of a number of embodiments for illustrative purposes. Any number of identical or distinct countershapes may be used in combination on top of a heat source. In an embodiment, a countershape includes a container 922 filled with particles 924. The particles preferably include metal or ceramic material. Countershape 920 may include heat distributor 910. A layer 914 of material may be placed over the countershape 920 or heat distributor 910 to provide slow, smooth, uniform heat conduction into the lens mold assembly. This layer preferably has a relatively low heat conductivity and may be made of rubber, cloth, Nomex™ fabric or any other suitable material that provides slow, smooth, uniform conduction.

In an embodiment, countershape 920 includes layer 914 (e.g., a bag or container) filled with particles 924 such that the countershape may be conveniently shaped to conform to the shape of face 906 or face 907. In an embodiment, the countershape is essentially a "beanbag" that contains particles 924 and is conformable to the shape of a mold face placed on top of it. Particles 924 may include ceramic material, metal material, glass beads, sand and/or salt. The particles preferably facilitate conductive heat to be applied to face 906 or face 907 substantially evenly.

In an embodiment, the countershape 920 is placed on top of heat source 912 for a sufficient time for a portion of the countershape to attain a temperature substantially near or equal to the temperature on the surface of the heat source. The countershape may then be "flipped over" such that the heated portion of the countershape that has a temperature substantially near or equal to that of the surface of the heat source is exposed. A mold may be placed on top of the heated portion of the countershape, and the countershape is preferably conformed to the shape of the face of the mold. In this manner, the rate of conductive heat transfer to the lens may begin at a maximum. Heat is preferably conductively transferred through the countershape and the mold face to a face of the lens. The temperature of the heated portion of the countershape may tend to decrease after the mold is placed onto the countershape.

In an embodiment, heat distributor 910 may partially insulate a mold member from conductive heat source 912. The heat distributor preferably allows a gradual, uniform transfer of heat to the mold member. The heat distributor is preferably made of rubber and/or another suitable material. The heat distributor may include countershapes of various shapes (e.g., hemispherically concave or convex) and sizes that are adapted to contact and receive mold members.

Figure 8:
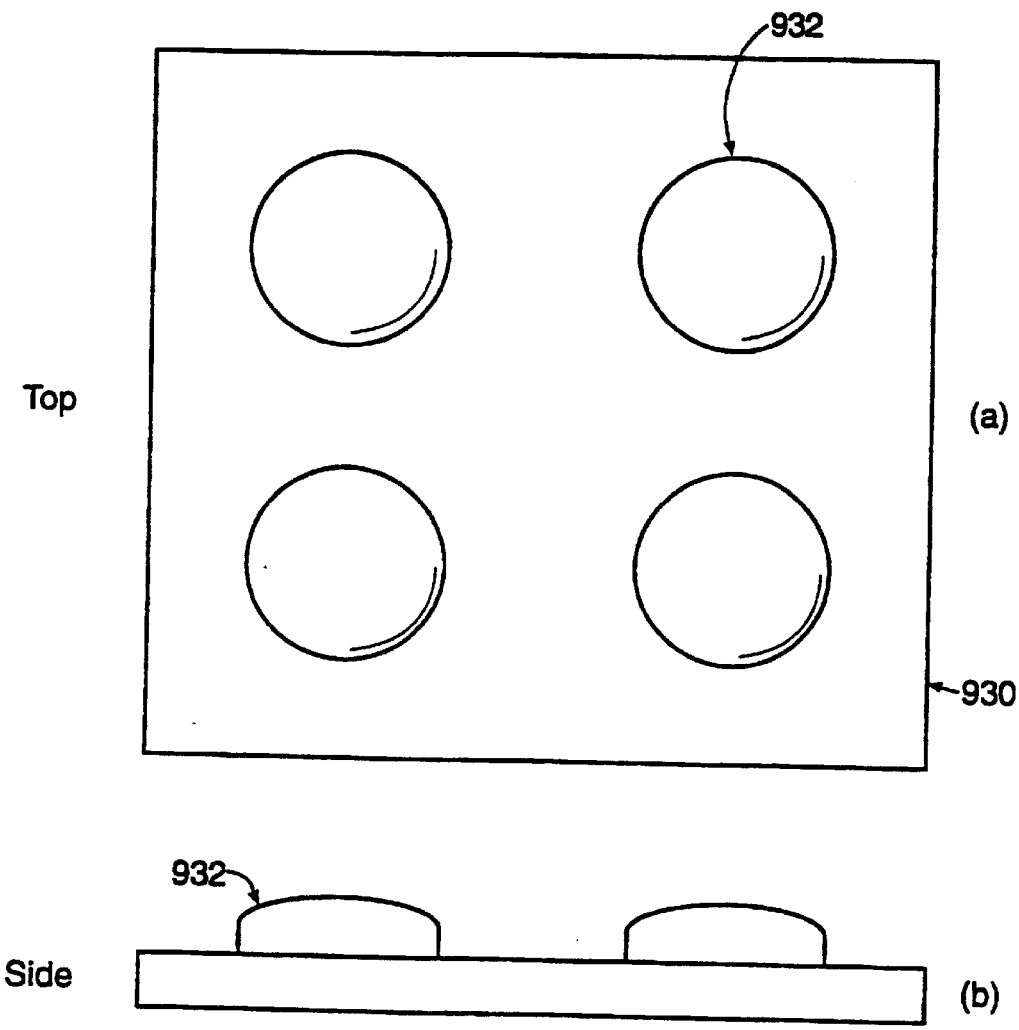
FIGS. 8(a) and 8(b) is a top and side view of an embodiment of a heat distributor to be placed between a heat source and a mold surface.

In an embodiment, hot plate cover 930 (shown in FIG. 8) is used to distribute conductive heat to face 906 of mold member 902. Cover 930 is adapted to rest directly upon hot plate 918 (or any other heat source). Cover 930 preferably includes portion 932, which is substantially conformed to the shape of face 906. Portion 932 preferably includes a convex surface or a concave surface (not shown) adapted to receive face 906. Portion 932 is preferably made of rubber and causes slow, uniform transfer of conductive heat to face 906. In an embodiment, a hot plate cover having concave indentations substantially conformed to the shape of face 907 is used to distribute heat through a mold member to a lens.

In an embodiment, heat is conductively applied by the heat source to only one outside face of one mold member. This outside face may be face 906 or face 907. Heat may be applied to back face 915 of the lens to enhance crosslinking and/or tintability of the lens material proximate to the surface of the back face of the lens.

In a preferred embodiment, thermostatically controlled hot plate 918 is used as a heat source. Glass optical mold 928 is preferably placed convex side up on hot plate 918 to serve as a countershape. The glass optical mold preferably has about an 80 mm diameter and a radius of curvature of about 93 mm. Rubber disc 929 may be placed over this mold 928 to provide uniform conductive heat to the lens mold assembly. The rubber disc is preferably made of silicone and preferably has a diameter of approximately 74 mm and a thickness of about 3 mm. The lens mold assembly preferably is placed on mold 928 so that outside face 906 of a mold member of the assembly rests on top of mold 928. It is preferred that the edge of the lens mold assembly not directly contact the hot plate. The lens mold assembly preferably receives heat through the rubber disc and not through its mold edges.

To achieve good yield rates and reduce the incidence of premature release while using the conductive heat method, it may be necessary for the edge of the lens be completely cured and dry before conductive heat is applied. If the lens edge is incompletely cured (i.e., liquid or gel is still present) while conductive heat is applied, there may be a high incidence of premature release of the lens from the heating unit.

In an embodiment, the edges of a lens are treated to cure or remove incompletely cured lens forming material (see above description) before conductive heat is applied. The mold cavity may be defined by at least gasket 908, first mold member 902, and second mold member 904. Ultraviolet rays are directed toward at least one of the mold members, thereby curing the lens forming material to a lens preferably having front face 916, a back face 915, and edges. Upon the formation of the lens, the gasket may be removed from the mold assembly. An oxygen barrier may be used to cure any remaining liquid or gel on the lens edge according to any of the methods of the above-detailed embodiments. An oxygen barrier treated with photoinitiator is preferably employed. Alternatively, any remaining liquid or gel may be removed manually. Once the edge of the lens is dry, a face of the lens may be conductively heated using any of the methods described herein.

In an embodiment, a lens is tinted after receiving conductive heat postcure treatment in a mold cavity. During tinting of the lens, the lens is preferably immersed in a dye solution.

CONDUCTIVE HEATING EXAMPLE

A liquid lens forming composition was initially cured in a process and apparatus similar to that specified in Example 1 except for post-cure treatment which was conducted as follows: After the sample was irradiated for 15 minutes, the lens was removed from the FC-104 chamber and then passed through the above-mentioned UVEXS Model 912 curing chamber (see FIG. 10) to receive a dose of about 1500 mJ/cm$^2$ (+/−100 mJ) of ultraviolet light per pass. The gasket was then removed from the mold assembly and the edges of the mold were wiped with an absorbent tissue to remove incompletely cured lens forming material proximate the mold edges. A strip of plastic material impregnated with photoinitiator was wrapped around the edges of the molds that were exposed when the gasket was removed. Next, the mold assembly was passed through the UVEXS curing chamber once to expose the front surface of the mold to a dose of about 1500 mJ/cm$^2$. The mold assembly was then passed through the UVEXS four more times, with the back surface of the mold receiving a dose of about 1500 mJ/cm$^2$ per pass. A hot plate was operated such that the surface of the hot plate reached a temperature of 340 degrees F (+/−50 degrees F). A conformable "beanbag" container having a covering made of Nomex™ fabric was placed on the hot plate. The container contained glass beads and was turned over such that the portion of the container that had directly contacted the hot plate (i.e., the hottest portion of the container) faced upward and away from the hot plate. The mold assembly was then placed onto the heated, exposed portion of the container that had been in direct contact with the hot plate. The concave, non-casting face of the mold was placed onto the exposed surface of the container which substantially conformed to the shape of the face. Heat was conducted through the container and the mold member to the lens for 13 minutes. A lens having a Shore D hardness of 84 was formed.

PULSED ULTRAVIOLET LIGHT APPLICATION

A polymerizable lens forming composition may be placed in a mold/gasket assembly and continuously exposed to appropriate levels of ultraviolet light to cure the composition to an optical lens. The progress of the curing reaction may be determined by monitoring the internal temperature of the composition. The lens forming composition may be considered to pass through three stages as it is cured: (1) Induction, (2) Gel Formation & Exotherm, and (3) Extinction. These stages are illustrated in FIG. 20 for a −0.75−1.00 power lens cured by continuous application of UV light. FIG. 20 shows temperature within the mold cavity as a function of time throughout a continuous radiation curing cycle.

The induction stage occurs at the beginning of the curing cycle and is typically characterized by a substantially steady temperature (or falling temperature when the curing chamber temperature is below that of the composition) of the lens forming composition as it is irradiated with ultraviolet light. During the induction period, the lens forming composition remains in a liquid state as the photoinitiator breaks down and consumes inhibitor and dissolved oxygen present in the composition. As the inhibitor content and oxygen content of the composition fall, decomposing photoinitiator and the composition begin to form chains to produce a pourable, "syrup-like" material.

As irradiation continues, the "syrup" proceeds to develop into a soft, non-pourable, viscous, gel. A noticeable quantity of heat will begin to be generated during this soft gel stage. The optical quality of the lens may be affected at this point. Should there be any sharp discontinuities in the intensity of the activating ultraviolet light (for example, a drop of composition on the exterior of a mold which focuses light into a portion of the lens forming composition, proximate the drop), a local distortion will tend to be created in the gel structure, likely causing an aberration in the final product. The lens forming composition will pass through this very soft gel state and through a firm gel state to become a crystalline structure. When using OMB-91 lens forming composition, a haze tends to form momentarily during the transition between the gel and crystalline stages. As the reaction continues and more double bonds are consumed, the rate of reaction and the rate of heat generated by the reaction will slow, which may cause the internal temperature of the lens forming composition to pass through a maximum at the point where the rate of heat generation exactly matches the heat removal capacity of the system.

By the time the maximum temperature has been reached and the lens forming composition begins to cool, the lens will typically have achieved a crystalline form and will tend to crack rather than crumble if it is broken. The rate of conversion will slow dramatically and the lens may begin to cool even though some reaction still may be occurring. Irradiation may still be applied through this extinction phase. Generally, the curing cycle is assumed to be complete when the temperature of the lens forming composition falls to a temperature near its temperature at the beginning of exotherm (i.e., the point where the temperature of the composition increased due to the heat released by the reaction).

The continuous irradiation method tends to work well for relatively low mass lenses (up to about 20–25 grams) under the FC-104 curing chamber conditions (see, e.g., U.S. Pat. Nos. 5,364,256 and 5,415,816). As the amount of material being cured increases, problems may be encountered. The total amount of heat generated during the exothermic phase is substantially proportional to the mass of the lens forming material. During curing of relatively high mass lenses, a greater amount of heat is generated per a given time than during curing of lower mass lenses. The total mold/gasket surface area available for heat transfer (e.g., heat removal from the lens forming composition), however, remains substantially constant. Thus the internal temperature of a relatively high mass of lens forming material may rise to a higher temperature more rapidly than typically occurs with a lower mass of lens forming material. For example, the internal temperature of a low minus cast-to-finish lens typically will not exceed about 100° F., whereas certain thicker semi-finished lens "blanks" may attain temperatures greater than about 350° F. when continually exposed to radiation. The lens forming material tends to shrink as curing proceeds and the release of excessive heat during curing tends to reduce the adhesion between the mold and the lens forming material. These factors may lead to persistent problems of premature release and/or cracking during the curing of lens forming material having a relatively high mass.

A significant advantage of the present invention is the production of relatively high-mass, semi-finished lens blanks and high power cast-to-finish lenses without the above-mentioned problems of premature release and cracking. Methods of the present invention as described below allow even more control over the process of curing ophthalmic lenses with ultraviolet light-initiated polymerization than previous methods. By interrupting or decreasing the activating light at the proper time during the cycle, the rate of heat generation and release can be controlled and the incidence of premature release can be reduced. An embodiment of the invention relates to a method of controlling the rate of reaction (and therefore the rate of heat generation) of a UV light-curable, lens forming material by applying selected intermittent doses (e.g., pulses) of radiation followed by selected periods of decreased UV light or "darkness". It is to be understood that in the description that follows, "darkness" refers to the absence of activating radiation, and not necessarily the absence of visible light.

More particularly, an embodiment of the invention relates to: (a) an initial exposure period of the lens forming material to radiation (e.g., continuous or pulsed radiation) extending through the induction period, (b) interrupting or decreasing the irradiation before the material reaches a first temperature (e.g., the maximum temperature the composition could reach if irradiation were continued) and allowing the reaction to proceed to a second temperature lower than the first temperature, and (c) applying a sufficient number of alternating periods of exposure and decreased UV light or darkness to the lens forming material to complete the cure while controlling the rate of heat generation and/or dissipation via manipulation of the timing and duration of the radiation, or the cooling in the curing chamber. FIG. 21 shows the temperature within the mold cavity as a function of time for both (a) continuous ultraviolet light exposure and (b) pulsed ultraviolet light exposure.

In the context of this application, a "gel" occurs when the liquid lens forming composition is cured to the extent that it becomes substantially non-pourable, yet is still substantially deformable and substantially not crystallized.

In the following description, it is to be understood that the term "first period" refers to the length of time of the initial exposure period where radiation (e.g., in pulses) is applied to the lens forming composition, preferably to form at least a portion of the composition into a gel. "First ultraviolet" rays or light refers to the radiation applied to the lens forming composition during the initial exposure period. "Second ultraviolet" rays or light refers to the radiation that is applied to the lens forming composition (e.g., in pulses) after the composition has been allowed to cool to the "third temperature" mentioned above. "Second period" refers to the duration of time that second ultraviolet rays are directed to the lens forming composition. "Third period" refers to the duration of decreased UV light or darkness than ensues after UV light has been delivered in the second period.

In an embodiment of the invention, the lens forming material is placed in a mold cavity defined in part between a first mold member and a second mold member. The first mold member and/or second mold member may or may not be continuously cooled as the formation of the lens is completed during the second period and/or third period. One method of removing heat from the lens forming material is to continuously direct air at a non-casting face of at least one of the mold members. It is preferred that air be directed at both the first and second mold members. A cooler may be used to cool the temperature of the air to a temperature below ambient temperature, more preferably between about 0° C. and about 20° C., and more preferably still between about 3° C. and about 15° C. Air may also be used to cool at least one of the mold members (in any of the manners described previously) during the first period.

In an embodiment of the invention, the first period ends when at least a portion of the lens forming composition begins to increase in temperature or form a gel, and the first ultraviolet rays are decreased or removed (e.g., blocked) such that they cease to contact the first or second mold members. It is preferred that the first period be sufficient to allow the lens forming material to gel in the mold cavity such that there is substantially no liquid present (except small amounts proximate the edge of the material). The interruption of irradiation prior to complete gelation may in some circumstances produce optical distortions. It is preferred that the length of the first period be selected to inhibit the lens forming composition from reaching a first temperature. The first temperature is preferably the maximum temperature that the lens forming composition could reach if it was irradiated under the system conditions (e.g., flow rate and temperature of any cooling air, wavelength and intensity of radiation) until the "exothermic potential" (i.e., ability to evolve heat through reaction) of the composition was exhausted.

According to an embodiment of the invention, the reactions within the composition are allowed to proceed after the first ultraviolet rays are removed until the composition reaches a second temperature. The second temperature is preferably less than the first temperature. The first temperature is preferably never reached by the composition. Thus, preferably the composition is prevented from achieving the first temperature and then cooling to the second temperature. The composition preferably is allowed to cool from the second temperature to the third temperature. This cooling may occur "inactively" by allowing heat to transfer to the ambient surroundings, or at least one of the mold members may be cooled by any of the methods described above.

In an embodiment of the invention, the curing of the lens forming material is completed by directing second ultraviolet rays (e.g., in pulses) toward at least one of the mold members. The second UV rays may be directed toward the mold member(s) for a second period that may be determined according to the rate of reaction of the lens forming composition. The change in temperature of the composition or a portion of the mold cavity, or the air in or exiting the chamber is an indicator of the rate of reaction, and the second period may be determined accordingly. The second period may be varied such that subsequent pulses have a longer or shorter duration than previous pulses. The time between pulses (i.e., the third period) may also be varied as a function of the temperature and/or reaction rate of the composition. To achieve a light pulse, (a) the power to a light source may be turned on and then off, (b) a device may be used to alternately transmit and then block the passage of light to the lens forming composition, or (c) the light source and/or mold assembly may be moved to inhibit ultraviolet light from contacting the lens forming material. The second and/or third periods are preferably controlled to allow rapid formation of a lens while reducing the incidence of (a) premature release of the lens from the first and/or second mold member and/or (b) cracking of the lens.

In an embodiment, the second period is preferably controlled to inhibit the temperature of the composition from exceeding the second temperature. The temperature of the lens forming composition may continue to increase after radiation is removed from the first and/or second mold members due to the exothermic nature of reactions occurring within the composition. The second period may be sufficiently brief such that the pulse of second ultraviolet rays is removed while the temperature of the composition is below the second temperature, and the temperature of the composition increases during the third period to become substantially equal to the second temperature at the point that the temperature of the composition begins to decrease.

In an embodiment, the third period extends until the temperature of the composition becomes substantially equal to the third temperature. Once the temperature of the composition decreases to the third temperature, a pulse of second ultraviolet rays may be delivered to the composition. In an embodiment, the second period remains constant, and the third period is controlled to maintain the temperature of the composition below the second temperature. The third period may be used to lower the temperature of the composition to a temperature that is expected to cause the composition to reach but not exceed the second temperature after a pulse is delivered to the composition.

Figure 7:
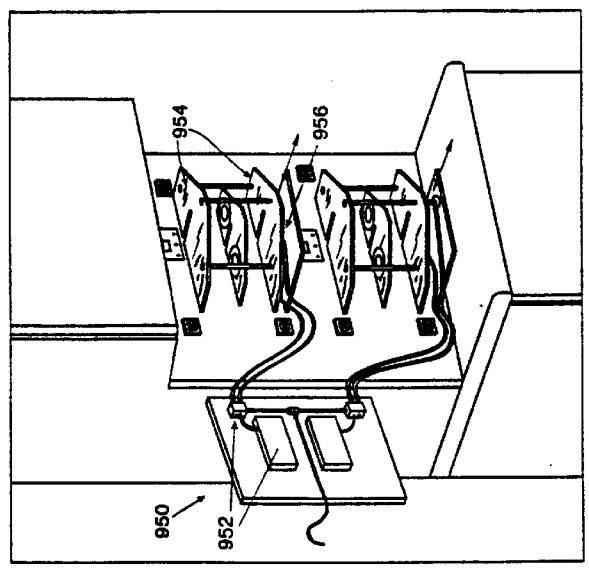
FIG. 7 is a view of an embodiment of a shutter system.

In an embodiment, shutter system 950 (shown in FIG. 7) is used to control the application of first and/or second ultraviolet rays to the lens forming material. Shutter system 950 preferably includes air-actuated shutter plates 954 that may be inserted into the curing chamber to prevent ultraviolet light from reaching the lens forming material. Shutter system 950 may include programmable logic controller 952, which may actuate air cylinder 956 to cause shutter plates 954 to be inserted or extracted from the curing chamber. Programmable logic controller 952 preferably allows the insertion and extraction of shutter plates 954 at specified time intervals. Programmable logic controller 952 may receive signals from thermocouple(s) located inside chamber, proximate at least a portion the mold cavity, or located to sense the temperature of air in or exiting the chamber, allowing the time intervals in which the shutters are inserted and/or extracted to be adjusted as a function of a temperature within the curing chamber. The thermocouple may be located at numerous positions proximate the mold cavity and/or casting chamber.

The wavelength and intensity of the second ultraviolet rays are preferably substantially equal to those of the first ultraviolet rays. It may be desirable to vary the intensity and/or wavelength of the radiation (e.g, first or second ultraviolet rays). The particular wavelength and intensity of the radiation employed may vary among embodiments according to such factors as the identity of the composition and curing cycle variables.

Numerous curing cycles may be designed and employed. The design of an optimal cycle should include consideration of a number of interacting variables. Significant independent variables include: 1) the mass of the sample of lens forming material, 2) the intensity of the light applied to the material, 3) the physical characteristics of the lens forming material, and 4) the cooling efficiency of the system. Significant curing cycle (dependent) variables include: 1) the optimum initial exposure time for induction and gelling, 2) the total cycle time, 3) the time period between pulses, 4) the duration of the pulses, and 5) the total exposure time.

Most of the experiments involving methods of the present invention were conducted using below described OMB-91 monomer and the above-mentioned FC-104 curing chamber set at an operating temperature of 55 degrees F, although tests have been performed using other lens forming materials and curing chamber temperatures. The OMB-91 formulation and properties are listed below.

| OMB-91 FORMULATION: | |
|---|---|
| INGREDIENT | WEIGHT PERCENT |
| Sartomer SR 351 (Trimethylolpropane Triacrylate) | 20.0 +/− 1.0 |
| Sartomer SR 268 (Tetraethylene Glycol Diacrylate) | 21.0 +/− 1.0 |
| Sartomer SR 306 (Tripropylene Glycol Diacrylate) | 32.0 +/− 1.0 |
| Sartomer SR 239 (1,6 Hexanediol Dimethacrylate) | 10.0 +/− 1.0 |
| (Bisphenol A Bis(Allyl Carbonate)) | 17.0 +/− 1.0 |
| Irgacure 184 (1-Hydroxycyclohexyl Phenyl Ketone | 0.017 +/− 0.0002 |
| Methyl Benzoyl Formate | 0.068 +/− 0.0007 |
| Methyl Ester of Hydroquinone ("MeHQ") | 35 ppm +/− 10 ppm |
| Thermoplast Blue P (9,10-Anthracenedione, 1-hydroxy-4-((4-methyl phenyl) Amino) | 0.35 ppm +/− 0.1 ppm |

| MEASUREMENTS/PROPERTIES: | |
|---|---|
| PROPERTY | PROPOSED SPECIFICATION |
| Appearance | Clear Liquid |
| Color | |
| (APHA) | 50 maximum |
| (Test Tube Test) | Match Standard |
| Acidity (ppm as Acrylic Acid) | 100 maximum |
| Refractive Index | 1.4725 +/− 0.002 |
| Density | 1.08 +/− 0.005 gm/cc. at 23 degrees C. |
| Viscosity @ 22.5 Degrees C. | 27.0 +/− 2 centipoise |
| Solvent Weight (wt %) | 0.1 Maximum |
| Water (wt %) | 0.1 Maximum |
| MeHQ (from HPLC) | 35 ppm +/− 10 ppm |

It is recognized that methods and systems of the present invention could be applied to a large variety of radiation-curable, lens forming materials in addition to those mentioned herein. It should be understood that adjustments to curing cycle variables (particularly the initial exposure time) may be required even among lens forming compositions of the same type due to variations in inhibitor levels among batches of the lens forming compositions. In addition, changes in the heat removal capacity of the system may require adjustments to the curing cycle variables (e.g. duration of the cooling periods between radiation pulses). Changes in the cooling capacity of the system and/or changes in compositions of the lens forming material may require adjustments to curing cycle variables as well.

Significant variables impacting the design of a pulsed curing cycle include (a) the mass of the material to be cured and (b) the intensity of the light applied to the material. A significant aspect of methods of the present invention is the initial exposure period. If a sample is initially overdosed with radiation, the reaction may progress too far and increase the likelihood of premature release and/or cracking. If a sample is underdosed initially in a fixed (i.e., preset) curing cycle, subsequent exposures may cause too great a temperature rise later in the cycle, tending to cause premature release and/or cracking. Additionally, if the light intensity varies more than about +/−10% in a cycle that has been designed for a fixed light intensity level and/or fixed mass of lens forming material, premature release and/or cracking may result.

An embodiment of the present invention involves a curing cycle having two processes. A first process relates to forming a dry gel by continuously irradiating a lens forming composition for a relatively long period. The material is then cooled down to a lower temperature under darkness. A second process relates to controllably discharging the remaining exothermic potential of the material by alternately exposing the material to relatively short periods of irradiation and longer periods of decreased irradiation (e.g., dark cooling).

The behavior of the lens forming material during the second process will depend upon the degree of reaction of the lens forming material that has occurred during the first process. For a fixed curing cycle, it is preferable that the extent of reaction occurring in the first process consistently fall within a specified range. If the progress of reaction is not controlled well, the incidence of cracking and/or premature release may rise. For a curing cycle involving a composition having a constant level of inhibitor and initiator, the intensity of the radiation employed is the most likely source of variability in the level of cure attained in the first process. Generally, a fluctuation of +/−5% in the intensity tends to cause observable differences in the cure level achieved in the first process. Light intensity variations of +/−10% may significantly reduce yield rates.

The effect of various light intensities on the material being cured depends upon whether the intensity is higher or lower than a preferred intensity for which the curing cycle was designed. FIG. 23 shows temperature profiles for three embodiments in which different light levels were employed. If the light intensity to which the material is exposed is higher than a preferred intensity, the overdosage may cause the reaction to proceed too far. In such a case, excessive heat may be generated, increasing the possibility of cracking and/or premature release during the first process of the curing cycle. If premature release or cracking of the overdosed material does not occur in the first process, then subsequent pulses administered during the second process may create very little additional reaction.

If the light intensity is lower than a preferred intensity and the lens forming material is underdosed, other problems may arise. The material may not be driven to a sufficient level of cure in the first process. Pulses applied during the second process may then cause relatively high amounts of reaction to occur, and the heat generated by reaction may be much greater than the heat removal capacity of the system. Thus the temperature of the lens forming material may tend to excessively increase. Premature release may result. Otherwise, undercured lenses that continue generating heat after the end of the cycle may be produced.

The optimal initial radiation dose to apply to the lens forming material may depend primarily upon its mass. The initial dose is also a function of the light intensity and exposure time. A method for designing a curing cycle for a given mold/gasket/monomer combination may involve selecting a fixed light intensity.

Methods of the present invention may involve a wide range of light intensities. Using a relatively low intensity may allow for the length of each cooling step to be decreased such that shorter and more controllable pulses are applied. Where a fluorescent lamp is employed, the use of a lower intensity may allow the use of lower power settings, thereby reducing the load on the lamp cooling system and extending the life of the lamp. A disadvantage of using a relatively low light intensity is that the initial exposure period tends to be somewhat longer. Relatively high intensity levels tend to provide shorter initial exposure times while placing more demand upon the lamp drivers and/or lamp cooling system, either of which tends to reduce the life of the lamp.

In an embodiment, General Electric F15T8BL lamps powered by Mercron HR0696-4 drivers may be used in conjunction with an FC 104 curing chamber having one piece of double-frosted diffusing glass and one piece of clear P0-4 acrylic plate. The light intensity settings may be 760 microwatts/cm$^2$ for the top lamps and 950 microwatts/cm$^2$ for the bottom lamps.

Once a light intensity is selected, the initial exposure time may be determined. A convenient method of monitoring the reaction during the cycle involves fashioning a fine gage thermocouple, positioning it inside the mold cavity, and connecting it to an appropriate data acquisition system. A preferred thermocouple is Type J, 0.005 inch diameter, Teflon-insulated wire available from Omega Engineering. The insulation is stripped back about 30 to 50 mm and each wire is passed through the gasket wall via a fine bore hypodermic needle. The needle is then removed and the two wires are twisted together to form a thermocouple junction inside the inner circumference of the gasket. The other ends of the leads are attached to a miniature connector which can be plugged into a permanent thermocouple extension cord leading to the data acquisition unit after the mold set is filled.

The data acquisition unit may be a Hydra 2625A Data Logger made by John Fluke Mfg. Company. It is connected to an IBM compatible personal computer running Hydra Data Logger software. The computer is configured to display a trend plot as well as numeric temperature readings on a monitor. The scan interval may be set to any convenient time period and a period of five or ten seconds usually provides good resolution.

The position of the thermocouple junction in the mold cavity may affect its reading and behavior through the cycle. When the junction is located between the front and back molds, relatively high temperatures may be observed compared to the temperatures at or near the mold face. The distance from the edge of the cavity to the junction may affect both absolute temperature readings as well as the shape of the curing cycles' temperature plot. The edges of the lens forming material may begin to increase in temperature slightly later than other portions of the material. Later in the cycle, the lens forming material at the center may be somewhat ahead of the material at the edge and will tend to respond little to the radiation pulses, whereas the material near the edge may tend to exhibit significant activity. When performing experiments to develop curing cycles, it is preferred to insert two probes into the mold cavity, one near the center and one near the edge. The center probe should be relied upon early in the cycle and the edge probe should guide the later stages of the cycle.

Differing rates of reaction among various regions of the lens forming material may be achieved by applying a differential light distribution across the mold face(s). Tests have been performed where "minus type" light distributions have caused the edge of the lens forming material to begin reacting before the center of the material. The potential advantages of using light distributing filters to cure high mass semi-finished lenses may be offset by nonuniformity of total light transmission that tends to occur across large numbers of filters. The UV light transmission of the P0-4 acrylic plates (Cyro Industries; Piano, Tex.) used over the apertures in the FC-104 curing chamber tends to be considerably more consistent than that of silk-screened filter plates.

After the selection and/or configuration of (a) the radiation intensity, (b) the radiation-curable, lens forming material, (c) the mold/gasket set, and (d) the data acquisition system, the optimum initial exposure period may be determined. It is useful to expose a sample of lens forming material to continuous radiation to obtain a temperature profile. This will provide an identifiable range of elapsed time within which the optimal initial exposure time will fall. Two points of interest are the time where the temperature rise in the sample is first detected ("T initial" or "Ti"), and the time where the maximum temperature of the sample is reached ("Tmax"). Also of interest is the actual maximum temperature, an indication of the "heat potential" of the sample under the system conditions (e.g., in the presence of cooling).

As a general rule, the temperature of high mass lenses (i.e., lenses greater than about 70 grams) should remain under about 200° F. and preferably between about 150° F. and about 180° F. Higher temperatures are typically associated with reduced lens yield rates due to cracking and/or premature release. Generally, the lower mass lenses (i.e., lenses no greater than about 45 grams) should be kept under about 150° F. and preferably between about 110° F. and about 140° F.

The first period may be selected according to the mass of the lens forming material. In an embodiment, the lens forming material has a mass of between about 45 grams and about 70 grams and the selected second temperature is a temperature between about 150° F. and about 200° F. According to another embodiment, the lens forming material has a mass no greater than about 45 grams and a second temperature less than about 150° F. In yet another embodiment of the invention, the lens forming material has a mass of at least about 70 grams, and a second temperature between about 170° F. and about 190° F.

An experiment may be performed in which the radiation is removed from the mold members slightly before one-half of the time between T initial and Tmax. The initial exposure time may be interactively reduced or increased according to the results of the above experiment in subsequent experiments to provide a Tmax in a preferred range. This procedure may allow the determination of the optimal initial exposure time for any given mold/gasket set and light intensity.

A qualitative summary of relationships among system variables related to the above-described methods is shown in FIG. 22.

After the initial exposure period, a series of irradiation pulse/cooling steps may be performed to controllably discharge the remaining exothermic potential of the material and thus complete the cure. There are at least two approaches to accomplish this second process. The first involves applying a large number of very short pulses and short cooling periods. The second approach involves applying a fewer number of longer pluses with correspondingly longer cooling periods. Either of these two methods may produce a good product and many acceptable cycles may exist between these extremes.

A significant aspect of the invention relates to using pulsed application of light to produce a large range (e.g., from −6 to +4 diopter) of lenses without requiring refrigerated cooling fluid (e.g., cooled air). With proper light application, air at ambient may be used as a cooling fluid, thus significantly reducing system costs.

Some established cycles are detailed in the table below for three semifinished mold gasket sets: a 6.00 D base curve, a 4.50 D base curve, and a 3.00 D base curve. These cycles have been performed using an FC-104 curing chamber in which cooling air at a temperature of about 56 degrees F was directed at the front and back surfaces of a mold assembly. Frosted diffusing window glass was positioned between the samples and the lamps, with a layer of PO-4 acrylic material approximately 1 inch below the glass. A top light intensity was adjusted to 760 microwatts/cm$^2$ and a bottom light intensity was adjusted to 950 microwatts/cm$^2$, as measured at about the plane of the sample. A Spectroline meter DM365N and standard detector stage were used. An in-mold coating as described in U.S. application Ser. No. 07/931,946 was used to coat both the front and back molds.

|  | BASE CURVE | | |
| --- | --- | --- | --- |
| Mold Sets | 6.00 | 4.50 | 3.00 |
| Front Mold | 5.95 | 4.45 | 2.93 |
| Back Mold | 6.05 | 6.80 | 7.80 |
| Gasket | −5.00 | 13 mm | 16 mm |
| Resulting Semifinished Blank | | | |
| Diameter | 74 mm | 76 mm | 76 mm |
| Center Thickness | 9.0 mm | 7.8 mm | 7.3 mm |
| Edge Thickness | 9.0 mm | 11.0 mm | 15.0 mm |
| Mass | 46 grams | 48 grams | 57 grams |
| Curing Cycle Variables | | | |
| Total Cycle Time | 25:00 | 25:00 | 35:00 |
| Initial Exposure | 4:40 | 4:40 | 4:35 |
| Number of Pulses | 4 | 4 | 4 |
| Timing (in seconds) and Duration of Pulses @Elapsed Time From Onset of Initial Exposure | | | |
| Pulse 1 | 15@10:00 | 15@10:00 | 15@13:00 |
| Pulse 2 | 15@15:00 | 15@15:00 | 15@21:00 |
| Pulse 3 | 30@19:00 | 30@27:00 | 20@27:00 |
| Pulse 4 | 30@22:00 | 30@32:00 | 30@32:00 |

Figure 26:
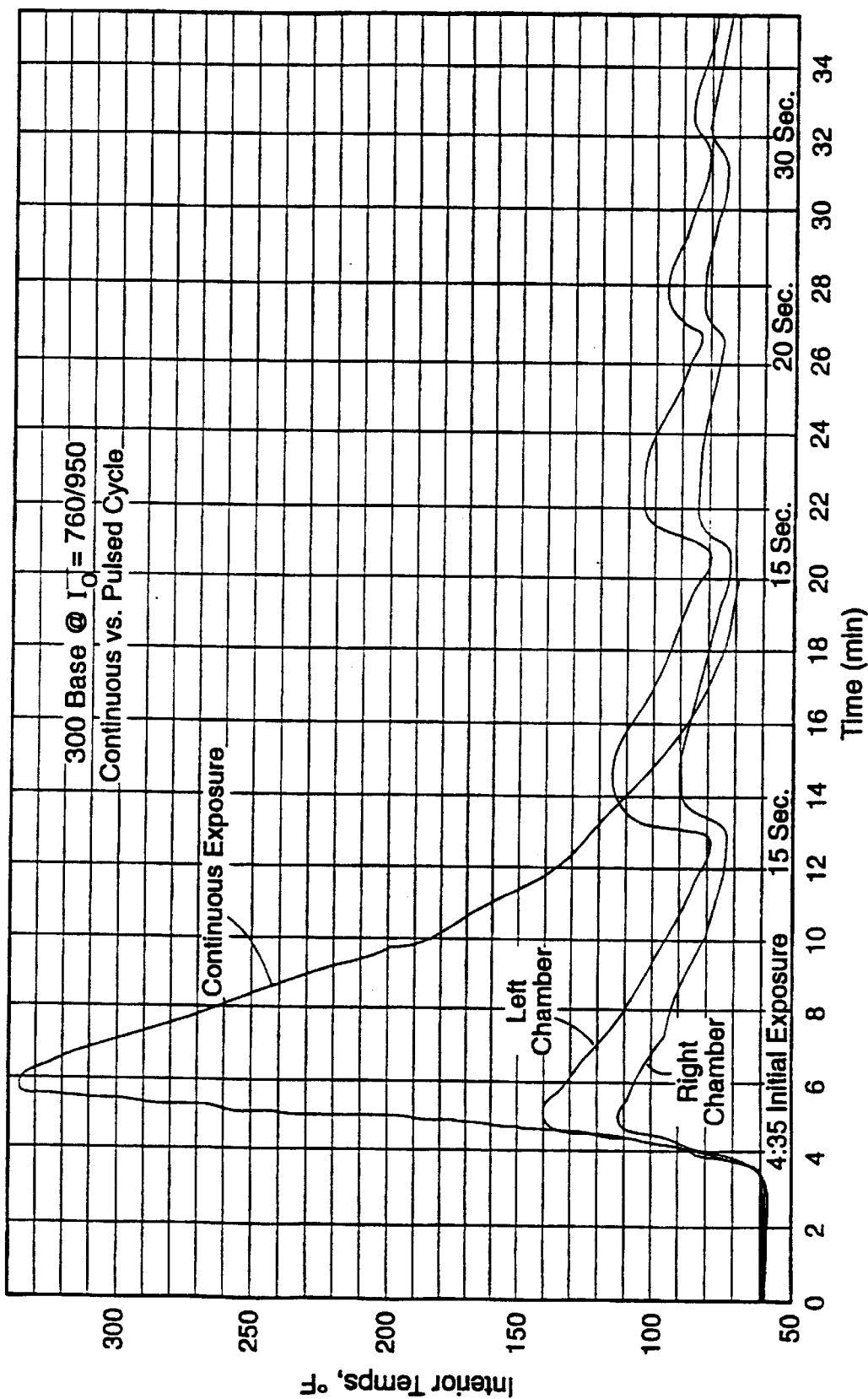
FIG. 26 is a graph illustrating continuous and pulsed temperature profiles for a curing cycle employing a mold/gasket set with a 3.00 D base curve.

FIGS. 24, 25, and 26 each show temperature profiles of the above-detailed cycles for a case where the ultraviolet light exposure is continuous and a case where the ultraviolet light delivery is pulsed. In FIGS. 23–26, "Io" denotes the initial intensity of the ultraviolet rays used in a curing cycle. The phrase "Io=760/950" means that the light intensity was adjusted to initial settings of 760 microwatts/cm$^2$ for the top lamps and 950 microwatts/cm$^2$ for the bottom lamps. The "interior temperature" of FIGS. 23–26 refers to a temperature of the lens forming material as measured by a thermocouple located within the mold cavity.

The following general rules for the design of pulse/cooling cycles may be employed to allow rapid curing of a lens while inhibiting premature release and/or cracking of the lens. The duration of the pulses preferably does not result in a temperature that exceeds the maximum temperature attained in the initial exposure period. The length of the cooling period may be determined by the length of time necessary for the internal temperature of the lens forming material to return to near the temperature it had immediately before it received a pulse. Following these general rules during routine experimentation may permit proper curing cycles to be established for a broad range of lens forming materials, light intensity levels, and cooling conditions.

Preferably light output is measured and controlled by varying the amount of power applied to the lights in response to changes in light output. Specifically, a preferred embodiment of the invention includes a light sensor mounted near the lights. This light sensor measures the amount of light, and then a controller increases the power supplied to maintain the first ultraviolet rays as the intensity of the first ultraviolet rays decreases during use, and vice versa. Specifically, the power is varied by varying the electric frequency supplied to the lights.

A filter is preferably applied to the light sensor so that light waves other than ultraviolet light impinge less, or not at all, on the light sensor. In one embodiment, a piece of 365N Glass made by Hoya Optics (Fremont, Calif.) was applied to a light sensor to filter out visible rays.

One "lamp driver" or light controller was a Mercron Model FX0696-4 and Model FX06120-6 (Mercron, Inc., Dallas, Tex., U.S.A.). These light controllers may be described in U.S. Pat. Nos. 4,717,863 and 4,937,470.

Figure 13:
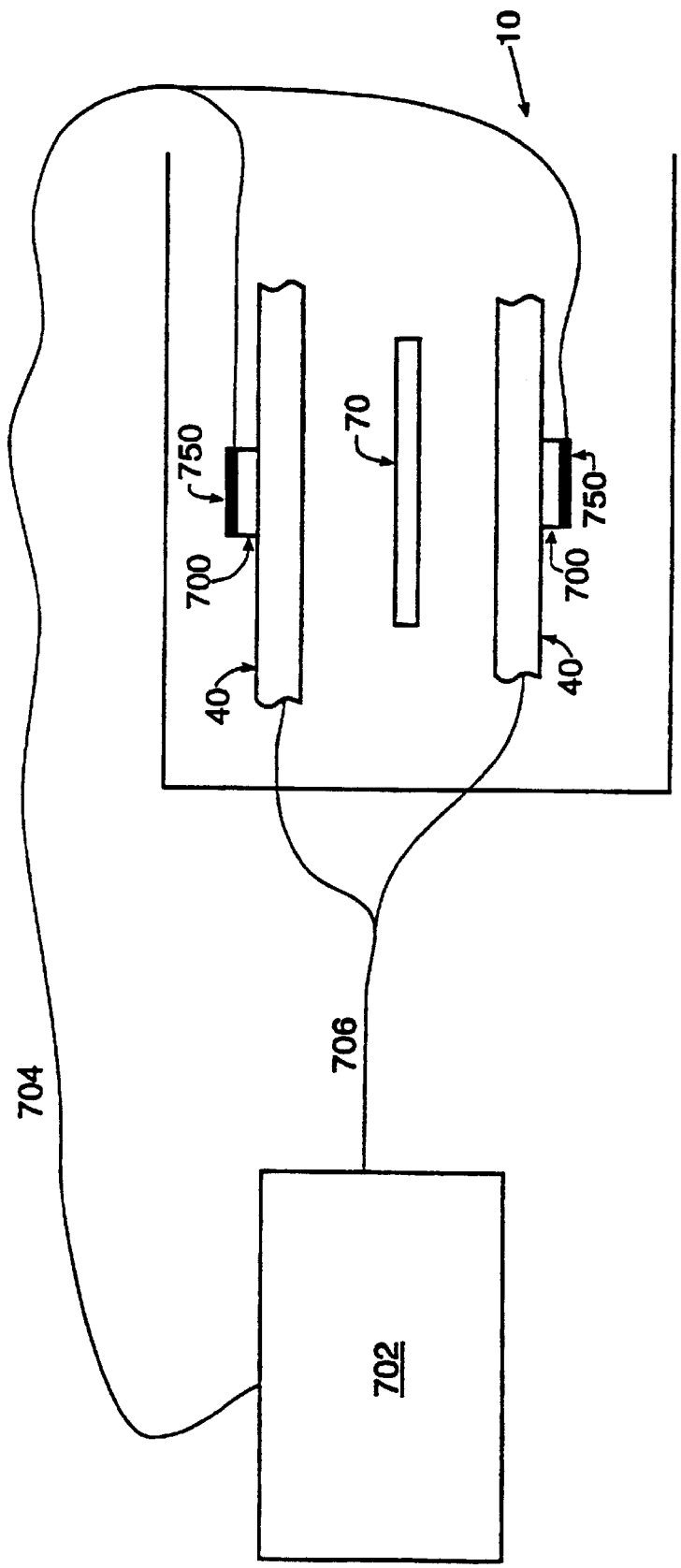
FIG. 13 is a schematic diagram of a lens curing apparatus with a light sensor and controller.

FIG. 13 schematically depicts the light control system described above. The lights 40 in apparatus 10 apply light towards the lens holder 70. A light sensor 700 is located adjacent the lights 40. Preferably the light sensor 700 is a photoresistor light sensor (photodiodes or other light sensors may also be usable in this application). The light sensor 700 with a filter 750 is connected to lamp driver 702 via wires 704. Lamp driver 702 sends a current through the light sensor 700 and receives a return signal from the light sensor 700. The return signal is compared against an adjustable set point, and then the electrical frequency sent to the ultraviolet lights 40 via wires 706 is varied depending on the differences between the set point and the signal received from the light sensor 700. Preferably the light output is maintained within about +/-1.0 percent.

In an embodiment of the invention, a medium pressure mercury vapor lamp is used to cure the lens forming material and the lens coating. This lamp and many conventional light sources used for ultraviolet light curing may not be repeatedly turned on and off since a several minute warm-up period is generally required prior to operation. Mercury vapor light sources may be idled at a lower power setting between exposure periods (i.e., second periods), however, the light source will still generate significant heat and consume electricity while at the lower power setting.

In an embodiment, a flash lamp emits ultraviolet light pulses to cure the lens forming material. It is believed that a flash lamp would provide a smaller, cooler, less expensive, and more reliable light source than other sources. The power supply for a flash lamp tends to draw relatively minimal current while charging its capacitor bank. The flash lamp discharges the stored energy on a microsecond scale to produce very high peak intensities from the flash tube itself. Thus flash lamps tend to require less power for operation and generate less heat than other light sources used for ultraviolet light curing. A flash lamp may also be used to cure a lens coating.

Figure 29:
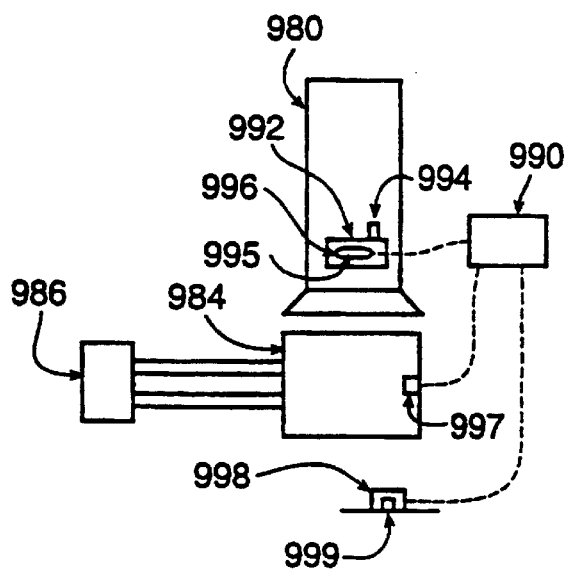
FIG. 29 is an embodiment of a system employing an ultraviolet light controller.

In an embodiment, the flash lamp used to direct ultraviolet rays toward at least one of the mold members is a xenon light source. The lens coating may also be cured using a xenon light source. Referring to FIG. 29, xenon light source 980 preferably contains photostrobe 992 having a tube 996 and electrodes to allow the transmission of ultraviolet rays. The tube may include borosilicate glass or quartz. A quartz tube will generally withstand about 3 to 10 times more power than a hard glass tube. The tube may be in the shape of a ring, U, helix, or it may be linear. The tube may include capacitive trigger electrode 995. The capacitive trigger electrode may include a wire, silver strip, or conductive coating located on the exterior of tube 996. The xenon light source is preferably adapted to deliver pulses of light for a duration of less than about 1 second, more preferably between about 1/10 of a second and about 1/1000 of a second, and more preferably still between about 1/400 of a second and 1/600 of a second. The xenon source may be adapted to deliver light pulses about every 4 seconds or less. The relatively high intensity of the xenon lamp and short pulse duration may allow rapid curing of the lens forming composition without imparting significant radiative heat to the composition.

In an embodiment, controller 990 (shown in FIG. 29) controls the intensity and duration of ultraviolet light pulses delivered from ultraviolet light source 980 and the time interval between pulses. Ultraviolet light source 980 may include capacitor 994, which stores the energy required to deliver the pulses of ultraviolet light. Capacitor 994 may be adapted to allow pulses of ultraviolet light to be delivered as frequently as desired. Temperature monitor 997 may be located at a number of positions within mold chamber 984. The temperature monitor may measure the temperature within the chamber and/or the temperature of air exiting the chamber. The system may be adapted to send a signal to cooler 988 and/or distributor 986 (shown in FIG. 27) to vary the amount and/or temperature of the cooling air. The temperature monitor may also determine the temperature at any of a number of locations proximate the mold cavity and send a signal to controller 990 to vary the pulse duration, pulse intensity, or time between pulses as a function of a temperature within mold chamber 984.

In an embodiment, light sensor 999 is used to determine the intensity of ultraviolet light emanating from source 980. The light sensor is preferably adapted to send a signal to controller 990, which is preferably adapted to maintain the intensity of the ultraviolet light at a selected level. Filter 998 may be positioned between ultraviolet light source 980 and light sensor 999 and is preferably adapted to inhibit visible rays from contacting light sensor 999, while allowing ultraviolet rays to contact the sensor. The filter may include 365 N glass or any other material adapted to filter visible rays and transmit ultraviolet rays.

In an embodiment, a cooling distributor is used to direct air toward the non-casting face of at least one of the mold members to cool the lens forming composition. The air may be cooled to a temperature of below ambient temperature prior to being directed toward at least one of the mold members to cool the composition.

In an embodiment, air at ambient temperature may be used to cool the lens forming composition. Since the xenon flash generally has a duration of much less than about one second, considerably less radiative heat tends to be transferred to the lens forming composition compared to curing methods employing other ultraviolet sources. Thus, the reduced heat imparted to the lens forming composition may allow for air at ambient temperature to remove sufficient heat of exotherm to substantially inhibit premature release and/or cracking of the lens.

In an embodiment, the xenon source is used to direct first ultraviolet rays toward the first and second mold members to the point that a temperature increase is measured and/or the lens forming composition begins to or forms a gel. It is preferred that the gel is formed with less than 15 pulses of radiation, and more preferably with less than about 5 pulses. It is preferred that the gel is formed before the total time to which the composition has been exposed to the pulses exceeds about 1/10 or 1/100 of a second.

In an embodiment, a reflecting device is employed in conjunction with the xenon light source. The reflecting device is positioned behind the flash source and preferably allows an even distribution of ultraviolet rays from the center of the composition to the edge of the composition.

In an embodiment, a xenon light flash lamp is used to apply a plurality of ultraviolet light pulses to the lens forming composition to cure it to an eyeglass lens in a time period of less than 30 minutes, or more preferably, less than 20 or 15 minutes.

The use of a xenon light source also may allow the formation lenses over a wider range of diopters. Higher power lenses exhibit greatest thinnest to thickest region ratios, meaning that more shrinkage-induced stress is created, causing greater mold flexure and thus increased tendency for premature release. Higher power lenses also possess thicker regions. Portions of lens forming material within these thicker regions may receive less light than regions closer to the mold surfaces. Continuous irradiation lens forming techniques typically require the use of relatively low light intensities to control the heat generated during curing. The relatively low light intensities used tends to result in a long, slow gelation period. Optical distortions tend to be created when one portion of the lens is cured at a different rate than another portion. Methods characterized by non-uniform curing are typically poorly suited for the production of relatively high power lenses, since the deeper regions (e.g., regions within a thick portion of a lens) tend to gel at a slower rate than regions closer to the mold surfaces.

The relatively high intensity attainable with the xenon source may allow deeper penetration into, and/or saturation of, the lens forming material, thereby allowing uniform curing of thicker lenses than in conventional radiation-initiated curing. More uniform gelation tends to occur where the lens forming material is dosed with a high intensity pulse of ultraviolet light and then subjected to decreased UV light or darkness as the reaction proceeds without activating radiation. Lenses having a diopter of between about +5.0 and about −6.0 and greater may be cured. It is believed that light distribution across the sample is less critical when curing and especially when gelation is induced with relatively high intensity light. The lens forming material may be capable of absorbing an amount of energy per time that is below that delivered during a relatively high intensity pulse. The lens forming material may be "oversaturated" with respect to the light delivered via a high intensity flash source. In an embodiment the xenon source is used to cure a lens having a diopter between about −4.0 and about −6.0. In an embodiment, the xenon source is used to cure a lens having a diopter between about +2.0 and about +4.0.

Figure 28:
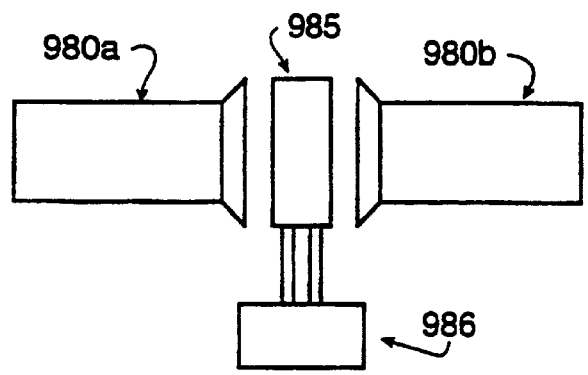
FIG. 28 is an embodiment of a system simultaneously employing two flash light sources.

In an embodiment, more than one xenon light source is used simultaneously to apply ultraviolet pulses to the lens forming composition. Such an embodiment is shown in FIG. 28. Xenon light sources 980a and 980b may be positioned around mold chamber 985 so that pulses may be directed toward the front face of a lens and the back face of a lens substantially simultaneously. Mold chamber 985 is preferably adapted to hold a mold in a vertical position such that pulses from xenon source 980a may be applied to the face of a first mold member, while pulses from source 980b may be applied to the face of a second mold member. In an embodiment, xenon source 980b applies ultraviolet light pulses to a back surface of a lens more frequently than xenon source 980a applies ultraviolet light pulses to a front surface of a lens. Xenon sources 980a and 980b may be configured such that one source applies light to mold chamber 984 from a position above the chamber while the other xenon source applies light to the mold chamber from a position below the chamber.

Figure 27:
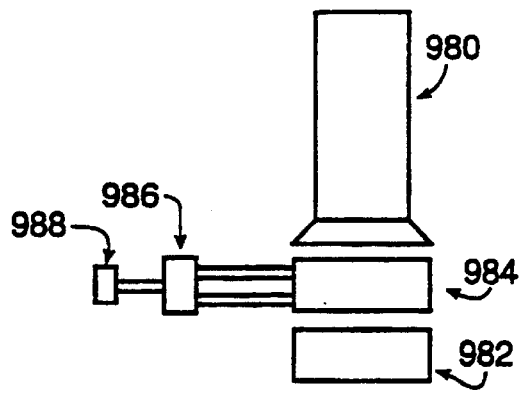
FIG. 27 is a view of an embodiment of a system simultaneously employing both a flash light source and a continuous UV (e.g., fluorescent) source.

In an embodiment, a xenon light source and a relatively low intensity (e.g., fluorescent) light source are used to simultaneously apply ultraviolet light to a mold chamber. As illustrated in FIG. 27, xenon source 980 may apply ultraviolet light to one side of mold chamber 984 while low intensity fluorescent source 982 applies ultraviolet light to another side of the mold chamber. Fluorescent source 982 may include a compact fluorescent "light bucket" or a diffused fluorescent lamp. The fluorescent light source may deliver continuous or substantially pulsed ultraviolet rays as the xenon source delivers ultraviolet pulses. The fluorescent source may deliver continuous ultraviolet rays having a relatively low intensity of less than about 100 microwatts/cm$^2$.

Methods of the present invention allow curing of high-mass semi-finished lens blanks from the same material used to cure cast-to-finish lenses. Both are considered to be "eyeglass lenses" for the purposes of this patent. These methods may also be used to cure a variety of other lens forming materials. Methods of the present invention have been successfully used to make cast-to-finish lenses in addition to semi-finished lenses.

PULSE METHOD EXAMPLE 1

USE OF A MEDIUM PRESSURE VAPOR LAMP

An eyeglass lens was successfully cured with ultraviolet light utilizing a medium pressure mercury vapor lamp as a source of activating radiation (i.e., the UVEXS Model 912 previously described herein). The curing chamber included a six inch medium pressure vapor lamp operating at a power level of approximately 250 watts per inch and a defocused dichroic reflector that is highly UV reflective. A high percentage of infrared radiation was passed through the body of the reflector so that it would not be directed toward the material to be cured. The curing chamber further included a conveyor mechanism for transporting the sample underneath the lamp. With this curing chamber, the transport mechanism was set up so that a carriage would move the sample from the front of the chamber to the rear such that the sample would move completely through an irradiation zone under the lamp. The sample would then be transported through the zone again to the front of the chamber. In this manner the sample was provided with two distinct exposures per cycle. One pass, as defined hereinafter, consists of two of these distinct exposures. One pass provided a dosage of approximately 275 milliJoules measured at the plane of the sample using an International Light IL 1400 radiometer equipped with a XRL 340 B detector.

A lens cavity was created using the same molds lens forming composition, and gasket of Pulsed Method Example 2 below. The reaction cell containing the lens forming material was placed on a supporting stage such that the plane of the edges of the convex mold were at a distance of approximately 75 mm from the plane of the lamp. The lens cavity was then exposed to a series of UV doses consisting of two passes directed to the back surface of the mold followed immediately by one pass directed to the front surface of the mold. Subsequent to these first exposures, the reaction cell was allowed to cool for 5 minutes in the absence of any activating radiation in an FC-104 chamber as described in Pulsed Method Example 1 at an air temperature of 74.6 degrees F and at an air flow rate of approximately 15 to 25 scf per minute to the back surface and 15 to 25 scf to the front surface of the cell. The lens cavity was then dosed with one pass to the front mold surface and returned to the cooling chamber for 6 minutes. Then the back surface was exposed in one pass and then was cooled for 2 minutes. Next, the front surface was exposed in two passes and then cooled for 3.5 minutes. The front surface and the back surface were then each exposed to two passes, and the gasket was removed to expose the edges of the lens. A strip of polyethylene film impregnated with photoinitiator was then wrapped around the edge of the lens and the front and back surfaces were exposed to another 3 passes each. The back surface of the cell was then placed on the conductive thermal in-mold postcure device using "bean-bag" container filled with glass beads on a hot plate at about 340° F. described previously (see conductive heating example 1) for a time period of 13 minutes, after which the glass molds were removed from the finished lens. The finished lens exhibited a distance focusing power of −6.09 diopters, had excellent optics, was aberration-free, was 74 mm in diameter, and had a center thickness of 1.6 mm. During the cooling steps, a small surface probe thermistor was positioned against the outside of the gasket wall to monitor the reaction. The results are summarized below.

| UV Dose | Approx. Elapsed Time After UV Dose (min) | Gasket Wall Temperature (° F.) |
|---|---|---|
| 2 passes to back surface and 1 pass to front surface | 0 | Not recorded |
| | 1 | 80.5 |
| | 2 | 79.7 |
| | 3 | 79.0 |
| | 4 | 77.1 |
| | 5 | 76.2 |
| 1 pass to front surface | 0 | Not recorded |
| | 1 | 83.4 |
| | 2 | 86.5 |
| | 3 | 84.6 |
| | 4 | Not recorded |
| | 5 | 81.4 |
| | 6 | 79.5 |
| 1 pass to back surface | 0 | Not recorded |
| | 1 | 79.3 |
| | 2 | 79.0 |
| 2 passes to front surface | 0 | Not recorded |
| | 1 | 78.4 |
| | 2 | 77.8 |
| | 3 | 77.0 |
| | 3.5 | 76.7 |

PULSE METHOD EXAMPLE 2

USE OF A SINGLE XENON FLASH LAMP

An eyeglass lens was successfully cured with ultraviolet light utilizing a xenon flash lamp as a source of activating radiation. The flash lamp used was an Ultra 1800 White Lightning photographic strobe, commercially available from Paul C. Buff Incorporated of Nashville, Tenn. This lamp was modified by replacing the standard borosilicate flash tubes with quartz flash tubes. A quartz flash tube is preferred because some of the ultraviolet light generated by the arc inside the tube tends to be absorbed by borosilicate glass. The strobe possessed two semicircular flash tubes that trigger simultaneously and are positioned to form a ring approximately 73 millimeters in diameter. The hole in the reflector behind the lamps, which normally contains a modeling lamp for photographic purposes, was covered with a flat piece of highly-polished ultraviolet reflective material, which is commercially available under the trade name of Alzac from Ultra Violet Process Supply of Chicago, Ill. The power selector switch was set to full power. The ultraviolet energy generated from one flash was measured using an International Light IL 1700 Research Radiometer available from International Light, Incorporated of Newburyport, Mass. The detector head was an International Light XRL 340 B, which is sensitive to radiation in the 326 nm to 401 nm region. The window of the detector head was positioned approximately 35 mm from the plane of the flash tubes and was approximately centered within the ring formed by the tubes.

A mold cavity was created by placing two round 80 mm diameter crown glass molds into a silicone rubber ring or gasket, which possessed a raised lip around its inner circumference. The edges of the glass molds rested upon the raised lip to form a sealed cavity in the shape of the lens to be created. The inner circumference of the raised lip corresponded to the edge of the finished lens. The concave surface of the first mold corresponded to the front surface of the finished lens and the convex surface of the second mold corresponded to the back surface of the finished lens. The height of the raised lip of the rubber ring into which the two glass molds are inserted controls the spacing between the two glass molds, thereby controlling the thickness of the finished lens. By selecting proper gaskets and first and second molds that possess various radii of curvature, lens cavities can be created to produce lenses of various powers.

A lens cavity was created by placing a concave glass mold with a radius of curvature of 407.20 mm and a convex glass mold with a radius of curvature of 65.26 mm into a gasket which provided spacing between the molds of 1.8 mm measured at the center of the cavity. Approximately 32 grams of a lens forming monomer was charged into the cavity. The lens forming material used for this test was OMB-91 lens monomer. The reaction cell containing the lens forming material was placed horizontally on a supporting stage such that the plane of the edges of the convex mold were at a distance of approximately 30 mm from the plane of the flash tubes and the cell was approximately centered under the light source.

The back surface of the lens cavity was then exposed to a first series of 5 flashes, with an interval of approximately 4 seconds in between each flash. The cell was then turned over and the front surface was exposed to another 4 flashes with intervals of about 4 seconds in between each flash. It is preferable to apply the first set of flashes to the back surface to start to cure the material so that any air bubbles in the liquid monomer will not migrate from the edge of the cavity to the center of the optical zone of the lens. Subsequent to these first nine flashes, the reaction cell was allowed to cool for five minutes in the absence of any activating radiation in the above-described FC-104 chamber. To cool the reaction cell, air at a temperature of 71.4 degrees F and at a flow rate of approximately 15 to 25 scf per minute was applied to the back surface and air at a temperature of 71.4 degrees F and at a flow rate of approximately 15 to 25 scf per minute was applied to the front surface of the cell. The back surface of the lens cavity was then dosed with one more flash and returned to the cooling chamber for four minutes.

Next, the cell was exposed to one flash on the front surface and cooled in the cooling chamber for seven minutes. Then the cell was exposed to one flash on the front surface and one flash on the back surface and cooled for three minutes. Next, the cell was exposed to two flashes on the front surface and two flashes on the back surface and cooled for four and a half minutes. The cell was then exposed to five flashes each to the back surface and front surface, and the gasket was removed to expose the edges of the lens. A strip of polyethylene film impregnated with photoinitiator (Irgacure 184) was then wrapped around the edge of the lens, and the cell was exposed to another five flashes to the front surface and fifteen flashes to the back surface. The back surface of the cell was then placed on the conductive thermal in-mold postcure device (i.e., "bean bags" filled with glass beads sitting on a hot plate at approx. 340° F.) as described previously (see conductive heating example above) for a time period of 13 minutes, after which the glass molds were removed from the finished lens. The finished lens exhibited a distance focusing power of −6.16 diopters and a +2.55 bifocal add power, had excellent optics, was aberration-free, was 74 mm in diameter, and had a center of thickness of 1.7 mm. During the cooling steps, a small surface probe thermistor was positioned against the outside of the gasket wall to monitor the reaction. The results are summarized below.

| Dose | Elapsed Time From Dose (min) | Gasket Wall Temperature (F) |
|---|---|---|
| 5 flashes to back surface and 4 flashes to front surface | 0 | Not recorded |
| | 1 | Not recorded |
| | 2 | 78.4 |
| | 3 | 77.9 |
| | 4 | 76.9 |
| | 5 | 75.9 |
| 1 flash to back surface | 0 | Not recorded |
| | 1 | 76.8 |
| | 2 | 77.8 |
| | 3 | 78 |
| | 4 | 77.8 |
| 1 flash to front surface | 0 | Not recorded |
| | 1 | 79.4 |
| | 2 | 81.2 |
| | 3 | 81.1 |
| | 4 | 79.7 |
| | 5 | 78.7 |
| | 6 | 77.5 |
| | 7 | 77.4 |
| 1 flash to front surface and 1 flash to back surface | 0 | Not recorded |
| | 1 | 78.8 |
| | 2 | 78.8 |
| | 3 | 78.0 |
| 2 flashes to front surface and 2 flashes to back surface | 0 | Not recorded |
| | 1 | 80.2 |
| | 2 | 79.8 |
| | 3 | 78.3 |
| | 4 | 76.7 |
| | 4.5 | 76.3 |

IMPROVED ULTRAVIOLET LENS CURING APPARATUS

Figure 30:
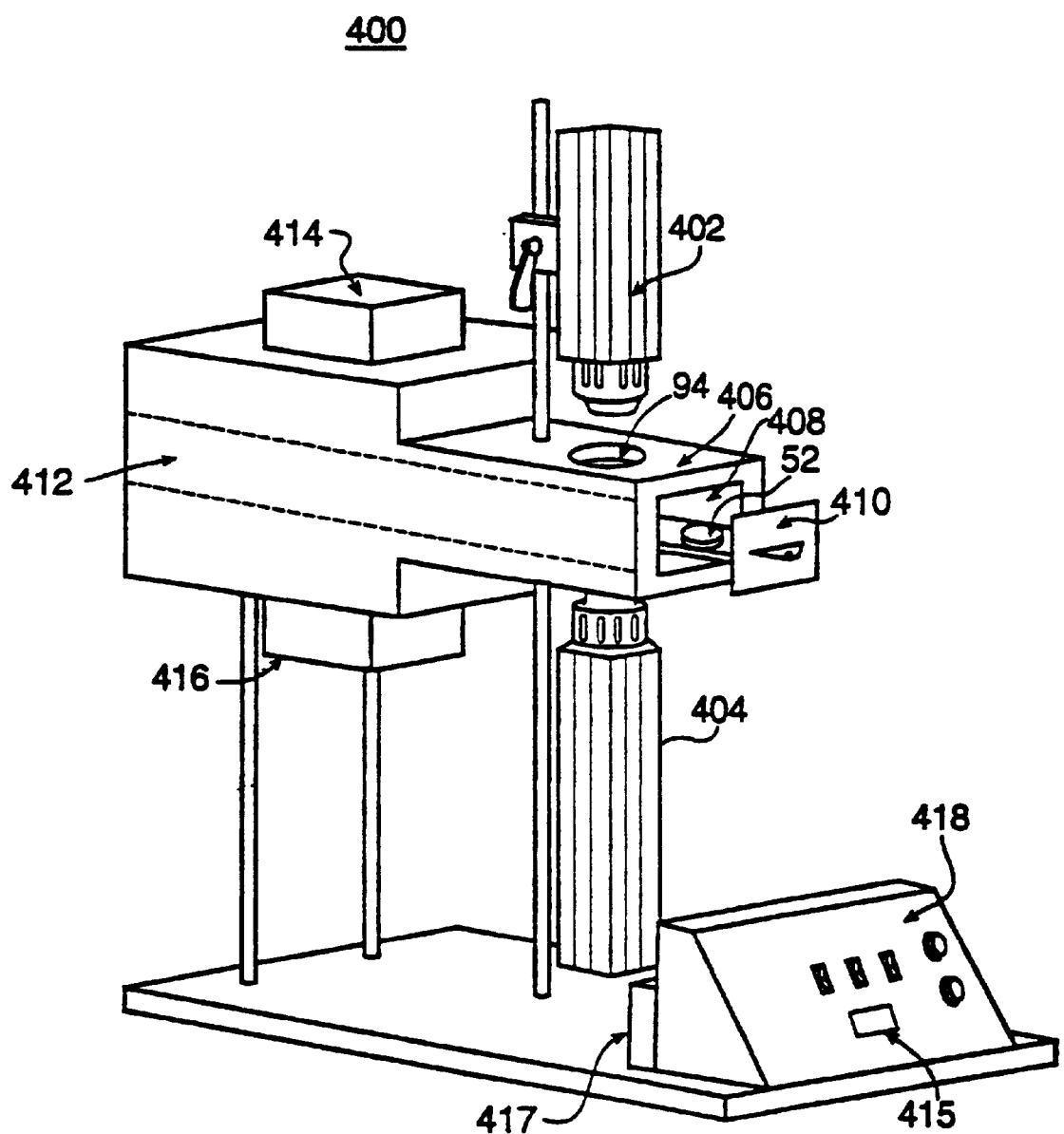
FIG. 30 depicts a schematic view of a lens curing apparatus.

FIG. 30 depicts a schematic view of an embodiment of an ultraviolet lens curing apparatus 400. The apparatus preferably includes a first light generator 402 and a second light generator 404 for generating and directing ultraviolet light towards lens cell 52. First light generator 402 is preferably configured to direct ultraviolet light toward a first mold member of the lens cell, and second light generator 404 is preferably configured to direct ultraviolet light toward a second mold member of the lens cell. The light generators 402 and 404 may be medium pressure mercury lamps for continuously directing ultraviolet light towards the lens cell or may be strobe light sources for delivering pulses of ultraviolet light to the lens cell. In an embodiment, the strobe light source is a xenon source having a flash tube made of quartz. In an alternate embodiment, the strobe light source is a xenon source having a flash tube made from, for example, borosilicate.

The apparatus may include shutter system 950 (shown in FIG. 7) and programmable logic controller 952. The shutter system is preferably operable to block at least a portion of the ultraviolet light directed toward at least one of the mold members. Programmable logic controller 952 is preferably coupled to the shutter and adapted to activate the shutter system. The shutters are preferably adapted to extend to block passage of ultraviolet light toward the lens cell and are preferably adapted to retract to allow passage of the ultraviolet light toward the lens cell.

Apparatus 400 preferably includes an air manifold 406 that may substantially surround irradiation chamber 407. Air distribution device 94 is preferably disposed on the surface of the air manifold to direct air toward the non-casting face of at least one of the mold members. The irradiation chamber preferably communicates with air plenum 412, which directs "effluent air" away from the irradiation chamber. As described herein, "effluent air" is taken to mean air that has contacted at least one of the mold members to remove heat from the lens forming material contained within the mold cavity. The lens cell is preferably secured within a lens holder of lens drawer 410 prior to being inserted into the irradiation chamber. The lens drawer may be inserted within and removed from the irradiation chamber and is preferably adapted to form a substantially airtight seal with the air manifold when inserted into the irradiation chamber.

Figure 32:
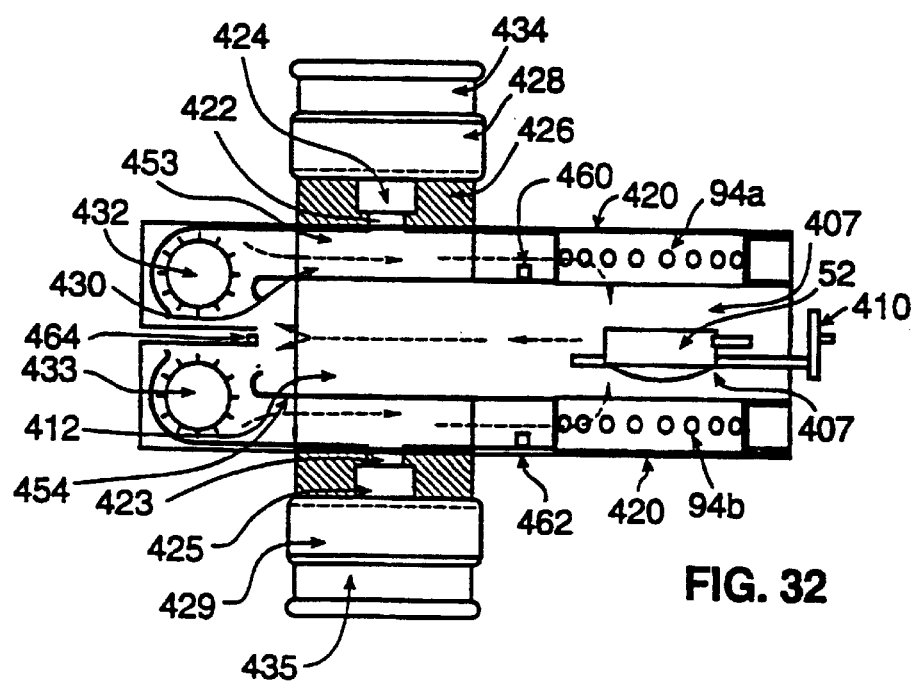
FIG. 32 depicts a cross sectional view of a thermoelectric cooling system.

Apparatus 400 preferably includes a first cooling assembly 414 and a second cooling assembly 416 for reducing the temperature of the air (and preferably cooling the air to a temperature below ambient temperature) before it is passed from air distribution device 94 to the lens cell. FIG. 32 depicts a cross-sectional view of the irradiation chamber and the cooling assemblies. Irradiation chamber 408 is preferably enclosed with substantially airtight seals to inhibit or prevent cooling air from escaping from the chamber. In an embodiment, members 420 and 422 may be positioned on the air distribution devices to form a substantially airtight seal. Member 420 is preferably disposed between light generator 402 and the first mold member, and member 422 is preferably disposed between light generator 404 and the second mold member. Members 420 and 422 may be plates and are preferably substantially transparent to the ultraviolet light delivered from light generators 402 and 404, respectively. In an embodiment, members 402 and 404 are substantially clear borosilicate glass. In an alternate embodiment, members 402 and 404 are light diffusers for diffusing the ultraviolet light directed to the lens cell. The light diffusers are preferably made of borosilicate glass that has been sandblasted to "frost" the glass. In an alternate embodiment, member 402 and 404 may be made from quartz glass.

In an embodiment, cooling assemblies 414 and 416 are thermoelectric cooling systems. Cooling assembly 414 may be used to cool air directed toward the first mold member, and cooling assembly 416 may be used to cool air directed toward the second mold member. The cooling assemblies are preferably sized to cool the air to a temperature between about 0° C. and about 20° C.

Figure 33:
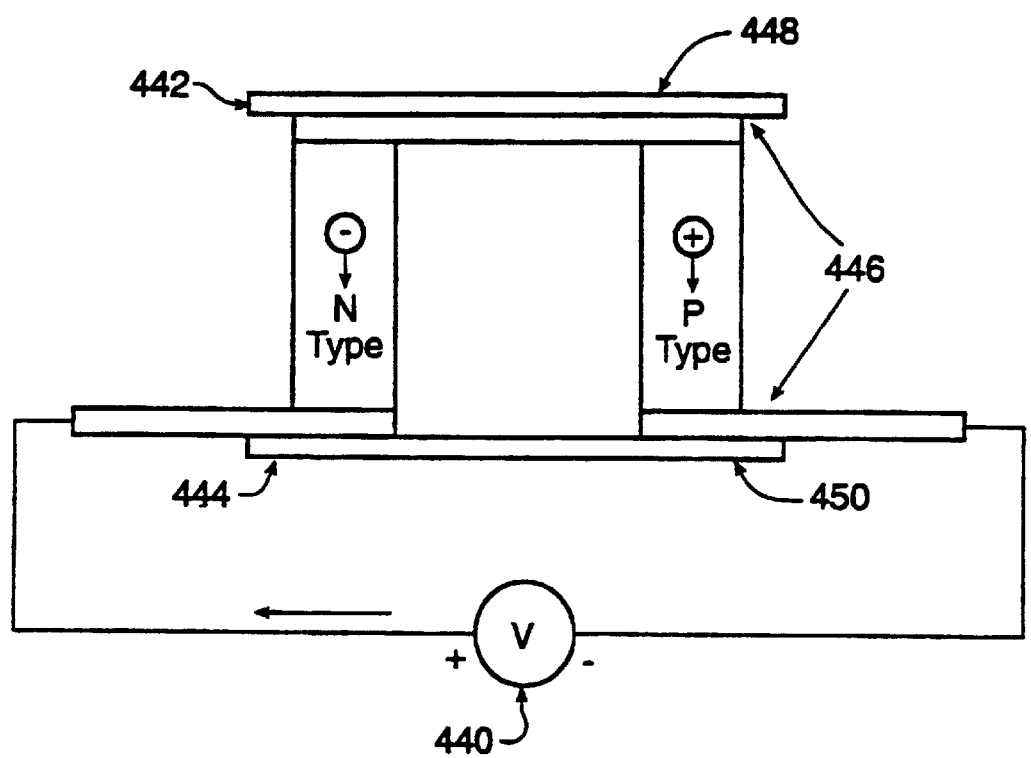
FIG. 33 depicts a thermoelectric module.

Cooling assembly 414 preferably includes a thermoelectric module 422 for creating a temperature differential to allow the air to be cooled to below ambient temperature. An exemplary thermoelectric module is shown in FIG. 33. The thermoelectric module is preferably connected to a DC power source 440. The thermoelectric module is preferably a semiconductor wafer and preferably includes a plurality of semiconductor pn-couples disposed between a pair of ceramic plates 448 and 450 containing metallization 446. The pn-couples are preferably connected thermally in parallel and electrically in series. The thermoelectric module may be a single-stage or cascade module. When the thermoelectric module is connected to the DC power source, a phenomenon (i.e., "the Peltier effect") occurs whereby heat is absorbed on cold side 448 and heat is dissipated from hot side 450. It is to be understood that the flow of current may be reversed to cause side 448 to dissipate heat while side 450 absorbs heat.

The publication entitled "An Introduction to Thermoelectrics", available from Tellurex Corp. of Traverse City, Mich. discusses such thermoelectric modules and is incorporated by reference as if fully set forth herein. The pamphlet entitled "A Thermoelectric Bible on How to Keep Cool", available from Supercool Corp. of Minneapolis, Minn. also describes a thermoelectric module and is incorporated by reference as if fully set forth herein.

Figure 31:
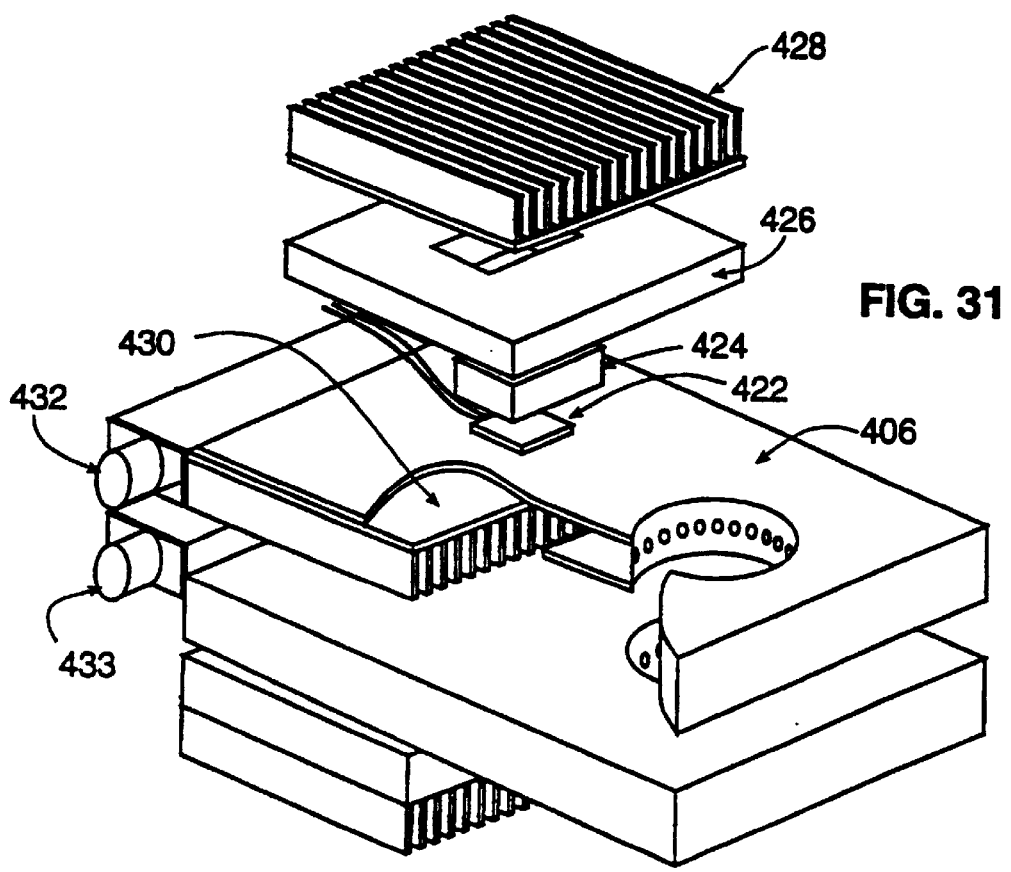
FIG. 31 depicts a detail view of a thermoelectric cooling system.

In FIG. 31, the side of the thermoelectric module facing upwards is the hot side. Cooling assembly 414 preferably includes a heat sink 428 coupled to the hot side to facilitate the dissipation of heat from the thermoelectric module. The heat sink may be directly coupled to the hot side or the heat sink may be indirectly coupled to the hot side via a member having a relatively high thermal conductivity. In FIG. 31, the heat sink is indirectly coupled to the hot side by conductive block 424. Insulation 426 preferably substantially surrounds the thermoelectric module and the conductive block. In an embodiment, a fan 434 is used to direct air across heat sink 428 to increase the rate of heat dissipation from the thermoelectric module. The heat sink preferably includes a plurality of fins which serve as a heat transfer surface.

The cold side of the thermoelectric module is preferably coupled to a cold side heat sink 430 serving to absorb heat to cool the air directed toward the lens cell. The cold side heat sink may be located within air conduit 453 and preferably contains a plurality of fins through which the air is passed to cool it.

Cooling assembly 416 preferably includes second thermoelectric module 423, second conductive block 425, second hot side heat sink 429, and second fan 435, each of which may operate in the manner as described above for the elements included within cooling assembly 414. In an alternate embodiment, cooling assemblies 414 and 416 may be independently operable to allow air directed toward the first mold member to have a different temperature than air directed toward the second mold member.

A first blower 432 is preferably configured to direct air through air conduit 453, which communicates with air distribution device 94a. Second blower 433 is preferably configured to direct air through air conduit 454, which communicates with air distribution device 94b. As described herein, a "blower" is taken to mean any device operable to drive a fluid such as air through a conduit. The first blower preferably drives air that is distributed across the non-casting face of the first mold member. The second blower preferably drives air that is distributed across the non-casting face of the second mold member. Effluent air that has contacted the non-casting face of at least one of the mold members is preferably passed through air plenum 412 and to blowers 432 and 433 for recycling to air distribution devices 94a and 94b. Each of the thermoelectric modules is preferably sized to cool about 1–30 cubic feet per minute of heated effluent air to a temperature of about 0–20° C.

In an alternate embodiment, the cooling assemblies may be used to reduce the temperature of the recirculated air to ambient temperature or a temperature above ambient temperature. The cooling assemblies may be activated when the cooling air exceeds a predetermined temperature level above ambient temperature.

The thermoelectric cooling system has been found to operate more quietly, efficiently, and reliably than some conventional cooling systems. Recirculating the effluent air through the closed cooling loop tends to reduce the heat duty on the cooling system, since the effluent air in air plenum 412 preferably has a temperature less than ambient temperature.

In an embodiment, a control panel 418 is operable to manually or automatically control operation of apparatus 400. The control panel may include an electronic controller for automatic control of system variables and a digital display 415 indicating the temperature of the cooling air at various locations in the air conduits, irradiation chamber, and air plenum. The control panel is preferably adapted to receive electronic signals from temperature sensors 460, 462, and 464. Cavities may also be formed in conductive blocks 424 and 425 to hold temperature sensors placed therein. The blowers 432 and 433 may be activated or deactivated and the cooling assemblies may be engaged or disengaged by switches on the control panel or by a programmable logic controller. The flow rate of air passed across the mold members may be adjusted via the control panel, or the flow rate may be maintained at a constant rate during operation of blowers 432 and 433.

A programmable logic controller 417 may be housed within the control panel. Controller 417 is preferably adapted to independently control operation of the light generators 402 and 404 such that ultraviolet light is directed in a plurality of pulses toward at least one of the mold members. The controller 417 is preferably programmable such that a predetermined time elapses between each of the pulses to optimize the curing cycle. The controller 417 may be adapted to cause the strobes to fire at predetermined times through the curing cycle, thereby controlling the rate of polymerization and exothermic heat generation of the lens forming composition. One programmable logic controller that has been found to perform adequately is the Little Star Microcontroller combined with a Relay Six relay board, both commercially available from Z-World Engineering of Davis, Calif. The strobe firing sequence may be written in Dynamic C programming language. The Ultra 1800 White Lightning photographic strobes, commercially available from Paul C. Buff, Incorporated of Nashville, Tenn., have been found to perform adequately.

It is to be understood that embodiments of apparatus 400 may be combined with the methods and apparatus of preferred embodiments described above in previous sections.

IMPROVED LENS CURING APPARATUS EXAMPLE

An 80 mm diameter glass 28 flattop bifocal mold with a distance radius of curvature of −5.98 diopters and a +2.50 diopter bifocal add power was sprayed with a mixture of isopropyl alcohol and distilled water in equal parts and wiped dry with a lint free paper towel. The mold was assembled into a silicone rubber gasket in combination with a cleaned convex mold possessing a radius of curvature of +4.11 diopters. A raised lip present on the inner circumference of the rubber gasket provided a spacing of 4.2 mm between the two molds at the center point.

The mold/gasket assembly was positioned on a filling stage and the edge of the gasket was peeled back to permit the cavity to be filled with 14.4 grams of OMB-91 lens forming composition, commercially available from the Fast-Cast Corporation of Louisville, Ky. The edge of the gasket was returned to its sealing relationship with the edges of the molds and excess lens forming composition was vacuumed off the non-casting surface of the back mold with a suction device. The filled mold/gasket assembly was transferred from the filling stage to a stage incorporated into a lens drawer of a strobe curing chamber. The assembly was irradiated on both its sides according to the exposure cycle shown in FIG. 34, which was controlled by a programmable logic controller. The power settings on the strobes were adjusted to maximum power.

During the irradiation, the lens cell was continuously exposed to streams of recirculated air directed by the blower and cooled by the thermoelectric cooling module shown in FIGS. 31 and 32. At the beginning of the cycle, the air temperature was 68 degrees F and at the end of the cycle is was measured at 73 degrees F. The air temperature varied during the rest of the cycle up to temperatures as high as 90 degrees F, primarily as a result of the heat added to the system from both the strobe flash lamps and the exothermic heat generated by the lens forming composition. It is anticipated that the operating temperatures of the air could be reduced to well below ambient temperature and the curing cycle could be shortened by use of thermoelectric coolers having a greater capacity than those used in this experiment.

The casting cell was turned over in the chamber so that its convex surface faced upwards and was dosed with 13 flashes to the convex surface and 10 flashes to the concave surface. The casting cell was removed from the strobe chamber, the gasket was stripped from the assembly, and residual uncured material was wiped from the exposed edge of the lens. The cell was returned to the chamber with its concave side facing up and was dosed with an additional 13 flashes to the concave surface and 10 flashes to the convex surface.

The non-casting surfaces of both the front and the back molds were placed in contact with thermal transfer pads, commercially available from the FastCast Corporation of Louisville, Ky., at temperatures of approximately 150 to 200 degrees F as measured on top of the pad for ten minutes. The assembly was removed from the thermal transfer pad and the back mold was removed with a slight impact from an appropriately sized wedge. The lens with the front mold attached was placed in a container of water at room temperature and the lens separated from the front mold. The now finished lens was sprayed with a mixture of isopropyl alcohol and water in equal parts and wiped dry. The finished lens was 4.0 mm thick at the center and was 74 mm in diameter. The lens exhibited a focusing power of +1.98–0.02 D with a bifocal addition power of +2.54 D, provided good optical quality, and was non-yellow.

IMPROVED LENS CURING PROCESS

When casting an eyeglass lens with ultraviolet light, the gelation pattern of the lens forming composition may affect the resultant optical quality of the lens. If there are localized discontinuities in the light intensities received by the monomer contained in the casting cavity during the early stages of the polymerization process, optical distortions may be seen in the finished product. Higher power lenses are, by definition, thicker in certain regions than relatively lower power lenses of the same diameter. The layers of a lens closest to the mold faces of the casting cavity tend to receive a higher light intensity than the deeper layers because the lens forming composition absorbs some of the incident light. This causes the onset of polymerization to be delayed in the deeper layers relative to the outer layers, which may cause optical distortions in the finished product. It is believed that concurrent with this differential curing rate, there is a difference in the rate of exothermic heat generation, specifically, the deeper regions will begin to generate heat arter the outer regions in the cavity have already cured and the effectiveness of the heat removal may be impaired, contributing to optical waves and distortions in the finished product. This phenomena is particularly observable in high powered positive lenses due to the magnification of such defects.

In an embodiment, the lens forming composition contained within the casting cavity is exposed to relatively high intensity ultraviolet light for a time period sufficient to initialize the reaction. Irradiation is terminated before the polymerization of the lens forming composition proceeds far enough to generate a substantial amount of heat. This initial relatively high intensity dose preferably substantially uniformly gels the material within the casting cavity such that the difference in the rate of reaction between the inner and outer layers of the lens being cured is reduced, thereby eliminating the waves and distortions often encountered when using continuous low intensity irradiation to initialize the reaction, particularly with high dioptric power positive lenses.

In an embodiment, the relatively high intensity dose of ultraviolet light is applied to the lens forming composition in the form of pulses. The pulses preferably have a duration of less than about 10 seconds, preferably less than about 5 seconds, and more preferably less than about 3 seconds. The pulses preferably have an intensity of at least about 10 milliwatts/cm$^2$, more preferably at least about 100 milliwatts/cm$^2$, and more preferably still between about 150 milliwatts/cm$^2$ and about 250 milliwatts/cm$^2$. It is preferred that substantially all of the lens forming composition forms into a gel after the initial application of the relatively high intensity ultraviolet light. In an embodiment, no more than an insubstantial amount of heat is generated by exothermic reaction of the lens forming composition during the initial application of the relatively high intensity ultraviolet light.

Subsequent to this initial high intensity dose, a second irradiation step is performed in which the material contained within the casting cell is preferably irradiated for a relatively longer time at a relatively lower intensity while cool fluid is directed at the non-casting surface of at least one of the molds forming the cavity. The cooling fluid preferably removes the exothermic heat generated by the polymerization of the lens forming composition. If the intensity of the ultraviolet light is too great during this second irradiation step, the rate of heat generation will tend to be too rapid and the lens may release prematurely from the casting face of the mold and/or crack. Similarly, should the rate of heat removal from the lens forming composition be too slow, the lens may release prematurely and/or crack. It is preferred that the mold/gasket assembly containing the lens forming composition be placed within the cooling environment as shortly after the initial dose of ultraviolet light as possible.

In an embodiment, the ultraviolet light applied to the lens forming composition during the second irradiation step is less about 350 microwatts/cm$^2$, more preferably less than about 150 microwatts/cm$^2$, and more preferably still between about 90 microwatts/cm$^2$ and about 100 microwatts/cm$^2$. During the second irradiation step, the ultraviolet light may be applied to the lens forming composition continuously preferred or in pulses. A translucent high density polyethylene plate may be positioned between the ultraviolet light generator and at least one of the mold members to reduce the intensity of the ultraviolet light to within a preferred range.

In an embodiment, relatively high intensity ultraviolet light is applied to the lens curing composition in a third irradiation step to post cure the lens subsequent to the second relatively low intensity irradiation step. In the third irradiation step, pulses of ultraviolet light are preferably directed toward the lens forming composition, although the composition may be continuously irradiated instead. The pulses preferably have an intensity of at least about 10 milliwatts/cm$^2$, more preferably at least about 100 milliwatts/cm$^2$, and more preferably still between about 100 milliwatts/cm$^2$ and about 150 milliwatts/cm$^2$.

Each of the above-mentioned irradiation steps is preferably performed by directing the ultraviolet light through each of the first and second mold members. The eyeglass lens is preferably cured in a total time of less than 30 minutes and is preferably free of cracks, striations, distortions, haziness, and yellowness.

It is believed that the above-described methods enable the production of whole lenses in prescription ranges beyond those currently attainable with continuous low intensity irradiation. The method can be practiced in the curing of relatively high or low power lenses with a reduced incidence of optical distortions in the finished lens as compared to conventional methods. It is to be understood that the above-described methods may be used independently or combined with the methods and apparatus of preferred embodiments described above in the previous sections.

IMPROVED CURING PROCESS EXAMPLE

An 80 mm diameter glass progressive addition mold with a nominal distance radius of curvature of −6.00 diopters and a +2.50 diopter bifocal add power was sprayed with a mixture of isopropyl alcohol and distilled water in equal parts and wiped dry with a lint free paper towel. The progressive mold was lenticularized to provide an optical zone 68 mm in diameter along the 180 degree meridian and 65 mm in diameter along the 90 degree meridian. The non-casting face of the mold was mounted to a suction cup, which was attached to a spindle. The spindle was placed on a spinning device provided in the FastCast UX-462 Flash-Cure Unit, commercially available from the FastCast Corporation of Louisville, Ky. A one inch diameter pool of liquid Primer was dispensed into the center of the horizontally positioned glass mold from a soft polyethylene squeeze bottle equipped with a nozzle with an orifice diameter of approximately 0.040 inches. The composition of the Primer is discussed in detail below (see Scratch Resistant Lens Formation Process Example).

The spin motor was engaged to rotate the mold at a speed of approximately 850 to 900 revolutions per minute, which caused the liquid material to spread out over the face of the mold. Immediately thereafter, a steady stream of an additional 1.5 to 2.0 grams of Primer material was dispensed onto the casting face of the spinning mold with the nozzle tip positioned at a 45 degree angle approximately 12 mm from the mold face such that the stream was flowing with the direction of rotation of the mold. The stream of Primer material was directed first at the center of the mold face and then dispensed along the radius of the mold face in a direction from the center toward the edge of the mold face. The solvent present in the Primer was allowed to evaporate off for 8 to 10 seconds while the mold was rotated. The rotation was stopped and the Primer coat present on the mold was cured via two exposures to the ultraviolet output from the medium pressure mercury vapor lamp contained in the UX-462 FlashCure unit, totaling approximately 300 mJ/cm$^2$.

The spin motor was again engaged and approximately 1.5 to 2.0 grams of HC8-H Hard Coat (see description below), commercially available from the FastCast Corporation of Louisville, Ky. was dispensed onto the spinning mold in a similar fashion as the Primer coat. The solvent present in the HC8-H was allowed to evaporate off for 25 seconds while the mold was rotated. The rotation was stopped and the HC8-H coat was cured in the same manner as the Primer coat.

The mold was removed from the FlashCure unit and assembled into a silicone rubber gasket in combination with a cleaned convex mold possessing a radius of curvature of +2.00 diopters. The raised lip present on the inner circumference of the rubber gasket provided a spacing of 6.3 mm between the two molds at the center point. The mold/gasket assembly was positioned on a filling stage and the edge of the gasket was peeled back to permit the cavity to be filled with OMB-91 lens forming composition, commercially available from the FastCast Corporation of Louisville, Ky. The edge of the gasket was returned to its sealing relationship with the edges of the molds and the excess lens forming composition was vacuumed off the non-casting surface of the back mold with a suction device. The filled mold/gasket assembly was placed on a stage in the UX-462 FlashCure unit and subjected to four exposures of the ultraviolet output from the six inch medium pressure mercury vapor lamp, totaling approximately 600 mJ/cm$^2$.

Immediately following this initial dose of high intensity ultraviolet light, the assembly was transferred to the FC-132 curing chamber where the casting cell was continuously exposed to streams of air having a temperature of 42 degrees F while being irradiated with very low intensity ultraviolet light for eight minutes. The light intensity measured approximately 90 microwatts/cm$^2$ from above plus approximately 95 microwatts/cm$^2$ from below, according to the plus lens light distribution pattern called for by the manufacturer. The lamp racks are typically configured to deliver ultraviolet light having an intensity of about 300 microwatt/cm$^2$ for the standard fifteen minute curing cycle. The reduction in ultraviolet light intensity was accomplished by inserting a translucent high density polyethylene plate into the light distribution filter plate slot along with the plus lens light distribution plate. A translucent high density polyethylene plate was positioned between the front mold member and one light distribution plate and between the back mold member and the other light distribution plate.

The assembly was subsequently returned to the UX-462 FlashCure unit and the non-casting surface of the back mold was exposed to four doses of high intensity UV light totaling approximately 1150 mJ/cm$^2$. The gasket was stripped from the assembly and residual uncured material wiped from the exposed edge of the lens. An oxygen barrier strip (polyethylene) was wrapped around the edge of the lens and the mold was exposed to two more doses of high intensity UV light totaling 575 mJ/cm$^2$ to the non-casting surface of the front mold followed by eight more flashes to the non-casting surface of the back mold totaling 2300 mJ/cm$^2$.

The non-casting surface of the back mold was placed in contact with a thermal transfer pad, commercially available from the FastCast Corporation of Louisville, Ky., at a temperature of approximately 150 to 200 degrees F for thirteen minutes. The assembly was removed from the thermal transfer pad and the back mold was removed with a slight impact from an appropriately sized wedge. The front mold with the lens attached thereto was placed in a container of room temperature water and the lens separated from the front mold. The now-finished lens was sprayed with a mixture of isopropyl alcohol and water in equal parts and wiped dry. The lens read +3.98 D with an addition power of +2.50, was clear, non-yellow, and exhibited good optics.

IMPROVED SCRATCH RESISTANT LENS FORMATION PROCESS

The "in-mold" method involves forming a scratch resistant coating over an eyeglass lens by placing the liquid coating in a mold and subsequently curing it. The in-mold method is advantageous to "out-of-mold" methods since the in-mold method exhibits less occurrences of coating defects manifested as irregularities on the anterior surface of the coating. Using the in-mold method produces a scratch resistant coating that replicates the topography and smoothness of the mold casting face. However, a problem encountered when using conventional in-mold scratch resistant coatings is that minute "pinholes" often form in the coating. It is believed that the pinholes are caused by either contaminants on the mold, airborne particles falling on the coating before it is cured, or bubbles formed during the application of the coating which burst afterwards. The formation of such pinholes is especially prevalent when using a flat-top bifocal mold, such as the one depicted in FIG. 35. As illustrated, the segment line 454 of a bifocal segment 452 below the main surface 456 of the mold reduces the smoothness of the casting face. When a coating is spin-coated over the mold face, this indentation becomes an obstacle to the even flow of the casting face. The pinhole defects are mainly a problem in tinted lenses because the dye used to tint a lens can penetrate through the pinholes, resulting in a tiny speck of dye visible in the lens.

According to an embodiment of the invention, a first coating composition, i.e., a polymerizable "primer" material is passed through a filter and then placed within a mold member having a casting face and a non-casting face. The first coating composition preferably contains a photoinitiator to make it curable upon exposure to ultraviolet light. The mold member may then be spun so that the first composition becomes distributed over the casting face. The mold member is preferably rotated about a substantially vertical axis at a speed between about 750 and about 1000 revolutions per minute. Further, a dispensing device may be used to direct an additional amount of the first composition onto the casting face while the mold member is spinning. The dispensing device preferably moves from the center of the mold member to an edge of the mold member so that the additional amount is directed along a radius of the mold member. Ultraviolet light is preferably directed at the mold member to cure at least a portion of the first composition.

A second coating composition may then be placed upon the first composition in the mold member. The second coating is also preferably curable when exposed to ultraviolet light because it contains a photoinitiator. The mold member is again spun to distribute the second coating composition over the cured portion of the first coating composition. The mold member may also be spun simultaneously while adding the second composition to the mold member. Ultraviolet light is then preferably directed at the mold member to simultaneously cure at least a portion of the second coating composition and form a transparent combination coat having both coating compositions. The combination coat is preferably a substantially scratch-resistant coating. The mold member may then be assembled with a second mold member by positioning a gasket between the members to seal them. Therefore, a mold having a cavity shared by the original two mold members is formed. An edge of the gasket may be displaced to insert a lens-forming composition into the cavity. The combination coat and the lens-forming material preferably adhere well to each other. This lens-forming composition preferably comprises a photoinitiator and is preferably cured using ultraviolet light. Air which preferably has a temperature below ambient temperature may be directed toward a non-casting face of the second mold member to cool the lens-forming composition while it is being cured.

The primer coat preferably comprises a mixture of high viscosity monomers, a low viscosity, low flashpoint organic solvent, and a suitable photoinitiator system. The solvent may make up about more than 80% of the mixture, preferably about 93% to 96%. This mixture preferably has low viscosity and preferably covers any surface irregularity during the spin application, for example the segment line of a flat-top bifocal mold. The low flashpoint solvent preferably evaporates off relatively quickly, leaving a thin layer of high viscosity monomer, containing photoinitiator, which coats the casting face of the mold. The cured primer coat is preferably soft to allow it to adhere well to the glass mold face. Since the primer coat is soft, it may not possess scratch resistant characteristics. However, applying a high scratch resistance hard coating (i.e., the second coating composition) to the primer coat preferably results in a scratch resistant combination coat. The hard coat preferably contains a solvent which evaporates when the mold member is rotated to distribute the hard coating over the primer coat.

In general, the ideal primer material preferably possesses the following characteristics: exhibits chemical stability at normal storage conditions, e.g. at room temperature and in the absence of ultraviolet light; flows well on an irregular surface, especially over a flat-top bifocal segment; when cured with a specified ultra-violet dose, leaves a crack-free coating, with a high double bond conversion (approximately greater than 80%); maintains adhesion with the mold face through the lens forming curing cycle, especially the segment part of the flat-top bifocal mold; and is chemically compatible with the hard coat which is subsequently applied on top of it, e.g. forms an optically clear combination coat. Even though pinhole defects may be present in either the primer coat or the hard coat, it is highly unlikely that defects in one coat would coincide with defects of another coat. Each coat preferably covers the holes of the other coat, resulting in less pinholes in the combination coat. Thus, the finished in-mold coated lens may be tinted using dye without problems created by pinholes. It is also preferably free of cracks, yellowness, haziness, and distortions.

In an embodiment, the gasket between the first mold member and the second mold member may be removed after a portion of the lens-forming material has been cured. The removal of the gasket preferably exposes an edge of the lens. An oxygen barrier having a photoinitiator may be placed around the exposed edge of the lens, wherein the oxygen barrier photoinitiator is preferably near an uncured portion of the lens-forming composition. Additional ultraviolet rays may then be directed towards the lens to cause at least a portion of the oxygen barrier photoinitiator to initiate reaction of the lens-forming material. The oxygen barrier preferably prevents oxygen from contacting at least a portion of the lens forming composition during exposure of the lens to the ultraviolet rays.

According to one embodiment, a substantially solid conductive heat source is applied to one of the mold members. Heat may be conductively transferred from the heat source to a face of the mold member. Further, the heat may be conductively transferred through the mold member to the face of the lens.

SCRATCH RESISTANT LENS FORMATION PROCESS EXAMPLE

A first coating composition, hereinafter referred to as "Primer", was prepared by mixing the following components by weight:

93.87% acetone;

3.43% SR-399 (dipentaerythritol pentaacrylate), available from Sartomer;

2.14% CN-104 (epoxy acrylate), available from Sartomer;

0.28% Irgacure 184 (1-hydroxycyclohexylphenylketone), available from Ciba-Geigy; and 0.28% Darocur 1173 (2-hydroxy-2-methyl-1-phenyl-propan-1-one) available from Ciba-Geigy.

A second coating composition, hereinafter referred to as "HC8-H" was prepared by mixing the following components by weight:

84.69% 1-methoxy 2-propanol;

9.45% SR-399 (dipentaerythritol pentaacrylate), available from Sartomer;

4.32% SR601 (ethoxylated bisphenol A diacrylate), available from Sartomer; and 1.54% Irgacure 184 (1-hydroxycyclohexyl-phenyl ketone), available from Ciba-Geigy.

Each of these coating compositions was prepared by first dissolving the monomers into the solvent, then adding the photoinitiators, mixing well, and finally passing the composition through a one micron filter prior to use.

An 80 mm diameter glass 28 mm flattop mold with a distance radius of curvature of −6.00 diopters and a +2.00 diopter bifocal add power were sprayed with a mixture of isopropyl alcohol and distilled water in equal parts. The flattop mold was wiped dry with a lint free paper towel. The non-casting face of the mold was mounted to a suction cup, which was attached to a spindle. The spindle was placed on the spinning device provided in the FastCast UX-462 Flash-Cure Unit, commercially available from the FastCast Corporation of Louisville, Ky.

A one inch diameter pool of liquid Primer was dispensed into the center of the horizontally positioned glass mold. The Primer was dispensed from a soft polyethylene squeeze bottle equipped with a nozzle having an orifice diameter of approximately 0.040 inches. A spin motor of the spinning device was engaged to rotate the mold at a speed of approximately 850 to 900 revolutions per minute, causing the liquid Primer to spread out over the face of the mold. Immediately thereafter, a steady stream of an additional 1.5 to 2.0 grams of Primer material was dispensed onto the casting face of the spinning mold. The stream of Primer material was directed onto the casting face with the nozzle tip positioned at a 45 degree angle approximately 12 mm from the mold face. This positioning of the nozzle tip made the stream to flow with the direction of rotation of the mold. The stream of Primer material was directed first at the center of the mold face and then dispensed along the radius of the mold face in a direction from the center toward the edge of the mold face.

The solvent present in the Primer was allowed to evaporate off for 8 to 10 seconds during rotation of the mold. The rotation was stopped and the Primer coat which remained on the mold was cured via two exposures to the ultraviolet output from the medium pressure mercury vapor lamp contained in the UX-462 FlashCure unit, totaling approximately 300 mJ/cm$^2$. All light intensity/dosage measurements cited herein were taken with an International Light IL-1400 Radiometer equipped with an XLR-340B Detector Head, both commercially available from International Light, Inc. of Newburyport, Mass.

Upon exposure to the ultraviolet light, the spin motor was again engaged and approximately 1.5 to 2.0 grams of HC8-H Hard Coat, commercially available from the Fast-Cast Corporation of Louisville, Ky. was dispensed onto the spinning mold in a similar fashion as the Primer coat. The solvent present in the HC8-H was allowed to evaporate off for 25 seconds while the mold was spinning. The rotation was stopped, and the HC8-H coat was cured in the same manner as the Primer coat.

The mold was removed from the FlashCure unit and assembled into a silicone rubber gasket in combination with a cleaned convex mold possessing a radius of curvature of +7.50 diopters. The raised lip present on the inner circumference of the rubber gasket provided a spacing of 1.8 mm between the two molds at the center point. At this point, the mold/gasket assembly was positioned on a filling stage and the edge of the gasket was peeled back to permit the cavity to be filled with OMB-91 lens forming composition, commercially available from the FastCast Corporation of Louisville, Ky. The edge of the gasket was returned to its sealing relationship with the edges of the molds and the excess lens forming composition was vacuumed off the non-casting surface of the back mold with a suction device.

The filled mold/gasket assembly was transferred from the filling stage to an FC-132 curing chamber, commercially available from the FastCast Corporation of Louisville, Ky. While in the chamber, the assembly was continuously irradiated from both sides for a period of 15 minutes at approximately 300 microwatts/cm$^2$ from above and at approximately 350 microwatts/cm$^2$ from below, according to the minus lens light distribution pattern called for by the manufacturer. During the irradiation, the casting cell was continuously exposed to streams of air having a temperature of 42° F.

The mold/gasket assembly was subsequently returned to the UX-462 FlashCure unit. The non-casting surface of the back mold was exposed to four doses of high intensity UV light totaling approximately 1150 mJ/cm$^2$. The gasket was stripped from the assembly and residual uncured material was wiped from the exposed edge of the lens. An oxygen barrier strip (polyethylene) was wrapped around the edge of the lens. The mold/gasket assembly was exposed to two more doses of high intensity UV light, wherein 575 mJ/cm$^2$ total was directed to the non-casting surface of the front mold. Subsequently, eight more flashes of the UV light were directed to the non-casting surface of the back mold, totaling 2300 mJ/cm$^2$.

The non-casting surface of the back mold was placed in contact with a thermal transfer pad, commercially available from the FastCast Corporation of Louisville, Ky., at a temperature of approximately 150 to 200° F. for thirteen minutes. The mold/gasket assembly was removed from the thermal transfer pad, and the back mold was removed with a slight impact from an appropriately sized wedge. The front mold with the lens attached thereto was placed in a container of room temperature water. While within the water, the lens became separated from the front mold. The now-finished lens was sprayed with a mixture of isopropyl alcohol and water in equal parts and wiped dry.

The lens was positioned in a holder and placed into a heated dye pot for 5 minutes. The dye pot contained a solution of BPI Black, commercially available from Brain Power, Inc. of Miami, Fla., and distilled water at a temperature of approximately 190 degrees F. The lens was removed from the dye pot, rinsed with tap water, and wiped dry. The lens exhibited a total visible light absorbance of approximately 80%. When inspected for cosmetic defects on a light table, no pinhole defects were observed. Further, the tint which had been absorbed by the back surface of the lens was found to be smooth and even.

NON-POLYMERIZABLE SCRATCH RESISTANT COATING PROCESS EXAMPLE

A non-polymerizable coating composition, hereinafter referred to as "Precoat", was prepared by mixing the following materials by weight: 99.80% acetone; and 0.20% BYK-300, a slip agent commercially available from BykChemie.

An 80 mm diameter glass 28 mm flattop mold with a distance radius of curvature of −6.00 diopters and a +2.00 diopter bifocal add power was sprayed with a mixture of isopropyl alcohol and distilled water in equal parts. The mold was subsequently wiped dry with a lint free paper towel. The non-casting face of the mold was mounted to a suction cup, which was attached to a spindle. The spindle was placed on the spinning device provided in the FastCast UX-462 FlashCure Unit, commercially available from the FastCast Corporation of Louisville, Ky.

A spin motor of the spinning device was engaged to rotate the mold at a speed of approximately 850 to 900 revolutions per minute. A steady stream of approximately 2.0 to 3.0 grams of Precoat material was dispensed onto the casting face of the spinning mold with the nozzle tip positioned at a 45 degree angle approximately 12 mm from the mold face, thereby causing the stream to flow with the direction of rotation of the mold. The stream of Precoat material was directed first at the center of the mold face. The stream was then dispensed along the radius of the mold face in a direction from the center toward the edge of the mold face. The intended purpose of the Precoat was to improve the wetting characteristics of the glass mold so that the HC8-H material would flow over it more evenly.

The solvent present in the Precoat evaporated off the spinning mold almost instantly, and approximately 1.5 to 2.0 grams of HC8-H Hard Coat was dispensed onto the casting face of the spinning mold. The HC8-H Hard Coat was directed onto the casting face along the radius of the mold face in a direction from the center toward the edge. The nozzle tip was positioned at a 45 degree angle approximately 12 mm from the mold face such that the stream was flowing with the direction of rotation of the mold. The solvent present in the HC8-H was allowed to evaporate off for 25 seconds while the mold was spinning. The rotation was stopped, and the HC8-H coat was cured via two exposures to the ultraviolet output from the medium pressure mercury vapor lamp contained in the UX-462 FlashCure unit, totaling approximately 300 mJ/cm$^2$.

The mold was removed from the FlashCure unit and assembled into a silicone rubber gasket in combination with a cleaned convex mold possessing a radius of curvature of +7.50 diopters. The raised lip present on the inner circumference of the rubber gasket provided a spacing of 1.8 mm between the two molds at the center point. The mold/gasket assembly was positioned on a filling stage, and the edge of the gasket was peeled back to permit the cavity to be filled with OMB-91 lens forming composition, commercially available from the FastCast Corporation of Louisville, Ky. The edge of the gasket was returned to its sealing relationship with the edges of the molds. The excess lens forming composition was vacuumed from the non-casting surface of the back mold with a suction device. The filled mold/gasket assembly was transferred from the filling stage to an FC-132 curing chamber, commercially available from the FastCast Corporation of Louisville, Ky. The assembly was continuously irradiated from both sides for a period of 15 minutes at approximately 300 microwatts/cm$^2$ from above and approximately 350 microwatts/cm$^2$ from below, according to the minus lens light distribution pattern called for by the manufacturer. During the irradiation, the casting cell was continuously exposed to streams of air having a temperature of 42° F.

The assembly was subsequently returned to the UX-462 FlashCure unit. The non-casting surface of the back mold was exposed to four doses of high intensity UV light, totaling approximately 1150 mJ/cm$^2$. The gasket was stripped from the assembly, and residual uncured material was wiped from the exposed edge of the lens. An oxygen barrier strip (i.e., polyethylene) was wrapped around the edge of the lens and the cell was exposed to two more doses of high intensity UV light, wherein 575 mJ/cm$^2$ total were directed to the non-casting surface of the front mold. Eight more flashes of high intensity UV light followed. The eight flashes exposed the non-casting surface of the back mold to a total of 2300 mJ/cm$^2$.

The non-casting surface of the back mold was placed in contact with a thermal transfer pad at a temperature of approximately 150 to 200° F. for thirteen minutes. The assembly was removed from the thermal transfer pad, and the back mold was removed with a slight impact from an appropriately sized wedge. The front mold with the lens attached thereto was placed in a container of room temperature water in order to cause the lens to be separated from the front mold. The now-finished lens was sprayed with a mixture of isopropyl alcohol and water in equal parts and wiped dry.

The lens was positioned in a holder and placed into a heated dye pot for 5 minutes. The dye pot contained a solution of BPI Black, commercially available from Brain Power, Inc. of Miami, Fla., and distilled water at a temperature of approximately 190° F. The lens was removed from the dye pot, rinsed with tap water and wiped dry. The lens exhibited a total visible light absorbance of approximately 80%. When inspected for cosmetic defects on a light table, several pinhole tint defects were observed. They appeared to be in the range of 0.2 mm to 0.05 mm in diameter. However, the tint which had been absorbed by the back surface of the lens was found to be smooth and even.

ULTRAVIOLET INITIATED POLYMERIZATION OF A LENS FORMING COMPOSITION CONTAINING ULTRAVIOLET ABSORBING MATERIALS

Materials (hereinafter referred to as "ultraviolet absorbing compounds") that absorb various degrees of ultraviolet light may be used in an eyeglass lens to inhibit ultraviolet light from being transmitted through the eyeglass lens. Such an eyeglass lens advantageously inhibits ultraviolet light from being transmitted to the eye of a user wearing the lens. Thus eyeglass lenses containing ultraviolet absorbing compounds may function to protect the eyes of a person from damaging ultraviolet light. Photochromic pigments are one type of ultraviolet absorbing compounds. Photochromic inorganic lenses which contain silver halide particles or cuprous halide particles suspended throughout the body of the lens are well known and have been commercially available for decades. Such inorganic lenses, however, suffer the disadvantage of being relatively heavy and less comfortable to the wearer when compared to organic lenses. Consequently, the majority of the eyeglass lenses produced today are formed from organic materials rather than Morganic materials. Accordingly, photochromic plastic eyeglass lenses have been the subject of considerable attention in recent years.

Efforts to provide a plastic eyeglass lens which demonstrates photochromic performance have primarily centered around permeating and/or covering the surface(s) of an already formed lens with photochromic pigments. This general technique may be accomplished by a number of specific methods. For example, (a) the lens may be soaked in a heated bath which contains photochromic pigments, (b)

photochromic pigments may be transferred into the surface of a plastic lens via a solvent assisted transfer process, or (c) a coating containing photochromic pigments may be applied to the surface of a lens. A problem with such methods is that the lens often might not absorb enough of the photochromic pigments at low temperatures, resulting in an eyeglass lens which does not exhibit acceptable photochromic performance. Unfortunately, increasing the temperature used during absorption of the photochromic pigments is not a solution to this problem since at high temperatures degradation of the polymer contained within the lens may occur.

Attempts have also been made to incorporate photochromic pigments into the liquid monomer from which plastic lenses are thermally polymerized. See U.S. Pat. No. 4,913,544 to Rickwood et al., wherein it is disclosed that triethyleneglycol dimethacrylate monomer was combined with 0.2% by weight of various spiro-oxazine compounds and 0.1% benzoyl peroxide and subsequently thermally polymerized to form non-prescription eyeglass lenses. Generally, efforts to incorporate photochromic pigments into the liquid monomer from which the lenses are polymerized have been unsuccessful. It is believed that the organic peroxide catalysts utilized to initiate the thermal polymerization reaction tend to damage the photochromic pigments, impairing their photochromic response.

Curing of an eyeglass lens using ultraviolet light to initiate the polymerization of a lens forming composition generally requires that the composition exhibit a high degree of ultraviolet transmissibility so that the activating radiation can penetrate to the deeper regions of the lens cavity. Otherwise the resulting cast lens may possess optical aberrations and distortions. The cast lens may also contain layers of cured material in the regions closest to the transparent mold faces, sandwiching inner layers which are either incompletely cured, gelled, barely gelled, or even liquid. Often, when even small amounts of ultraviolet absorbing compounds of the types well known in the art are added to a normally UV curable lens forming composition, substantially the entire amount of lens forming composition contained within the lens cavity may remain liquid in the presence of activating radiation.

Photochromic pigments which have utility for photochromic eyeglass lenses absorb ultraviolet light strongly and change from an unactivated state to an activated state when exposed to light. The presence of photochromic pigments, as well as other ultraviolet absorbing compounds within a lens forming composition, generally does not permit enough activating radiation to penetrate into the depths of the lens cavity sufficient to cause ultraviolet photoinitiators to break down and initiate polymerization of the lens forming composition. Thus, it is difficult to cure a lens forming composition containing ultraviolet absorbing compounds using ultraviolet light. It is therefore desirable to provide a method for using ultraviolet light to initiate polymerization of an eyeglass lens forming monomer which contains ultraviolet absorbing compounds, in spite of the high ultraviolet absorption characteristics of the ultraviolet absorbing compounds. Examples of such ultraviolet absorbing compounds other than photochromic pigments are fixed dyes and colorless additives.

In an embodiment of the present invention, an ophthalmic eyeglass lens may be made from a lens forming composition comprising a monomer, an ultraviolet absorbing compound, an ultraviolet photoinitiator, and a co-initiator. Herein, an "ophthalmic eyeglass lens" is taken to mean any plastic eyeglass lens, including a prescription lens, a non-prescription lens, a sunglass lens, and a bifocal lens. The lens forming composition, in liquid form, is preferably placed in a mold cavity defined by a first mold member and a second mold member. It is believed that ultraviolet light which is directed toward the mold members to activate the photoinitiator causes the photoinitiator to form a polymer chain radical. The polymer chain radical preferably reacts with the co-initiator more readily than with the monomer. The co-initiator may react with a fragment or an active species of either the photoinitiator or the polymer chain radical to produce a monomer initiating species in the regions of the lens cavity where the level of ultraviolet light is either relatively low or not present.

The co-initiator is preferably activated only in the presence of the photoinitiator. Further, without the co-initiator, the photoinitiator may exclusively be activated near the surface of the lens forming composition but not within the middle portion of the composition. Therefore, using a suitable photoinitiator combined with a co-initiator permits polymerization of the lens forming composition to proceed through the depths of the lens cavity. A cured, clear, aberration free lens is preferably formed in less than about 30 minutes, more preferably in less than about 10 minutes.

Herein, a "clear lens" is taken to mean a lens that transmits visible light without scattering so that objects beyond the lens are seen clearly. Herein, "aberration" is taken to mean the failure of a lens to produce point-to-point correspondence between an object and its image. The lens, when exposed to ultraviolet light preferably inhibits at least a portion of the ultraviolet light from being transmitted through the lens that is preferably formed. A lens that permits no ultraviolet light from passing through the lens (at least with respect to certain UV wavelengths) is more preferred.

In an embodiment, the lens forming composition which contains an ultraviolet absorbing compound may be cured with ultraviolet light utilizing the UVEXS curing apparatus previously described herein and depicted in FIG. 10. In another embodiment, the lens forming composition may be cured with ultraviolet light supplied from the FC-104 curing chamber which is depicted in FIGS. 14 and 15. Alternately, the lens forming composition may be cured by exposing the composition to ultraviolet light multiple times using both the UVEXS and the FC-104. Preferably, all ultraviolet light directed toward the mold members is at a wavelength of 400 nm or below. The above-mentioned embodiments which describe various methods for forming eyeglass lenses may also be utilized to form the eyeglass lens hereof.

The identity of the major polymerizable components of the lens forming composition tends to affect the optimal curing process. It is anticipated that the identity of the ultraviolet absorbing compound present in the monomer or blend of monomers may affect the optimal photoinitiator/co-initiator system used as well as the optimal curing process used to initiate polymerization. Also, varying the identities or the proportions of the monomer(s) in the lens forming composition may require adjustments to various production process variables including, but not limited to, exposure times, exposure intensities, cooling times and temperatures, ultraviolet and thermal postcure procedures and the like. For example, compositions comprising relatively slow reacting monomers, such as bisphenol A bis allyl carbonate or hexanediol dimethacrylate, or compositions comprising relatively higher proportions of such monomers may require either longer exposure times, higher intensities, or both. It is postulated that increasing the amount of either fast reacting monomer or the initiator levels present in a system will require reduced exposure times, more rigidly controlled light doses, and more efficient exothermic heat removal.

Preferably, the monomers selected as components of the lens forming composition are capable of dissolving the ultraviolet absorbing compounds added to them. Herein, "dissolving" is taken to mean being substantially homogeneously mixed with". For example, monomers may be selected from a group including polyol (allyl carbonate) monomers, multi-functional acrylate monomers, and multi-functional methacrylic monomers for use in an ultraviolet absorbing lens forming composition.

In an embodiment, the following mixture of monomers, hereinafter referred to as PRO-629, may be blended together before addition of other components required to make the lens forming composition. This blend of monomers is preferably used as the basis for a lens forming composition to which ultraviolet absorbing compounds are added.

32% Tripropyleneglycol diacrylate (SR-306)
21% Tetraethyleneglycol diacrylate (SR-268)
20% Trimethylolpropane triacrylate (SR-351)
17% Bisphenol A bis allyl carbonate (HiRi)
10% Hexanediol dimethacrylate (SR-239)

The acrylic and methacrylic monomers listed above are commercially available from Sartomer Company in Exton, Pa. The bisphenol A bis allyl carbonate is commercially available from PPG in Pittsburgh, Pa. The hexanediol dimethacrylate is hereinafter referred to as HDDMA.

A polymerization inhibitor may be added to the monomer mixture at relatively low levels to inhibit polymerization of the monomer at inappropriate times (e.g., during storage). Preferably about 0 to 50 ppm of monomethylether hydroquinone (MEHQ) are added to the monomer mixture. It is also preferred that the acidity of the monomer mixture be as low as possible. Preferably less than about 100 ppm residual acrylic acid exists in the mixture. It is also preferred that the water content of the monomer mixture be relatively low, preferably less than about 0.15%.

Ultraviolet photoinitiators which have utility in the present invention may include: 1-hydroxycyclohexylphenyl ketone commercially available from Ciba Additives under the trade name of Irgacure 184; mixtures of bis(2,6-dimethoxybenzoyl) (2,4,4-trimethyl phenyl) phosphine oxide and 2-hydroxy-2-methyl-1phenyl-propan1-one commercially available from Ciba Additives under the trade name of Irgacure 1700; mixtures of bis(2,6-dimethoxybenzoyl) (2,4,4 trimethyl phenyl) phosphine oxide and 1-hydroxycyclohexylphenyl ketone commercially available from Ciba Additives under the trade names of Irgacure 1800 and Irgacure 1850; 2,2-dimethoxy-2-phenyl acetophenone commercially available from Ciba Additives under the trade name of Irgacure 651; 2-hydroxy-2-methyl-1phenyl-propan1-one commercially available from Ciba Additives under the trade names of Darocur 1173; mixtures of 2,4,6-trimethylbenzoyl-diphenylphoshine oxide and 2-hydroxy-2-methyl-1phenyl-propan1-one commercially available from Ciba Additives under the trade name of Darocur 4265; 2,2-diethoxyacetophenone (DEAP) commercially available from First Chemical Corporation of Pascagoula, Miss., benzil dimethyl ketal commercially available from Sartomer Company under the trade name of KB-1; alpha hydroxy ketone commercially available from Sartomer company under the trade name of Esacure KIP100F; 2-methyl thioxanthone (MTX), 2-chloro thioxanthone (CTX), thioxanthone (TX), and xanthone, all commercially available from Aldrich Chemical; 2-isopropyl thioxanthone (ITX) commercially available from Aceto Chemical in Flushing, N.Y.; mixtures of triaryl sulfonium hexafluoroantimonate and propylene carbonate commercially available from Sartomer Company under the trade names of SarCat CD 1010, SarCat 1011, and SarCat KI85; diaryl iodonium hexafluoroantimonate commercially available from Sartomer Company under the trade name of SarCat CD-1012; mixtures of benzophenone and 1-hydroxycyclohexylphenyl ketone commercially available from Ciba Additives under the trade name of Irgacure 500; 2-benzyl-2-N,N-dimethylamino-1-(4-morpholinophenyl)-1-butanone commercially available from Ciba Additives under the trade name of Irgacure 369; 2-methyl-1-[4-(methylthio) phenyl]-2-morpholino propan-1-one commercially available from Ciba Additives under the trade name of Irgacure 907; bis(n5-2,4-cyclopentadien-1yl)-bis-[2,6-difluoro-3-(1H-pyrrol-1-yl)phenyl] titanium commercially available from Ciba Additives under the trade name of Irgacure 784 DC; mixtures of 2,4,6-trimethyl benzophenone and 4-methylbenzophenone commercially available from Sartomer Company under the trade name of EsaCure TZT; and benzoyl peroxide and methyl benzoyl formate both available from Aldrich Chemical in Milwaukee, Wis.

A preferred ultraviolet photoinitiator is bis(2,6 dimethoxybenzoyl) (2,4,4 trimethyl phenyl) phosphine oxide, commercially available from Ciba Additives in Tarrytown, N.Y. under the trade name of CGI-819. The amount of CGI-819 present in a lens forming composition containing photochromic compounds preferably ranges from about 30 ppm by weight to about 2000 ppm by weight.

Co-initiators which may have utility in the present invention include reactive amine co-initiators commercially available from Sartomer Company under the trade names of CN-381, CN-383, CN-384, and CN-386, where these co-initiators are monoacrylic amines, diacrylic amines, or mixtures thereof. Other co-initiators include N,N-dimethyldiethanolamine (N,NMDEA), triethanolamine (TEA), ethyl-4-dimethylamino benzoate (E-4-DMAB), ethyl-2-dimethylamino benzoate (E-2-DMAB), all commercially available from Aldrich Chemicals. Co-initiators which may also be used include n-butoxyethyl-4-dimethyl amino benzoate, P-dimethyl amino benzaldehyde. Other co-initiators include N,N-dimethyl-para-toluidine, octyl-para-(dimethylamino) benzoate commercially available from The First Chemical Group of Pascagoula, Miss.

Preferably, the co-initiator is N-methyldiethanolamine (NMDEA) commercially available from Aldrich Chemical in Milwaukee, Wis., CN-384 commercially available from Sartomer Company, or CN-386 also commercially available from Sartomer Company. The quantity of NMDEA present in a lens forming composition containing photochromic pigments is preferably between about 1 ppm by weight and 7% by weight and more preferably between about 0.3% and 2% by weight. Further, certain fixed pigments which may be added to the lens forming composition to create a background color within the lens (i.e., to tint the lens), may also function as co-initiators. Examples of such fixed pigments include Thermoplast Blue P, Oil Soluble Blue II, Thermoplast Red 454, Thermoplast Yellow 104, Zapon Brown 286, Zapon Brown 287, all commercially available from BASF Corporation in Holland, Mich.

Ultraviolet absorbing compounds which may be added to a normally ultraviolet transmissible lens forming composition include 2-(2H benzotriazole-2-yl)4-(1,1,3,3 tetramethyl butyl) phenol and 2-hydroxy-4-methoxybenzophenone, both commercially available from Aldrich Chemical as well as mixtures of 2-[4-((2-hydroxy-3-dodecyloxypropyl)-oxy]2-2 hydroxyphenyl]-4,6-bis(2,4-dimethylphenyl)-1,3,5-triazine and 2-[4-(2-hydroxy-3-tridecyloxypropyl)-oxy]-2-hydroxyphenyl]-4,6-bis(2,4-dimethylpheyl-1,3,5-triazine commercially available from Ciba Additives under the trade name of Tinuvin 400, mixtures of poly (oxy-1,2-ethanediyl), a-(3-(3-(2H-benzotriazol-2-yl)-5-(1,1-dimethylethyl)-4-hydroxyphenyl)-1-oxopropyl)-w-hydroxy and poly(oxy-1, 2-ethanediyl), a-(3-(3-(2H-benzotriazol-2-yl)-5-(1,1-dimethylethyl)-4-hydroxyphenyl)-1-oxopropyl)-w-(3-(3-(2H-benzotriazol-2-yl)-5-1,1-dimethylethyl)-4- hydroxyphenyl)-1-oxopropoxy) commercially available from Ciba Additives under the trade name of Tinuvin 1130. Other UV absorbers may include Tinuvin 328, Tinuvin 900, 2(2 hydroxy-5-methyl phenyl) benzotriazole, ethyl-2-cyano 3,3 diphenyl acrylate, and phenyl salicylate.

While any number of families of photochromic pigments may be incorporated into the blend of monomers, either individually or in combination, spiropyrans, spironapthoxazines, spiropyridobenzoxazines, spirobenzoxazines, napthopyrans benzopyrans, spiro-oxazines, spironapthopyrans, indolinospironapthoxazines, indolinospironapthopyrans, diarylnapthopyrans, and organometallic materials, such as phenylmercury compounds are of particular interest. A phenylmercury compound available from Marks Polarized Corporation in Hauppauge, N.Y. under the trade name of A241 may be an appropriate organometallic material. The quantity of photochromic pigments present in the lens forming composition is preferably sufficient to provide observable photochromic effect. The amount of photochromic pigments present in the lens forming composition may widely range from about 1 ppm by weight to 5% by weight. In preferred compositions the photochromic pigments are present in ranges from about 30 ppm to 2000 ppm. In the more preferred compositions the photochromic pigments are present in ranges from about 150 ppm to 1000 ppm. The concentration may be adjusted depending upon the thickness of the lens being produced to obtain optimal visible light absorption characteristics.

In an embodiment, hindered amine light stabilizers may be added to the lens forming composition. It is believed that these materials act to reduce the rate of degradation of the cured polymer caused by exposure to ultraviolet light by deactivating harmful polymer radicals. These compounds may be effective in terminating oxygen and carbon free radicals, and thus interfering with the different stages of auto-oxidation and photo-degradation. A useful hindered amine light stabilizer is bis(1,2,2,6,6-pentamethyl-4-piperidinyl) sebacate commercially available from Ciba Additives under the trade name of Tinuvin 292. Hindered phenolic anti-oxidants and thermal stabilizers may also be added to a lens forming composition. The hindered phenolic compounds hereof include thiodiethylene bis-(3,5,-di-tert-butyl-4-hydroxy)hydrocinnamate commercially available from Ciba Additives under the trade name of Irganox 1035 and octadecyl 3,5-bis(1,1-dimethylethyl)-4-hydroxybenzene-propanoate commercially available from Ciba Additives under the trade name of Irganox 1076.

Preferably, more than one monomer and more than one initiator are used in a lens forming composition to ensure that the initial polymerization of the lens forming composition with ultraviolet light does not occur over too short a period of time. The use of such a lens forming composition may allow greater control over the gel formation, resulting in better control of the optical quality of the lens. Further, greater control over the rate of exothermic heat generation may be achieved. Thus, cracking of the lens and premature release of the lens from the mold which are typically caused by the release of heat may be prevented. An example of a poor initiator system was observed when CGI-819 was used alone as a photoinitiator in combination with the PRO-629 monomer blend to which ultraviolet absorbing compounds had been added. When such an initiator system was used, a fast rate of reaction occurred near the surface of the lens cavity while a very slow rate of reaction occurred in the deeper regions of the cavity. The resultant lens exhibited unwanted waves and distortions.

In another example, a small amount of a co-initiator, i.e., NMDEA was added to the above lens forming composition. During the curing process, two separate waves of heat were generated when the composition was irradiated continuously at about 600 microwatts/cm$^2$. One possible explanation of this phenomena is that the first wave resulted from reaction of the NMDEA and the second wave resulted from the reaction of the unconsumed portion of the CGI-819. Another possible explanation is that the rate of reaction was faster in the top portion than in the bottom portion of the lens forming composition since ultraviolet light was separately directed toward both the bottom and the top mold members. A third wave of heat generation may also occur if the rate of reaction at the middle portion of the lens forming composition is different from the rates at the bottom and top portions. Unfortunately, the resulting lens possessed waves and distortions. It is postulated, however, that as the amounts of both CGI-819 and NMDEA are increased, the two waves of exothermic heat will move closer together in time, causing the optical quality of the lens to improve, the hardness of the lens to increase, and the rate of heat generation to be slow enough to prevent cracking and premature release of the lens from the mold.

It is anticipated that the optimal amounts of the lens forming composition components is where the total amount of both initiators are minimized subject to the constraint of complete polymerization and production of a rigid, aberration free lens. The relative proportions of the photoinitiator to the co-initiator may be optimized by experimentation. For example, an ultraviolet absorptive lens forming composition that includes a photoinitiator with no co-initiator may be cured. If waves and distortions are observed in the resulting lens, a co-initiator may then be added to the lens forming composition by increasing amounts until a lens having the best optical properties is formed. It is anticipated that excess co-initiator in the lens forming composition should be avoided to inhibit problems of too rapid polymerization, yellowing of the lens, and migration of residual unreacted co-initiator to the surface of the finished lens.

The following charts may be used as a guide in the selection of an appropriate photoinitiator/co-initiator system for various UV absorbtive lens forming composition Photoinitiator Guide

| Photoinitiator | Yellowness | Odor | Shelf Life | Lens Forming Composition Type | | |
| --- | --- | --- | --- | --- | --- | --- |
| | | | | UV Absorbtive Photochromic | UV Absorbtive Fixed Pigments | UV Absorbtive Colorless |
| CGI 819 | Moderate | Low | Good | Good | Good | Good |
| Irgacure 184 | Low | Low | Good | Good | Good | Good |
| Irgacure 651 | High | Low | Poor | Less Preferred | Good | Less Preferred |
| Irgacure 1700 | High | Low | Fair | Good | Good | Less Preferred |
| Irgacure 1800 | Moderate | Low | Good | Good | Good | Less Preferred |
| Irgacure 1850 | Moderate | Low | Good | Good | Good | Good |
| Darocur 1173 | High | Low | Good | Good | Good | Less Preferred |

-continued

Photoinitiator Guide

| | | | | Lens Forming Composition Type | | |
|---|---|---|---|---|---|---|
| Photoinitiator | Yellowness | Odor | Shelf Life | UV Absorbtive Photochromic | UV Absorbtive Fixed Pigments | UV Absorbtive Colorless |
| Darocur 4265 | High | Moderate | Fair | Good | Good | Less Preferred |
| DEAP | High | Strong | Poor | Less Preferred | Less Preferred | Less Preferred |
| KB-1 | High | Strong | Poor | Less Preferred | Less Preferred | Less Preferred |
| EsaCure KIP100F | High | Strong | Poor | Less Preferred | Less Preferred | Less Preferred |
| Irgacure 369 | High | Moderate | Poor | Less Preferred | Good | Less Preferred |
| Irgacure 500 | High | Strong | Poor | Less Preferred | Less Preferred | Less Preferred |
| Irgacure 784 DC | High | Low | Poor | Less Preferred | Less Preferred | Less Prefereed |
| Irgacure 907 | High | Strong | Poor | Less Preferred | Less Preferred | Less Preferred |
| Benzoyl peroxide | Moderate | Low | Poor | Less Preferred | Less Preferred | Less Preferred |
| Methyl benzoyl formate | Moderate | Low | Fair | Less Preferred | Less Preferred | Less Preferred |
| EsaCure TZT | High | Low | Poor | Less Preferred | Less Preferred | Less Preferred |
| ITX | High | Low | Poor | Less Preferred | Good | Good |
| MTX | High | Low | Poor | Less Preferred | Good | Good |
| CTX | High | Low | Poor | Less Preferred | Less Preferred | Less Preferred |
| TX | High | Low | Poor | Less Preferred | Less Preferred | Less Preferred |
| Xanthone | High | Low | Poor | Less Preferred | Less Preferred | Less Preferred |
| CD-1010 | Low | Low | Poor | Good | Less Preferred | Less Preferred |
| CD-1011 | Low | Low | Poor | Good | Less Preferred | Less Preferred |
| CD1012 | Low | Low | Poor | Good | Good | Good |

Yellowness High, Moderate, Low
Odor Strong, Moderate, Low
Shelf life Good, Fair, Poor
Lens Forming Composition Type Good, Less Preferred Co-initiator Guide

| | Lens Forming Composition Type | | |
|---|---|---|---|
| Co-initiator | UV Absorbtive Photochromic | UV Absorbtive Fixed Pigments | UV Asorbtive Colorless |
| CN-383 | | Good | |
| CN-384 | Good | Good | Good |
| CN-386 | Good | Good | Good |
| NMDEA | Good | Good | Good |
| N,NMDEA | Less Preferred | Less Preferred | |
| TEA | Less Preferred | Less Preferred | |
| E-4-DMAB | Good | Less Preferred | Less Preferred |
| E-2-DMAB | | Less Preferred | Less Preferred |

Lens Forming Composition Type   Good, Less Preferred

As mentioned above, exothermic reactions occur during the curing process of the lens forming composition. The thicker portions of the lens forming composition may generate more heat than the thinner portions of the composition as a result of the exothermic reactions taking place. It is believed that the speed of reaction in the thicker sections is slower than in the thinner sections. Thus, in a positive lens a "donut effect" may occur in which the relatively thin outer portion of the lens forming composition reaches its fully cured state before the relatively thick inner portion of the lens forming composition. Conversely, in a negative lens the relatively thin inner portion of the lens forming composition may reach its fully cured state before the relatively thick outer portion of the lens forming composition.

Figure 36:
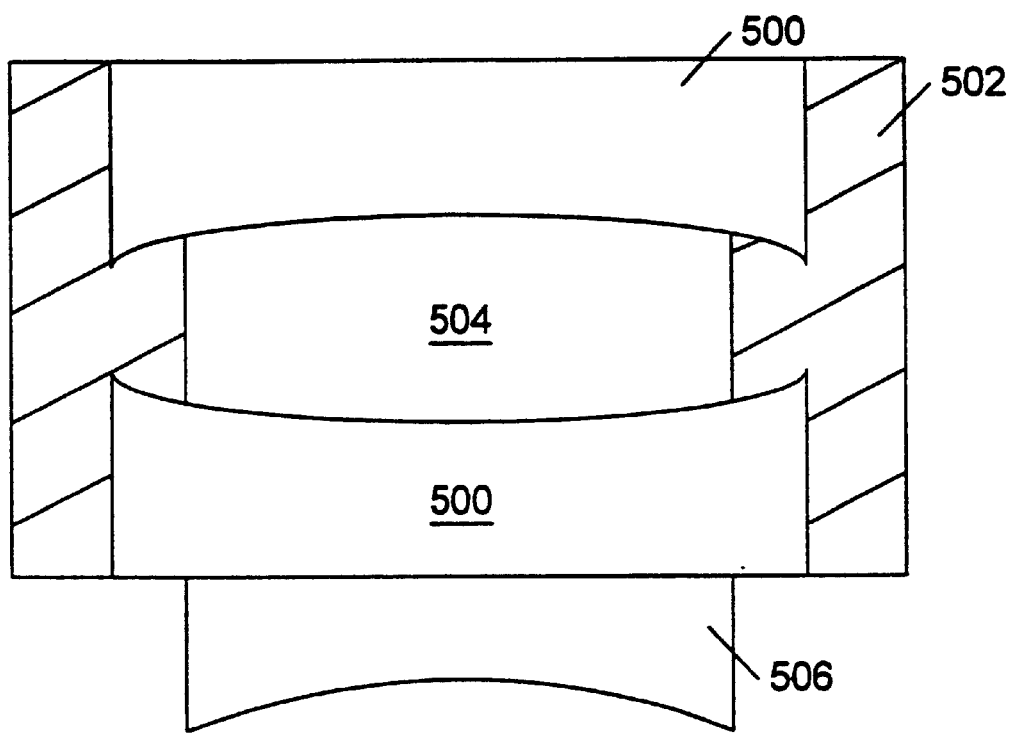
FIG. 36 depicts a cross sectional view of a filter disposed directly adjacent to a mold member.

Accordingly, it is preferred that a greater amount of ultraviolet light is applied to the thicker sections of the composition than to the thinner sections. FIG. 36 depicts one embodiment in which a pair of mold members 500 are held together by a gasket 502 such that members 500 define a cavity to make a positive lens. A filter 506 may be placed directly adjacent to at least one of the mold members 500. Filter 506 may further be disposed between an ultraviolet light source (not shown) and the mold member. Alternately, filters may be placed adjacent to both mold members (not shown). In one embodiment, as shown in FIG. 36, the thickness of the filter preferably varies so that a thinner section of the filter corresponds to an adjacent thicker section of the mold cavity and a thicker section of the filter corresponds to an adjacent thinner section of the mold cavity. In other words, the thickness of the filter may be varied according to the varying thickness of the lens forming composition disposed within the mold cavity. The filter is preferably a hazy filter that may be formed by a variety of means. The filter may be polymerized from a hazy material or any combination of materials which create haze. More specifically, the filter may be a "lens" (i.e., a piece of plastic shaped like a lens) made by adding an incompatible chemical to a typical lens forming composition. For example, a bisphenol compound may be added to a lens forming composition and polymerized, resulting in a cloudy filter in the shape of a lens that separates light into numerous (e.g., millions) of fragments. The filter may be injection molded from polyethylene or any suitable thermoplastic.

A purpose of the filter is to simultaneously diffuse light and provide differential light distribution between the thin and thick sections of the mold cavity. See U.S. Pat. No. 5,415,816 for a discussion of the importance of differential light distribution with respect to the ultraviolet light initiated polymerization of eyeglass lenses. See U.S. Pat. No. 4,728,469 for a discussion of the importance of light diffusion with respect to the ultraviolet initiated polymerization of eyeglass lenses. The filter is preferably translucent to ultraviolet light. When a hazy filter is used, the ultraviolet light may be broken up into a relatively large number of fragments. It is believed that the amount of light attenuation created by such a filter is proportional to the thickness of the filter. The diffusing characteristics of the filter tends to impact the occurrence of optical aberrations and distortions in the finished lens.

In general, when curing a minus (negative) lens which is thin in the center and thick on the edge, it is preferable to use a filter which is thick in the center and thin at the edge adjacent to the mold members. When curing a plus (positive) lens which is thick in the center and thin on the edge, it is preferable to use a filter which is thin in the center and thick at the edge adjacent to the mold members. The location of the filter is preferably chosen to be near the mold cavity so that the differential light distribution of the filter tends to be maximized. Thus, the ultraviolet light intensity directed toward the thick and thin regions of the mold cavity may be controlled more readily than if the filter is further away from the mold members.

Figure 35:
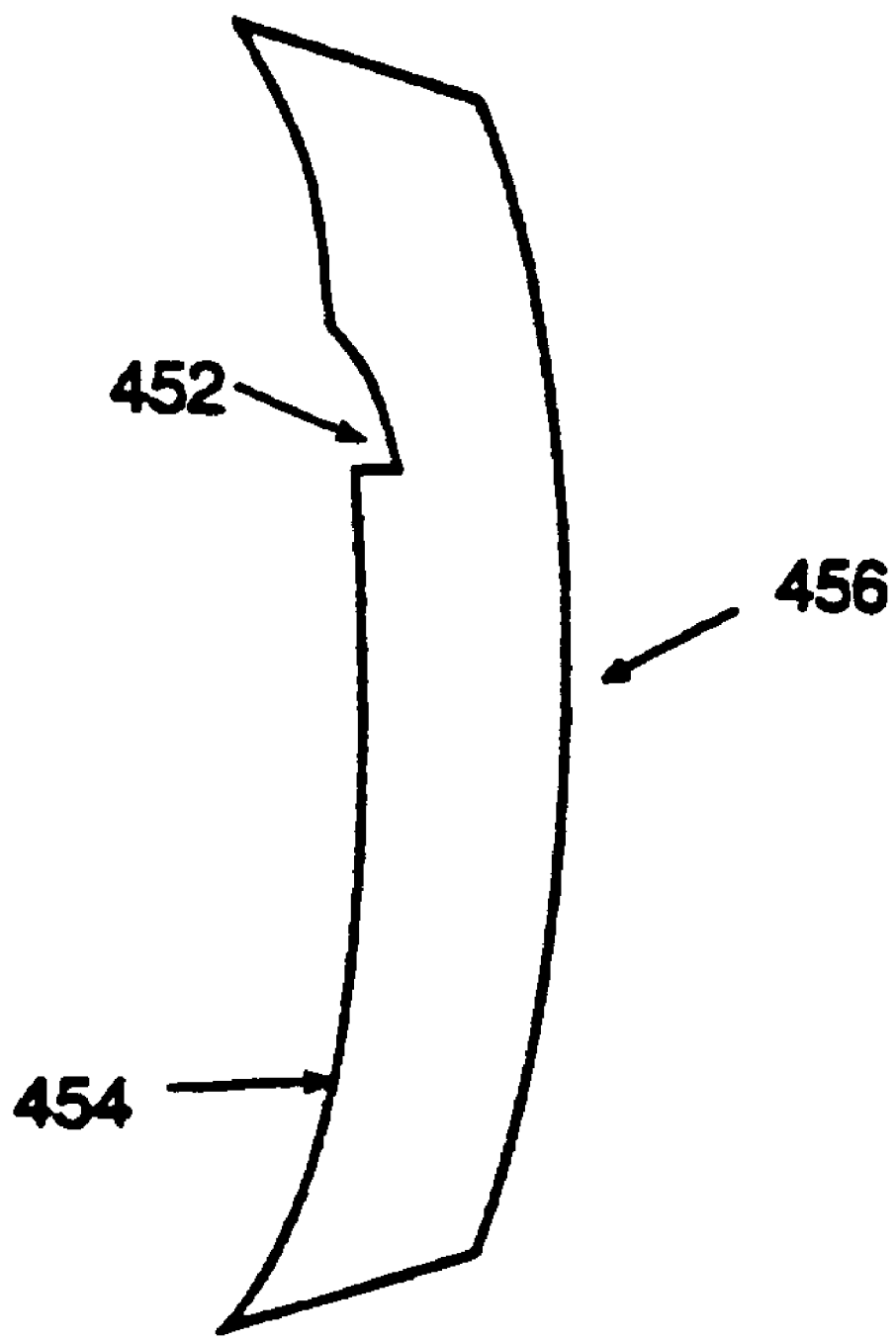
FIG. 35 depicts a cross sectional view of a flat-top bifocal mold.

A flat-top bifocal mold, such as the one depicted in FIG. 35 reflects light in different regions with different light intensities. Particularly, the segment line 454 of the bifocal segment 452 reflects light more than other areas of the mold, increasing the amount of ultraviolet light that the lens forming composition is exposed to in the region near segment line 454. It is believed that this region of the lens forming composition will gel more rapidly state than other portions of the lens forming composition. Thus, when using a flat-top bifocal mold to form a lens, it is desirable to diffuse ultraviolet light before it reaches the segment line of the mold, and thereby reduce the amount of light that is reflected at the segment line. In an embodiment in which a flat-top bifocal mold is being utilized, the use of a hazy filter as described above is preferred.

In one embodiment, after the lens forming composition has been placed in the mold cavity, it may be pre-cooled 3 to 7 minutes before being exposed to ultraviolet light. Thus, the lens forming composition may be cooled to below ambient temperature prior to polymerization of the lens forming composition. Advantageously, the heat released by the reaction within the composition may be balanced by the coolness of the composition so that the composition is not exposed to extreme amounts of thermal radiation. Thus, exposing the lens forming composition to below ambient temperatures before the reaction is initiated may inhibit undesirable effects resulting from the exothermic nature of the reaction. For example, cooling the lens forming composition might help prevent the loss of process control caused by variations in the rate of reaction that result from temperature changes of the lens forming composition.

In an embodiment, the ultraviolet light is directed toward the mold members until at least a portion of the lens forming composition is a gel. At this point, application of the ultraviolet light is preferably terminated to inhibit the polymerization reaction from proceeding too rapidly, thereby inhibiting the rate of heat generation from increasing so rapidly that premature release of the lens from the mold cavity and/or cracking of the lens results. After termination of the light, the gasket holding the two mold members together is preferably removed to expose the lens forming composition to air while the reaction is allowed to continue at a desired rate. The air may advantageously help cool the lens forming composition. In an embodiment, the lens forming composition may be exposed to ambient conditions for about 5 to 15 minutes, depending on the mass of the composition. Since the amount of heat released during reaction tends to be proportional to the mass of the composition, the more mass the composition has, the longer it may be cooled. After cooling the composition, it may be exposed to ultraviolet light again if desired.

In an embodiment, the inner surface, i.e., the casting face, of the front mold member may be coated with one or more hardcoat layers before the lens forming composition is placed within the mold cavity. Preferably, two hardcoat layers are used so that any imperfections, such as pin holes in the first hardcoat layer, are covered by the second hardcoat layer. The resulting double hardcoat layer is preferably scratch resistant and protects the subsequently formed eyeglass lens to which the double hardcoat layer adheres. In an embodiment, the casting face of the back mold member may be coated with a material that is capable of being tinted with dye prior to filling the mold cavity with the lens forming composition. This tintable coat preferably adheres to the lens forming composition so that dyes may later be added to the resulting eyeglass lens for tinting the lens.

In an embodiment, dyes may be added to the lens forming composition. It is believed that certain dyes may be used to attack and encapsulate ambient oxygen so that the oxygen cannot react with free radicals formed during the curing process. Also, dyes may be added to the composition to alter the color of an unactivated photochromic lens. For instance, a yellow color that sometimes results after a lens is formed may be "hidden" if a blue-red or blue-pink dye is present in the lens forming composition. The unactivated color of a photochromic lens may also be adjusted by the addition of non-photochromic pigments to the lens forming composition.

In an embodiment, the eyeglass lens that is formed may be coated with a hydrophobic layer, e.g. a hardcoat layer. The hydrophobic layer preferably extends the life of the photochromic pigments near the surfaces of the lens by preventing water and oxygen molecules from degrading the photochromic pigments.

In a preferred embodiment, both mold members are coated with a cured adhesion-promoting composition prior to placing the lens forming composition into the mold cavity. Providing the mold members with such an adhesion-promoting composition is preferred to increase the adhesion between the casting surface of the mold and the lens forming composition. The adhesion-promoting composition thus reduces the possibility of premature release of the lens from the mold. Further, it is believed that such a coating also provides an oxygen and moisture barrier on the lens which serves to protect the photochromic pigments near the surface of the lens from oxygen and moisture degradation. Yet further, the coating provides abrasion resistance, chemical resistance, and improved cosmetics to the finished lens.

An eyeglass lens formed using the lens forming composition of the present invention is not only applicable for use as a prescription lens and may be used for a non-prescription lens as well. Particularly, such a lens may be used in sunglasses. Advantageously, photochromic sunglass lenses would remain light enough in color to allow a user to see through them clearly while at the same time prohibiting ultraviolet light from passing through the lenses. In one embodiment, a background dye may be added to the photochromic lens to make the lens appear to be a dark shade of color at all times like typical sunglasses.

Each of the embodiments described above may be combined or used individually.

CASTING A PLASTIC LENS CONTAINING PHOTOCHROMIC MATERIAL PROCESS EXAMPLE

A polymerizable mixture of PRO-629 (see above for a description of the components of PRO-629), photochromic pigments, and an ultraviolet photoinitiator/co-initiator system was prepared according to the following procedure. A photochromic stock solution was prepared by dissolving the following pigments into 484 grams of HDDMA.

| Pigment | grams | % by wt. |
|---|---|---|
| Dye #94 | 1.25 | 0.250% |
| Dye #266 | 0.45 | 0.090% |
| Variacrol Red PNO | 2.66 | 0.532% |
| Variacrol Yellow L | 1.64 | 0.328% |
| Reversacol Corn Yellow | 3.58 | 0.716% |
| Reversacol Berry Red | 2.96 | 0.590% |
| Reversacol Sea Green | 2.17 | 0.434% |
| Reversacol Palatinate Purple | 1.29 | 0.258% |
| Total | 16.0 | 3.200% |

Dye #94 and Dye #266 are indilino spiropyrans commercially available from Chroma Chemicals, Inc. in Dayton, Ohio. Variacrol Red PNO is a spiro-napthoxazine material and Variacrol Yellow L is a napthopyran material, both commercially available from Great Lakes Chemical in West Lafayette, Ind. Reversacol Corn Yellow and Reversacol Berry Red are napthopyrans and Reversacol Sea Green, and Reversacol Palatinate Purple are spiro-napthoxazine materials commercially available from Keystone Analine Corporation in Chicago, Ill.

The powdered pigments were weighed and placed in a beaker. The HDDMA was added to the powdered pigments, and the entire mixture was heated to a temperature in the range from about 50° C. to 60° C. and stirred for two hours. Subsequently, the photochromic stock solution was cooled to room temperature and then gravity fed through a four inch deep bed of aluminum oxide basic in a one inch diameter column. Prior to passing the stock solution through the alumina, the alumina was washed with acetone and dried with air. The remaining HDDMA was forced out of the alumina with pressurized air. It is believed that this filtration step removes any degradation by-products of the photochromic pigments and/or any impurities present in the mixture. After the filtration step, the stock solution was passed through a 1 micron filter to remove any alumina particles which may have passed out of the column with the stock solution.

A photoinitiator stock solution containing an ultraviolet photoinitiator combined with an ultraviolet absorber was also prepared by mixing 2.56 grams of CGI-819 and 0.2 grams of Tinuvin 400, an ultraviolet absorber commercially available from Ciba Additives of Tarrytown, N.Y., with 97.24 grams of PRO-629. The stock solution was stirred for two hours at room temperature in the absence of light. The photoinitiator stock solution was then filtered by passing it through a layer of alumina and a one micron filter. The stock solution was placed in an opaque polyethylene container for storage.

A background dye stock solution was prepared by mixing 50 grams of a 422 ppm solution of A241/HDDMA, 50 grams of a 592 ppm solution of Thermoplast Red 454/HDDMA, 50 grams of 490 ppm solution of Zapon Brown 286/HDDMA, 50 grams of 450 ppm solution of Zapon Brown 287/HDDMA, 50 grams of 1110 ppm solution of Oil Soluble Blue II/HDDMA, and 50 grams of a 1110 ppm solution of Thermoplast Blue P/HDDMA, all with 700 grams of PRO-629. The entire mixture was heated to a temperature ranging from about 50° C. to 60° C. and subsequently stirred for two hours.

A lens forming composition was prepared by adding 12.48 grams of the above described photochromic stock solution, 10 grams of the photoinitiator stock solution, 27 grams of the background dye stock solution, and 7.3 grams of the NMDEA co-initiator to 943.22 grams of PRO-629. The components of the lens forming composition were stirred at room temperature for several minutes until well mixed. This composition is hereafter referred to as PC #1. The PC#1 contained the following amounts of components.

| Component | Amount |
|---|---|
| Tripropyleneglycol diacrylate | 31.16% |
| Tetraethyleneglycol diacrylate | 20.45% |
| Triethylopropane triacrylate | 19.47% |
| Bisphenol A bis.allyl carbonate | 16.55% |
| Hexanediol dimethacrylate | 11.56% |
| Dye #94 | 31.20 ppm |
| Dye #266 | 11.20 ppm |
| Variacrol Red PNO | 66.40 ppm |
| Variacrol Yellow L | 40.90 ppm |
| Reversacol Corn Yellow | 89.30 ppm |
| Reversacol Berry Red | 73.60 ppm |
| Reversacol Sea Green | 54.20 ppm |
| Reversacol Palatinate Purple | 32.20 ppm |
| A241 | 0.57 ppm |
| Thermoplast Red 454 | 0.80 ppm |
| Zapon Brown 286 | 0.66 ppm |
| Zapon Brown 287 | 0.61 ppm |
| Oil Soluble Blue 11 | 1.50 ppm |
| Thermoplast Blue | 1.50 ppm |
| CGI-819 | 255.90 ppm |
| NMDEA | 0.73% |
| Tinuvin 400 | 20.00 ppm |

An 80 mm diameter concave glass progressive addition mold having a distance radius of curvature of 6.00 diopters and a +1.75 diopter bifocal add power was sprayed with a mixture of isopropyl alcohol and distilled water in equal parts and wiped dry with a lint free paper towel. The mold was then mounted with its casting face upward on the center of a stage. The mold was fixed securely to the stage using three equidistant clip-style contact points to hold the periphery of the mold. The mold stage had a spindle attached to it which was adapted to connect to a spinning device of a FastCast UX-462 Flashcure Unit, commercially available from the FastCast Corporation of Louisville, Ky. The mold stage, with the mold affixed, was placed on the spinning device in the FlashCure unit. The mold was rotated at approximately 750 to 900 revolutions per minute. A stream of isopropyl alcohol was directed at the casting surface while the casting surface was simultaneously brushed with a soft camel hair brush to clean the surface. After the cleaning step, the mold surface was dried by directing a stream of reagent grade acetone over the surface and allowing it to evaporate off, all while continuing the rotation of the mold.

The rotation of the mold was then terminated and a one inch diameter pool of a liquid coating composition was dispensed into the center of the horizontally positioned glass mold from a soft polyethylene squeeze bottle equipped with a nozzle having an orifice diameter of approximately 0.040 inches. The spin motor was engaged to rotate the mold at a speed of approximately 750 to 900 revolutions per minute, causing the liquid material to spread out over the face of the mold. Immediately thereafter, a steady stream of an additional 1.5 to 2.0 grams of the coating composition was dispensed onto the casting face of the spinning mold. The stream was moved from the center to the edge of the casting face with a nozzle tip positioned at a 45° angle approximately 12 mm from the mold face. Thus, the stream was flowing with the direction of rotation of the mold.

The solvent present in the coating composition was allowed to evaporate while rotating the mold for 10 to 15 seconds. The rotation was stopped, and then the coating composition on the mold was cured via totaling exposures of approximately 300 mJ/cm² of ultraviolet light. The light was provided from a medium pressure mercury vapor lamp contained in the UX-462 FlashCure unit. All light intensity/dosage measurements cited herein were taken with an International Light IL-1400 Radiometer equipped with an XLR-340B Detector Head, both commercially available from International Light, Inc. of Newburyport, Mass. At this point, the spin motor was again engaged and approximately 1.5 to 2.0 grams of additional coating composition was dispensed onto the spinning mold. The solvent of the composition was allowed to evaporate, and the composition was cured in a similar fashion to the first layer of coating composition.

The above described coating composition comprised the following materials:

| Material | % by wt. |
|---|---|
| Irgacure 184 | 0.91% |
| Dye Absorption Stabilizer | 0.80% |
| CN-104 | 2.00% |
| SR-601 | 1.00% |
| SR-399 | 8.60% |
| Acetone | 26.00% |
| Ethanol | 7.00% |
| 1-Methoxypropanol | 53.69% |

Irgacure 184 is a UV photoinitiator commercially available from Ciba Additives, Inc. CN-104 is an epoxy acrylate oligomer, SR-601 is an ethoxylated bisphenol A diacrylate, and SR-399 is dipentaerythritol pentaacrylate, all available from Sartomer Company in Exton, Pa. The acetone, the ethanol and the 1-methoxypropanol were all reagent grade solvents The dye absorption accelerator improves the impact resistance of the lens and is available from Crs di Claudio Crose in Milan, Italy.

An 80 mm diameter convex mold with radii of curvature of 6.80/7.80 diopters was cleaned and coated using the same procedure described above except that no pooling of the coating composition occurred in the center of the mold when the composition was dispensed thereto.

The concave and convex molds were then assembled together with a silicone rubber gasket. A raised lip on the inner circumference of the rubber gasket provided a spacing of 2.8 mm between the two molds at the center point. At this point the mold/gasket assembly was positioned on a filling stage. The edge of the gasket was peeled back to permit the cavity to be filled with PC #1 lens forming composition. The edge of the gasket was returned to its sealing relationship with the edges of the molds, and the excess lens forming composition was vacuumed from the non-casting surface of the back mold with a suction device. The filled mold/gasket assembly was then transferred from the filling stage to the UX-462 curing chamber. The assembly was placed with the back mold facing upward on a black stage configured to hold the mold/gasket assembly.

An ultraviolet light filter was then placed on top of the back mold. The filter was approximately 80 mm in diameter which is the same as the mold diameter. The filter also had a spherical configuration with a center thickness of 6.7 mm and an edge thickness of 5.5 mm. The filter was taken from a group of previously made filters. These filters were formed by using eyeglass lens casting molds and gaskets to create cavities that were thickest in the center (a plus spherical cavity) and cavities that were thinnest in the center (a minus spherical cavity). A toric component was also incorporated with some of these cavities to form compound cavities.

The filter cavities were filled with an ultraviolet light curable composition comprising by weight: 99.37% PRO-629, 0.35% K-Resin, 0.27% NMDEA, 121ppm CGI-819, and 10 ppm Tinuvin 400. K-resin is a styrene-butadiene copolymer commercially available from Phillips Chemical Company. To form this composition, the K-resin was first dissolved in toluene. An appropriate amount of the K-resin toluene solution was added to the PRO-629, and then the toluene was evaporated off by heat and stirring. The NMDEA, CGI-19, and the Tinuvin 400 were then added to the PRO-629/K-Resin solution. The compositions contained in the cavities were cured by exposure to ultraviolet radiation. When the cured article was removed from the mold cavity, it exhibited a high degree of haze caused by the incompatibility of the PRO-629. and the K-Resin. In the strictest sense of the word, it should be noted that these filters were not "lenses" because their function was not to focus light but rather to scatter and diffuse light.

The mold/gasket assembly and the filter were then irradiated with four consecutive doses of ultraviolet light totaling approximately 1150 mJ/cm², as previously measured at the plane of the mold cavity with no filter or any other intervening media between the light source and the plane. The mold/gasket assembly was then turned over on the stage so that the front mold was facing upward. The mold/gasket assembly was further rotated 90 degrees around the paraxial axis from its original position. The light filter was then placed over the front mold. The entire assembly was then exposed to two more doses of ultraviolet light totaling approximately 575 mJ/cm². The mold/gasket assembly was removed from the curing chamber. The gasket was removed from the molds, and the exposed edge of the lens was wiped to remove any residual liquid. The molds with lens were then placed in a vertical orientation in a rack, and the non-casting faces of both the front and back molds were exposed to ambient room temperature air for a period of approximately ten minutes. At this point, the entire mold assembly was returned to the UX-462 chamber. Then, without the aforementioned light filter in place, the mold assembly was dosed with four exposures totaling 600 mJ/cm² directed toward the back mold and two exposures totaling 300 mJ/cm² directed toward the front mold.

Subsequent to these exposures, the junction of the back mold and the lens was scored with the edge of a brass spatula. The back mold was then removed from the lens by positioning an appropriate sized Delrin wedge between the front and back molds and applying a sharp impact to the wedge. The lens, along with the front mold to which it was attached, was held under running tap water and simultaneously brushed with a soft brush to remove any flakes or particles of polymer from the edges and surface of the lens. The front mold was then separated from the lens by breaking the seal between the two with the point of a pin pressed against the junction of the front mold and the lens. The lens was then placed concave side upward on a lens stage of similar design to the mold stage, except that the peripheral clips were configured to secure a smaller diameter workpiece. The lens stage, with the lens affixed, was positioned on the spinning device of the UX-462 unit and rotated at about 750 to 900 revolutions per minute. A stream of isopropyl alcohol was directed at the concave surface while simultaneously brushing the surface with a soft, clean brush.

After brushing, a stream of isopropyl alcohol was directed at the surface of the lens, and the rotation was continued for a period of approximately 30 seconds until the lens was dry. The lens was turned over on the stage so that the convex surface of the lens faced upward. Then the cleaning procedure was repeated on the convex surface. With the convex surface facing upward, the lens was dosed with four exposures of ultraviolet light totaling approximately 1150 mJ/cm$^2$. The lens was again turned over on the stage such that the concave surface was upward. The lens was subjected to an additional two exposures totaling 300 mJ/cm$^2$. The lens was removed from the stage and placed in a convection oven at 115° C. for five minutes. After annealing the lens, it was removed from the oven and allowed to cool to room temperature. At this point the lens was ready for shaping by conventional means to fit into an eyeglass frame.

Figure 37:
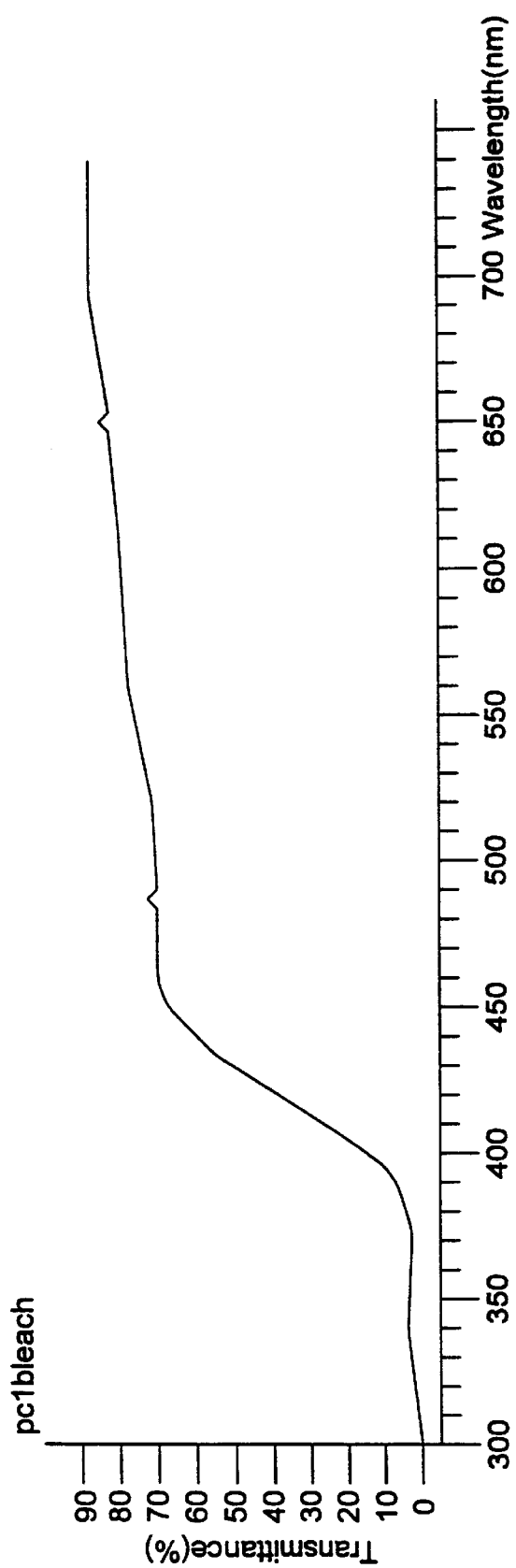
FIG. 37 depicts a plot of % transmittance of light versus wavelength for a photochromic lens.

The resulting lens was approximately 72 mm in diameter. The lens had a center thickness of 2.6 mm, a distance focusing power of −0.71–1.00 diopters, and a bifocal addition strength of 1.74 diopters. The lens appeared to have a bleached color of tan. Also, the lens that was formed exhibited approximately 75% visible transmittance as measured with a Hoya ULT-3000 meter. The lens was exposed to midday sunlight at a temperature of approximately 75° F. for 3 minutes. After being exposed to sunlight, the lens exhibited a grey color and a visible light transmittance of approximately 15%. The optics of the lens appeared to be crisp, without aberrated areas in either the distance or the bifocal segment regions. The same lens forming composition was cured to form a piano lens so that the lens could be scanned with a Hewlett Packard Model 8453 UV-Vis spectrophotometer. See FIG. 37 for a plot of % transmittance versus wavelength (nm), as exhibited by the piano lens in its lightened state (i.e., without sunlight exposure). The lens exhibited very little transmittance of light at wavelengths below about 370 nm.

The eyeglass lens of this example was cured using ultraviolet light even though the lens forming composition included UV absorbing photochromic pigments. Since photochromic pigments tend to absorb UV light strongly, the ultraviolet light might not have penetrated to the depths of the lens forming composition. The lens forming composition, however, contained a co-initiator in conjunction with a photoinitiator to help promote the curing of the entire lens forming composition. The present example thus demonstrates that a photochromic lens containing both a photoinitiator and a co-initiator may be cured using ultraviolet light to initiate polymerization of the lens forming composition.

CASTING A COLORLESS LENS CONTAINING UV ABSORBERS EXAMPLE

According to a preferred embodiment, a polymerizable mixture of PRO-629 (see above for a description of the components of PRO-629), colorless ultraviolet absorbing compounds, an ultraviolet stabilizer, background dyes, and an ultraviolet photoinitiator/co-initiator package was prepared according to the following procedure. Six separate stock solutions were prepared. One stock solution contained the photoinitiator, two stock solutions contained UV absorbing compounds, one stock solution contained co-initiators, one stock solution contained a UV stabilizer, and one stock solution contained a background dye package. Each of these stock solutions were treated by passing them through a one inch diameter column packed with approximately 30 grams of alumina basic. It is believed that this step reduced the impurities and trapped the acidic byproducts present in each of the additives to the PRO-629. The following is a detailed description of the preparation of the polymerizable mixture mentioned above.

About 500 grams of a photoinitiator stock solution was prepared by dissolving 2.5% by weight of bis(2,6-dimetoxybenzoyl)(2,4,4 trimethyl phenyl) phosphine oxide (CGI-819 commercially available from Ciba Additives) in Pro-629. This mixture was passed through an alumina basic column in the dark.

About 500 grams of the UV absorber stock solution was prepared by dissolving 2.5% by weight of 2(2H-benzotriazol-2-yl)-4-(1,1,3,3 tetramethyl)phenol (98% purity) in PRO-629. This mixture was also passed through an alumina basic column.

About 500 grams of a co-initiator stock solution was prepared by mixing 70% by weight of CN-384 (a reactive amine co-initiator commercially available from Sartomer Company) in Pro-629. This mixture was passed through an alumina basic column.

About 271 grams of a UV stabilizer stock solution was prepared by mixing 5.55% by weight of Tinuvin 292 in PRO-629. This mixture was passed through an alumina basic column.

About 250 grams of a UV absorber stock solution was prepared by mixing 5.0% Tinuvin 400 (i.e., a mixture of 2-[4-((2-hydroxy-3-dodecyloxypropyl)-oxy]2-2 hydroxyphenyl]-4,6-bis(2,4-dimethylphenyl)-1,3,5-triazine and 2-[4-((2-hydroxy-3-tridecyloxypropyl)-oxy]-2-hydroxyphenyl]-4,6-bis(2,4-dimethylpheyl-1,3,5-triazine)) by weight in PRO-629. This mixture was passed through an alumina basic column.

About 1000 grams of a background dye stock solution was prepared by mixing about 50 grams of a 592 ppm solution of Thermoplast Red 454/HDDMA, 50 grams of 490 ppm solution of Zapon Brown 286/HDDMA, 50 grams of 450 ppm solution of Zapon Brown 287/HDDMA, 50 grams of 1110 ppm solution of Oil Soluble Blue II/HDDMA, and 50 grams of a 1110 ppm solution of Thermoplast Blue P/HDDMA, all with 750 grams of PRO-629. The entire mixture was heated to a temperature between about 50° and 60° C. and stirred for two hours. This mixture was passed through an alumina basic column.

About 250 grams of CN-386 (a reactive amine co-initiator commercially available from Sartomer Company) was passed through an alumina basic column.

A lens forming composition was prepared by mixing 967.75 grams of Pro-629 with 12.84 grams of the 2.5% 2(2H-benzotriazol-2-yl)-4-(1,1,3,3 tetramethyl)phenol UV absorber stock solution, 4.3 grams of the 70% CN-384 co-initiator stock solution, 8.16 grams of the 2.5% CGI-819 photoinitiator stock solution, 0.53 grams of the CN-386, 1.54 grams of the Tinuvin 400 UV absorber stock solution, 0.92 grams of the Tinuvin 292 UV stabilizer stock solution, and 4.0 grams of the background dye stock solution. The resulting lens forming composition contained the following components:

| Material | % by weight |
| --- | --- |
| PRO-629 | 99.10% |
| 2(2H-benzotriazol-2-yl)4-(1,1,3,3 tetramethyl)phenol | 321 ppm |
| Tinuvin 400 | 77 ppm |
| Tinuvin 292 | 51 ppm |
| CN-384 | 0.3% |
| CN-386 | 0.53% |
| CGI-819 | 204 ppm |
| Thermoplast Red | 0.12 ppm |
| Zapon Brown 286 | 0.10 ppm |

-continued

| Material | % by weight |
| --- | --- |
| Zapon Brown 287 | 0.10 ppm |
| Oil Soluble Blue II | 0.22 ppm |
| Thermoplast Blue | 0.22 ppm |

An 80 mm diameter 28 flattop concave glass mold with a distance radius of curvature of 2.85 diopters and a +3.00 diopter bifocal add power was sprayed with a mixture of isopropyl alcohol and distilled water in equal parts and wiped dry with a lint free paper towel. The mold was then mounted with its casting face upward on a stage. The mold was fixed securely to the center of the stage using three equidistant clip-style contact points at the periphery of the mold. The mold stage had a spindle attached to it which was adapted to fit into the spinning device provided in the FastCast UX-462 FlashCure Unit, commercially available from the FastCast Corporation of Louisville, Ky. The mold stage, with the mold affixed, was placed on the spinning means in the FlashCure unit. The mold was rotated at approximately 750 to 900 revolutions per minute. A stream of the isopropyl alcohol was directed at the casting surface while the casting surface was simultaneously brushed with a soft camel hair brush to clean the surface. After the cleaning step, the mold surface was dried by directing a stream of reagent grade acetone over the surface and allowing it to evaporate off, all while continuing the rotation of the mold.

The rotation of the mold was then terminated and one inch diameter pool of a liquid coating composition was dispensed into the center of the horizontally positioned glass mold from a soft polyethylene squeeze bottle equipped with a nozzle with an orifice diameter of approximately 0.040 inches. The spin motor was engaged to begin to rotate the mold at a speed of approximately 750 to 900 revolutions per minute, causing the liquid material to be spread out over the face of the mold. Immediately thereafter, a steady stream of an additional 1.5 to 2.0 grams of the coating composition was dispensed onto the casting face of the spinning mold. The stream was moved from the center to the edge of the casting face with a nozzle tip positioned at a 45 degree angle, approximately 12 mm from the mold face. Thus, the stream was flowing with the direction of rotation of the mold.

The solvent present in the coating composition was allowed to evaporate off for 10 to 15 seconds while rotating. The rotation was stopped, and then the coating composition present on the mold was cured via two exposures to the ultraviolet output from the medium pressure mercury vapor lamp contained in the UX-462 FlashCure unit, totaling approximately 300 mJ/cm$^2$. All light intensity/dosage measurements cited herein were taken with an International Light IL-1400 Radiometer equipped with an XLR-340B Detector Head, both commercially available from International Light, Inc. of Newburyport, Mass.

The above described coating composition comprised the following materials:

| Material | % by wt. |
| --- | --- |
| Irgacure 184 | 0.91% |
| Dye Absorption Accelerator | 0.80% |

-continued

| Material | % by wt. |
| --- | --- |
| CN-104 | 2.00% |
| SR-601 | 1.00% |
| SR-399 | 8.60% |
| Acetone | 26.00% |
| Ethanol | 7.00% |
| 1-Methoxypropanol | 53.69% |

Irgacure 184 is a UV photoinitiator commercially available from Ciba Additives, Inc. CN-104 is an epoxy acrylate oligomer, SR-601 is an ethoxylated bisphenol A diacrylate, and SR-399 is dipentaerytritol pentaacrylate, all available from Sartomer Company in Exton, Pa. The acetone, the ethanol, and the 1-methoxypropanol were all reagent grade solvents. The dye absorption accelerator improves the impact resistance of the lens and is available from Crs di Crose in Milan, Italy.

An 80 mm diameter convex mold with radii of curvature of 7.05 diopters was cleaned and coated in the same fashion described above except that no pooling of the coating composition occurred in the center of the mold when the composition was dispensed thereto.

Both the concave and convex molds were then provided with a cured adhesion-promoting coating composition. By providing such a coating, the adhesion between the casting surface of the glass mold and the lens forming composition was increased, thereby reducing the possibility of premature release of the lens from the mold. The coating further provided abrasion resistance, chemical resistance, and improved cosmetics to the finished lens.

The concave and convex molds were then assembled into a silicone rubber gasket. A raised lip present on the inner circumference of the rubber gasket provided a spacing of 1.7 mm between the two molds at the center point. At this point the mold/gasket assembly was positioned on a filling stage. The edge of the gasket was peeled back to permit the cavity to be filled with the above described colorless lens forming composition containing the UV absorbing compounds. The edge of the gasket was returned to its sealing relationship with the edges of the molds, and the excess lens forming composition was vacuumed off the non-casting surface of the back mold with a suction device. The filled mold/gasket assembly was then transferred from the filling stage to the UX-462 curing chamber and placed back mold upward on a black stage configured to hold the mold/gasket assembly.

An ultraviolet light filter was then placed on top of the back mold. The filter was approximately 80 mm in diameter which is the same as the mold diameter. It had a plano configuration with a thickness of 3.1 mm. This filter transmitted approximately 30% of the incident ultraviolet light from the source as measured using the IL1400 radiometer with a XRL-340B detector head. The filter was taken from a group of previously made filters. The fabrication of these filters was discussed in the Casting A Plastic Lens Containing Photochromic Material Example (see above).

The mold/gasket assembly in which the lens forming composition had been placed and which had been covered by the above described filter was then irradiated with four consecutive doses of ultraviolet light totaling approximately 600 mJ/cm$^2$, as measured using the IL-1400 Radiometer equipped with the XLR-340B detector. This measurement was taken at the plane of the mold cavity while no filter or any intervening media was present between the light source and the plane. The mold/gasket assembly was then turned over on the stage so that the front mold was facing upward.

The mold/gasket assembly was further rotated 90 degrees around the paraxial axis from its original position. The light filter was then replaced over the front mold. The entire assembly was exposed to two more doses of ultraviolet light totaling approximately 300 mJ/cm$^2$.

The mold/gasket assembly was then removed from the curing chamber, and the gasket was removed from the assembly. The mold with lens was then returned to the UX-462 curing chamber such that the back mold was facing upward. An opaque rubber disc, approximately 80 mm in diameter was placed over the back mold. This disc had the function of preventing ultraviolet light from impinging on the major portion of the material contained within the cavity. With the disc in position, the cell was exposed to two more exposures at 300 mJ/cm$^2$. This subsequent exposure was used to cure the residual liquid around the edges of the lens, particularly around the junction between the front mold and the lens and to help seal the periphery. The mold assembly was removed from the curing chamber and placed in a vertical orientation in a rack. The non-casting faces of both the front and back molds were then exposed to ambient room temperature air for a period of approximately fifteen minutes. At this point, the entire mold assembly was returned to the UX-462 chamber and, without the aforementioned light filter or opaque disc in place, was dosed with two exposures totaling 300 mJ/cm$^2$ directed toward the back mold and two exposures totaling 300 mJ/cm$^2$ directed toward the front mold.

Subsequent to these exposures, the junction of the back mold and the lens was scored with the edge of a brass spatula. The back mold was then removed from the lens by positioning an appropriate sized Dehrin wedge between the front and back mold and applying a sharp impact to the wedge. The lens, with the front mold attached, was held under running tap water and simultaneously brushed with a soft brush to remove any flakes or particles of polymer from the edges and surface of the lens. The front mold was then separated from the lens by breaking the seal between the two with the point of a pin pressed against the junction of the front mold and the lens. The lens was then placed concave side upward on a lens stage of similar design to the mold stage except that the peripheral clips were configured to secure a smaller diameter workpiece. The lens stage, with the lens affixed, was positioned on the spinning device of the UX-462 unit and rotated at 750 to 900 revolutions per minute. A stream of isopropyl alcohol was directed at the concave surface while simultaneously brushing with a soft, clean brush.

After brushing, a stream of isopropyl alcohol was directed at the surface of the lens, and the rotation was continued for a period of approximately 30 seconds until the lens was dry. The lens was turned over on the stage so that the convex surface of the lens was upward. Then the cleaning procedure was repeated on the convex surface. With the convex surface upward, the lens was dosed with four exposures of ultraviolet light totaling approximately 1150 mJ/cm$^2$. The lens was turned over on the stage so that the concave surface faced upward. The lens was subjected to an additional two exposures totaling 300 mJ/cm$^2$. The lens was removed from the stage and placed in a convection oven at 115° C. for five minutes. The lens was then removed from the oven and allowed to cool to room temperature. At this point, the lens was ready for shaping by conventional means to fit into an eyeglass frame.

Figure 38:
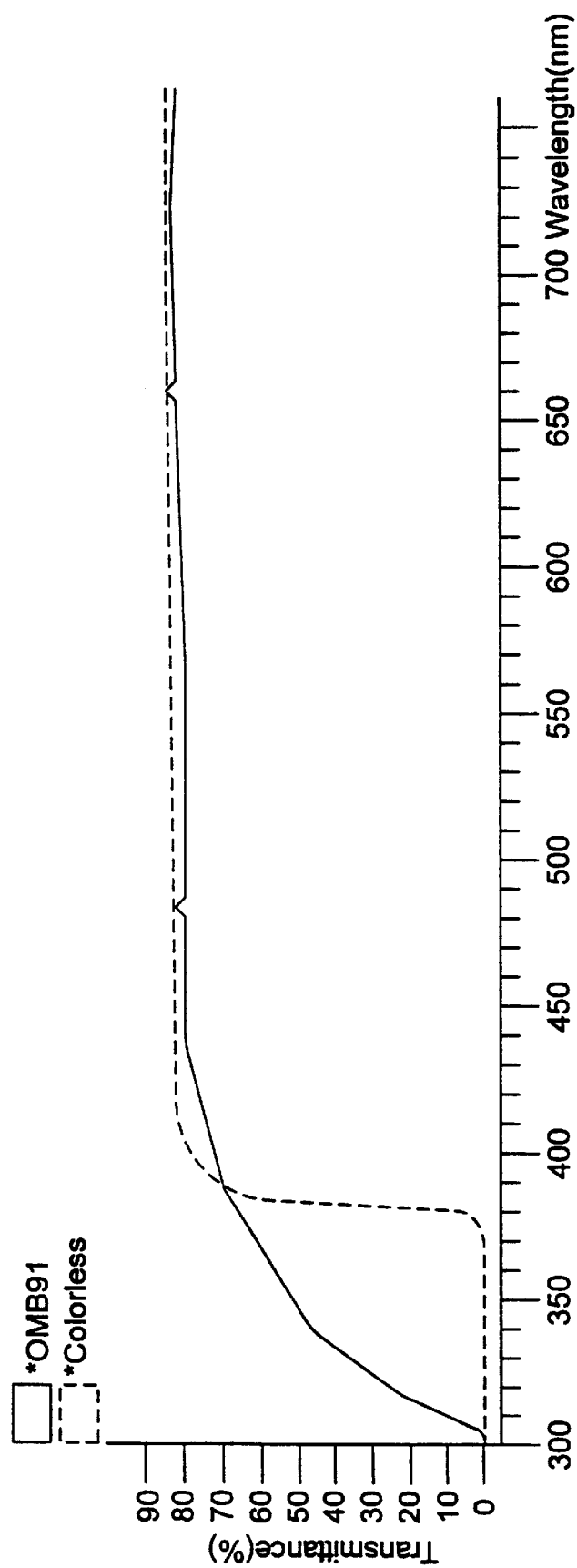
FIG. 38 depicts a plot of % transmittance of light versus wavelength for both a colorless lens containing ultraviolet absorbers and a lens containing no ultraviolet absorbers.
Figure 39:
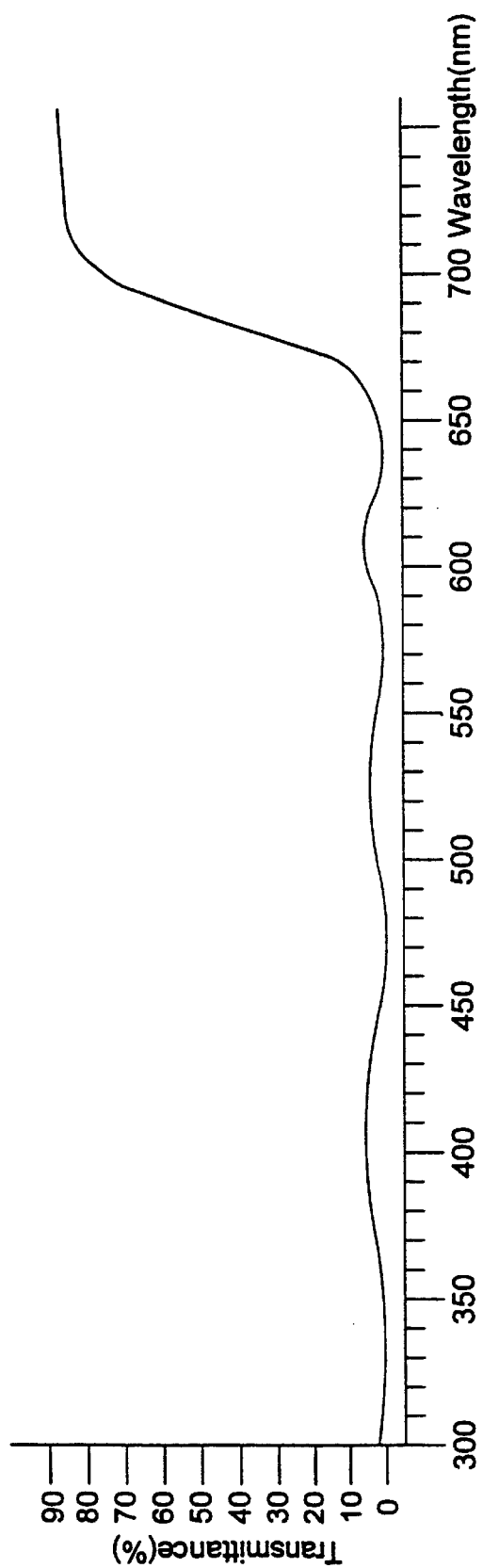
FIG. 39 depicts a plot of % transmittance of light versus wavelength for a colored lens containing fixed pigments.

The resulting lens was approximately 72 mm in diameter, had a center thickness of 1.5 mm, a distance focusing power of 4.08 diopters, and a bifocal addition strength of 3.00 diopters. The resultant lens was water white. The optics of the lens were crisp, without aberrated areas in either the distance or the bifocal segment regions. The same lens forming composition was cured to form a piano lens. The piano lens was scanned with a Hewlett Packard Model 8453 UV-Vis spectrophotometer. See FIG. 38 for a plot of % transmittance versus wavelength (nm), as exhibited by the photochromic lens when exposed to sunlight. The lens exhibited virtually no transmittance of light at wavelengths below about 370 nm. Also shown in FIG. 38 is the results of a similar scan made on a piano lens formed using the OMB-91 lens forming composition (see Pulsed Ultraviolet Light Application section above for components of OMB-91). The OMB-91 lens, which has no ultraviolet absorbing compounds, appears to transmit light at wavelengths shorter than 370 nm, unlike the colorless lens that contained ultraviolet absorbing compounds.

The eyeglass lens of this example was cured using ultraviolet light even though the lens forming composition included ultraviolet absorbing compounds. Since ultraviolet absorbing compounds tend to absorb UV light strongly, the UV light might not have penetrated to the depths of the lens forming composition. The lens forming composition, however, contained a co-initiator in conjunction with a photoinitiator to help promote the curing of the entire lens forming composition. The present example thus demonstrates that a lens containing ultraviolet absorbing compounds may be cured using ultraviolet light to initiate polymerization of a lens forming composition which contains a photoinitiator/co-initiator system.

CASTING A COLORED LENS CONTAINING UV ABSORBERS EXAMPLE

According to a preferred embodiment, a polymerizable mixture of PRO-629 (see above for a description of the components of PRO-629), fixed pigments, and an ultraviolet photoinitiator/co-initiator package was prepared according to the following procedure. Nine separate stock solutions were prepared. Seven of the stock solutions contained fixed pigments, one of the stock solutions contained a UV absorbing compound, and one of the stock solutions contained a photoinitiator. Each of these stock solutions were treated by passing them through a one inch diameter column packed with approximately 30 grams of alumina basic. It is believed that this step reduces the impurities and traps the acidic byproducts present in each of the additives to the PRO-629.

For each of the following fixed pigments, a stock solution was prepared by the following procedure. The pigments used were Thermoplast Red 454, Thermoplast Blue P, Oil Soluble Blue II, Zapon Green 936, Zapon Brown 286, Zapon Brown 287, Thermoplast Yellow 284. One gram of each pigment was dissolved in 499 grams of HDDMA. Each mixture was heated to a temperature in the range from about 50° C. to 60° C. for approximately two hours. This mixture was passed through an alumina basic column. The alumina was then washed with 200 grams of HDDMA at a temperature of 50° C. to 60° C. followed by 300 grams of PRO-629 at a temperature of 50° C. to 60° C. This washing step ensured that any pigments trapped in the alumina were washed into the stock solution. This resulted in stock solutions which contained a 0.1% concentration of each pigment in 29.97% PRO-629 and 69.93% HDDMA.

About 250 grams of the UV absorber stock solution was prepared by dissolving 5.0% Tinuvin 400 (a mixture of 2-[4-((2-hydroxy-3-dodecyloxypropyl)-oxy] 2-2 hydroxyphenyl]-4,6-bis(2,4-dimethylphenyl)-1,3,5-triazine and 2-(4-((2-hydroxy-3-tridecyloxypropyl)-oxy]-2- hydroxyphenyl]-4,6-bis(2,4-dimethylpheyl-1,3,5-triazine) by weight in PRO-629. This mixture was passed through an alumina basic column.

About 500 grams of the photoinitiator stock solution was prepared by dissolving 2.5% by weight of bis(2,6-dimetoxybenzoyl)(2,4,4 trimethyl phenyl) phosphine oxide (CGI-819 commercially available from Ciba Additives) in Pro-629. This mixture was passed through an alumina basic column in the dark.

A lens forming composition was prepared by mixing 685.3 grams of Pro-629 with 10.48 grams of the 2.5% CGI-819 photoinitiator stock solution, 5.3 grams of NMDEA (N-methyldiethanolamine is commercially available from Aldrich Chemicals), 0.6 grams of Tinuvin 400 UV absorber stock solution, 7 grams of the Thermoplast Red stock solution, 58.3 grams of the Thermoplast Blue stock solution, 55.5 of the Oil Soluble Blue II stock solution, 29.2 grams of the Zapon Green 936 stock solution, 68.1 grams of the Zapon Brown 286 stock solution, 38.9 grams of the Zapon Brown 287 stock solution, and 41.3 grams of the Thermoplast Yellow 104 stock solution. The resulting lens forming composition contained the following components:

| Material | % by weight |
|---|---|
| Bisphenol A bis allyl carbonate | 13.35% |
| Tripropyleneglycol diacrylate | 25.13% |
| Tetraethyleneglycol diacrylate | 16.49% |
| Trimethylolpropane triacrylate | 15.71% |
| Hexanediol dimethacrylate | 28.75% |
| Thermoplast Red | 7.0 ppm |
| Zapon Brown 286 | 68.1 ppm |
| Zapon Brown 287 | 38.9 ppm |
| Oil Soluble Blue 11 | 55.5 ppm |
| Thermoplast Blue | 58.3 ppm |
| Zapon Green 936 | 29.2 ppm |
| Thermoplast Yellow 104 | 41.3 ppm |
| NMDEA | 0.53% |
| CGI-819 | 262 ppm |
| Tinuvin 400 | 30 ppm |

An 80 mm diameter single vision concave glass mold with a distance radius of curvature of 6.00 diopters was sprayed with a mixture of isopropyl alcohol and distilled water in equal parts and wiped dry with a lint free paper towel. The mold was then mounted with its casting face upward on the center of a stage. The mold was fixed securely to the stage with three equidistant clip-style contact points at the periphery of the mold. This mold stage had a spindle attached to it which was sized to fit into a spinning device of a FastCast UX-462 FlashCure Unit, commercially available from the FastCast Corporation of Louisville, Ky. The mold stage, with the mold affixed, was placed on the spinning device in the FlashCure unit. The mold was rotated at approximately 750 to 900 revolutions per minute. A stream of the isopropyl alcohol was directed at the casting surface while the casting surface was simultaneously brushed with a soft camel hair brush. After the cleaning step, the mold surface was dried by directing a stream of reagent grade acetone over the surface and allowing it to evaporate off, all while continuing the rotation of the mold.

The rotation of the mold was then terminated. A one inch diameter pool of a liquid coating composition was dispensed into the center of the horizontally positioned glass mold from a soft polyethylene squeeze bottle equipped with a nozzle with an orifice diameter of approximately 0.040 inches. The spin motor was engaged to begin to rotate the mold at a speed of approximately 750 to 900 revolutions per minute, which caused the liquid material to be spread out over the face of the mold. Immediately thereafter, a steady stream of an additional 1.5 to 2.0 grams of the said coating composition was dispensed onto the casting face of the spinning mold. The stream was moved from the center to the edge of the casting face with a nozzle tip positioned at a 45° angle approximately 12 mm from the mold face. Thus, the stream was flowing with the direction of rotation of the mold.

The solvent present in the coating composition was allowed to evaporate off for 10 to 15 seconds while rotating the mold. The rotation was stopped, and then the coating composition present on the mold was cured via two exposures to the ultraviolet output from the medium pressure mercury vapor lamp contained in the UX-462 FlashCure unit, totaling approximately 300 mJ/cm$^2$. All light intensity/dosage measurements cited herein were taken with an International Light IL-1400 Radiometer equipped with an XLR-340B Detector Head, both commercially available from International Light, Inc. of Newburyport, Mass.

The above described coating composition comprised the following materials:

| Material | % by wt. |
|---|---|
| Irgacure 184 | 0.91% |
| Dye Absorption Accelerator | 0.80% |
| CN-104 | 2.00% |
| SR-601 | 1.00% |
| SR-399 | 8.60% |
| Acetone | 26.00% |
| Ethanol | 7.00% |
| 1-Methoxypropanol | 53.69% |

Irgacure 184 is a UV photoinitiator commercially available from Ciba Additives, Inc. CN-104 is an epoxy acrylate oligomer, SR-601 is an ethoxylated bisphenol A diacrylate, and SR-399 is dipentaerythritol pentaacrylate, all available from Sartomer Company in Exton, Pa. The acetone, the ethanol, and the 1-methoxypropanol were all reagent grade solvents. The dye absorption accelerator improves the impact resistance of the lens and is available from Crs di Claudio Crose in Milan, Italy.

An 80 mm diameter convex mold with radii of curvature of 6.05 diopters was cleaned and coated in the same fashion except that no pooling of the coating composition occurred in the center of the mold when the composition was dispensed thereto.

The concave and convex molds were then coated with a cured adhesion-promoting coating composition. By providing such a coating, the adhesion between the casting surface of the glass mold and the curing lens forming composition was increased, thereby reducing the possibility of premature release of the lens from the mold. The coating also provided abrasion resistance, chemical resistance, and improved cosmetics to the finished lens.

The concave and convex molds were then assembled together with an ethylene vinyl acetate gasket. A raised lip on the inner circumference of the rubber gasket provided a spacing of 3.0 mm between the two molds at the center point. At this point the mold/gasket assembly was fixtured on a filling stage. The edge of the gasket was peeled back to permit the cavity to be filled with the above described colorless lens forming composition which contained UV absorbing compounds. The edge of the gasket was returned to its sealing relationship with the edges of the molds, and the excess lens forming composition was vacuumed off the non-casting surface of the back mold with a suction device. The filled mold/gasket assembly was transferred from the filling stage to the UX-462 curing chamber. The assembly was placed back mold upward on a black stage configured to hold the mold/gasket assembly.

An ultraviolet light filter was then placed on top of the back mold. The filter was approximately 80 mm in diameter which is the same as the mold diameter. It had a piano configuration with a thickness of 3.1 mm. This filter transmitted approximately 30% of the incident ultraviolet light from the source as measured using the IL1400 radiometer with a XRL-340B detector head. The filter was taken from a group of previously made filters. The fabrication of these filters was discussed in the Casting A Plastic Lens Containing Photochromic Material Example.

The mold/gasket assembly, containing the lens forming composition was then irradiated with six consecutive doses of ultraviolet light totaling approximately 1725 mJ/cm$^2$, as previously measured using the IL-1400 Radiometer equipped with the XLR-340B detector at the plane of the mold cavity with no filter or any intervening media between the light source and the plane. The mold/gasket assembly was then turned over on the stage so that the front mold was facing upward. The entire assembly was then exposed to six more doses of ultraviolet light totaling approximately 1725 mJ/cm$^2$. The mold/gasket assembly was removed from the curing chamber. The gasket was removed from the molds, and the assembly was placed in a vertical orientation in a rack such that the non-casting faces of both the front and back molds were exposed to ambient room temperature air for a period of approximately ten minutes. At this point, the assembly was returned to the UX-462 chamber and was dosed with four exposures totaling 600 mJ/cm$^2$ directed toward the back mold and four exposures totaling 600 mJ/cm$^2$ directed toward the front mold.

Subsequent to these exposures, the junction of the back mold and the lens was scored with the edge of a brass spatula. The back mold was removed from the lens by positioning an appropriate sized Delrin wedge between the front and back mold and applying a sharp impact to the wedge. The lens, with the front mold attached, was held under running tap water and simultaneously brushed with a soft brush to remove any flakes or particles of polymer from the edges and surface of the lens. The front mold was then separated from the lens by breaking the seal between the two with the point of a pin pressed against the junction of the front mold and the lens. The lens was then placed concave side upward on a lens stage of similar design to the mold stage, except that the peripheral clips were configured to secure a smaller diameter workpiece. The lens stage, with the lens affixed, was positioned on the spinning device of the UX-462 unit and rotated at 750 to 900 revolutions per minute. A stream of isopropyl alcohol was directed at the concave surface while simultaneously brushing with a soft, clean brush.

After brushing, a stream of isopropyl alcohol was directed at the surface of the lens, and the rotation was continued for a period of approximately 30 seconds until the lens was dry. The lens was turned over on the stage so that the convex surface of the lens faced upward. Then the cleaning procedure was repeated on the convex surface. With the convex surface facing upward, the lens was dosed with four exposures of ultraviolet light totaling approximately 1150 mJ/cm$^2$. The lens was turned over on the stage so that the concave surface was upward. The lens was dosed with an additional two exposures totaling 300 mJ/cm$^2$. The lens was removed from the stage and placed in a convection oven at 115° C. for five minutes. The lens was then removed from the oven and allowed to cool to room temperature. At this point the lens was ready for shaping by conventional means to fit into an eyeglass frame.

The resulting lens was approximately 74 mm in diameter, had a center thickness of 2.7 mm, and a distance focusing power of +0.06 diopters. The resultant lens was dark green/greyish in color and could be used as a sunglass lens. The optics of the lens were crisp, without aberrated areas. The lens exhibited visible light transmission of approximately 10%. When scanned with a Hewlett Packard Model UV-Vis spectrophotometer, the lens transmitted virtually no light at wavelengths less than 650 nm.

The sunglass lens of this example was cured using ultraviolet light even though the lens forming composition included ultraviolet absorbing fixed pigments. Since such fixed pigments tend to absorb UV light strongly, the UV light might not have penetrated to the depths of the lens forming composition. The lens forming composition, however, contained a co-initiator in conjunction with a photoinitiator to help promote the curing of the entire lens forming composition. The present example thus demonstrates that a sunglass lens containing ultraviolet absorbing fixed pigments may be cured using ultraviolet light to initiate polymerization of a lens forming composition which contains a photoinitiator/co-initiator system.

FURTHER IMPROVEMENTS

LIGHT INITIATED POLYMERIZATION OF A LENS FORMING COMPOSITION CONTAINING LIGHT ABSORBING MATERIALS

Curing of an eyeglass lens using activating light to initiate the polymerization of a lens forming composition generally requires that the composition exhibit a high degree of activating light transmissibility so that the activating light can penetrate to the deeper regions of the lens cavity. Otherwise the resulting cast lens may possess optical aberrations and distortions. The cast lens may also contain layers of cured material in the regions closest to the transparent mold faces, sandwiching inner layers which are either incompletely cured, gelled, barely gelled, or even liquid. Often, when even small amounts of activating light absorbing compounds have been added to a normally curable lens forming composition, substantially the entire amount of lens forming composition contained within the lens cavity may remain liquid in the presence of activating light.

Photochromic pigments which have utility for photochromic eyeglass lenses typically absorb activating light strongly and change from an inactivated state to an activated state when exposed to activating light. The presence of photochromic pigments, as well as other activating light absorbing compounds within a lens forming composition, generally does not permit enough activating radiation to penetrate into the depths of the lens cavity sufficient to cause photoinitiators to break down and initiate polymerization of the lens forming composition. Examples of such activating light absorbing compounds other than photochromic pigments are fixed dyes and colorless additives.

It is therefore difficult to cure a lens forming composition containing activating light absorbing compounds using activating light. One solution to this problem involves the use of a co-initiator. By using a co-initiator, activating light may be used to initiate the polymerization reaction. It is believed that activating light which is directed toward the mold members may cause the photoinitiator to form a polymer chain radical. The polymer chain radical preferably reacts with the co-initiator more readily than with the monomer. The co-initiator may react with a fragment or an active species of either the photoinitiator or the polymer chain radical to produce a monomer initiating species in the regions of the lens cavity where the level of activating light is either relatively low or not present. It is therefore desirable to provide a method for polymerizing an eyeglass lens forming composition which contains light absorbing compounds by using activating light having a wavelength which is not absorbed by the light absorbing compounds, thus avoiding the need for a co-initiator.

In an embodiment of the present invention, an ophthalmic eyeglass lens may be made from a lens forming composition comprising a monomer, a light (e.g., ultraviolet light) absorbing compound, and a photoinitiator, by irradiation of the lens forming composition with activating light. As used herein "activating light" means light that may affect a chemical change. Activating light may include ultraviolet light, visible light or infrared light. Generally any wavelength of light capable of affecting a chemical change may be classified as activating. Chemical changes may be manifested in a number of forms. A chemical change may include, but is not limited to, any chemical reaction which causes a polymerization to take place. Preferably the chemical change causes the formation of a initiator species within the lens forming composition, the initiator species being capable of initiating a chemical polymerization reaction.

The lens forming composition, in liquid form, is preferably placed in a mold cavity defined by a first mold member and a second mold member. It is believed that activating light, when directed toward and through the mold members to activate the photoinitiator, causes the photoinitiator to form a polymer chain radical. The polymer chain radical may react with a fragment or an active species of either photoinitiator or the polymer chain radical to produce a monomer initiating species in other regions of the lens cavity.

The use of activating light of the appropriate wavelength preferably prevents the lens from darkening during the curing process. Herein, "darkening" means becoming at least partially non-transparent to the incoming activating light such that the activating light may not significantly penetrate the lens forming composition. Photochromic compounds may cause such darkening. Ultraviolet absorbing compounds present in the lens forming composition may prevent activating light having a wavelength substantially below about 380 nm from penetrating into the lens forming composition. When treated with activating light containing light with wavelengths in the ultraviolet region, e.g. light with wavelengths below about 380 nm, the ultraviolet absorbing compounds darken, preventing further ultraviolet activating light from penetrating the lens forming composition. The darkening of the lens forming composition may also prevent non-ultraviolet activating light from penetrating the composition. This darkening effect may prevent activating light of any wavelength from initiating the polymerization reaction throughout the lens forming composition.

When the light absorbing compounds absorb in the ultraviolet region activating light having a wavelength above about 380 nm may be used to prevent the darkening effect. Because the wavelength of the activating light is substantially above the wavelength at which the ultraviolet light absorbing compounds absorb, the darkening effect may be avoided. Additionally, activating light with a wavelength above about 380 nm may be used to initiate the polymerization of the lens forming material. By the use of such activating light an eyeglass lens containing ultraviolet light absorbing compounds may, in some circumstances, be formed without the use of a co-initiator.

In an embodiment the above-described lens forming composition, where the light absorbing compound absorbs ultraviolet light, may be treated with activating light having a wavelength above about 380 nm to activate the photoinitiator. Preferably activating light having a wavelength substantially between about 380 nm to 490 nm is used. By using activating light above about 380 nm the darkening effect caused by the ultraviolet absorbing compounds may be avoided. The activating light may penetrate into the lens forming composition, initiating the polymerization reaction throughout the composition. A filter which blocks light having a wavelength that is substantially below about 380 nm may be used to prevent the ultraviolet absorbing compounds from darkening.

The use of activating light permits polymerization of the lens forming composition to proceed through the depths of the lens cavity. A cured, clear, aberration free lens is preferably formed in less than about 30–60 minutes, more preferably in less than about 20 minutes. As used herein a "clear lens" means a lens that transmits visible light without scattering so that objects beyond the lens are seen clearly. As used herein "aberration" means the failure of a lens to produce point-to-point correspondence between an object and its image. The lens, when exposed to ultraviolet light, preferably inhibits at least a portion of the ultraviolet light from being transmitted through the lens. In this manner the eye may be protected from certain light. A lens that permits no ultraviolet light from passing through the lens (at least with respect to certain UV wavelengths) is more preferred.

In an embodiment, the lens forming composition which contains an ultraviolet absorbing compound may be cured with an activating light. Preferably, the activating light has a wavelength substantially above about 380 nm. Activating lights may replace the ultraviolet lights within the UVEXS curing apparatus previously described herein and depicted in FIG. 10. In another embodiment, the lens forming composition may be cured with activating light supplied from the FC-104 curing chamber which is depicted in FIGS. 14 and 15. The lens forming composition may be cured by exposing the composition to activating light multiple times using both the UVEXS and the FC-104. Alternatively, the lens forming composition may be cured by exposing the composition to a plurality of activating light pulses, at least one of the pulses having a duration of less than about one second (more preferably less than about 0.1 seconds, and more preferably between 0.1 and 0.001 seconds). Preferably, all activating light directed toward the mold members is at a wavelength between about 380 nm to 490 nm. The previously described embodiments which describe various methods and compositions for forming eyeglass lenses may also be utilized to form the eyeglass lens hereof, by replacing the ultraviolet light in these examples with activating light having a wavelength substantially greater than about 380 nm.

In an embodiment, the activating light may be generated from a fluorescent lamp. The fluorescent lamp is preferably used to direct activating light rays toward at least one of the mold members. At least one and preferably two fluorescent light sources, with strong emission spectra in the 380 to 490 nm region may be used. When two light sources are used, they are preferably positioned on opposite sides of the mold cavity. A fluorescent lamp emitting activating light with the described wavelengths is commercially available from Voltarc, Inc. of Fairfield, Conn. as model F20 T12/AQA/BP/65W.

Preferably three or four fluorescent lamps are positioned to provide substantially uniform radiation over the entire surface of the mold assembly to be cured. The activating light source may be turned on and off quickly between exposures. A flasher ballast may be used for this function. A flasher ballast may operate in a standby mode wherein a low current is supplied to the lamp filaments to keep the filaments warm and thereby reduce the strike time of the lamp. Such a ballast is commercially available from Magnatek, Inc of Bridgeport, Conn. Alternately, the light source may employ a shutter system to block the light between doses. This shutter system is preferably controlled by a microprocessor based control system in order to provide the necessary doses of light. A feedback loop may be used to control the light intensity so that intensity fluctuations due to environmental variables (e.g. lamp temperature) and lamp aging are minimized. A light sensor may be incorporated into the control system to minimize variances in dose for a given exposure time.

The identity of the major polymerizable components of the lens forming composition tends to affect the optimal curing process. It is anticipated that the identity of the light absorbing compound present in the monomer or blend of monomers may affect the optimal photoinitiator system used as well as the optimal curing process used to initiate polymerization. Also, varying the identities or the proportions of the monomer(s) in the lens forming composition may require adjustments to various production process variables including, but not limited to, exposure times, exposure intensities, cooling times and temperatures, postcure procedures and the like. For example, compositions including relatively slow reacting monomers, such as bisphenol A bis allyl carbonate or hexanediol dimethacrylate, or compositions including relatively higher proportions of such monomers may require either longer exposure times, higher intensities, or both. It is postulated that increasing the amount of either fast reacting monomer or the initiator levels present in a system will require reduced exposure times, more rigidly controlled light doses, and more efficient exothermic heat removal.

Preferably, the monomers selected as components of the lens forming composition are capable of dissolving the light absorbing compounds added to them. As used herein "dissolving" means being substantially homogeneously mixed. For example, monomers may be selected from a group including polyol (allyl carbonate) monomers, multifunctional acrylate monomers, and multi-functional methacrylic monomers for use in an ultraviolet light absorbing lens forming composition.

In an embodiment, the mixture of monomers, previously described as PRO-629, may be blended together before addition of other components required to make the lens forming composition. This blend of monomers is preferably used as the basis for a lens forming composition to which ultraviolet light absorbing compounds are added.

A polymerization inhibitor may be added to the monomer mixture at relatively low levels to inhibit polymerization of the monomer at inappropriate times (e.g., during storage). Preferably about 0 to 50 ppm of monomethylether hydroquinone (MEHQ) are added to the monomer mixture. It is also preferred that the acidity of the monomer mixture be as low as possible. Preferably less than about 100 ppm residual acrylic acid exists in the mixture. It is also preferred that the water content of the monomer mixture be relatively low, preferably less than about 0.15 percent.

Photoinitiators which have utility in the present invention have been described in previous embodiments. Ultraviolet light absorbing compounds which may be added to a normally ultraviolet transmissible lens forming composition have also been described in previous embodiments. The quantity of photochromic pigments present in the lens forming composition is preferably sufficient to provide observable photochromic effect. The amount of photochromic pigments present in the lens forming composition may widely range from about 1 ppm by weight to 1–5% by weight. In preferred compositions the photochromic pigments are present in ranges from about 30 ppm to 2000 ppm. In the more preferred compositions the photochromic pigments are present in ranges from about 150 ppm to 1000 ppm. The concentration may be adjusted depending upon the thickness of the lens being produced to obtain optimal visible light absorption characteristics.

In another embodiment co-initiators may be added to the lens forming composition. As described previously, such compositions may aid the polymerization of the lens forming composition by interacting with the photoinitiator such that the composition polymerizes in a substantially uniform manner. It is anticipated that the optimal amounts of the lens forming composition components is where the total amount of both initiators are minimized subject to the constraint of complete polymerization and production of a rigid, aberration free lens. The relative proportions of the photoinitiator to the co-initiator may be optimized by experimentation. For example, an ultraviolet absorptive lens forming composition that includes a photoinitiator with no co-initiator may be cured. If waves and distortions are observed in the resulting lens, a co-initiator may then be added to the lens forming composition by increasing amounts until a lens having the best optical properties is formed. It is anticipated that excess co-initiator in the lens forming composition should be avoided to inhibit problems of too rapid polymerization, yellowing of the lens, and migration of residual, unreacted co-initiator to the surface of the finished lens.

In an embodiment, hindered amine light stabilizers may be added to the lens forming composition. It is believed that these materials act to reduce the rate of degradation of the cured polymer caused by exposure to ultraviolet light by deactivating harmful polymer radicals. These compounds may be effective in terminating oxygen and carbon free radicals, and thus interfering with the different stages of auto-oxidation and photo-degradation. Preferably, more than one monomer and more than one initiator are used in a lens forming composition to ensure that the initial polymerization of the lens forming composition with activating light does not occur over too short a period of time. The use of such a lens forming composition may allow greater control over the gel formation, resulting in better control of the optical quality of the lens. Further, greater control over the rate of exothermic heat generation may be achieved. Thus, cracking of the lens and premature release of the lens from the mold which are typically caused by the release of heat may be prevented. As mentioned above, exothermic reactions occur during the curing process of the lens forming composition. As previously described a "donut effect" may occur for positive lens in which the relatively thin outer portion of the lens forming composition reaches its fully cured state before the relatively thick inner portion of the lens forming composition. Conversely, in a negative lens the relatively thin inner portion of the lens forming composition may reach its fully cured state before the relatively thick outer portion of the lens forming composition.

Accordingly, it is preferred that a greater amount of activating light is applied to the thicker sections of the composition than to the thinner sections. In one embodiment, as shown in FIG. 36, the thickness of a filter preferably varies so that a thinner section of the filter corresponds to an adjacent thicker section of the mold cavity and a thicker section of the filter corresponds to an adjacent thinner section of the mold cavity. In other words, the thickness of the filter may be varied according to the varying thickness of the lens forming composition disposed within the mold cavity. The filter is preferably a hazy filter that may be formed by a variety of means. The filter may be polymerized from a hazy material or any combination of materials which create haze. More specifically, the filter may be a "lens" (i.e., a piece of plastic shaped like a lens) made by adding an incompatible chemical to a typical lens forming composition. For example, a bisphenol compound may be added to a lens forming composition and polymerized, resulting in a cloudy filter in the shape of a lens that separates light into numerous (e.g., millions) of fragments. The filter may be injection molded from polyethylene or any suitable thermoplastic.

In one embodiment, after the lens forming composition has been placed in the mold cavity, it may be pre-cooled 3 to 7 minutes before being exposed to activating light. Thus, the lens forming composition may be cooled to below ambient temperature prior to polymerization of the lens forming composition. Advantageously, the heat released by the reaction within the composition may be balanced by the coolness of the composition so that the composition is not exposed to extreme amounts of thermal radiation. Thus, exposing the lens forming composition to below ambient temperatures before the reaction is initiated may inhibit undesirable effects resulting from the exothermic nature of the reaction. For example, cooling the lens forming composition might help prevent the loss of process control caused by variations in the rate of reaction that result from temperature changes of the lens forming composition.

In an embodiment, the activating light is directed toward the mold members until at least a portion of the lens forming composition is a gel. At this point, application of the activating light is preferably terminated to inhibit the polymerization reaction from proceeding too rapidly, thereby inhibiting the rate of heat generation from increasing so rapidly that premature release of the lens from the mold cavity and/or cracking of the lens results. The heat generated by the polymerization reaction may also be controlled by applying a stream of air to the mold cavity to remove heat from he mold cavity. Cooling of the mold cavity has been previously described. After termination of the activating light, the gasket holding the two mold members together is preferably removed to expose the lens forming composition to air while the reaction is allowed to continue at a desired rate. The air may advantageously help cool the lens forming composition. In an embodiment, the lens forming composition may be exposed to ambient conditions for about 5 to 30 minutes, depending on the mass of the composition. It is believed that approximately one minute of such exposure is preferred for each gram of the composition. Since the amount of heat released during reaction tends to be proportional to the mass of the composition, the more mass the composition has, the longer it may be cooled. After cooling the composition, it may be exposed to activating light again if desired.

In an embodiment, the inner surface, i.e., the casting face, of the front mold member may be coated with one or more hardcoat layers before the lens forming composition is placed within the mold cavity. Preferably, two hardcoat layers are used so that any imperfections, such as pin holes in the first hardcoat layer, are covered by the second hardcoat layer. The resulting double hardcoat layer is preferably scratch resistant and protects the subsequently formed eyeglass lens to which the double hardcoat layer adheres. In an embodiment, the casting face of the back mold member may be coated with a material prior to filling the mold cavity with the lens forming composition. This material may be capable of being tinted with dye. This tintable coat preferably adheres to the lens forming composition so that dyes may later be added to the resulting eyeglass lens for tinting the lens.

In an embodiment, dyes may be added to the lens forming composition. It is believed that certain dyes may be used to attack and encapsulate ambient oxygen so that the oxygen cannot react with free radicals formed during the curing process. Also, dyes may be added to the composition to alter the color of an inactivated photochromic lens. For instance, a yellow color that sometimes results after a lens is formed may be "hidden" if a blue-red or blue-pink dye is present in the lens forming composition. The inactivated color of a photochromic lens may also be adjusted by the addition of non-photochromic pigments to the lens forming composition.

In an embodiment, the eyeglass lens that is formed may be coated with a hydrophobic layer, e.g. a hardcoat layer. The hydrophobic layer preferably extends the life of the photochromic pigments near the surfaces of the lens by preventing water and oxygen molecules from degrading the photochromic pigments.

In a preferred embodiment, both mold members are coated with a cured adhesion-promoting composition prior to placing the lens forming composition into the mold cavity. Providing the mold members with such an adhesion-promoting composition is preferred to increase the adhesion between the casting surface of the mold and the lens forming composition. The adhesion-promoting composition thus reduces the possibility of premature release of the lens from the mold. Further, it is believed that such a coating also provides an oxygen and moisture barrier on the lens which serves to protect the photochromic pigments near the surface of the lens from oxygen and moisture degradation. Yet further, the coating provides abrasion resistance, chemical resistance, and improved cosmetics to the finished lens.

An eyeglass lens formed using the lens forming composition of the present invention is not only applicable for use as a prescription lens and may be used for a non-prescription lens as well. Particularly, such a lens may be used in sunglasses. Advantageously, photochromic sunglass lenses would remain light enough in color to allow a user to see through them clearly while at the same time prohibiting ultraviolet light from passing through the lenses. In one embodiment, a background dye may be added to the photochromic lens to make the lens appear to be a dark shade of color at all times like typical sunglasses.

Each of the embodiments described above may be combined or used individually.

PREPARING LENS OF VARIOUS POWERS BY ALTERING THE LENS FORMING CONDITIONS

It has been determined that in some embodiments the finished power of an activating light polymerized lens may be controlled by manipulating the curing temperature of the lens forming composition. For instance, for an identical combination of mold members and gasket, the focusing power of the produced lens may be increased or decreased by changing the intensity of activating light across the lens mold cavity or the faces of the opposed mold members.

As the lens forming material begins to cure, it passes through a gel state, the pattern of which, within the lens cell, leads to the proper distribution of internal stresses generated later in the cure when the lens forming material begins to shrink. As the lens forming material shrinks during the cure, the opposed mold members will preferably flex as a result of the different amounts of shrinkage between the relatively thick and the relatively thin portions of the lens. When a negative lens, for example, is cured, the upper or back mold member will preferably flatten and the lower or front mold member will preferably steepen with most of the flexing occurring in the lower or front mold member. Conversely, with a positive lens, the upper or back mold member will preferably steepen and the lower or front mold member will preferably flatten with most of the flexing occurring in the upper or back mold member.

By varying the intensity of the activating light between the relatively thin and the relatively thick portions of the lens in the lens forming cavity, it is possible to create more or less total flexing. Those light conditions which result in less flexing will tend to minimize the possibility of premature release.

The initial curvature of the opposed mold members and the center thickness of the lens produced can be used to compute the targeted power of the lens. Herein, the "targeted power" of a lens is the power a lens may have if the lens were to have a curvature and thickness substantially identical to the mold cavity formed by the opposed mold members. The activating light conditions may be manipulated to alter the power of the lens to be more or less than the targeted power.

By varying the amount of activating light reaching the lens mold the polymerization rate, and therefore the temperature of the lens forming composition may be controlled. It has been determined that the maximum temperature reached by the lens forming composition during and/or after activation by light may effect the final power of the lens. By allowing the lens forming composition to reach a temperature higher than the typical temperatures described in previous embodiments, but less than the temperature at which the formed lens will crack, the power of the lens may be decreased. Similarly, controlling the polymerization such that the temperature of the lens forming composition remains substantially below the typical temperatures described in previous embodiments, but at a sufficient temperature such that a properly cured lens is formed, the power of the lens may be increased. Similarly, increasing such lens forming composition temperature during curing may decrease the power of the resulting lens.

Figure 40:
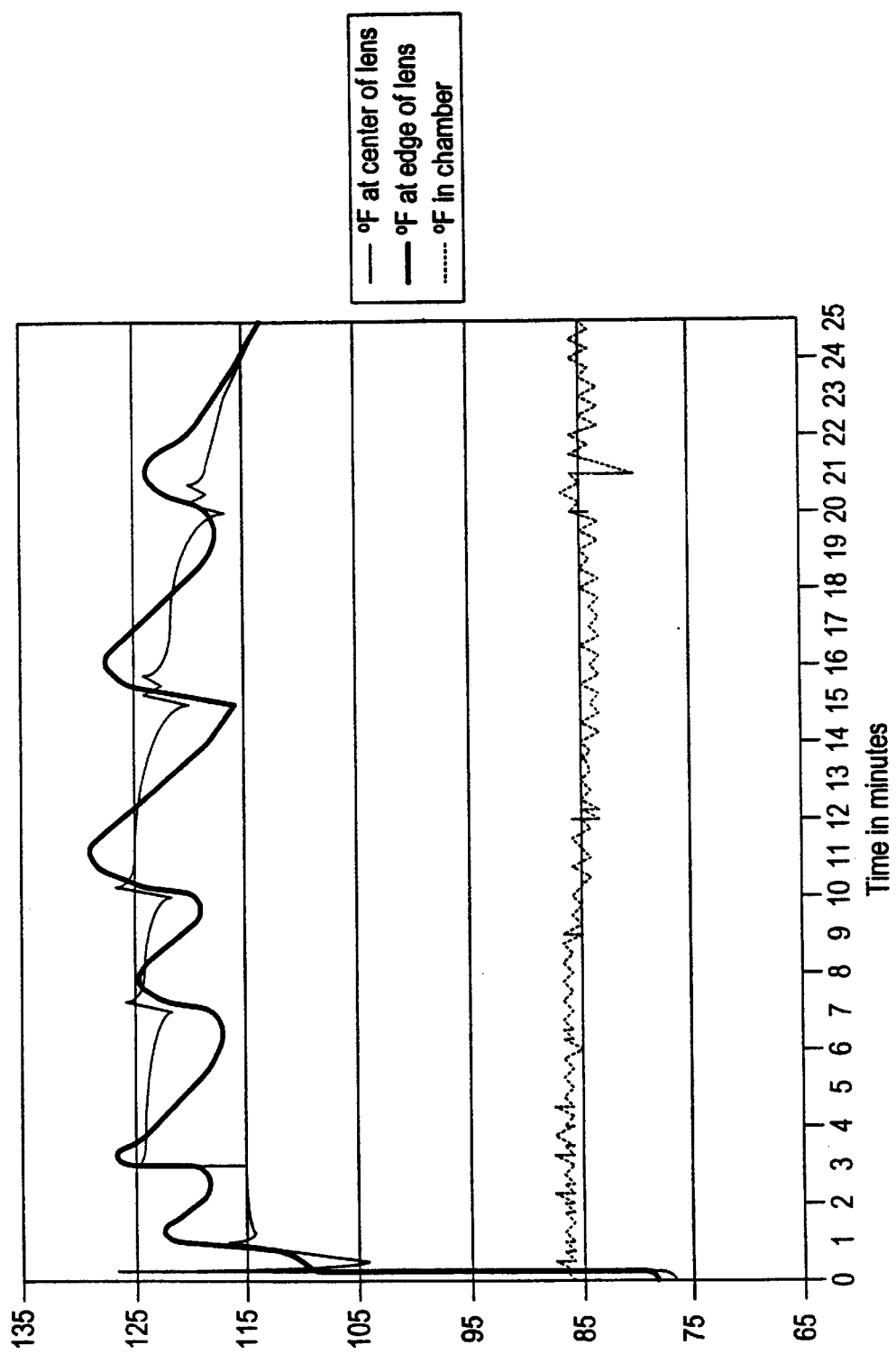
FIG. 40 depicts a plot of the temperature of the lens forming composition versus time during the application of activating light pulses.

In an embodiment, an ophthalmic eyeglass lens may be made from a lens forming composition comprising a monomer and a photoinitiator, by irradiation of the lens forming composition with activating light. The composition may optionally include one or more of: an ultraviolet absorbing compound, a polymerization inhibitor, a co-initiator, a hindered amine light stabilizer, and a dye. The activating light may include ultraviolet, visible or infrared light. The lens forming composition may be treated with activating light such that an eyeglass is formed which has a power substantially equal to the targeted power for a given mold cavity. The peak temperature of the lens forming process may be the maximum temperature attained after the application of each pulse of activating light. As depicted in FIG. 40, each pulse of activating light may cause the lens forming composition to rise to a peak temperature.

After reaching this peak temperature the lens forming composition may begin to cool until the next application of activating light. If the peak temperature of the lens forming composition is controlled such that the formed lens has a power substantially equal to the targeted power, the peak temperature is referred to as the "matching temperature". The matching temperature may be determined by performing a series of experiments using the same mold cavity. In these experiments the peak temperature attained during the process is preferably varied. By measuring the power of the lenses obtained through this experiment the matching temperature range may be determined.

When the temperature of the lens forming composition is allowed to rise above the matching temperature during treatment with activating light, the power of the lens may be substantially less than the targeted power of the lens. Alternatively, when the temperature of the lens forming composition is allowed to remain below the matching temperature, the power of the lens may be substantially greater than the targeted power of the lens. In this manner, a variety of lenses having substantially different lens powers from the targeted power may be produced from the same mold cavity.

When the lenses cured by the activating light are removed from the opposed mold members, they are typically under a stressed condition. It has been determined that the power of the lens can be brought to a final resting power, by subjecting the lenses to a post-curing heat treatment to relieve the internal stresses developed during the cure and cause the curvature of the front and the back of the lens to shift. Typically, the lenses are cured by the activating light in about 10–30 minutes (preferably about 15 minutes). The post-curing heat treatment is conducted at approximately 85–120° C. for approximately 5–15 minutes. Preferably, the post-curing heat treatment is conducted at 100–110° C. for approximately 10 minutes. Prior to the post-cure, the lenses generally have a lower power than the final resting power. The post-curing heat treatment reduces yellowing of the lens and reduces stress in the lens to alter the power thereof to a final resting power. The post-curing heat treatment can be conducted in a conventional convection oven or any other suitable device.

In an embodiment, an ophthalmic eyeglass lens may be made from a lens forming composition comprising a monomer and a photoinitiator, by irradiation of the lens forming composition with activating light. The composition may optionally include one or more of: an ultraviolet absorbing compound, a polymerization inhibitor, a co-initiator, a hindered amine light stabilizer, and a dye. The activating light may include ultraviolet, visible or infrared light. The lens forming composition may be treated with activating light such that an eyeglass is formed. The lens may be kept within the mold cavity formed by the mold members until the light has completely cured the lens forming composition. The minimum time which a lens must remain in the mold cavity to produce a lens with the targeted power, with respect to the mold cavity, is herein referred to as the "demolding time". The demolding time may be determined by performing a series of experiments using the same mold cavity. In these experiments the time that the lens is released from the mold cavity during the process is preferably varied. By measuring the power of the lenses obtained through this experiment the demolding time range may be determined.

When a formed lens is removed prior to the demolding time, the power of the lens may be substantially greater than the targeted power of the lens. By varying the demolding time a variety of lenses having substantially greater lens powers from the targeted power may be produced from the same mold cavity.

MICROPROCESSOR BASED CONTROL SYSTEM

In an embodiment a lens curing apparatus may include a microprocessor based control system. The control system may perform some and/or all of a number of functions during the lens curing process, including: (i) measuring the ambient room temperature; (ii) determining the initial dose of light required to cure the lens forming composition, based on the ambient room temperature; (iii) applying the activating light with an intensity and duration sufficient to equal the determined dose; (iv) measuring the composition's temperature response during and subsequent to the application of the first dose of light; (v) calculating the dose required for the next application of activating light; (vi) applying the activating light with an intensity and duration sufficient to equal the determined second dose; (vii) repeating these procedures until the lens forming material is substantially cured; (viii) determining when the curing process is complete by monitoring the temperature response of the lens forming composition during the application of activating light; (ix) tracking the usage and maintenance requirements of the system. Herein, "dose" refers to the amount of light energy applied to an object, the energy of the incident light being determined by the intensity and duration of the light.

A temperature monitor may be located at a number of positions within a mold chamber. Mold chambers including a temperature monitor have been described in the previous embodiments. In one embodiment an infra-red temperature sensor may be located such that it can measure the temperature of the mold and/or the lens forming composition in the mold cavity. One infra-red temperature sensor may be the Cole-Parmer Model E39669-00 (Vernon Hills, Ill.).

The temperature monitor may measure the temperature within the chamber and/or the temperature of air exiting the chamber. The controller may be adapted to send a signal to a cooler and/or distributor to vary the amount and/or temperature of the cooling air. The temperature monitor may also determine the temperature at any of a number of locations proximate the mold cavity. The temperature monitor preferably sends a signal to the controller such that the temperature of mold cavity and/or the lens forming composition is known by the controller throughout the curing process.

During the initial set-up the temperature of the lens forming composition within the mold cavity is determined. This initial temperature of the lens forming composition may be about equal to the ambient room temperature. The controller may then determine the initial temperature of the lens forming composition by measuring the ambient room temperature. Alternatively, the initial temperature of the lens forming composition may be measured directly using the aforementioned temperature sensors.

The controller preferably determines the initial dose to be given to the lens forming composition based on the initial temperature of the composition The controller may use a table to determine the initial dose, the table including a series of values correlating the initial temperature to the initial dose and/or the mass of the lens forming composition. The table may be prepared by routine experimentation. To prepare the table a specific lens forming composition of a specific mass is preferably treated with a known dose of activating light. The mold cavity is preferably disassembled and the gellation pattern of the lens forming composition observed. This procedure may be repeated, increasing or decreasing the dosage as dictated by the gellation patterns, until the optimal dosage is determined for the specific lens forming composition.

During this testing procedure the initial temperature of the lens forming composition may be determined, this temperature being herein referred to as the "testing temperature". In this manner the optimal dose for the lens forming composition at the testing temperature may be determined. When the lens forming material has an initial temperature that is substantially equal to the testing temperature, the initial dosage may be substantially equal to the experimentally determined dosage. When the lens forming material has a temperature that is substantially greater or less than the testing temperature, the initial dose may be calculated based on a function of the experimentally determined initial dose.

In an embodiment, the controller is adapted to control the intensity and duration of activating light pulses delivered from the activating light source and the time interval between the pulses. The activating light source may include a capacitor which stores the energy required to deliver the pulses of activating light. The capacitor may be adapted to allow pulses of activating light to be delivered as frequently as desired. A light sensor may be used to determine the intensity of activating light emanating from the source. The light sensor is preferably adapted to send a signal to the controller, which is preferably adapted to maintain the intensity of the activating light at a selected level. A filter may be positioned between the activating light source and the light sensor and is preferably adapted to inhibit a portion of the activating light rays from contacting the light sensor. This filter may be necessary to keep the intensity of the activating light upon the light sensor within the detectable range of the light sensor.

In an embodiment, a shutter system is used to control the application of activating light rays to the lens forming material. The shutter system preferably includes air-actuated shutter plates that may be inserted into the curing chamber to prevent activating light from reaching the lens forming material. The shutter system may be coupled to the controller, which may actuate an air cylinder to cause the shutter plates to be inserted or extracted from the curing chamber. The controller preferably allows the insertion and extraction of the shutter plates at specified time intervals. The controller may receive signals from temperature sensors allowing the time intervals in which the shutters are inserted and/or extracted to be adjusted as a function of a temperature of the lens forming composition and/or the molds. The temperature sensor may be located at numerous positions proximate the mold cavity and/or casting chamber.

In an embodiment a single dose of activating light may be used to cure a lens forming composition. The controller may monitor the change in temperature of the lens forming composition during the application of activating light. The activating light preferably initiates a polymerization reaction such that the temperature of the lens forming composition begins to rise. By monitoring the change in temperature over a time period the controller may determine the rate of temperature change. The controller preferably controls the polymerization of the lens forming composition based on the rate of temperature change. When the temperature is found to be rising at a faster than desired rate, the desired rate being determined based on previous experiments, the temperature controller may alter the intensity or duration of the pulse such that the rate of temperature change is lowered. Typically the duration of the activating light is shortened and/or the intensity of the activating light is diminished to achieve this effect. The controller may also increase the rate of cooling air blowing across the mold to help lower the temperature of the lens forming composition. Alternatively, if the temperature of the reaction is increasing too slowly, the controller may increase the intensity of the activating light and/or increase the duration of the pulse. Additionally, the controller may decrease the rate of cooling air blowing across the mold to allow the temperature of the lens forming composition to rise at a faster rate.

One manner in which the temperature may be controlled is by monitoring the temperature during the application of activating light, as described in U.S. Pat. No. 5,422,046 to Tarshiani et al. During activating light irradiation the temperature of the lens forming composition tends to rise. When the temperature reaches a predetermined upper set point the activating light source is preferably turned off. Removal of the activating energy may allow the temperature to gradually begin to fall. When the temperature is reduced to a predetermined lower set point the activating light source is turned on. In this way the temperature may be controlled within a desired range. This temperature range tends to be very broad due to the nature of the lens forming polymerization reactions. For example, turning the activating light off at a predetermined upper set point may not insure that the temperature of the lens forming composition will stop at that point. In fact, it is more likely that the temperature may continue to rise after the upper set point has been reached. To offset this effect the upper set point may be set at a temperature lower than the upper temperature desired during the lens forming process. Such a method of temperature control may be insufficient to control the temperature. As shown in FIG. 40, increase in the temperature of a lens forming composition during the lens forming process may not be constant. Since the increase in temperature of the composition changes as the process continues, the use of an upper set point for controlling the temperature may not adequately prevent the composition from reaching greater than desired temperatures. Additionally, near the completion of the process the upper set point may be set too low, thereby preventing the lens forming composition from reaching a temperature that is adequate to maintain the polymerization reaction due to insufficient doses of activating light.

In an embodiment the temperature control process may be described as a modified PID (Proportional, Integral, Derivative) control schema. Preferably the temperature of the lens forming composition is controlled in this manner with a PID controller. The PID controller may use a number of factors to determine the dose of activating light applied for each pulse. The PID controller preferably measures the temperature as well as the rate of temperature change.

The PID controller uses a method involving the combination of proportional, integral and derivative controlling methods. The first, proportional control, may be achieved by mixing two control factors in such a way as to achieve the desired effect. For lens control the two factors which may have the most effect on temperature control are the dosage of activating light and the flow rate of the cooling air. These two factors may be altered to achieve a desired temperature response. If the temperature must be raised as rapidly as possible a full dosage of light may delivered with no cooling air present. Similarly, if the composition must be rapidly cooled the sample may be treated with cooling air only. Preferably the two factors, application of incident light and cooling, are both applied to achieve the desired temperature response. The mixture, or proportions of these factors may allow the temperature of the composition to be controlled.

The use of proportional control tends to ignore other effects that influence the temperature of the lens forming composition. During the lens forming process the temperature of the lens forming composition may vary due to the rate of polymerization of the reaction. When the composition is undergoing a rapid rate of polymerization, the temperature of the composition may rise beyond that determined by the proportional setting of the activating light and cooling air controls. Toward the end of the process the lens may become too cool due to the a reduction in the rate of polymerization of the composition. The use of proportional control may therefore be inadequate to control this procedure and may lead to greater than desired variations in the temperature of the composition.

These limitations may be overcome by altering the proportions of the two components in response to the temperature of the composition. A single set point may be used to control the temperature of a reaction. As the temperature rises above this set point the proportion of the activating light and cooling may be adjusted such that the temperature begins to lower back toward the set point. If the temperature drops below the set point the proportion of activating light and cooling may be adjusted to raise the temperature back to the set point. Typically, to lower the temperature the dose of activating light may be reduced and/or the flow rate of the cooling air may be increased. To raise the temperature the dose of activating light may be increased and/or the flow rate of the cooling air may be decreased.

The use of proportional control in this manner may not lead to a steady temperature. Depending on the set point and the response time of the lens forming composition to variations in the dosage of light and/or cooling air, the temperature may oscillate over the set point, never attaining a steady value. To better control such a system the rate of change of the temperature over a predetermined time period is preferably monitored. As the temperature rises the rate at which the temperature rises is preferably noted. Based on this rate of change the controller can then alter the dosage of activating light and/or cooling air such that a temperature much closer to the set point may be achieved. Since the rate will change in response to changes in the rate of polymerization, such a system may better control the temperature of the lens forming composition throughout the process.

In an embodiment the controller is a modified PID) controller. The controller preferably monitors the temperature of the lens forming composition throughout the process. Additionally, the controller may monitor the rate of change of temperature throughout the reaction. When a plurality of pulses are being applied to control the polymerization, the controller preferably controls the duration and intensity of each pulse to control the temperature of the composition. In a typical process the rate of change in temperature is preferably monitored after the application of an activating light pulse. If the temperature is trending in an upward direction, the controller preferably waits for the temperature to crest and start descending, before the application of additional light pulses. This cresting temperature may vary, as depicted in FIG. 40, throughout the lens forming process. After the temperature has passed a predetermined set point, a dose, calculated from the rate of change in temperature caused by the application of the previous pulse, is applied to the lens forming composition. After the light pulse is delivered the controller repeats the procedure.

When the reaction nears completion the controller detects the lack of response to the last exposure (i.e. the lens temperature did not increase appreciably). At this point the controller may apply a final dose to assure a substantially complete cure and notify the operator that the mold assembly is ready to be removed form the chamber. Additionally, The microprocessor based control system provides system diagnostics and manages an interlock system for safety purposes. The control system will notify the user when routine maintenance is due or when a system error is detected. The control system will track system usage and lens yield rates.

It is to be understood that embodiments of a microprocessor based control system, as described above, may be combined with the methods and apparatus of preferred embodiments described above in the previous sections.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements and compositions described herein or in the features or in the sequence of features of the methods described herein without departing from the spirit and scope of the invention as described in the following claims.

What is claimed is:

1. A plastic eyeglass lens that absorbs at least some activating light when activating light is applied to the lens during use made by the method comprising:

placing a liquid lens forming composition in a mold cavity defined by at least a first mold member, the lens forming composition comprising:

a monomer that is curable in the mold cavity by exposure to activating light to substantially form the eyeglass lens;

a light absorbing compound that absorbs at least a portion of the activating light during at least a portion of the curing of the monomer;

a photoinitiator that activates a co-initiator after being exposed to at least a portion of the activating light during curing, wherein the co-initiator activates curing of the monomer to form the eyeglass lens, and wherein the co-initiator facilitates curing of the lens forming composition; and directing activating light toward the mold cavity to cure the lens forming composition to form the eyeglass lens, wherein the formed eyeglass lens absorbs some activating light when activating light is applied to the lens during use of the lens.

2. The eyeglass lens of claim 1, wherein curing the lens forming composition comprises polymerizing the monomer.

3. The eyeglass lens of claim 1, wherein directing activating light to the lens forming composition comprises applying a plurality of activating light pulses to the lens forming composition.

4. The eyeglass lens of claim 1, wherein the mold cavity is further defined by a second mold member.

5. The eyeglass lens of claim 1, wherein the method of forming the eyeglass lens further comprises applying air to the mold cavity to remove heat from the mold cavity.

6. The eyeglass lens of claim 1, wherein the method of forming the eyeglass lens further comprises directing air toward at least one of the mold members to cool the lens forming composition.

7. The eyeglass lens of claim 1, wherein the method of forming the eyeglass lens further comprises applying a hydrophobic coating to the eyeglass lens.

8. The eyeglass lens of claim 1, wherein the method of forming the eyeglass lens further comprises applying a hydrophobic coating to the eyeglass lens, wherein the hydrophobic coating is adapted to inhibit the eyeglass lens from being exposed to water and to ambient oxygen.

9. The eyeglass lens of claim 1, wherein the method of forming the eyeglass lens further comprises inhibiting the eyeglass lens from being exposed to water and to ambient oxygen by applying a coating to the eyeglass lens.

10. The eyeglass lens of claim 1, wherein the method of forming the eyeglass lens further comprises cooling at least one of the mold members to below ambient temperature prior to directing activating light toward the mold cavity.

11. The eyeglass lens of claim 1, wherein the first mold member comprises a casting face and a non-casting face, and wherein the method of forming the eyeglass lens further comprises placing a first hardcoat layer upon said casting face and a second hardcoat layer upon said first hardcoat layer prior to placing the liquid lens forming composition in the mold cavity.

12. The eyeglass lens of claim 4, wherein the second mold member comprises a casting face and a non-casting face, and wherein the method of forming the eyeglass lens further comprises placing a material capable of being tinted upon the casting face prior to placing the liquid lens forming composition in the mold cavity.

13. The eyeglass lens of claim 4, wherein the second mold member comprises a casting face and a non-casting face, and wherein the method of forming the eyeglass lens further comprised placing a material capable of being tinted upon the casting face prior to placing the liquid lens forming composition in the mold cavity, and further comprising applying dye to the material to tint the lens forming composition.

14. The eyeglass lens of claim 4, wherein the method of forming the eyeglass lens further comprises applying an adhesion-promoter coating to an inner surface of the first mold member and an inner surface of the second mold member to substantially adhere the lens forming composition to the first and second mold members during use.

15. The eyeglass lens of claim 4, wherein the method of forming the eyeglass lens further comprises placing a substantially hazy light filter between a light source and at least one of the mold members to vary intensity of activating light across the lens forming composition when the light is directed toward the mold cavity.

16. The eyeglass lens of claim 4, wherein the first mold member comprises a casting face and a non-casting face, wherein the second mold member comprises a casting face and a non-casting face, and wherein the method of forming the eyeglass lens further comprises directing cooled air having a temperature below ambient temperature toward at least one of the non-casting faces of the first and second mold members to remove heat from the lens forming composition.

17. The eyeglass lens of claim 1, wherein the activating light is removed from the mold cavity when substantially all of the lens forming composition has reached its gel point.

18. The eyeglass lens of claim 1, wherein the activating light comprises a first intensity, and wherein the activating light is directed toward the mold cavity until substantially all of the lens forming composition has reached its gel point, and wherein the method of forming the eyeglass lens further comprises directing activating light having a second intensity towards the mold cavity to cure substantially all of the lens forming composition, the first intensity being greater than the second intensity.

19. The eyeglass lens of claim 1, wherein the activating light is directed toward the mold cavity until substantially all of the lens forming composition has reached its gel point, and wherein the method of forming the eyeglass lens further comprises inhibiting the activating light from further being directed toward the mold cavity, thereby allowing substantially all of the lens forming composition to cure.

20. The eyeglass lens of claim 1, wherein the eyeglass lens is formed from the lens forming composition in a time period of less than about 10 minutes.

21. The eyeglass lens of claim 1, wherein the eyeglass lens is formed from the lens forming composition in a time period of less than about 30 minutes.

22. The eyeglass lens of claim 4, wherein the first mold member is spaced apart from the second mold member by a gasket, and wherein the method of forming the eyeglass lens further comprises removing the gasket subsequent to directing activating light toward the mold cavity to expose the lens forming composition to ambient air for approximately 5 to 30 minutes, thereby cooling the lens forming composition.

23. The eyeglass lens of claim 4, wherein the first mold member is spaced apart from the second mold member by a gasket, and wherein the method of forming the eyeglass lens further comprises removing the gasket subsequent to directing activating light toward the mold cavity to expose the lens forming composition to ambient air for approximately 5 to 30 minutes, thereby cooling the lens forming composition, and further comprising directing additional activating light toward the mold cavity to at least partially cure the lens forming composition.

24. The eyeglass lens of claim 1, wherein the method of forming the eyeglass lens further comprises heating the cured lens forming composition to a temperature between approximately 100° C. to 120° C. for approximately 3 to 15 minutes subsequent to curing the lens forming composition.

25. The eyeglass lens of claim 1, wherein the method of forming the eyeglass lens further comprises placing a filter between a light source and at least one of the mold members, wherein the filter comprises a varying thickness such that the filter varies an intensity distribution of activating light across the mold cavity.

26. The eyeglass lens of claim 1, wherein the method of forming the eyeglass lens further comprises a filter with a pattern printed on it between the light source and at least one of the mold members, wherein the filter varies an intensity distribution of the activating light across the mold cavity.

27. The eyeglass lens of claim 1, wherein directing activating light toward the mold cavity initiates the photo-initiator proximate a surface of the lens forming composition such that the photoinitiator initiates the co-initiator proximate a middle of the lens forming composition, the middle of the lens forming composition having insufficient light to initiate the photoinitiator therein.

28. The eyeglass lens of claim 1, wherein the light absorbing compound is a photochromic compound, and wherein the photochromic compound is dissolved in the monomer.

29. The eyeglass lens of claim 1, wherein the lens forming composition further comprises a hydroquinone compound for inhibiting polymerization of the monomer before polymerization is desired.

30. The eyeglass lens of claim 1, wherein the lens forming composition further comprises between about 0 and 70 ppm of monomethylether hydroquinone.

31. The eyeglass lens of claim 1, wherein the light absorbing compound is a photochromic compound.

32. The eyeglass lens of claim 1, wherein the light absorbing compound is a photochromic compound, and wherein the photochromic compound comprises a compound selected from the group consisting of spirooxazines, spiropyrans, spironaphthoxazines, spiropyridobenzoxazines, spirobenzoxazines, naphthopyrans, benzopyrans, spironaphthopyrans, indolinospironaphthoxazines, indolinospironaphthopyrans, diarylnaphthopyrans, organometallics, and phenylmercury.

33. The eyeglass lens of claim 1, wherein the lens forming composition further comprises a hindered phenolic compound selected from the group consisting of thiodiethylene bis-(3,5-di-tert-butyl-4-hydroxy)hydrocinnamate and octadecyl-3,5-bis(1,1-dimethylethyl)-4-hydroxybenzene-propanoate for inhibiting oxidation of the lens forming composition.

34. The eyeglass lens of claim 1, wherein the light absorbing compound is a photochromic compound, and wherein an amount of photochromic compound in the lens forming composition ranges from about 1 ppm to about 5% by weight.

35. The eyeglass lens of claim 1, wherein the light absorbing compound is a photochromic compound, and wherein an amount of photochromic compound in the lens forming composition ranges from about 30 ppm to about 2000 ppm.

36. The eyeglass lens of claim 1, wherein the light absorbing compound is a photochromic compound, and wherein an amount of photochromic compound in the lens forming composition ranges from about 150 ppm to about 1000 ppm.

37. The eyeglass lens of claim 1, wherein the light absorbing compound is a photochromic compound, and wherein an amount of photoinitiator in the lens forming composition ranges from about 30 ppm to about 2000 ppm.

38. The eyeglass lens of claim 1, wherein an amount of the co-initiator in the lens forming composition ranges from about 1 ppm to about 7% by weight.

39. The eyeglass lens of claim 1, wherein an amount of the co-initiator in the lens forming composition ranges from about 0.3% to about 2% by weight.

40. The eyeglass lens of claim 1, wherein the lens forming composition comprises less than about 0.15% water.

41. The eyeglass lens of claim 1, wherein the lens forming composition comprises less than about 100 ppm residual acrylic acid.

42. The eyeglass lens of claim 1, wherein the monomer comprises a polyethylenic-functional monomer containing ethylenically unsaturated groups selected from acrylyl and methacrylyl.

43. The eyeglass lens of claim 1, wherein the monomer comprises an aromatic containing bis(allyl carbonate)-functional monomer.

44. The eyeglass lens of claim 1, wherein the monomer comprises a compound selected from the group consisting of polyol (allyl carbonate)-functional monomer, acrylic-functional monomer, methacrylic-functional monomer, and mixtures thereof.

45. The eyeglass lens of claim 1, wherein the monomer comprises a compound selected from the group consisting of tripropyleneglycol diacrylate, tetraethyleneglycol diacrylate, trimethylolpropane triacrylate, trimethylolpropane triacrylate, bisphenol A bis allyl carbonate, hexanediol dimethacrylate, and mixtures thereof.

46. The eyeglass lens of claim 1, wherein the co-initiator comprises an amine.

47. The eyeglass lens of claim 1, wherein the co-initiator comprises an acrylic amine.

48. The eyeglass lens of claim 1, wherein the co-initiator comprises a diacrylic amine.

49. The eyeglass lens of claim 1, wherein the co-initiator comprises a compound selected from the group consisting of N,N-dimethyldiethanolamine, triethanol amine, ethyl-4-dimethylamino benzoate, ethyl-2-dimethylamino benzoate, n-butoxyethyl-4-dimethyl amino benzoate, p-dimethyl amino benzaldehyde, N,N-dimethyl-p-toluidine, and octyl p-dimethylaminobenzoate.

50. The eyeglass lens of claim 1, wherein the photoinitiator comprises a compound selected from the group consisting of 1-hydroxycyclohexylphenyl ketone, mixtures of bis(2,6-dimethoxybenzoyl) (2,4,4,-trimethylphenyl) phosphine oxide and 2-hydroxy-2-methyl-1-phenylpropan-1-one, mixtures of (2,6 dimethoxybenzoyl) (2,4,4,-trimethylphenyl) phosphine oxide and 1-hydroxycyclohexylphenylketone, 2,2-dimethoxy-2-phenylacetophenone, 2-hydroxy-2-methyl-1phenylpropan-1-one, mixtures of 2,4,6-trimethylbenzoyldiphenylphosphine oxide and 2-hydroxy-2-methyl-1phenylpropan-1-one, 2,2-diethoxyacetophenone, benzil dimethylketal, α-hydroxyketone, 2-methyl thioxanthone, 2-chlorothioxanthone, thioxanthone, xanthone, 2-isopropylthioxanthone, mixtures of triaryl sulfonium hexafluoroantimonate and propylene carbonate, diaryl diodonium hexafluoroantimonate, mixtures of benzophenone and 1-hydroxycyclohexylphenyl ketone, 2-benzyl-2-N,N-dimethylamino-1-(4-morpholinophenyl)-1-butanone, 2-methyl-1-[4-(methylthio)phenyl]-2-morpholino propan-1-one, bis($\eta$5-2,4-cyclopentadien-1-yl)-bis-[2,6-difluoro-3-(1H-pyrrol-1-yl) phenyl]titanium, mixtures of 2,4,6-trimethylbenzophenone and 4-methylbenzophenone, benzoyl peroxide, and methyl benzoylformate.

51. The eyeglass lens of claim 1, wherein the photoinitiator comprises bis(2,6-dimethoxybenzoyl)-(2,4,4 trimethylphenyl) phosphine oxide.

52. The eyeglass lens of claim 1, wherein the photoinitiator forms a polymer chain radical in response to being exposed to activating light.

53. The eyeglass lens of claim 1, wherein the photoinitiator forms a first polymer chain radical in response to being exposed to activating light, and wherein the first polymer chain radical reacts with the co-initiator, thereby forming a second polymer chain radical.

54. The eyeglass lens of claim 1, wherein the photoinitiator forms a first polymer chain radical in response to being exposed to activating light, and wherein the first polymer chain radical reacts with the co-initiator, thereby forming a second polymer chain radical, and wherein the second polymer chain radical reacts with the monomer, thereby curing the monomer.

55. The eyeglass lens of claim 1, wherein the lens forming composition comprises bis(1,2,2,6,6-pentamethyl-4-piperidinyl)sebacate for inhibiting degradation of the cured monomer caused by exposure to activating light.

56. The eyeglass lens of claim 1, wherein the lens forming composition further comprises a dye to form a background color within the eyeglass lens.

57. The eyeglass lens of claim 1, wherein the lens forming composition further comprises a dye that inhibits ambient oxygen from reacting with the ultraviolet absorbing compound.

58. glass lens of claim 1, wherein the lens forming composition further comprises a dye for altering a background color of the lens during use.

59. The eyeglass lens of claim 1, wherein the lens forming composition further comprises a dye for inhibiting the light absorbing compound from being exposed to predetermined wavelengths of light.

60. The eyeglass lens of claim 1, wherein an amount of activating light is directed towards the mold cavity, and wherein the mold cavity comprises a temperature, and wherein the amount of activating light directed to the mold cavity is a function of the temperature of at least a portion of the mold cavity.

61. The eyeglass lens of claim 1, wherein directing light to the lens forming composition comprises applying a number of activating light pulses to the lens forming composition, wherein the number of light pulses is a function of a change in a temperature of the lens forming composition over a period of time.

62. The eyeglass lens of claim 1, wherein directing light to the lens forming composition comprises applying a plurality of activating light pulses to the lens forming composition, wherein a duration of the light pulses is a function of a change in a temperature of the lens forming composition over a period of time.

63. The eyeglass lens of claim 1, wherein directing light to the lens forming composition comprises applying a plurality of activating light pulses to the lens forming composition, wherein an intensity of the light pulses is a function of a change in a temperature of the lens forming composition over a predetermined period of time.

64. The eyeglass lens of claim 1, wherein the formed eyeglass lens absorbs some ultraviolet light when ultraviolet light is applied to the lens during use of the lens.

65. The eyeglass lens of claim 1, wherein the formed eyeglass lens is at least 1.5 mm thick.

66. The eyeglass lens of claim 1, wherein the light absorbing compound comprises a compound selected from the group consisting of 2-(2H-benzotriazole-2-yl)-4-(1,1,3,3 tetramethylbutyl)phenol, 2-hydroxy-4-methoxybenzophenone, mixtures of 2-[4-((2-hydroxy-3-dodecyloxypropyl)oxy)-2-hydroxyphenyl]-4,6-bis(2,4-dimethylphenyl)-1,3,5-triazine and 2-[4-((2-hydroxy-3-tridecyloxypropyl)oxy)-2-hydroxyphenyl]-4,6-bis(2,4-dimethylpheyl)-1,3,5-triazine, mixtures of polyoxy-1,2-ethanediyl and α-(3-(3-(2H-benzotriazol-2-yl)-5-(1,1-dimethylethyl)-4-hydroxyphenyl)-1-oxopropyl)-w-hydroxy, a-(3-(3-(2H-benzotriazol-2-yl)-5-(1,1-dimethylethyl)-4-hydroxyphenyl)-1-oxopropyl)-w-(3-(3-(2H-benzotriazol-2-yl)-5-(1,1-dimethylethyl)-4-hydroxyphenyl)-1-oxopropoxy), 2(2-hydroxy-5-methyl phenyl) benzotriazole, ethyl-2-cyano 3,3-diphenyl acrylate, and phenyl salicylate.

67. A plastic eyeglass lens that absorbs at least some activating light when activating light is applied to the lens during use, comprising the reaction product of a lens forming composition, the lens forming composition comprising:
 a monomer that is curable in the mold cavity by exposure to activating light to substantially form the eyeglass lens;
 a light absorbing compound that absorbs at least a portion of the activating light during at least a portion of the curing of the monomer; and
 a photoinitiator that activates a co-initiator after being exposed to at least a portion of the activating light during curing, wherein the co-initiator activates curing of the monomer to form the eyeglass lens, and wherein the co-initiator facilitates curing of the lens forming composition;
  wherein reaction of the lens forming composition is initiated by applying activating light to the lens forming composition.

68. The eyeglass lens of claim 67, wherein the lens forming composition further comprises a hydroquinone compound for inhibiting polymerization of the monomer before polymerization is desired.

69. The eyeglass lens of claim 67, wherein the lens forming composition further comprises between about 0 and 70 ppm of monomethylether hydroquinone.

70. The eyeglass lens of claim 67, wherein the light absorbing compound is a photochromic compound.

71. The eyeglass lens of claim 67, wherein the light absorbing compound is a photochromic compound, and wherein the photochromic compound comprises a compound selected from the group consisting of spirooxazines, spiropyrans, spironaphthoxazines, spiropyridobenzoxazines, spirobenzoxazines, naphthopyrans benzopyrans, spironaphthopyrans, indolinospironaphthoxazines, indolinospironaphthopyrans, diarylnaphthopyrans, organometallics, and phenylmercury.

72. The eyeglass lens of claim 67, wherein the lens forming composition further comprises a hindered phenolic compound selected from the group consisting of thiodiethylene bis-(3,5-di-tert-butyl-4-hydroxy)hydrocinnamate and octadecyl-3,5-bis(1,1-dimethylethyl)-4-hydroxybenzenepropanoate for inhibiting oxidation of the lens forming composition.

73. The eyeglass lens of claim 67, wherein the light absorbing compound is a photochromic compound, and wherein an amount of photochromic compound in the lens forming composition ranges from about 1 ppm to about 5% by weight.

74. The eyeglass lens of claim 67, wherein the light absorbing compound is a photochromic compound, and wherein an amount of photochromic compound in the lens forming composition ranges from about 30 ppm to about 2000 ppm.

75. The eyeglass lens of claim 67, wherein the light absorbing compound is a photochromic compound, and wherein an amount of photochromic compound in the lens forming composition ranges from about 150 ppm to about 1000 ppm.

76. The eyeglass lens of claim 67, wherein the light absorbing compound is a photochromic compound, and wherein an amount of photoinitiator in the lens forming composition ranges from about 30 ppm to about 2000 ppm.

77. The eyeglass lens of claim 67, wherein an amount of the co-initiator in the lens forming composition ranges from about 1 ppm to about 7% by weight.

78. The eyeglass lens of claim 67, wherein an amount of the co-initiator in the lens forming composition ranges from about 0.3% to about 2% by weight.

79. The eyeglass lens of claim 67, wherein the lens forming composition comprises less than about 0.15% water.

80. The eyeglass lens of claim 67, wherein the lens forming composition comprises less than about 100 ppm residual acrylic acid.

81. The eyeglass lens of claim 67, wherein the monomer comprises a polyethylenic-functional monomer containing ethylenically unsaturated groups selected from acrylyl and methacrylyl.

82. The eyeglass lens of claim 67, wherein the monomer comprises an aromatic containing bis(allyl carbonate)-functional monomer.

83. The eyeglass lens of claim 67, wherein the monomer comprises a compound selected from the group consisting of polyol (allyl carbonate)-functional monomer, acrylic-functional monomer, methacrylic-functional monomer, and mixtures thereof.

84. The eyeglass lens of claim 67, wherein the monomer comprises a compound selected from the group consisting of tripropyleneglycol diacrylate, tetraethyleneglycol diacrylate, trimethylolpropane triacrylate, trimethylolpropane triacrylate, bisphenol A bis allyl carbonate, hexanediol dimethacrylate, and mixtures thereof.

85. The eyeglass lens of claim 67, wherein the co-initiator comprises an amine.

86. The eyeglass lens of claim 67, wherein the co-initiator comprises an acrylic amine.

87. The eyeglass lens of claim 67, wherein the co-initiator comprises a diacrylic amine.

88. The eyeglass lens of claim 67, wherein the co-initiator comprises a compound selected from the group consisting of N,N-dimethyldiethanolamine, triethanolamine, ethyl-4-dimethylamino benzoate, ethyl-2-dimethylamino benzoate, n-butoxyethyl-4-dimethyl amino benzoate, p-dimethyl amino benzaldehyde, N,N-dimethyl-p-toluidine, and octyl p-dimethylaminobenzoate.

89. The eyeglass lens of claim 67, wherein the photoinitiator comprises a compound selected from the group consisting of 1-hydroxycyclohexylphenyl ketone, mixtures of bis(2,6-dimethoxybenzoyl) (2,4,4,-trimethylphenyl) phosphine oxide and 2-hydroxy-2-methyl-1-phenylpropan-1-one, mixtures of (2,6 dimethoxybenzoyl) (2,4,4,-trimethylphenyl) phosphine oxide and 1-hydroxycyclohexylphenylketone, 2,2-dimethoxy-2-phenylacetophenone, 2-hydroxy-2-methyl-1phenylpropan-1-one, mixtures of 2,4,6-trimethylbenzoyldiphenylphosphine oxide and 2-hydroxy-2-methyl-1phenylpropan-1-one, 2,2-diethoxyacetophenone, benzil dimethylketal, α-hydroxyketone, 2-methyl thioxanthone, 2-chlorothioxanthone, thioxanthone, xanthone, 2-isopropylthioxanthone, mixtures of triaryl sulfonium hexafluoroantimonate and propylene carbonate, diaryl diodonium hexafluoroantimonate, mixtures of benzophenone and 1-hydroxycyclohexylphenyl ketone, 2-benzyl-2-N,N-dimethylamino-1-(4-morpholinophenyl)-1-butanone, 2-methyl-1-[4-(methylthio)phenyl]-2-morpholino propan-1-one, bis(η5-2,4-cyclopentadien-1-yl)-bis-[2,6-difluoro-3-(1H-pyrrol-1-yl) phenyl]titanium, mixtures of 2,4,6-trimethylbenzophenone and 4-methylbenzophenone, benzoyl peroxide, and methyl benzoylformate.

90. The eyeglass lens of claim 67, wherein the photoinitiator comprises bis(2,6-dimethoxybenzoyl)-(2,4,4 trimethylphenyl) phosphine oxide.

91. The eyeglass lens of claim 67, wherein the lens forming composition comprises bis(1,2,2,6,6-pentamethyl-4-piperidinyl)sebacate for inhibiting degradation of the cured monomer caused by exposure to activating light.

92. The eyeglass lens of claim 67, wherein the lens forming composition further comprises a dye to form a background color within the eyeglass lens.

93. The eyeglass lens of claim 67, wherein the lens forming composition further comprises a dye that inhibits ambient oxygen from reacting with the ultraviolet absorbing compound.

94. The eyeglass lens of claim 67, wherein the lens forming composition further comprises a dye for altering a background color of the lens during use.

95. The eyeglass lens of claim 67, wherein the lens forming composition further comprises a dye for inhibiting the light absorbing compound from being exposed to predetermined wavelengths of light.

96. The eyeglass lens of claim 67, wherein the formed eyeglass lens is at least 1.5 mm thick.

97. The eyeglass lens of claim 67, wherein the light absorbing compound comprises a compound selected from the group consisting of 2-(2H-benzotriazole-2-yl)-4-(1,1,3,3 tetramethylbutyl)phenol, 2-hydroxy-4- methoxybenzophenone, mixtures of 2-[4-((2-hydroxy-3-dodecyloxypropyl)oxy)-2-hydroxyphenyl]-4,6-bis(2,4-dimethylphenyl)-1,3,5-triazine and 2-[4-((2-hydroxy-3-tridecyloxypropyl)oxy)-2-hydroxyphenyl]-4,6-bis(2,4-dimethylpheyl)- 1,3,5-triazine, mixtures of polyoxy-1,2-ethanediyl and α-(3-(3-(2H-benzotriazol-2-yl)-5-(1,1-dimethylethyl)-4-hydroxyphenyl)-1-oxopropyl)-w-hydroxy, a-(3-(3-(2H-benzotriazol-2-yl)-5-(1,1-dimethylethyl)-4-hydroxyphenyl)-1-oxopropyl)-w-(3-(3-(2H-benzotriazol-2-yl)-5-(1,1-dimethylethyl)-4-hydroxyphenyl)-1-oxopropoxy), 2(2-hydroxy-5-methyl phenyl) benzotriazole, ethyl-2-cyano 3,3-diphenyl acrylate, and phenyl salicylate.

98. A plastic eyeglass lens that absorbs at least some activating light when activating light is applied to the lens during use made by the method comprising:
  placing a liquid lens forming composition in a mold cavity defined by at least a first mold member, the lens forming composition comprising:
    a monomer that is curable in the mold cavity by exposure to activating light to substantially form the eyeglass lens;
    a photochromic compound that absorbs at least a portion of the activating light during at least a portion of the curing of the monomer;
    a photoinitiator that activates a co-initiator after being exposed to at least a portion of the activating light during curing, wherein the co-initiator activates curing of the monomer to form the eyeglass lens, and wherein the co-initiator facilitates curing of the lens forming composition; and
  directing activating light toward the mold cavity to cure the lens forming composition to form the eyeglass lens, wherein the formed eyeglass lens absorbs some activating light when activating light is applied to the lens during use of the lens.

99. A plastic eyeglass lens that absorbs at least some activating light when activating light is applied to the lens during use made by the method comprising:
  placing a liquid lens forming composition in a mold cavity defined by at least a first mold member, the lens forming composition comprising:
    a monomer that is curable in the mold cavity by exposure to activating light to substantially form the eyeglass lens;
    an ultraviolet light absorbing compound that absorbs at least a portion of the activating light during at least a portion of the curing of the monomer;
    a photoinitiator that activates a co-initiator after being exposed to at least a portion of the activating light during curing, wherein the co-initiator activates curing of the monomer to form the eyeglass lens, and wherein the co-initiator facilitates curing of the lens forming composition; and
  directing activating light toward the mold cavity to cure the lens forming composition to form the eyeglass lens, wherein the formed eyeglass lens absorbs some activating light when activating light is applied to the lens during use of the lens.

100. A plastic eyeglass lens that absorbs at least some activating light when activating light is applied to the lens during use, comprising the reaction product of a lens forming composition, the lens forming composition comprising:
  a monomer that is curable in the mold cavity by exposure to activating light to substantially form the eyeglass lens;
  a photochromic compound that absorbs at least a portion of the activating light during at least a portion of the curing of the monomer; and
  a photoinitiator that activates a co-initiator after being exposed to at least a portion of the activating light during curing, wherein the co-initiator activates curing of the monomer to form the eyeglass lens, and wherein the co-initiator facilitates curing of the lens forming composition;
    wherein reaction of the lens forming composition is initiated by applying activating light to the lens forming composition.

101. A plastic eyeglass lens that absorbs at least some activating light when activating light is applied to the lens during use, comprising the reaction product of a lens forming composition, the lens forming composition comprising:
  a monomer that is curable in the mold cavity by exposure to activating light to substantially form the eyeglass lens;
  an ultraviolet light absorbing compound that absorbs at least a portion of the activating light during at least a portion of the curing of the monomer; and
  a photoinitiator that activates a co-initiator after being exposed to at least a portion of the activating light during curing, wherein the co-initiator activates curing of the monomer to form the eyeglass lens, and wherein the co-initiator facilitates curing of the lens forming composition;
    wherein reaction of the lens forming composition is initiated by applying activating light to the lens forming composition.

102. A plastic eyeglass lens that absorbs at least some activating light when activating light is applied to the lens during use made by the method comprising:
  placing a liquid lens forming composition in a mold cavity defined by at least a first mold member, the lens forming composition comprising:
    a monomer that is curable in the mold cavity by exposure to activating light to substantially form the eyeglass lens;
    a light absorbing compound that absorbs at least a portion of the activating light having a wavelength in a first range during at least a portion of the curing of the monomer; and
    a photoinitiator that activates a co-initiator after being exposed to at least a portion of the activating light having a wavelength in a second range during curing, wherein the co-initiator activates curing of the monomer to form the eyeglass lens, and wherein the co-initiator facilitates curing of the lens forming composition; and
  directing activating light toward the mold cavity to cure the lens forming composition to form the eyeglass lens, wherein the formed eyeglass lens absorbs some activating light when activating light is applied to the lens during use of the lens.

103. The eyeglass lens of claim 102, wherein the first range is less than 380 nanometers.

104. The eyeglass lens of claim 102, wherein the second range is from about 380 to about 490 nanometers.

105. The eyeglass lens of claim 102, wherein the first range is less than 380 nanometers, and wherein the second range is from about 380 to about 490 nanometers.

106. The eyeglass lens of claim 102, wherein the first range is substantially different from the second range.

107. The eyeglass lens of claim 102, wherein curing the lens forming composition comprises polymerizing the monomer.

108. The eyeglass lens of claim 102, wherein directing activating light to the lens forming composition comprises applying a plurality of activating light pulses to the lens forming composition.

109. The eyeglass lens of claim 102, wherein the mold cavity is further defined by a second mold member.

110. The eyeglass lens of claim 102, wherein the method of forming the eyeglass lens further comprises applying air to the mold cavity to remove heat from the mold cavity.

111. The eyeglass lens of claim 102, wherein the method of forming the eyeglass lens further comprises directing air toward at least one of the mold members to cool the lens forming composition.

112. The eyeglass lens of claim 102, wherein the method of forming the eyeglass lens further comprises applying a hydrophobic coating to the eyeglass lens.

113. The eyeglass lens of claim 102, wherein the method of forming the eyeglass lens further comprises applying a hydrophobic coating to the eyeglass lens, wherein the hydrophobic coating is adapted to inhibit the eyeglass lens from being exposed to water and to ambient oxygen.

114. The eyeglass lens of claim 102, wherein the method of forming the eyeglass lens further comprises inhibiting the eyeglass lens from being exposed to water and to ambient oxygen by applying a coating to the eyeglass lens.

115. The eyeglass lens of claim 102, wherein the method of forming the eyeglass lens further comprises cooling at least one of the mold members to below ambient temperature prior to directing activating light toward the mold cavity.

116. The eyeglass lens of claim 102, wherein the first mold member comprises a casting face and a non-casting face, and wherein the method of forming the eyeglass lens further comprises placing a first hardcoat layer upon said casting face and a second hardcoat layer upon said first hardcoat layer prior to placing the liquid lens forming composition in the mold cavity.

117. The eyeglass lens of claim 109, wherein the second mold member comprises a casting face and a non-casting face, and wherein the method of forming the eyeglass lens further comprises placing a material capable of being tinted upon the casting face prior to placing the liquid lens forming composition in the mold cavity.

118. The eyeglass lens of claim 109, wherein the second mold member comprises a casting face and a non-casting face, and wherein the method of forming the eyeglass lens further comprised placing a material capable of being tinted upon the casting face prior to placing the liquid lens forming composition in the mold cavity, and further comprising applying dye to the material to tint the lens forming composition.

119. The eyeglass lens of claim 109, wherein the method of forming the eyeglass lens further comprises applying an adhesion-promoter coating to an inner surface of the first mold member and an inner surface of the second mold member to substantially adhere the lens forming composition to the first and second mold members during use.

120. The eyeglass lens of claim 109, wherein the method of forming the eyeglass lens further comprises placing a substantially hazy light filter between a light source and at least one of the mold members to vary intensity of activating light across the lens forming composition when the light is directed toward the mold cavity.

121. The eyeglass lens of claim 109, wherein the first mold member comprises a casting face and a non-casting face, wherein the second mold member comprises a casting face and a non-casting face, and wherein the method of forming the eyeglass lens further comprises directing cooled air having a temperature below ambient temperature toward at least one of the non-casting faces of the first and second mold members to remove heat from the lens forming composition.

122. The eyeglass lens of claim 102, wherein the activating light is removed from the mold cavity when substantially all of the lens forming composition has reached its gel point.

123. The eyeglass lens of claim 102, wherein the activating light comprises a first intensity, and wherein the activating light is directed toward the mold cavity until substantially all of the lens forming composition has reached its gel point, and wherein the method of forming the eyeglass lens further comprises directing activating light having a second intensity towards the mold cavity to cure substantially all of the lens forming composition, the first intensity being greater than the second intensity.

124. The eyeglass lens of claim 102, wherein the activating light is directed toward the mold cavity until substantially all of the lens forming composition has reached its gel point, and wherein the method of forming the eyeglass lens further comprises inhibiting the activating light from further being directed toward the mold cavity, thereby allowing substantially all of the lens forming composition to cure.

125. The eyeglass lens of claim 102, wherein the eyeglass lens is formed from the lens forming composition in a time period of less than about 10 minutes.

126. The eyeglass lens of claim 102, wherein the eyeglass lens is formed from the lens forming composition in a time period of less than about 30 minutes.

127. The eyeglass lens of claim 109, wherein the first mold member is spaced apart from the second mold member by a gasket, and wherein the method of forming the eyeglass lens further comprises removing the gasket subsequent to directing activating light toward the mold cavity to expose the lens forming composition to ambient air for approximately 5 to 30 minutes, thereby cooling the lens forming composition.

128. The eyeglass lens of claim 109, wherein the first mold member is spaced apart from the second mold member by a gasket, and wherein the method of forming the eyeglass lens further comprises removing the gasket subsequent to directing activating light toward the mold cavity to expose the lens forming composition to ambient air for approximately 5 to 30 minutes, thereby cooling the lens forming composition, and further comprising directing additional activating light toward the mold cavity to at least partially cure the lens forming composition.

129. The eyeglass lens of claim 102, wherein the method of forming the eyeglass lens further comprises heating the cured lens forming composition to a temperature between approximately 100° C. to 120° C. for approximately 3 to 15 minutes subsequent to curing the lens forming composition.

130. The eyeglass lens of claim 102, wherein the method of forming the eyeglass lens further comprises placing a filter between a light source and at least one of the mold members, wherein the filter comprises a varying thickness such that the filter varies an intensity distribution of activating light across the mold cavity.

131. The eyeglass lens of claim 102, wherein the method of forming the eyeglass lens further comprises a filter with a pattern printed on it between the light source and at least one of the mold members, wherein the filter varies an intensity distribution of the activating light across the mold cavity.

132. The eyeglass lens of claim 102, wherein directing activating light toward the mold cavity initiates the photoinitiator proximate a surface of the lens forming composition such that the photoinitiator initiates the co-initiator proximate a middle of the lens forming composition, the middle of the lens forming composition having insufficient light to initiate the photoinitiator therein.

133. The eyeglass lens of claim 102, wherein the photochromic compound is dissolved in the monomer.

134. The eyeglass lens of claim 102, wherein the lens forming composition further comprises a hydroquinone compound for inhibiting polymerization of the monomer before polymerization is desired.

135. The eyeglass lens of claim 102, wherein the lens forming composition further comprises between about 0 and 70 ppm of monomethylether hydroquinone.

136. The eyeglass lens of claim 102, wherein the light absorbing compound is a photochromic compound.

137. The eyeglass lens of claim 102, wherein the light absorbing compound is a photochromic compound, and wherein the photochromic compound comprises a compound selected from the group consisting of spirooxazines, spiropyrans, spironaphthoxazines, spiropyridobenzoxazines, spirobenzoxazines, naphthopyrans, benzopyrans, spironaphthopyrans, indolinospironaphthoxazines, indolinospironaphthopyrans, diarylnaphthopyrans, organometallics, and phenylmercury.

138. The eyeglass lens of claim 102, wherein the lens forming composition further comprises a hindered phenolic compound selected from the group consisting of thiodiethylene bis-(3,5-di-tert-butyl-4-hydroxy)hydrocinnamate and octadecyl-3,5-bis(1,1-dimethylethyl)-4-hydroxybenzenepropanoate for inhibiting oxidation of the lens forming composition.

139. The eyeglass lens of claim 102, wherein the light absorbing compound is a photochromic compound, and wherein an amount of photochromic compound in the lens forming composition ranges from about 1 ppm to about 5% by weight.

140. The eyeglass lens of claim 102, wherein the light absorbing compound is a photochromic compound, and wherein an amount of photochromic compound in the lens forming composition ranges from about 30 ppm to about 2000 ppm.

141. The eyeglass lens of claim 102, wherein the light absorbing compound is a photochromic compound, and wherein an amount of photochromic compound in the lens forming composition ranges from about 150 ppm to about 1000 ppm.

142. The eyeglass lens of claim 102, wherein the light absorbing compound is a photochromic compound, and wherein an amount of photoinitiator in the lens forming composition ranges from about 30 ppm to about 2000 ppm.

143. The eyeglass lens of claim 102, wherein an amount of the co-initiator in the lens forming composition ranges from about 1 ppm to about 7% by weight.

144. The eyeglass lens of claim 102, wherein an amount of the co-initiator in the lens forming composition ranges from about 0.3% to about 2% by weight.

145. The eyeglass lens of claim 102, wherein the lens forming composition comprises less than about 0.15% water.

146. The eyeglass lens of claim 102, wherein the lens forming composition comprises less than about 100 ppm residual acrylic acid.

147. The eyeglass lens of claim 102, wherein the monomer comprises a polyethylenic-functional monomer containing ethylenically unsaturated groups selected from acrylyl and methacrylyl.

148. The eyeglass lens of claim 102, wherein the monomer comprises an aromatic containing bis(allyl carbonate)-functional monomer.

149. The eyeglass lens of claim 102, wherein the monomer comprises a compound selected from the group consisting of polyol (allyl carbonate)-functional monomer, acrylic-functional monomer, methacrylic-functional monomer, and mixtures thereof.

150. The eyeglass lens of claim 102, wherein the monomer comprises a compound selected from the group consisting of tripropyleneglycol diacrylate, tetraethyleneglycol diacrylate, trimethylolpropane triacrylate, trimethylolpropane triacrylate, bisphenol A bis allyl carbonate, hexanediol dimethacrylate, and mixtures thereof.

151. The eyeglass lens of claim 102, wherein the co-initiator comprises an amine.

152. The eyeglass lens of claim 102, wherein the co-initiator comprises an acrylic amine.

153. The eyeglass lens of claim 102, wherein the co-initiator comprises a diacrylic amine.

154. The eyeglass lens of claim 102, wherein the co-initiator comprises a compound selected from the group consisting of N,N-dimethyldiethanolamine, triethanolamine, ethyl-4-dimethylamino benzoate, ethyl-2-dimethylamino benzoate, n-butoxyethyl-4-dimethyl amino benzoate, p-dimethyl amino benzaldehyde, N,N-dimethyl-p-toluidine, and octyl p-dimethylaminobenzoate.

155. The eyeglass lens of claim 102, wherein the photoinitiator comprises a compound selected from the group consisting of 1-hydroxycyclohexylphenyl ketone, mixtures of bis(2,6-dimethoxybenzoyl) (2,4,4,-trimethylphenyl) phosphine oxide and 2-hydroxy-2-methyl-1-phenylpropan-1-one, mixtures of (2,6 dimethoxybenzoyl) (2,4,4,-trimethylphenyl) phosphine oxide and 1-hydroxycyclohexylphenylketone, 2,2-dimethoxy-2-phenylacetophenone, 2-hydroxy-2-methyl-1phenylpropan-1-one, mixtures of 2,4,6-trimethylbenzoyldiphenylphosphine oxide and 2-hydroxy-2-methyl-1phenylpropan-1-one, 2,2-diethoxyacetophenone, benzil dimethylketal, α-hydroxyketone, 2-methyl thioxanthone, 2-chlorothioxanthone, thioxanthone, xanthone, 2-isopropylthioxanthone, mixtures of triaryl sulfonium hexafluoroantimonate and propylene carbonate, diaryl diodonium hexafluoroantimonate, mixtures of benzophenone and 1-hydroxycyclohexylphenyl ketone, 2-benzyl-2-N,N-dimethylamino-1-(4-morpholinophenyl)-1-butanone, 2-methyl-1-[4-(methylthio)phenyl]-2-morpholino propan-1-one, bis(η5-2,4-cyclopentadien-1-yl)-bis-[2,6-difluoro-3-(1H-pyrrol-1-yl) phenyl]titanium, mixtures of 2,4,6-trimethylbenzophenone and 4-methylbenzophenone, benzoyl peroxide, and methyl benzoylformate.

156. The eyeglass lens of claim 102, wherein the photoinitiator comprises bis(2,6-dimethoxybenzoyl)-(2,4,4 trimethylphenyl) phosphine oxide.

157. The eyeglass lens of claim 102, wherein the photoinitiator forms a polymer chain radical in response to being exposed to activating light.

158. The eyeglass lens of claim 102, wherein the photoinitiator forms a first polymer chain radical in response to being exposed to activating light, and wherein the first polymer chain radical reacts with the co-initiator, thereby forming a second polymer chain radical.

159. The eyeglass lens of claim 102, wherein the photoinitiator forms a first polymer chain radical in response to being exposed to activating light, and wherein the first polymer chain radical reacts with the co-initiator, thereby forming a second polymer chain radical, and wherein the second polymer chain radical reacts with the monomer, thereby curing the monomer.

160. The eyeglass lens of claim 102, wherein the lens forming composition comprises bis(1,2,2,6,6-pentamethyl- 4-piperidinyl)sebacate for inhibiting degradation of the cured monomer caused by exposure to activating light.

161. The eyeglass lens of claim 102, wherein the lens forming composition further comprises a dye to form a background color within the eyeglass lens.

162. The eyeglass lens of claim 102, wherein the lens forming composition further comprises a dye that inhibits ambient oxygen from reacting with the ultraviolet absorbing compound.

163. The eyeglass lens of claim 102, wherein the lens forming composition further comprises a dye for altering a background color of the lens during use.

164. The eyeglass lens of claim 102, wherein the lens forming composition further comprises a dye for inhibiting the light absorbing compound from being exposed to predetermined wavelengths of light.

165. The eyeglass lens of claim 102, wherein an amount of activating light is directed towards the mold cavity, and wherein the mold cavity comprises a temperature, and wherein the amount of activating light directed to the mold cavity is a function of the temperature of at least a portion of the mold cavity.

166. The eyeglass lens of claim 102, wherein directing light to the lens forming composition comprises applying a number of activating light pulses to the lens forming composition, wherein the number of light pulses is a function of a change in a temperature of the lens forming composition over a period of time.

167. The eyeglass lens of claim 102, wherein directing light to the lens forming composition comprises applying a plurality of activating light pulses to the lens forming composition, wherein a duration of the light pulses is a function of a change in a temperature of the lens forming composition over a period of time.

168. The eyeglass lens of claim 102, wherein directing light to the lens forming composition comprises applying a plurality of activating light pulses to the lens forming composition, wherein an intensity of the light pulses is a function of a change in a temperature of the lens forming composition over a predetermined period of time.

169. The eyeglass lens of claim 102, wherein the formed eyeglass lens absorbs some ultraviolet light when ultraviolet light is applied to the lens during use of the lens.

170. The eyeglass lens of claim 102, wherein the formed eyeglass lens is at least 1.5 mm thick.

171. The eyeglass lens of claim 102, wherein the light absorbing compound comprises a compound selected from the group consisting of 2-(2H-benzotriazole-2-yl)-4-(1,1,3,3 tetramethylbutyl)phenol, 2-hydroxy-4-methoxybenzophenone, mixtures of 2-[4-((2-hydroxy-3-dodecyloxypropyl)oxy)-2-hydroxyphenyl]-4,6-bis(2,4-dimethylphenyl)-1,3,5-triazine and 2-[4-((2-hydroxy-3-tridecyloxypropyl)oxy)-2-hydroxyphenyl]-4,6-bis(2,4-dimethylpheyl)-1,3,5-triazine, mixtures of polyoxy-1,2-ethanediyl and α-(3-(3-(2H-benzotriazol-2-yl)-5-(1,1-dimethylethyl)-4-hydroxyphenyl)-1-oxopropyl)-w-hydroxy, a-(3-(3-(2H-benzotriazol-2-yl)-5-(1,1-dimethylethyl)-4-hydroxyphenyl)-1-oxopropyl)-w-(3-(3-(2H-benzotriazol-2-yl)-5-(1,1-dimethylethyl)-4-hydroxyphenyl)-1-oxopropoxy), 2(2-hydroxy-5-methyl phenyl) benzotriazole, ethyl-2-cyano 3,3-diphenyl acrylate, and phenyl salicylate.

172. A plastic eyeglass lens that absorbs at least some activating light when activating light is applied to the lens during use made by the method comprising:
placing a liquid lens forming composition in a mold cavity defined by at least a first mold member, the lens forming composition comprising:
a monomer that is curable in the mold cavity by exposure to activating light to substantially form the eyeglass lens;
a photochromic compound that absorbs at least a portion of the activating light having a wavelength in a first range during at least a portion of the curing of the monomer; and
a photoinitiator that activates a co-initiator after being exposed to at least a portion of the activating light having a wavelength in a second range during curing, wherein the co-initiator activates curing of the monomer to form the eyeglass lens, and wherein the co-initiator facilitates curing of the lens forming composition; and
directing activating light toward the mold cavity to cure the lens forming composition to form the eyeglass lens, wherein the formed eyeglass lens absorbs some activating light when activating light is applied to the lens during use of the lens.

173. A plastic eyeglass lens that absorbs at least some activating light when activating light is applied to the lens during use made by the method comprising:
placing a liquid lens forming composition in a mold cavity defined by at least a first mold member, the lens forming composition comprising:
a monomer that is curable in the mold cavity by exposure to activating light to substantially form the eyeglass lens;
an ultraviolet light absorbing compound that absorbs at least a portion of the activating light having a wavelength in a first range during at least a portion of the curing of the monomer; and
a photoinitiator that activates a co-initiator after being exposed to at least a portion of the activating light having a wavelength in a second range during curing, wherein the co-initiator activates curing of the monomer to form the eyeglass lens, and wherein the co-initiator facilitates curing of the lens forming composition; and
directing activating light toward the mold cavity to cure the lens forming composition to form the eyeglass lens, wherein the formed eyeglass lens absorbs some activating light when activating light is applied to the lens during use of the lens.

174. A plastic eyeglass lens that absorbs at least some activating light when activating light is applied to the lens during use, comprising the reaction product of a lens forming composition, the lens forming composition comprising:
a monomer that is curable in the mold cavity by exposure to activating light to substantially form the eyeglass lens;
a light absorbing compound that absorbs at least a portion of the activating light having a wavelength in a first range during at least a portion of the curing of the monomer; and
a photoinitiator that activates a co-initiator after being exposed to at least a portion of the activating light having a wavelength in a second range during curing, wherein the co-initiator activates curing of the monomer to form the eyeglass lens, and wherein the co-initiator facilitates curing of the lens forming composition;
wherein reaction of the lens forming composition is initiated by applying activating light to the lens forming composition.

175. The eyeglass lens of claim 174, wherein the lens forming composition further comprises a hydroquinone compound for inhibiting polymerization of the monomer before polymerization is desired.

176. The eyeglass lens of claim 174, wherein the lens forming composition further comprises between about 0 and 70 ppm of monomethylether hydroquinone.

177. The eyeglass lens of claim 174, wherein the light absorbing compound is a photochromic compound.

178. The eyeglass lens of claim 174, wherein the light absorbing compound is a photochromic compound, and wherein the photochromic compound comprises a compound selected from the group consisting of spirooxazines, spiropyrans, spironaphthoxazines, spiropyridobenzoxazines, spirobenzoxazines, naphthopyrans benzopyrans, spironaphthopyrans, indolinospironaphthoxazines, indolinospironaphthopyrans, diarylnaphthopyrans, organometallics, and phenylmercury.

179. The eyeglass lens of claim 174, wherein the lens forming composition further comprises a hindered phenolic compound selected from the group consisting of thiodiethylene bis-(3,5-di-tert-butyl-4-hydroxy)hydrocinnamate and octadecyl-3,5-bis(1,1-dimethylethyl)-4-hydroxybenzene-propanoate for inhibiting oxidation of the lens forming composition.

180. The eyeglass lens of claim 174, wherein the light absorbing compound is a photochromic compound, and wherein an amount of photochromic compound in the lens forming composition ranges from about 1 ppm to about 5% by weight.

181. The eyeglass lens of claim 174, wherein the light absorbing compound is a photochromic compound, and wherein an amount of photochromic compound in the lens forming composition ranges from about 30 ppm to about 2000 ppm.

182. The eyeglass lens of claim 174, wherein the light absorbing compound is a photochromic compound, and wherein an amount of photochromic compound in the lens forming composition ranges from about 150 ppm to about 1000 ppm.

183. The eyeglass lens of claim 174, wherein the light absorbing compound is a photochromic compound, and wherein an amount of photoinitiator in the lens forming composition ranges from about 30 ppm to about 2000 ppm.

184. The eyeglass lens of claim 174, wherein an amount of the co-initiator in the lens forming composition ranges from about 1 ppm to about 7% by weight.

185. The eyeglass lens of claim 174, wherein an amount of the co-initiator in the lens forming composition ranges from about 0.3% to about 2% by weight.

186. The eyeglass lens of claim 174, wherein the lens forming composition comprises less than about 0.15% water.

187. The eyeglass lens of claim 174, wherein the lens forming composition comprises less than about 100 ppm residual acrylic acid.

188. The eyeglass lens of claim 174, wherein the monomer comprises a polyethylenic-functional monomer containing ethylenically unsaturated groups selected from acrylyl and methacrylyl.

189. The eyeglass lens of claim 174, wherein the monomer comprises an aromatic containing bis(allyl carbonate)-functional monomer.

190. The eyeglass lens of claim 174, wherein the monomer comprises a compound selected from the group consisting of polyol (allyl carbonate)-functional monomer, acrylic-functional monomer, methacrylic-functional monomer, and mixtures thereof.

191. The eyeglass lens of claim 174, wherein the monomer comprises a compound selected from the group consisting of tripropyleneglycol diacrylate, tetraethyleneglycol diacrylate, trimethylolpropane triacrylate, trimethylolpropane triacrylate, bisphenol A bis allyl carbonate, hexanediol dimethacrylate, and mixtures thereof.

192. The eyeglass lens of claim 174, wherein the co-initiator comprises an amine.

193. The eyeglass lens of claim 174, wherein the co-initiator comprises an acrylic amine.

194. The eyeglass lens of claim 174, wherein the co-initiator comprises a diacrylic amine.

195. The eyeglass lens of claim 174, wherein the co-initiator comprises a compound selected from the group consisting of N,N-dimethyldiethanolamine, triethanolamine, ethyl-4-dimethylamino benzoate, ethyl-2-dimethylamino benzoate, n-butoxyethyl-4-dimethyl amino benzoate, p-dimethyl amino benzaldehyde, N,N-dimethyl-p-toluidine, and octyl p-dimethylaminobenzoate.

196. The eyeglass lens of claim 174, wherein the photoinitiator comprises a compound selected from the group consisting of 1-hydroxycyclohexylphenyl ketone, mixtures of bis(2,6-dimethoxybenzoyl) (2,4,4,-trimethylphenyl) phosphine oxide and 2-hydroxy-2-methyl-1-phenylpropan-1-one, mixtures of (2,6 dimethoxybenzoyl) (2,4,4,-trimethylphenyl) phosphine oxide and 1-hydroxycyclohexylphenylketone, 2,2-dimethoxy-2-phenylacetophenone, 2-hydroxy-2-methyl-1phenylpropan-1-one, mixtures of 2,4,6-trimethylbenzoyldiphenylphosphine oxide and 2-hydroxy-2-methyl-1phenylpropan-1-one, 2,2-diethoxyacetophenone, benzil dimethylketal, α-hydroxyketone, 2-methyl thioxanthone, 2-chlorothioxanthone, thioxanthone, xanthone, 2-isopropylthioxanthone, mixtures of triaryl sulfonium hexafluoroantimonate and propylene carbonate, diaryl diodonium hexafluoroantimonate, mixtures of benzophenone and 1-hydroxycyclohexylphenyl ketone, 2-benzyl-2-N,N-dimethylamino-1-(4-morpholinophenyl)-1-butanone, 2-methyl-1-[4-(methylthio)phenyl]-2-morpholino propan-1-one, bis(η5-2,4-cyclopentadien-1-yl)-bis-[2,6-difluoro-3-(1H-pyrrol-1-yl) phenyl]titanium, mixtures of 2,4,6-trimethylbenzophenone and 4-methylbenzophenone, benzoyl peroxide, and methyl benzoylformate.

197. The eyeglass lens of claim 174, wherein the photoinitiator comprises bis(2,6-dimethoxybenzoyl)-(2,4,4 trimethylphenyl) phosphine oxide.

198. The eyeglass lens of claim 174, wherein the lens forming composition comprises bis(1,2,2,6,6-pentamethyl-4-piperidinyl)sebacate for inhibiting degradation of the cured monomer caused by exposure to activating light.

199. The eyeglass lens of claim 174, wherein the lens forming composition further comprises a dye to form a background color within the eyeglass lens.

200. The eyeglass lens of claim 174, wherein the lens forming composition further comprises a dye that inhibits ambient oxygen from reacting with the ultraviolet absorbing compound.

201. The eyeglass lens of claim 174, wherein the lens forming composition further comprises a dye for altering a background color of the lens during use.

202. The eyeglass lens of claim 174, wherein the lens forming composition further comprises a dye for inhibiting the light absorbing compound from being exposed to predetermined wavelengths of light.

203. The eyeglass lens of claim 174, wherein the formed eyeglass lens is at least 1.5 mm thick.

204. The eyeglass lens of claim 174, wherein the light absorbing compound comprises a compound selected from the group consisting of 2-(2H-benzotriazole-2-yl)-4-(1,1,3,3 tetramethylbutyl)phenol, 2-hydroxy-4-methoxybenzophenone, mixtures of 2-[4-((2-hydroxy-3-dodecyloxypropyl)oxy)-2-hydroxyphenyl]-4,6-bis(2,4-dimethylphenyl)-1,3,5-triazine and 2-[4-((2-hydroxy-3-tridecyloxypropyl)oxy)-2-hydroxyphenyl]-4,6-bis(2,4-dimethylpheyl)-1,3,5-triazine, mixtures of polyoxy-1,2-ethanediyl and α-(3-(3-(2H-benzotriazol-2-yl)-5-(1,1-dimethylethyl)-4-hydroxyphenyl)-1-oxopropyl)-w-hydroxy, a-(3-(3-(2H-benzotriazol-2-yl)-5-(1,1-dimethylethyl)-4-hydroxyphenyl)-1-oxopropyl)-w-(3-(3-(2H-benzotriazol-2-yl)-5-(1,1-dimethylethyl)-4-hydroxyphenyl)-1-oxopropoxy), 2(2-hydroxy-5-methyl phenyl) benzotriazole, ethyl-2-cyano 3,3-diphenyl acrylate, and phenyl salicylate.

205. A plastic eyeglass lens that absorbs at least some activating light when activating light is applied to the lens during use, comprising the reaction product of a lens forming composition, the lens forming composition comprising:

a monomer that is curable in the mold cavity by exposure to activating light to substantially form the eyeglass lens;

a photochromic compound that absorbs at least a portion of the activating light having a wavelength in a first range during at least a portion of the curing of the monomer; and a photoinitiator that activates a co-initiator after being exposed to at least a portion of the activating light having a wavelength in a second range during curing, wherein the co-initiator activates curing of the monomer to form the eyeglass lens, and wherein the co-initiator facilitates curing of the lens forming composition;

wherein reaction of the lens forming composition is initiated by applying activating light to the lens forming composition.

206. A plastic eyeglass lens that absorbs at least some activating light when activating light is applied to the lens during use, comprising the reaction product of a lens forming composition, the lens forming composition comprising:

a monomer that is curable in the mold cavity by exposure to activating light to substantially form the eyeglass lens;

an ultraviolet light absorbing compound that absorbs at least a portion of the activating light having a wavelength in a first range during at least a portion of the curing of the monomer; and a photoinitiator that activates a co-initiator after being exposed to at least a portion of the activating light having a wavelength in a second range during curing, wherein the co-initiator activates curing of the monomer to form the eyeglass lens, and wherein the co-initiator facilitates curing of the lens forming composition;

wherein reaction of the lens forming composition is initiated by applying activating light to the lens forming composition.

* * * * *